US009341888B2

(12) United States Patent
Takeuchi et al.

(10) Patent No.: US 9,341,888 B2
(45) Date of Patent: May 17, 2016

(54) LIGHT REFLECTION SHEET, LIGHT SOURCE DEVICE, AND DISPLAY DEVICE

(75) Inventors: Hideto Takeuchi, Osaka (JP); Toshiyuki Fujita, Osaka (JP); Tatsuo Sugahara, Osaka (JP); Yuuki Kawamura, Osaka (JP); Mamoru Yahata, Osaka (JP); Hiroshi Takahashi, Osaka (JP); Keita Ito, Osaka (JP); Kenzo Toshiyuki, Osaka (JP); Kenichiro Ito, Osaka (JP); Kazuki Nakamichi, Osaka (JP); Tomoo Sasaki, Osaka (JP); Kenta Moribe, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 599 days.

(21) Appl. No.: 13/321,783

(22) PCT Filed: Apr. 16, 2010

(86) PCT No.: PCT/JP2010/056809
§ 371 (c)(1),
(2), (4) Date: Nov. 21, 2011

(87) PCT Pub. No.: WO2010/134406
PCT Pub. Date: Nov. 25, 2010

(65) Prior Publication Data

US 2012/0063133 A1 Mar. 15, 2012

(30) Foreign Application Priority Data

| | | |
|---|---|---|
| May 22, 2009 | (JP) | 2009-124143 |
| Jun. 19, 2009 | (JP) | 2009-146611 |
| Jun. 19, 2009 | (JP) | 2009-146613 |
| Jun. 19, 2009 | (JP) | 2009-146615 |
| Jun. 30, 2009 | (JP) | 2009-155774 |
| Jul. 2, 2009 | (JP) | 2009-158162 |
| Jul. 2, 2009 | (JP) | 2009-158168 |
| Jul. 3, 2009 | (JP) | 2009-159136 |
| Jul. 3, 2009 | (JP) | 2009-159137 |
| Jul. 3, 2009 | (JP) | 2009-159195 |
| Jul. 6, 2009 | (JP) | 2009-160123 |
| Jul. 6, 2009 | (JP) | 2009-160125 |
| Nov. 30, 2009 | (JP) | 2009-271878 |

(51) Int. Cl.
*F21V 7/00* (2006.01)
*G02F 1/1335* (2006.01)
(Continued)

(52) U.S. Cl.
CPC .... *G02F 1/133605* (2013.01); *G02F 1/133603* (2013.01); *G02F 1/133608* (2013.01);
(Continued)

(58) Field of Classification Search
USPC .......... 362/217.05, 235, 249.02, 296.01, 341, 362/609
See application file for complete search history.

(56) References Cited

U.S. PATENT DOCUMENTS 3,550,835 A 12/1970 Persson
5,404,239 A 4/1995 Hirai
(Continued)

FOREIGN PATENT DOCUMENTS

CN 87200469 U 1/1988
CN 1702521 A 11/2005
(Continued)

OTHER PUBLICATIONS

PCT/ISA/210—International Search Report dated May 18, 2010 for PCT/JP2010/056809.
(Continued)

*Primary Examiner* — Evan Dzierzynski
*Assistant Examiner* — Meghan Dunwiddie
(74) *Attorney, Agent, or Firm* — Birch, Stewart, Kolasch & Birch, LLP

(57) ABSTRACT

A through hole penetrating in a vertical direction and a slot which is separated from the through hole in the direction along the sheet surface and is long in a separating direction are provided on a light reflection sheet supported on a support body supporting a light source for reflecting light emitted from the light source, and there are provided a first shaft member fitted in the through hole for setting a position of the light reflection sheet with respect to the support body, and a second shaft member fitted in the slot to enable a relative movement in a longitudinal direction of the slot for setting the position of the light reflection sheet with respect to the support body.

23 Claims, 161 Drawing Sheets

(51) Int. Cl.
*G02B 5/08* (2006.01)
*H05K 1/14* (2006.01)

(52) U.S. Cl.
CPC ............. *G02B5/08* (2013.01); *G02F 2201/465* (2013.01); *H05K 1/142* (2013.01); *H05K 2201/10106* (2013.01); *H05K 2201/10189* (2013.01)

(56) References Cited

U.S. PATENT DOCUMENTS

| | | | |
|---|---|---|---|
| 6,280,055 B1 | 8/2001 | Merko | |
| 6,322,239 B1 | 11/2001 | Nitta et al. | |
| 7,192,149 B2 * | 3/2007 | Lai | 362/29 |
| 7,339,646 B2 | 3/2008 | Izawa et al. | |
| 2004/0252252 A1 | 12/2004 | Lee et al. | |
| 2005/0052587 A1 | 3/2005 | Kitada et al. | |
| 2005/0058117 A1 | 3/2005 | Morioka et al. | |
| 2005/0103964 A1 | 5/2005 | Baechle | |
| 2005/0183308 A1 | 8/2005 | Peery | |
| 2005/0265020 A1 | 12/2005 | Kim | |
| 2005/0265051 A1 | 12/2005 | Yamamoto et al. | |
| 2006/0083000 A1 | 4/2006 | Yoon et al. | |
| 2006/0104094 A1 | 5/2006 | Kang et al. | |
| 2007/0059991 A1 | 3/2007 | Chikazawa et al. | |
| 2007/0103908 A1 | 5/2007 | Tabito et al. | |
| 2007/0295677 A1 | 12/2007 | Kowatari | |
| 2008/0031703 A1 | 2/2008 | Nakajima | |
| 2008/0106667 A1 | 5/2008 | Fukuda | |
| 2008/0123020 A1 | 5/2008 | Hayashimoto | |
| 2008/0143919 A1 | 6/2008 | Azuma et al. | |
| 2008/0231776 A1 | 9/2008 | Shin et al. | |
| 2008/0252819 A1 * | 10/2008 | Hung | 349/65 |
| 2009/0009680 A1 | 1/2009 | Zensai | |
| 2009/0046445 A1 * | 2/2009 | Namiki et al. | 362/97.2 |
| 2009/0067167 A1 | 3/2009 | Cheng et al. | |
| 2009/0103288 A1 | 4/2009 | Boyer et al. | |
| 2009/0109655 A1 | 4/2009 | Shinozaki | |
| 2009/0122229 A1 | 5/2009 | Kim et al. | |
| 2009/0135331 A1 | 5/2009 | Kawase | |
| 2009/0135583 A1 | 5/2009 | Hillman et al. | |
| 2009/0140656 A1 | 6/2009 | Kohashikawa et al. | |
| 2009/0141208 A1 | 6/2009 | Byoun et al. | |
| 2009/0167990 A1 | 7/2009 | Konno et al. | |
| 2009/0172881 A1 | 7/2009 | Peterson | |
| 2009/0229157 A1 | 9/2009 | Mehler | |
| 2009/0263210 A1 | 10/2009 | Loewe et al. | |
| 2010/0007977 A1 | 1/2010 | Nhusomkaew et al. | |
| 2010/0008066 A1 | 1/2010 | Moro et al. | |
| 2010/0026928 A1 | 2/2010 | Park | |
| 2010/0040930 A1 * | 2/2010 | Delfino et al. | 429/34 |
| 2010/0046206 A1 | 2/2010 | Kawada | |
| 2010/0073912 A1 | 3/2010 | Shinozaki et al. | |
| 2010/0097783 A1 | 4/2010 | Gomi | |
| 2010/0220461 A1 | 9/2010 | Naijo | |
| 2011/0013377 A1 | 1/2011 | Kim | |
| 2012/0063133 A1 | 3/2012 | Takeuchi et al. | |

FOREIGN PATENT DOCUMENTS

| | | | |
|---|---|---|---|
| CN | 1882268 | A | 12/2006 |
| CN | 200946751 | Y | 9/2007 |
| CN | 101053002 | A | 10/2007 |
| CN | 101201509 | A | 6/2008 |
| CN | 101206348 | A | 6/2008 |
| CN | 101329017 | A | 12/2008 |
| CN | 101344681 | A | 1/2009 |
| CN | 101350346 | A | 1/2009 |
| JP | 63-28620 | U | 2/1988 |
| JP | 4-81406 | U | 7/1992 |
| JP | 6-40428 | U | 5/1994 |
| JP | 9-267821 | A | 10/1997 |
| JP | 10-35639 | A | 2/1998 |
| JP | 11-348966 | A | 12/1999 |
| JP | 2000-251511 | A | 9/2000 |
| JP | 2002-128056 | A | 5/2002 |
| JP | 2003-35304 | A | 2/2003 |
| JP | 2003-40244 | A | 2/2003 |
| JP | 2004-177876 | A | 6/2004 |
| JP | 2004-263791 | A | 9/2004 |
| JP | 2004-345721 | A | 12/2004 |
| JP | 2005-4200 | A | 1/2005 |
| JP | 2005-156575 | A | 6/2005 |
| JP | 2005-309093 | A | 11/2005 |
| JP | 2005-322645 | A | 11/2005 |
| JP | 2005-353498 | A | 12/2005 |
| JP | 2006-49098 | A | 2/2006 |
| JP | 2006-58679 | A | 3/2006 |
| JP | 2006-65139 | A | 3/2006 |
| JP | 2006-114445 | A | 4/2006 |
| JP | 2006-114863 | A | 4/2006 |
| JP | 2006-147543 | A | 6/2006 |
| JP | 2006-216512 | A | 8/2006 |
| JP | 2006-234108 | A | 9/2006 |
| JP | 2007-73300 | A | 3/2007 |
| JP | 2007-180006 | A | 7/2007 |
| JP | 2007-311561 | A | 11/2007 |
| JP | 2007-322697 | A | 12/2007 |
| JP | 2008-37463 | A | 2/2008 |
| JP | 2008-41546 | A | 2/2008 |
| JP | 2008-71586 | A | 3/2008 |
| JP | 2008-116832 | A | 5/2008 |
| JP | 2008-146970 | A | 6/2008 |
| JP | 2008-147147 | A | 6/2008 |
| JP | 2008-150078 | A | 7/2008 |
| JP | 2008-159394 | A | 7/2008 |
| JP | 2008-198398 | A | 8/2008 |
| JP | 2008-235241 | A | 10/2008 |
| JP | 2008-292886 | A | 12/2008 |
| JP | 2008-299171 | A | 12/2008 |
| JP | 2008-305940 | A | 12/2008 |
| JP | 2009-4116 | A | 1/2009 |
| JP | 2009-37925 | A | 2/2009 |
| JP | 2009-87879 | A | 4/2009 |
| JP | 2009-92199 | A | 4/2009 |
| JP | 2009-163902 | A | 7/2009 |
| JP | 2009-257576 | A | 11/2009 |
| JP | 2010-515218 | A | 5/2010 |
| JP | 2011-34947 | A | 2/2011 |
| WO | WO 2007/020720 | A1 | 2/2007 |
| WO | WO 2007/134221 | A2 | 11/2007 |
| WO | WO 2007/134221 | A3 | 11/2007 |
| WO | WO 2008/023893 | A1 | 2/2008 |
| WO | WO 2008/132941 | A1 | 6/2008 |
| WO | WO 2008/078587 | A1 | 7/2008 |
| WO | WO 2008/082105 | A1 | 7/2008 |
| WO | WO 2009/035272 | A2 | 3/2009 |

OTHER PUBLICATIONS

U.S. Office Action issued in U.S. Appl. No. 13/321,781 on Nov. 29, 2013.
Notice of Allowance issued in U.S. Appl. No. 13/321,781 on Mar. 31, 2014.
US Office Action mailed Oct. 29, 2014 for related U.S. Appl. No. 13/321,788.
Office Action (Advisory Action) for related U.S. Appl. No. 13/321,788, dated Sep. 11, 2014.
U.S. Office Action issued in U.S. Appl. No. 13/321,771 on Apr. 29, 2013.
U.S. Office Action issued in U.S. Appl. No. 13/321,788 on Oct. 11, 2013.
U.S. Notice of Allowance issued in U.S. Appl. No. 13/321,771 on Sep. 6, 2013.
US Restriction mailed Dec. 31, 2014 for U.S. Appl. No. 13/916,244.
Notice of Allowance mailed Jan. 22, 2015 for related U.S. Appl. No. 14/098,215.
English Translation of JP 2008-150078 A dated Jul. 3, 2008 which was disclosed by the Examiner on the PTO-892 attached to the Office Action mailed Mar. 4, 2015 for U.S. Appl. No. 13/916,244.
U.S. Office Action mailed Mar. 4, 2015 for U.S. Appl. No. 13/916,244.

(56) References Cited

OTHER PUBLICATIONS

US Notice of Allowance mailed Jun. 19, 2015 in copending U.S. Appl. No. 13/916,244.

US Non-Final Office Action mailed May 21, 2015 in related U.S. Appl. No. 14/319,720.

Office Action mailed Oct. 23, 2015 in copending U.S. Appl. No. 14/319,720.

* cited by examiner

F I G. 1 3 B
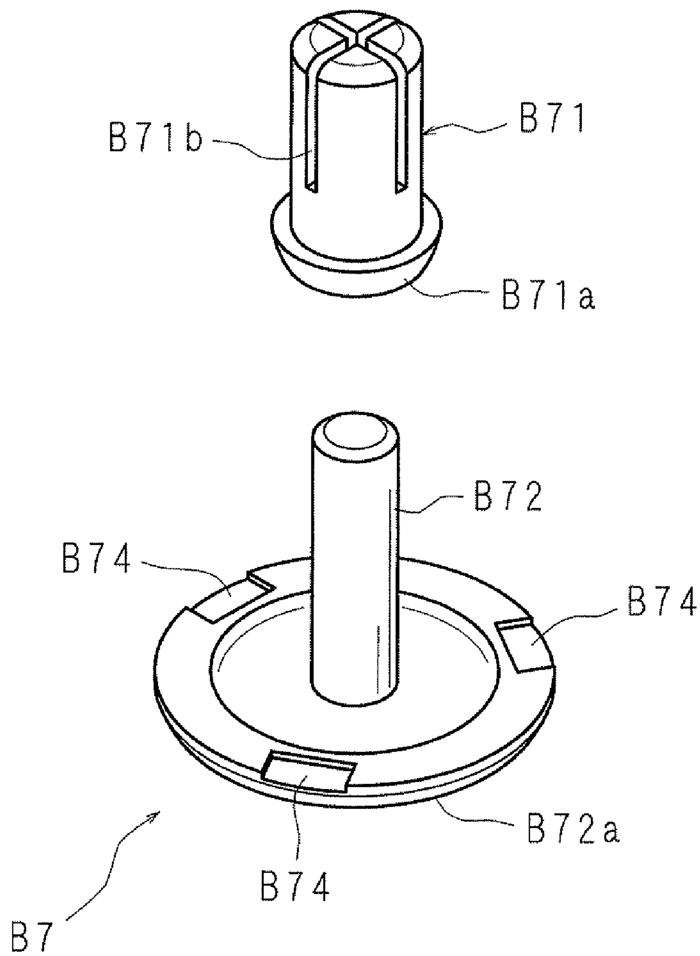

F I G. 1 5
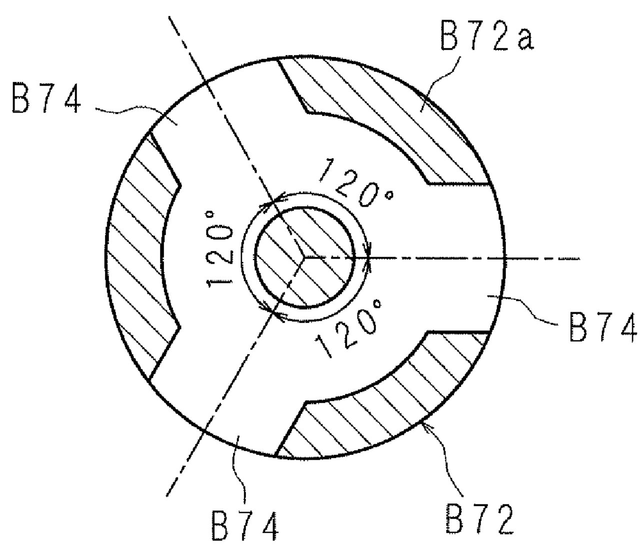

F I G. 21
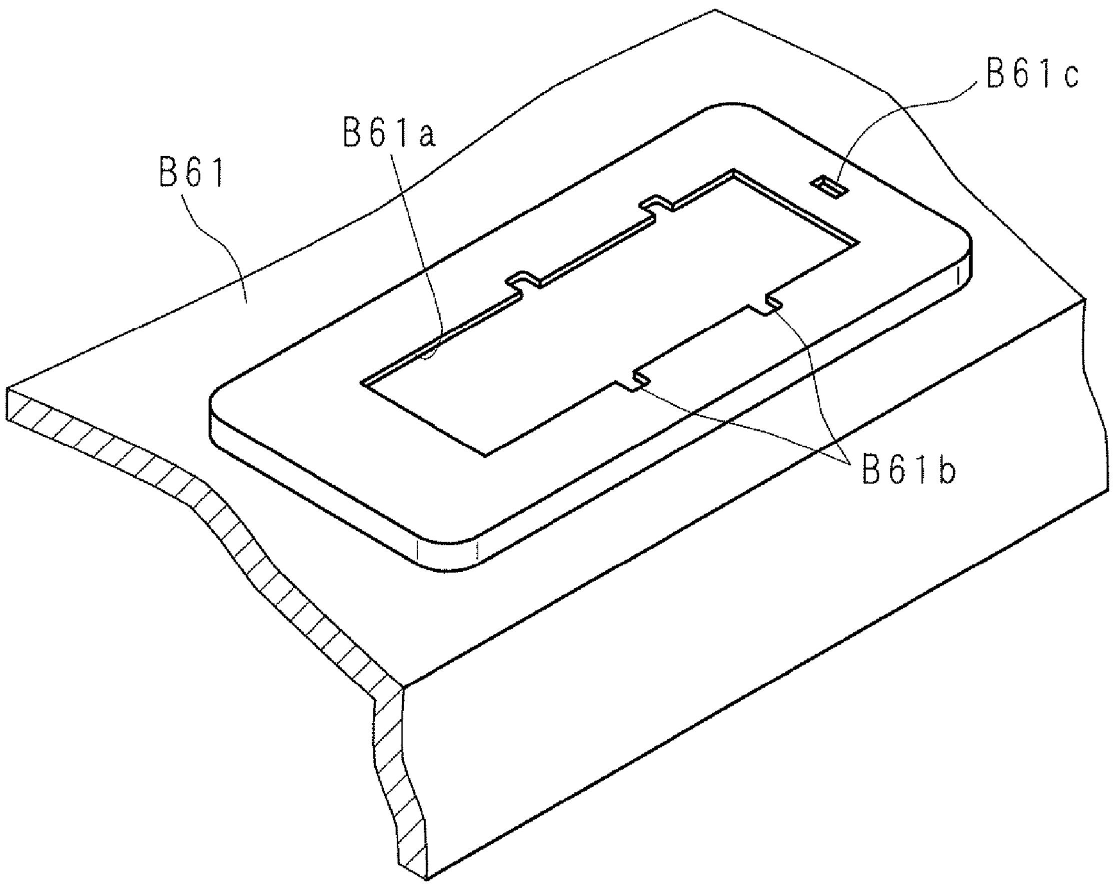

F I G. 2 4
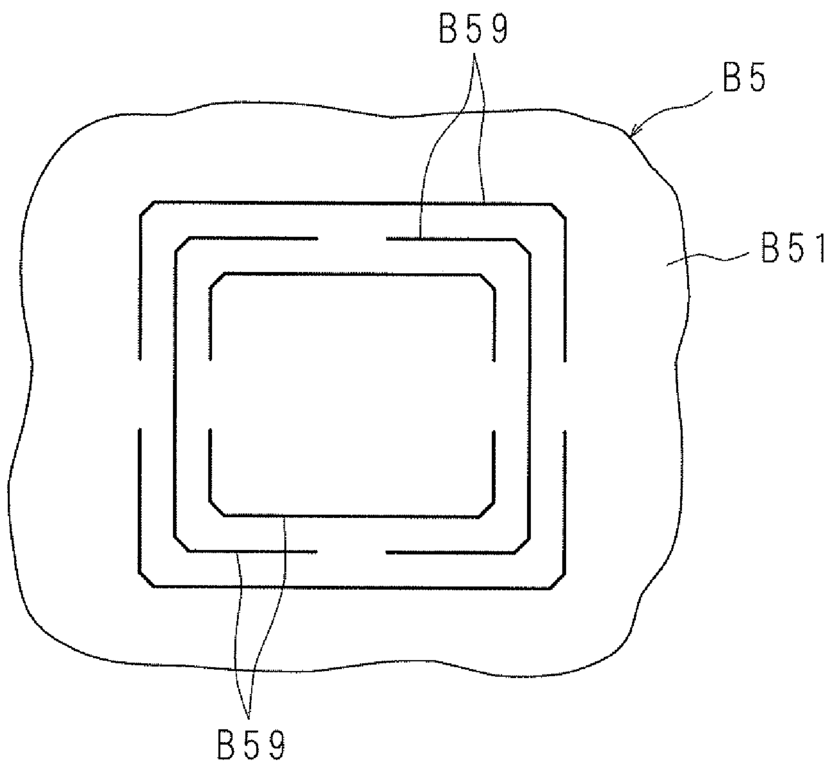

F I G. 3 5
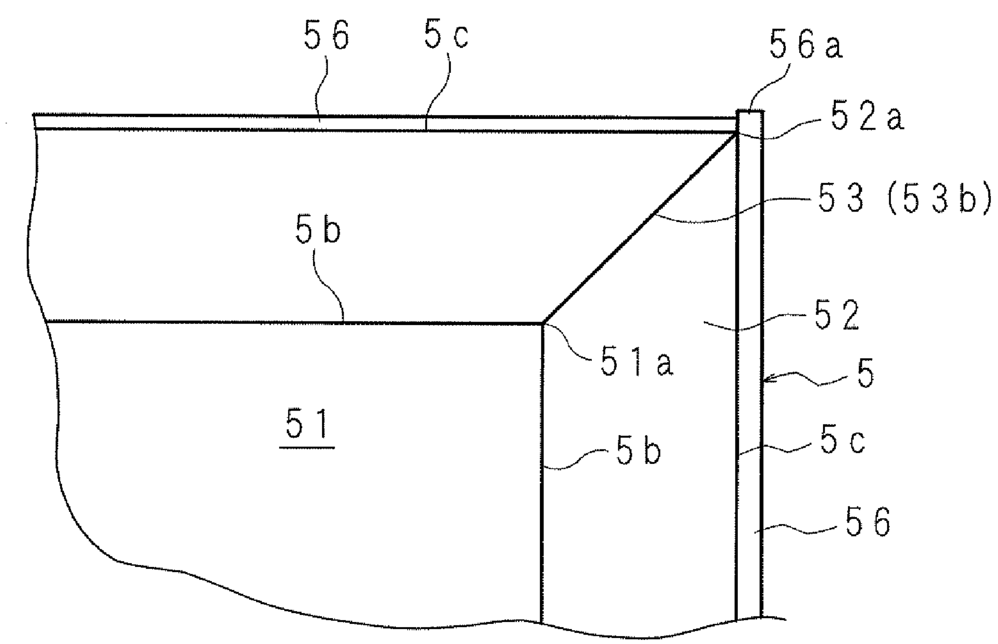

F I G. 3 7
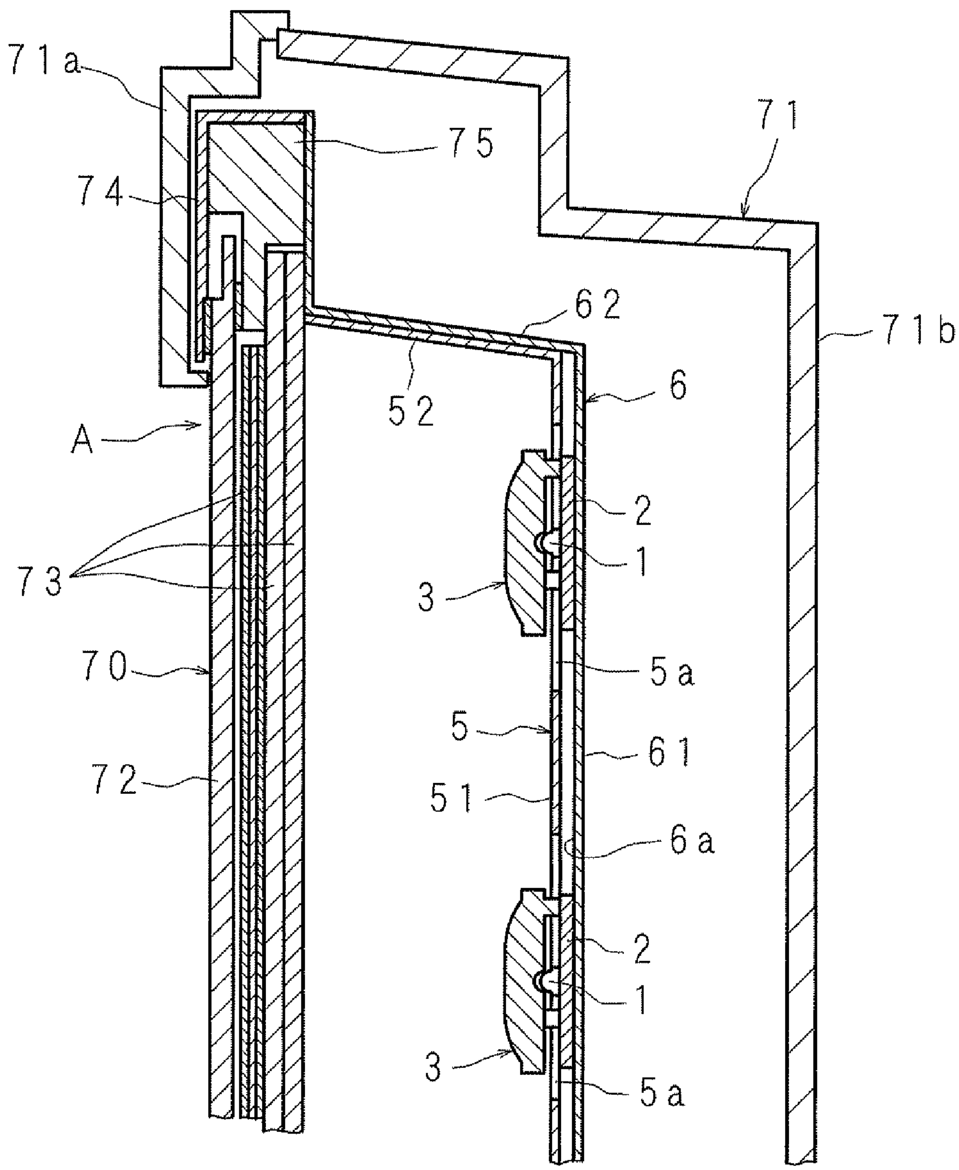

F I G. 5 4
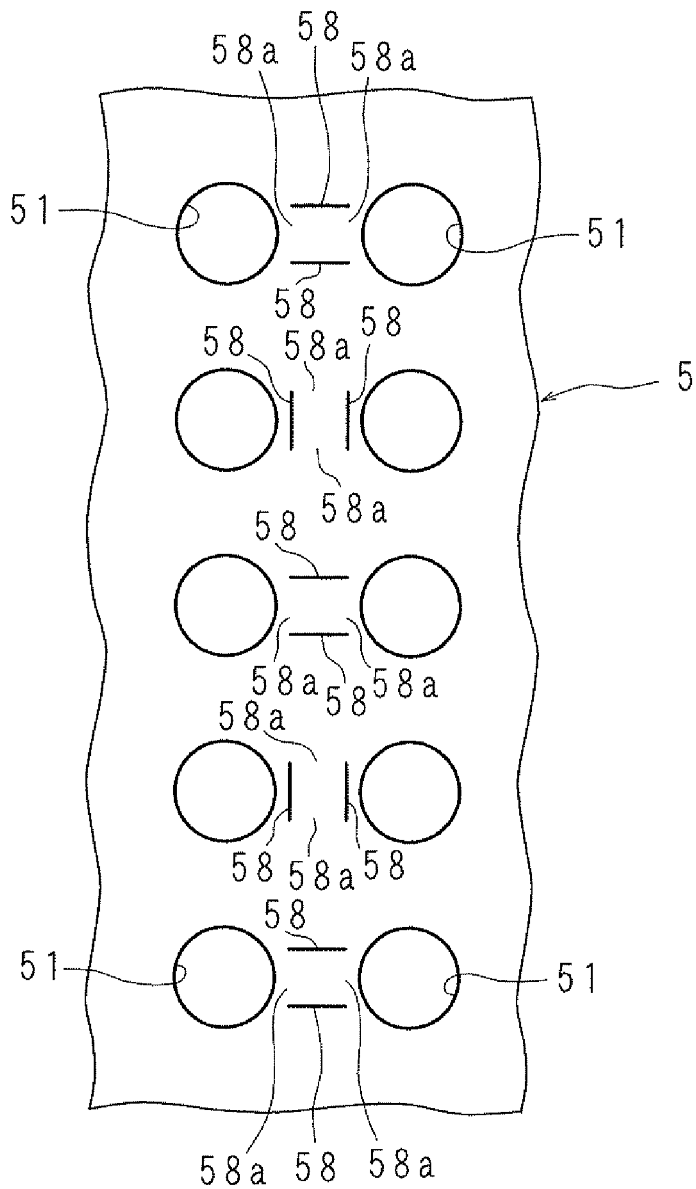

F I G. 56
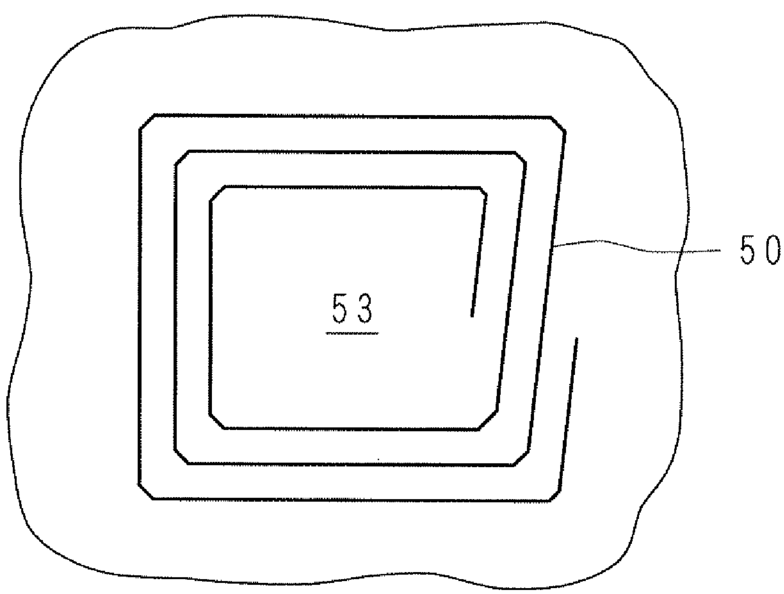

F I G. 5 7
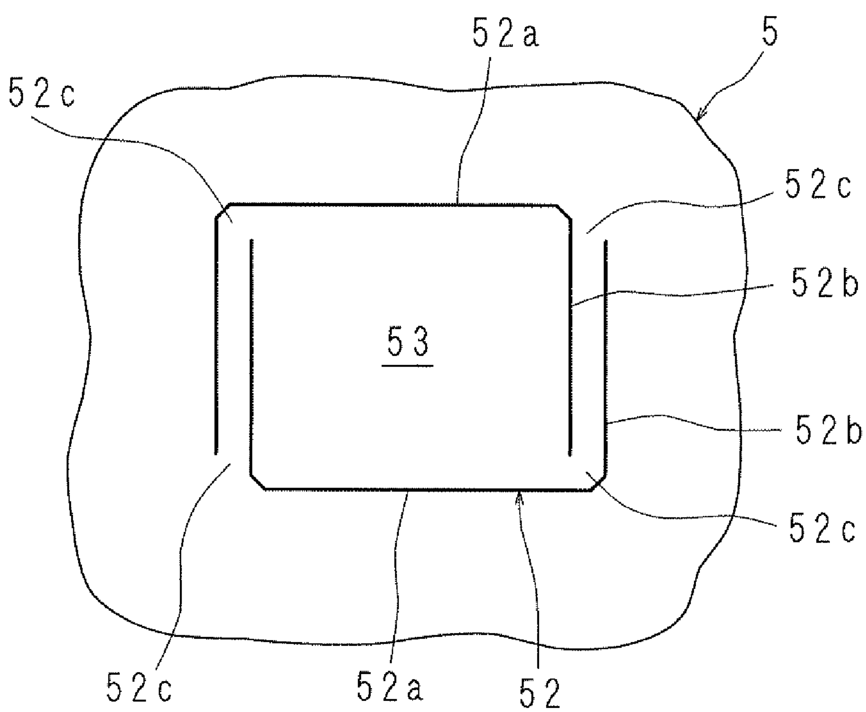

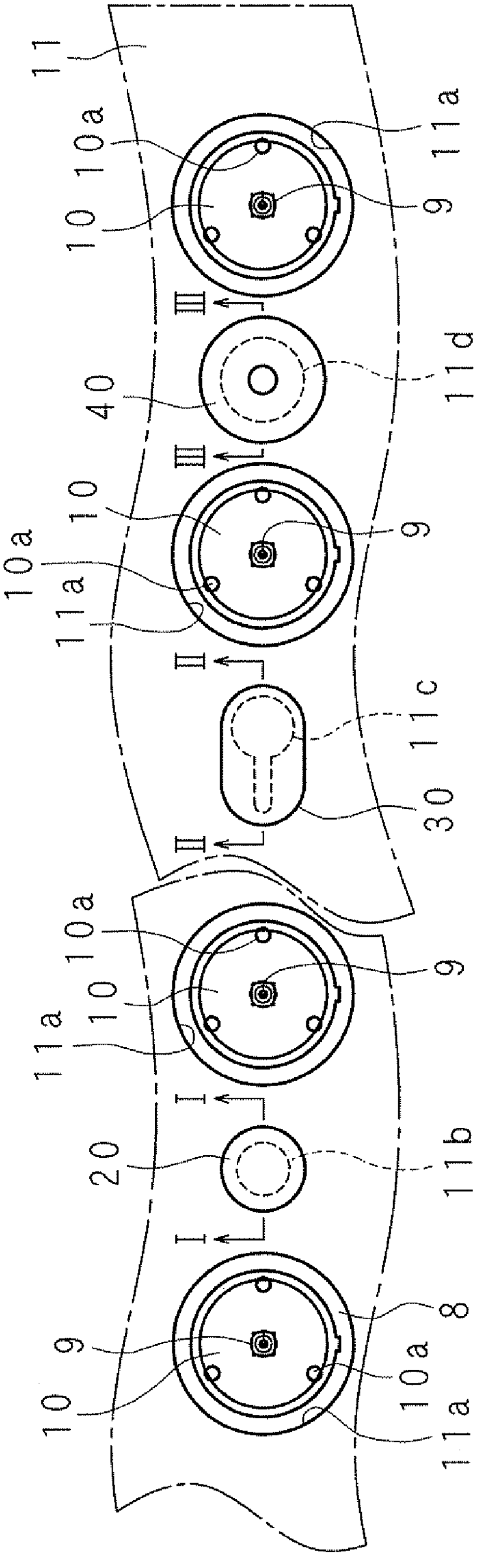
F I G. 6 2

F I G. 6 3
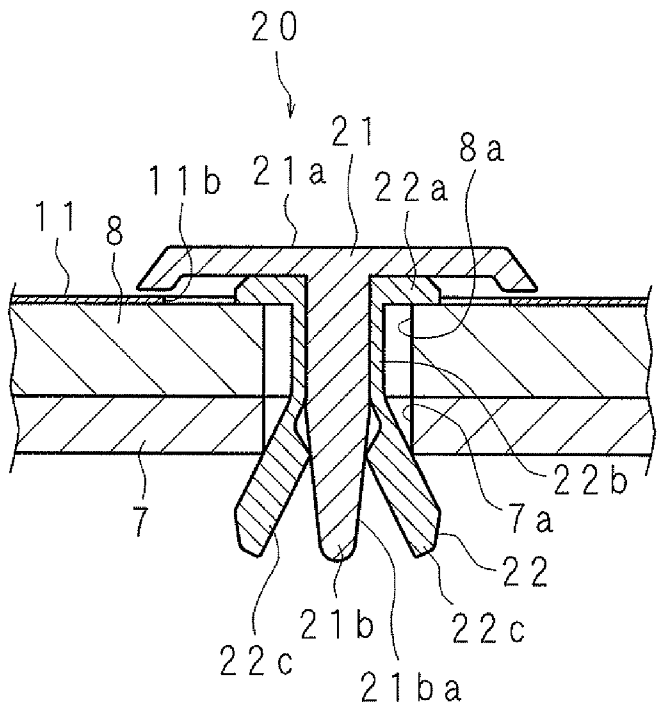

F I G. 65
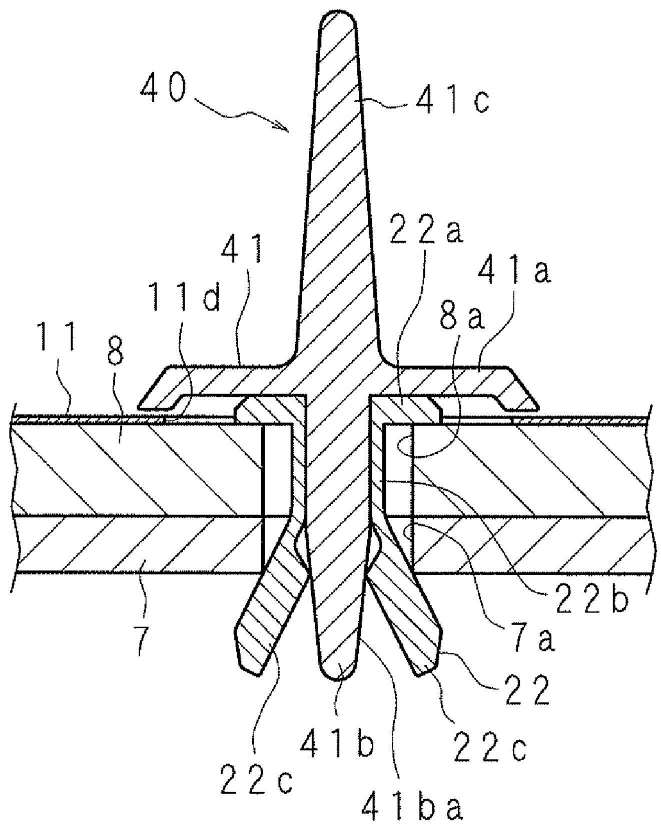

F I G. 7 2
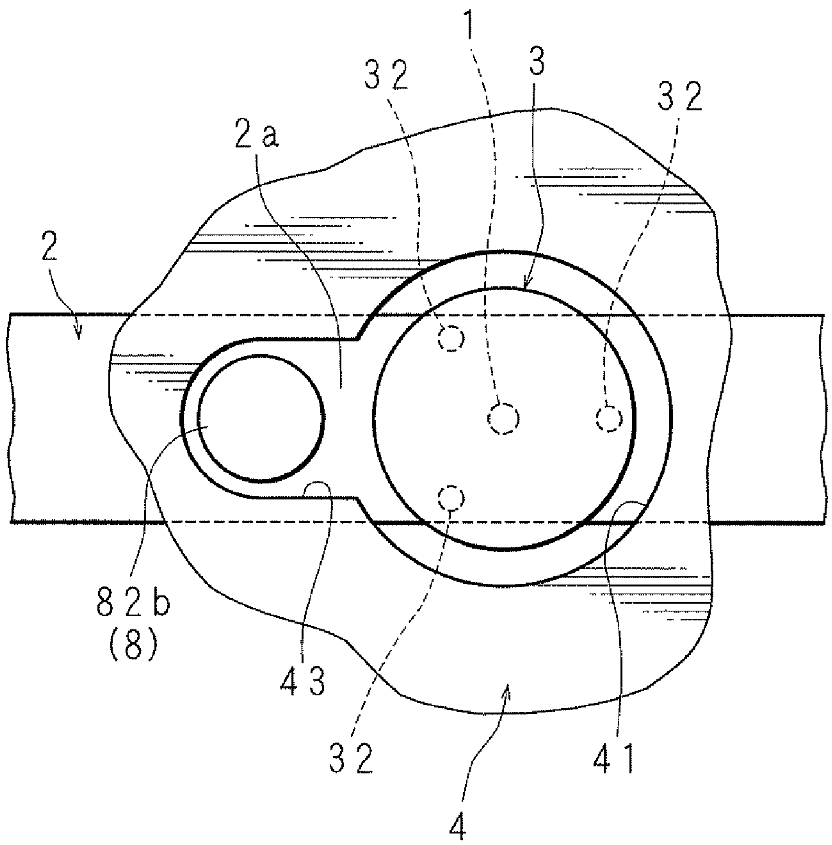

F I G. 7 3
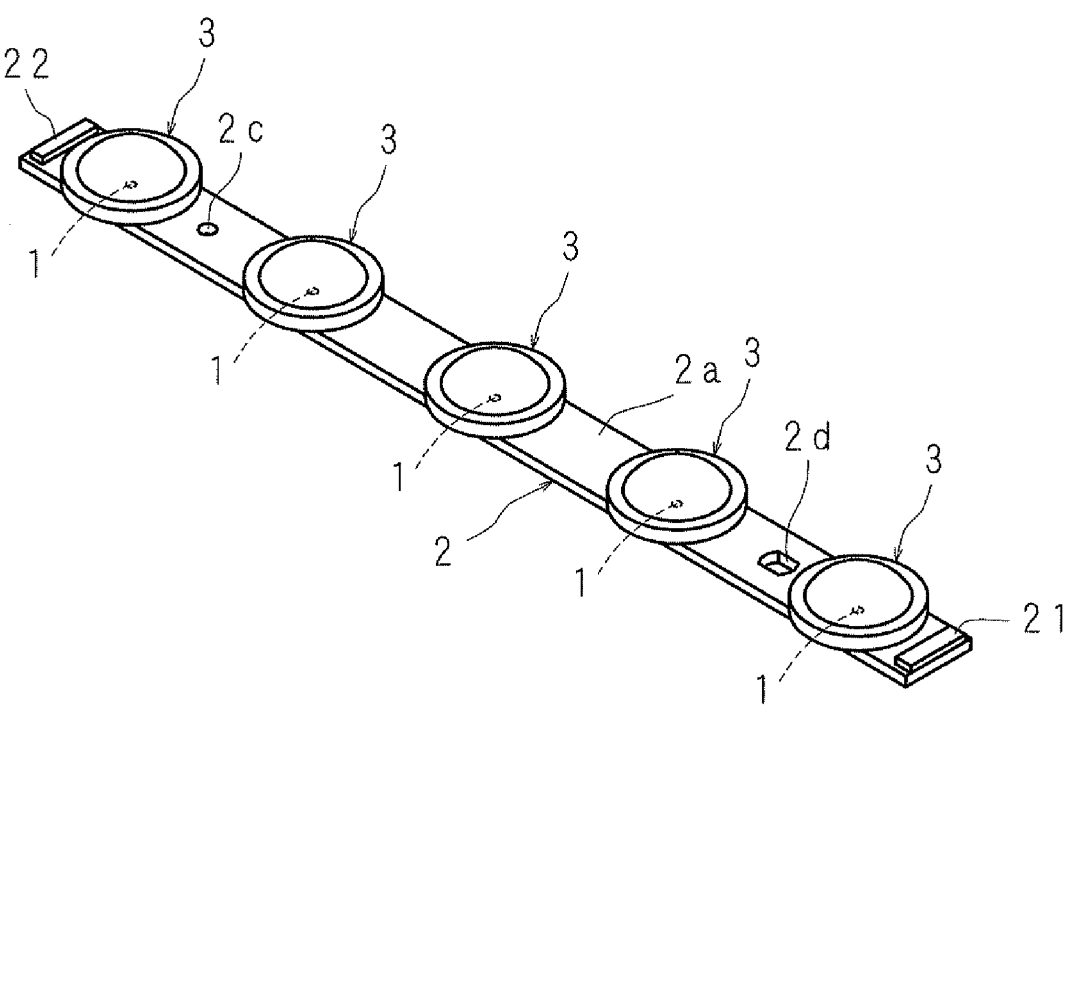

F I G. 7 4
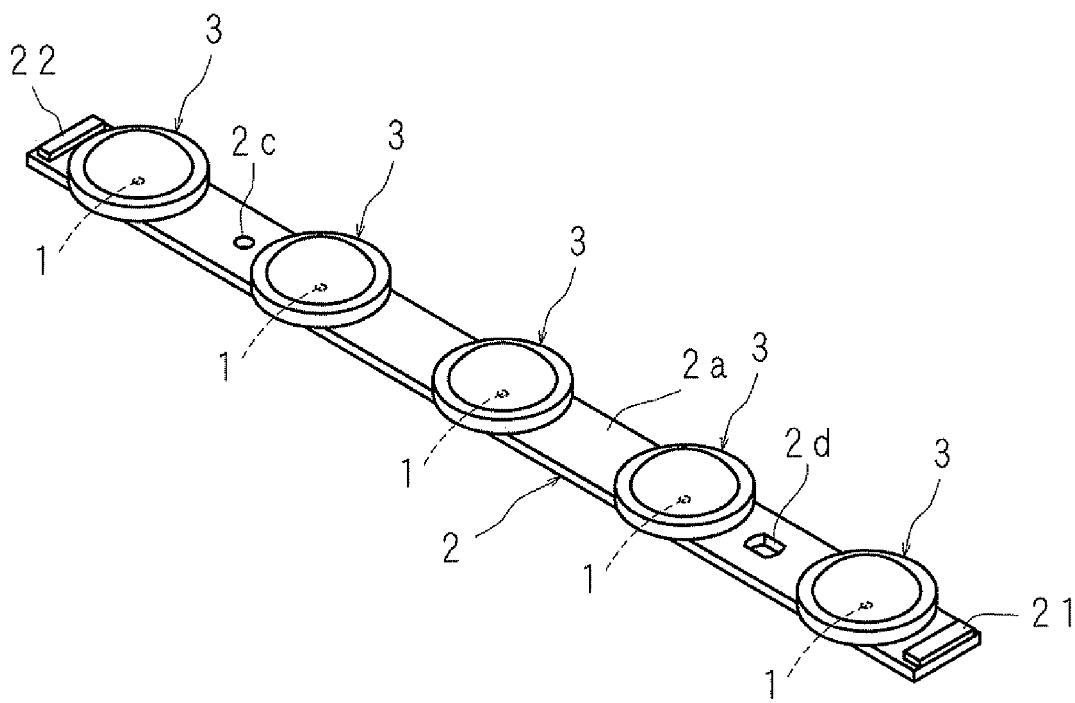

F I G. 75
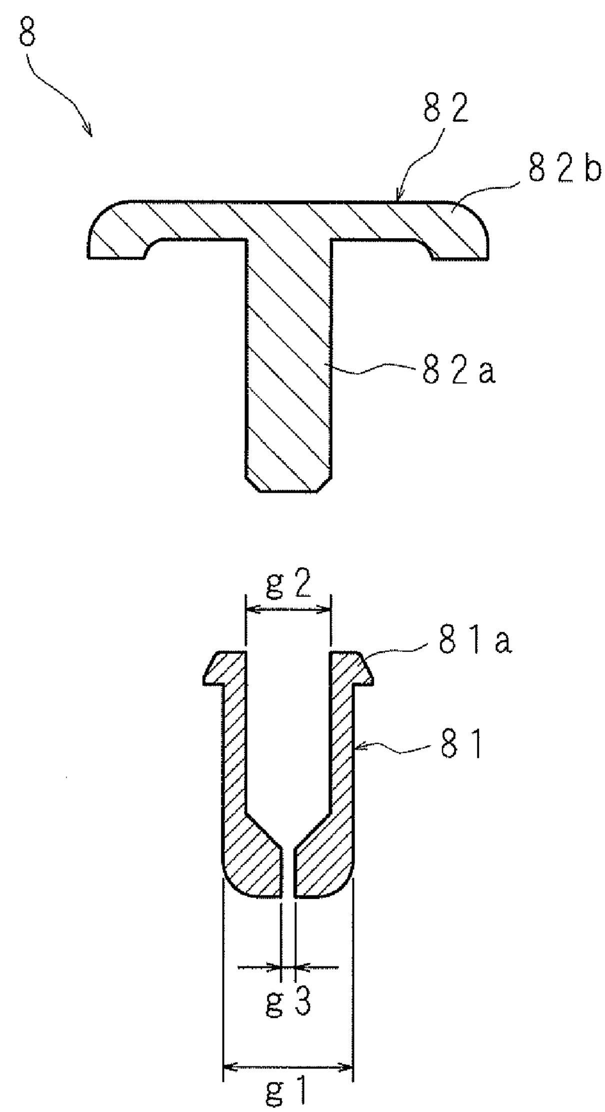

F I G. 80
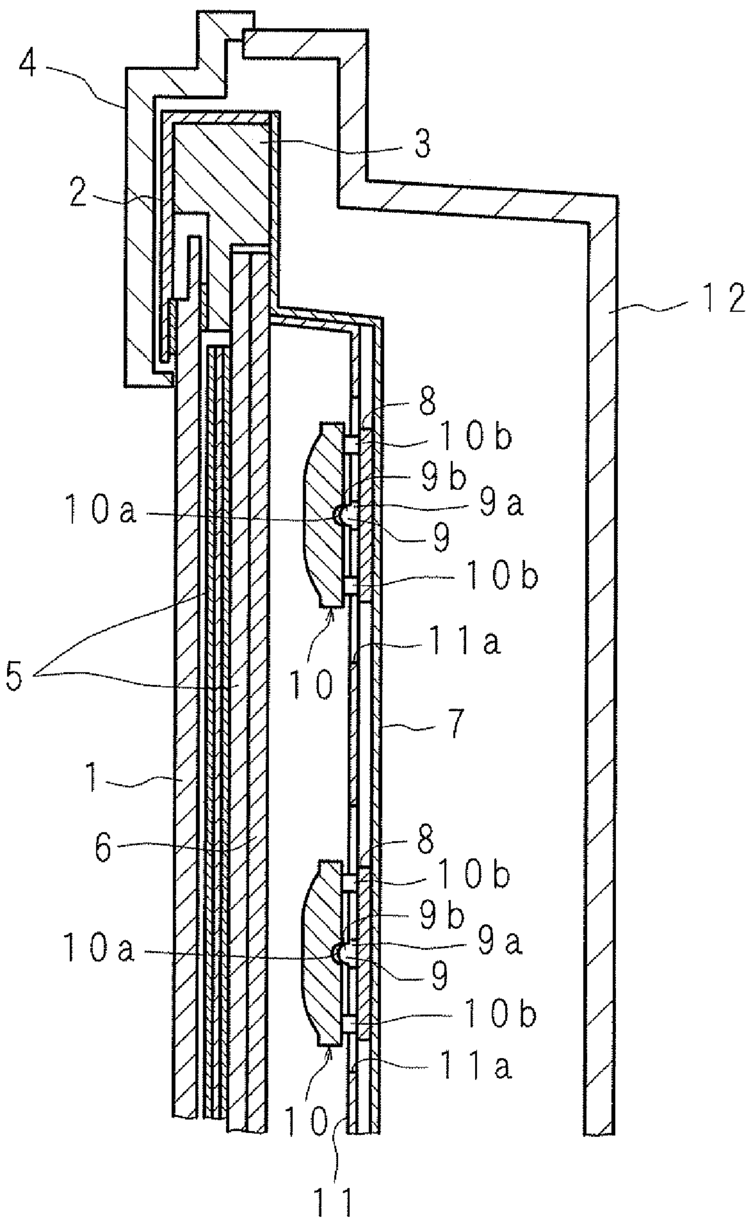

F I G. 92A
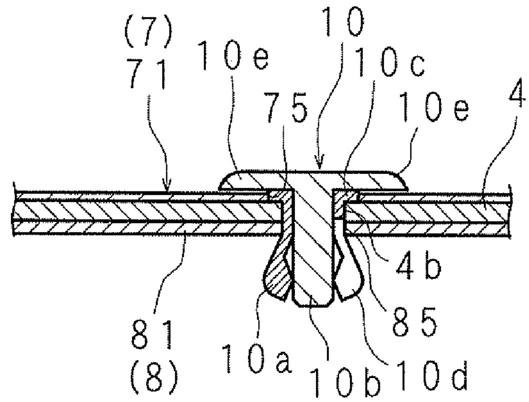
F I G. 92B
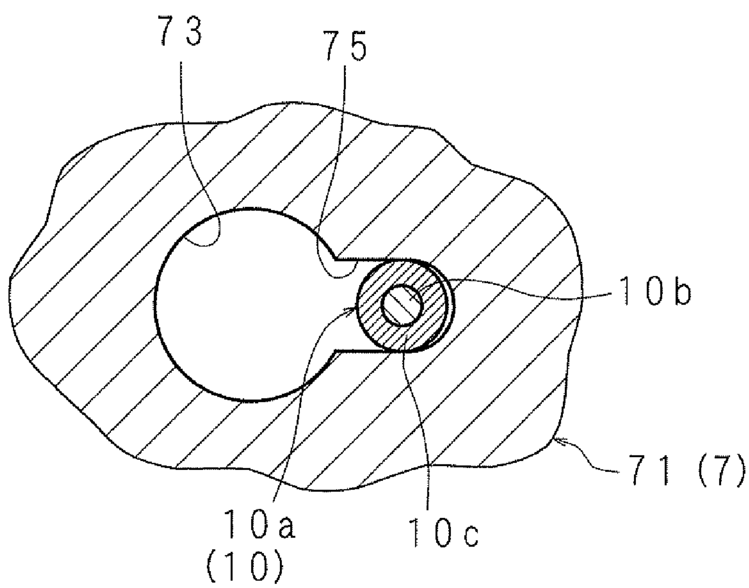

F I G. 93
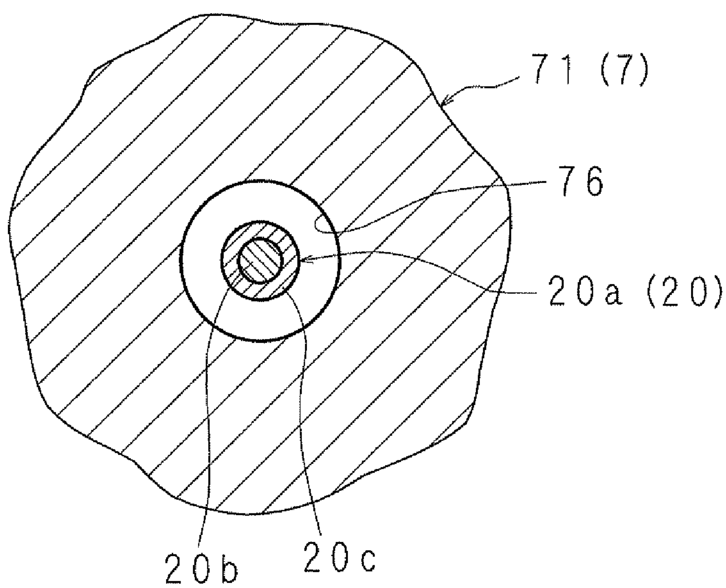

F I G. 96
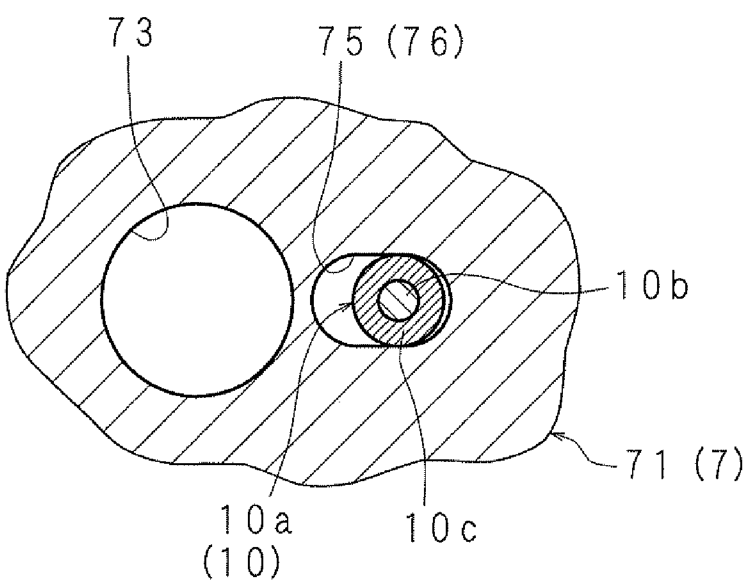

F I G. 97
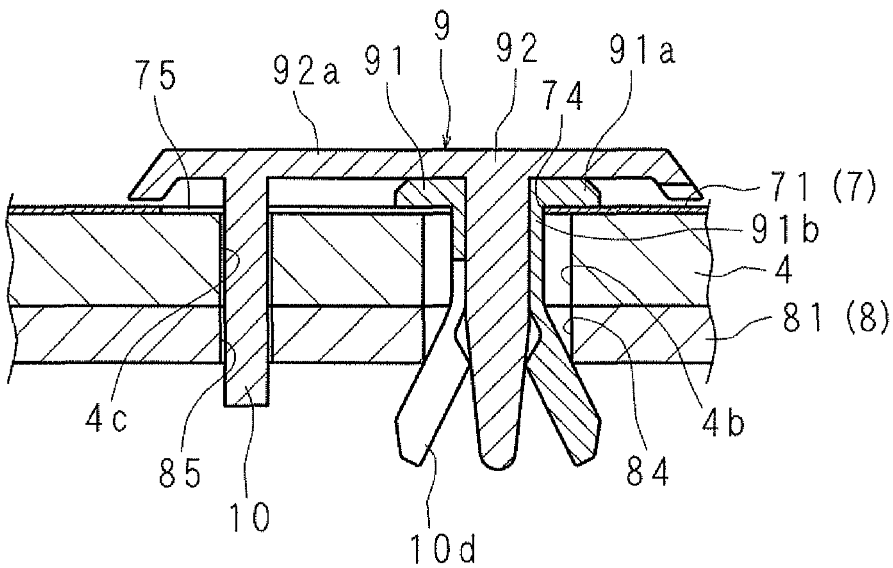

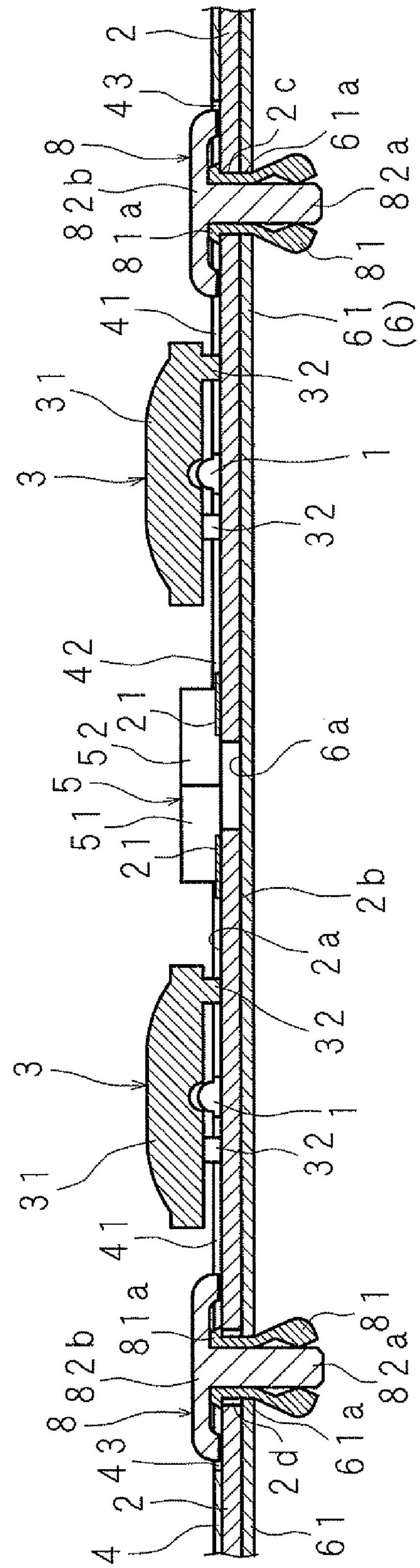
F I G. 1 0 0

F I G. 1 0 4
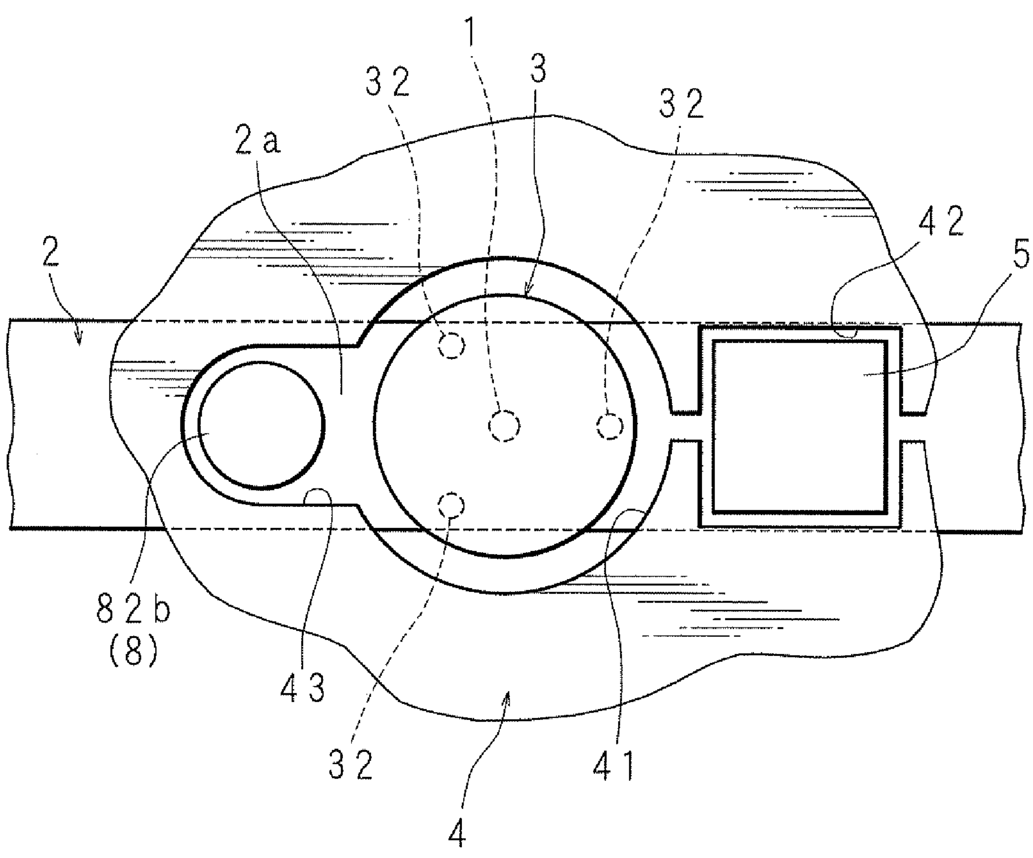

F I G. 1 0 5
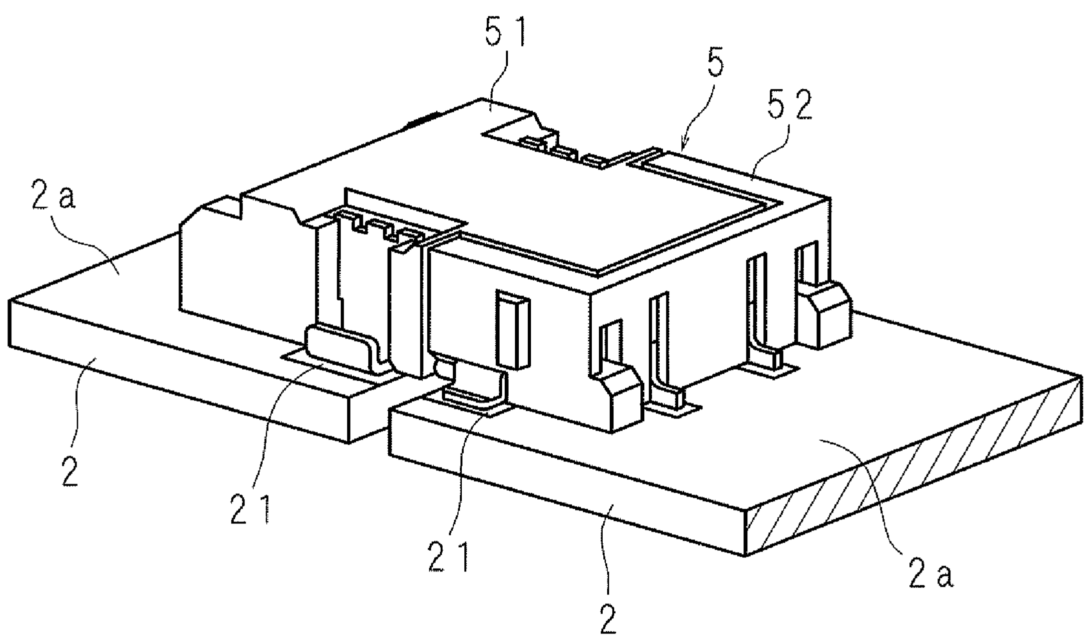

F I G. 1 0 6
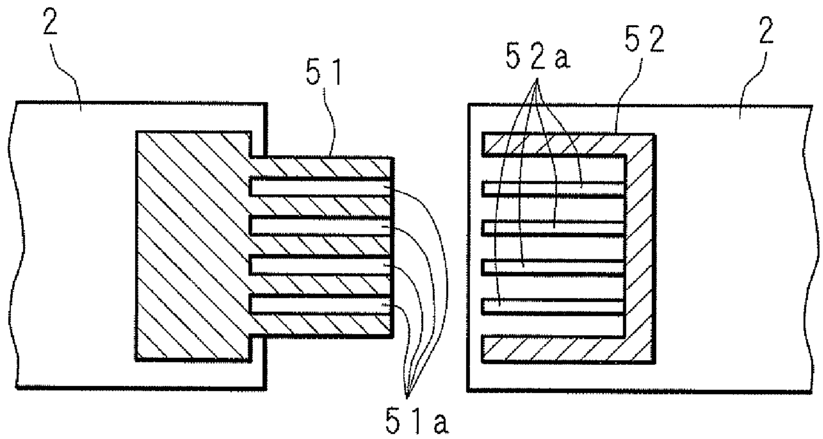

F I G. 1 0 8
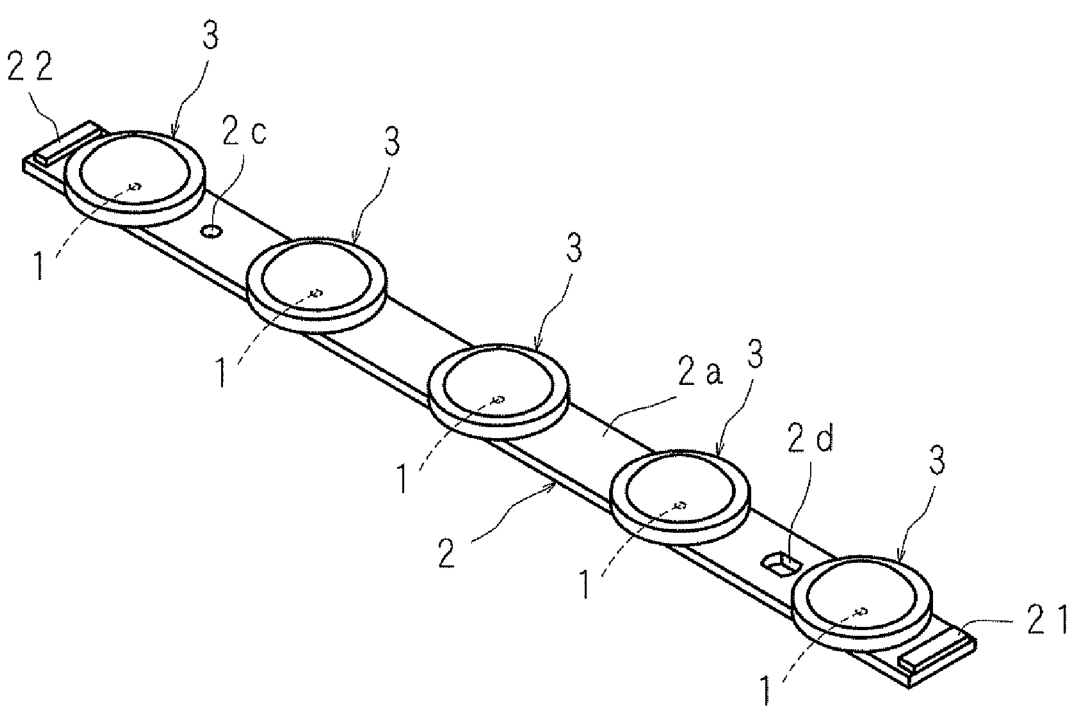

F I G. 1 0 9
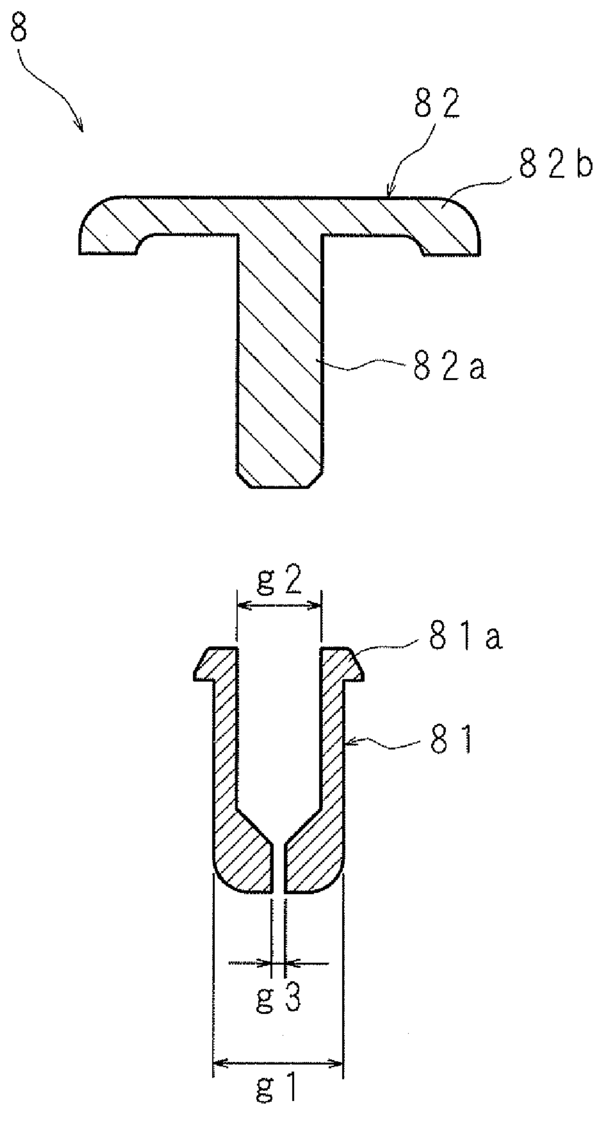

F I G. 1 1 8
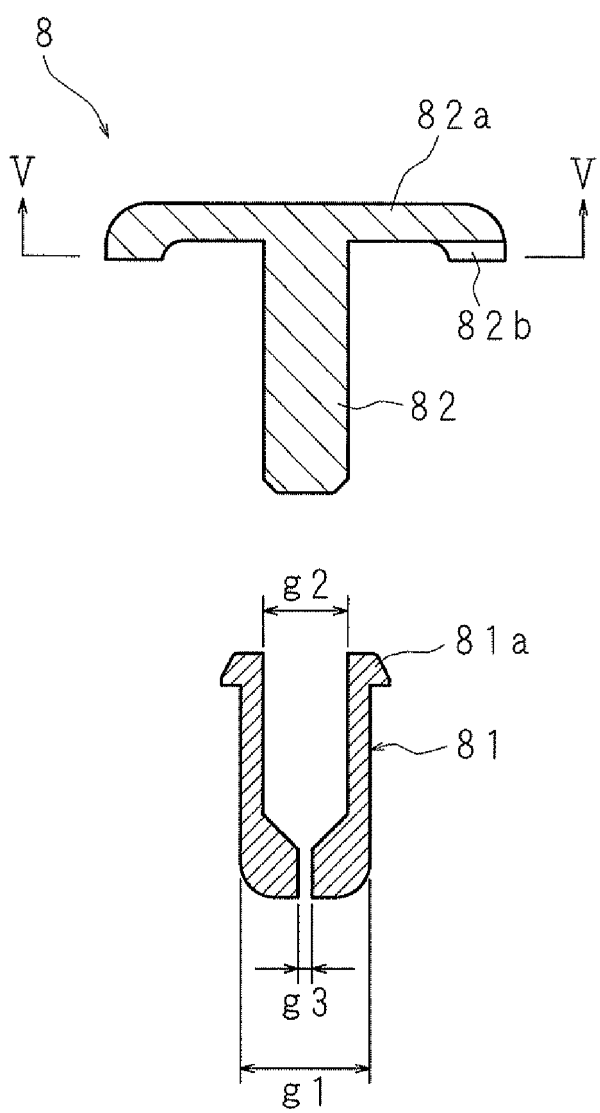

F I G. 1 2 0
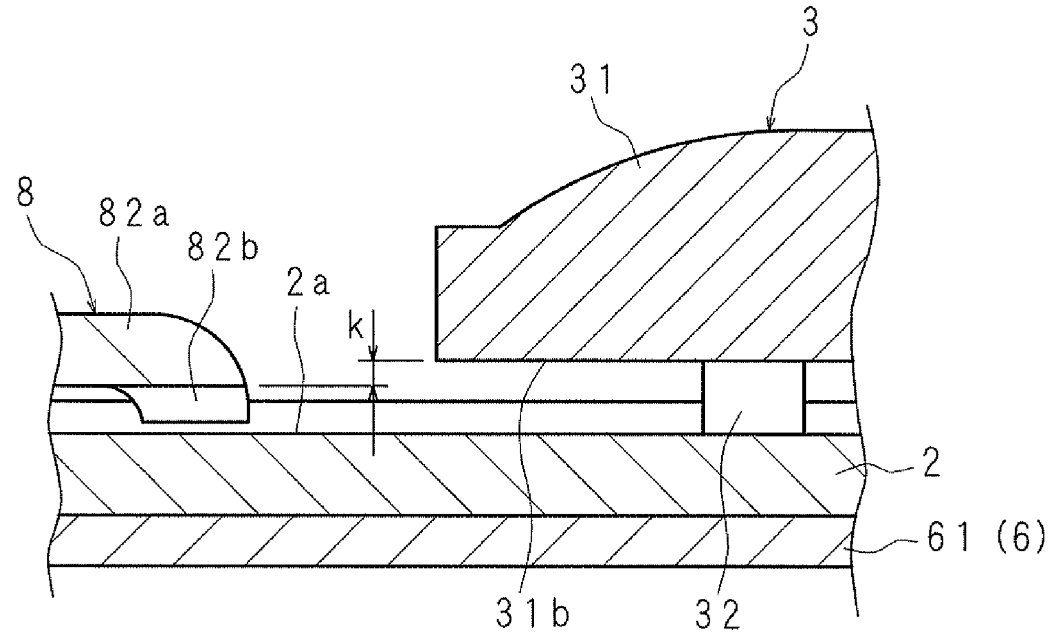

F I G. 1 2 4
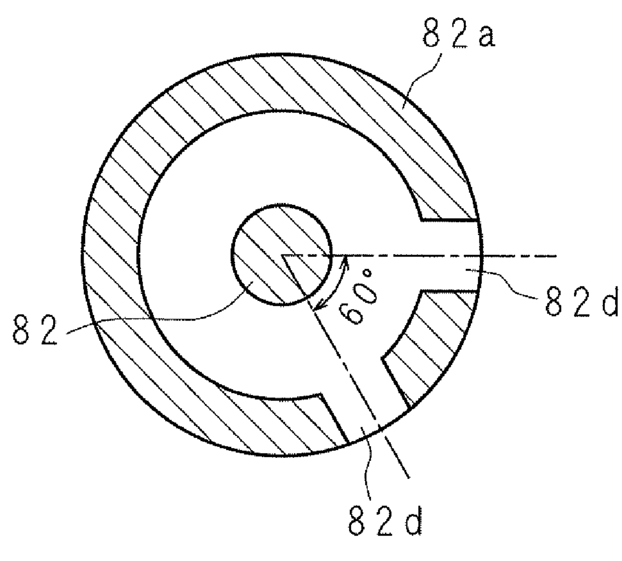

F I G. 1 3 3
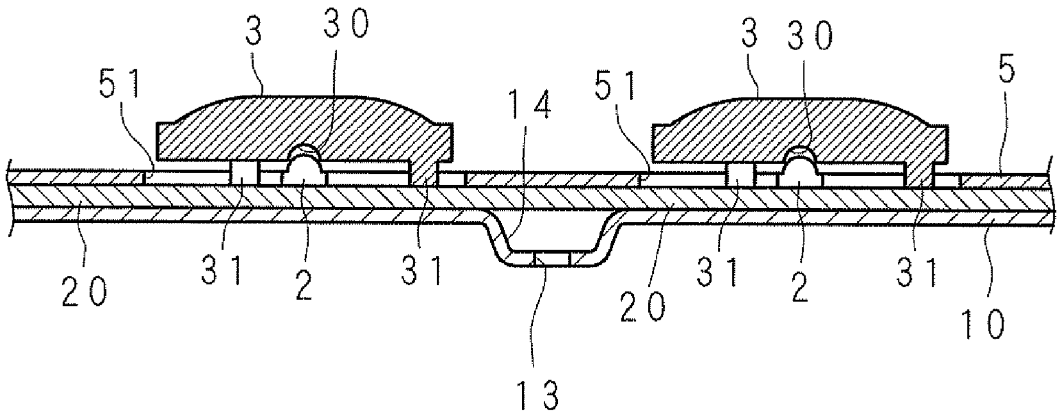

F I G. 1 4 1 A
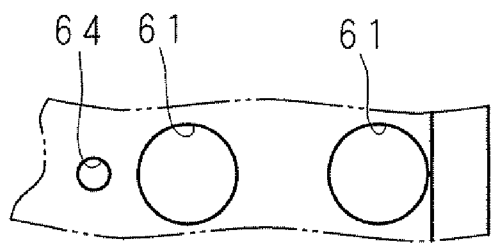
F I G. 1 4 1 B
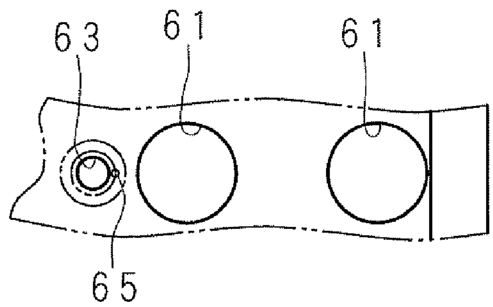

F I G. 1 4 4
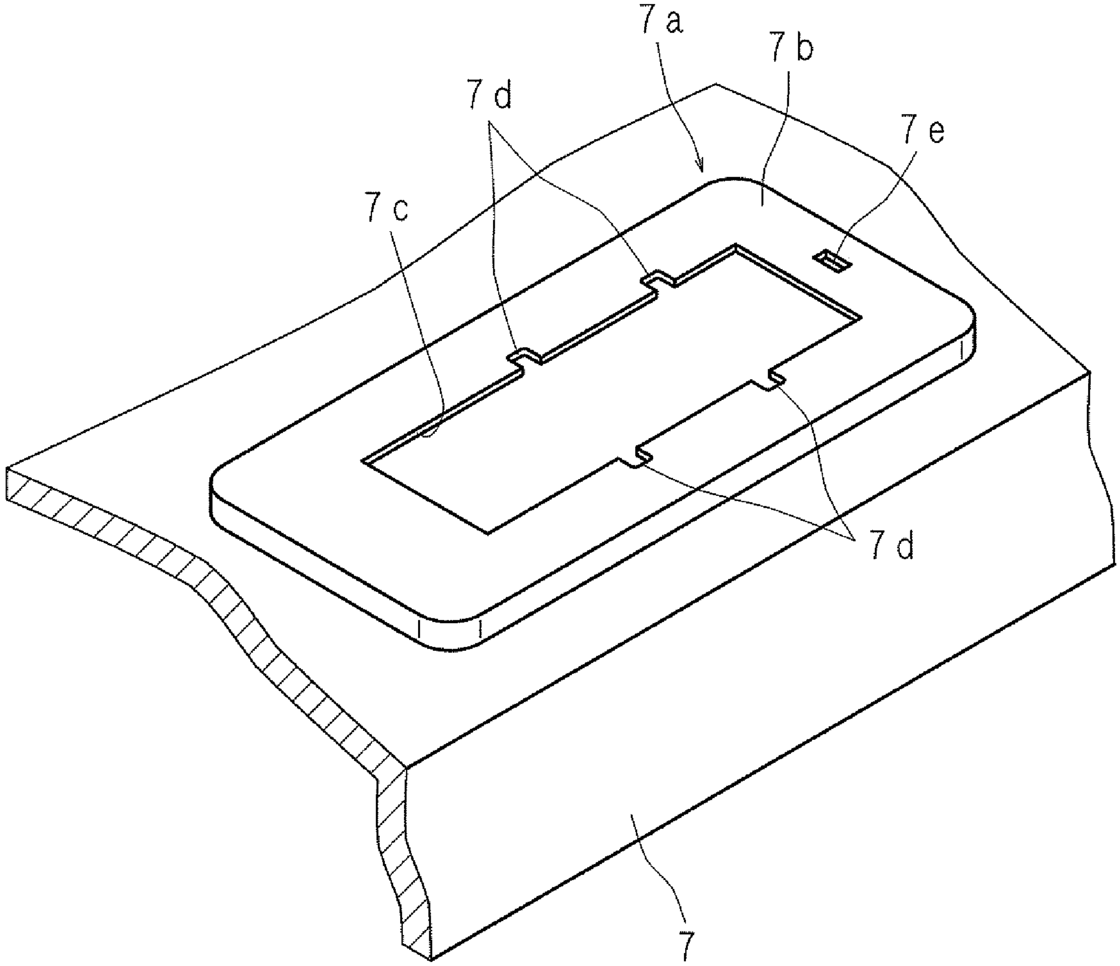

F I G. 1 4 8
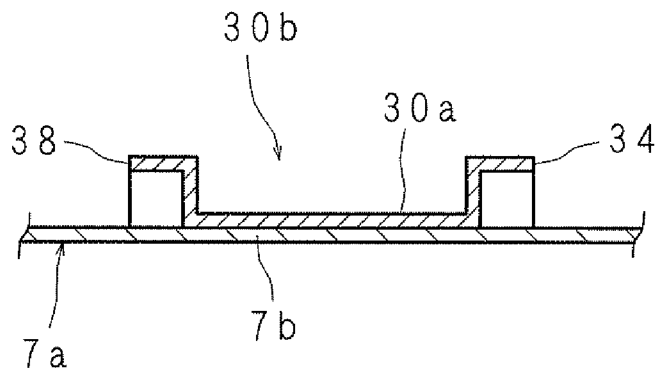

F I G. 1 5 1
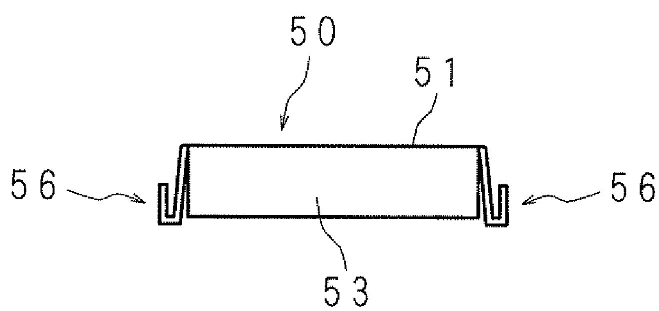

F I G. 1 5 8
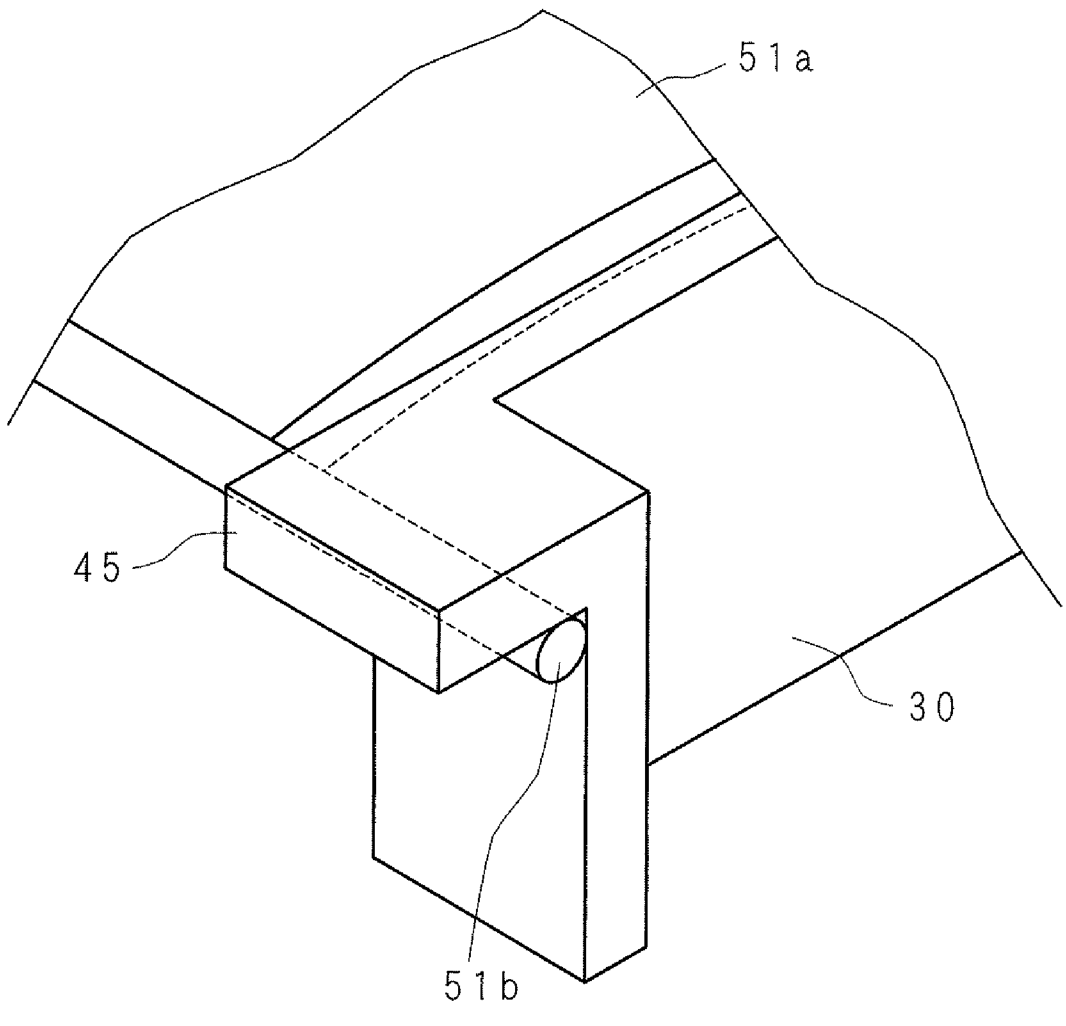

LIGHT REFLECTION SHEET, LIGHT SOURCE DEVICE, AND DISPLAY DEVICE

This application is the national phase under 35 U.S.C. §371 of PCT International Application No. PCT/JP2010/056809 which has an International filing date of Apr. 16, 2010 and designated the United States of America.

BACKGROUND

1. Technical Field

The present invention relates to a display device such as a liquid crystal television, a light source device to be used as a light source of the display device, and a light reflection sheet for reflecting light applied from the light source of the light source device.

2. Description of Related Art

A liquid crystal display device referred to as a thin type such as a liquid crystal television includes a display unit which has, on a right side, a display surface for displaying an image and takes a shape of an almost rectangular parallelepiped, and a light source device disposed on a back side of the display unit for applying light on the display unit, and a diffusion plate and an optical sheet such as a prism sheet are provided between the light source device and the display unit.

The display unit has a liquid crystal display panel taking a shape of an almost rectangular parallelepiped. The liquid crystal display panel itself does not emit light. For this reason, an illuminating light source for displaying a video image on the display surface is required, and a backlight device is used as the illuminating light source.

As the backlight device, there are generally employed an edge light system in which a light guide is provided on a back side of a display unit and an illuminating light source is disposed on an edge side of the light guide, and a falling system in which a diffusion plate is provided on the back side of the display unit and an illuminating light source is disposed on a back side of the diffusion plate.

Referring to the edge light system of the backlight device, a cold cathode fluorescent lamp (CCFL) is provided on the edge side of the light guide and light incident from the edge of the light guide is emitted from one surface of the light guide while guiding light in the light guide. Therefore, a luminance characteristic can be enhanced in a display device including a display surface having a comparatively small area. Referring to a display device including a display surface having a comparatively large area, however, it is hard to uniformly enhance the luminance characteristic over the whole surface. For this reason, in a display device such as a television which is increasingly large-sized, the backlight device of the falling system is used.

For the backlight device of the falling system, there are generally employed, as illuminating light sources, a CCFL type in which a plurality of cold cathode fluorescent lamps (CCFLs) having electrodes on both ends and taking a shape of a straight pipe or an almost U shape are juxtaposed on a back side of the diffusion plate (for example, see Japanese Patent Application Laid-Open No. 2008-116832) and an LED type in which a plurality of light-emitting diodes (LEDs) are juxtaposed on a back side of the diffusion plate (for example, see Japanese Patent Application Laid-Open No. 2009-87879).

The backlight device of the CCFL type includes a plurality of cold cathode fluorescent lamps juxtaposed vertically apart from each other in a direction along a surface of a diffusion plate, a support case for accommodating and supporting the cold cathode fluorescent lamps, an inverter circuit board for emitting light from the cold cathode fluorescent lamps, and a cover for covering the inverter circuit board.

However, the backlight device of the CCFL type requires high voltage components such as, for example, the inverter circuit board for discharging the cold cathode fluorescent lamp, the electrodes on the both ends of the cold cathode fluorescent lamp and the like, and it is necessary to maintain a comparatively long insulating distance around the high voltage components. Therefore, the high voltage components hinder a longitudinal thickness from being reduced. For this reason, there is a tendency that a backlight device of an LED type which has no high voltage component, does not need to maintain a comparatively long insulating distance and is more advantageous to reduce a longitudinal thickness than the backlight device of the CCFL type is employed for a recent display device.

Moreover, the cold cathode fluorescent lamp is formed in a length provided over both ends in a transverse direction of the diffusion plate. For this reason, it is impossible to control a lighting operation of the cold cathode fluorescent lamp in a fine area. Furthermore, a high-speed flashing control for suppressing an animation blur or the like is more disadvantageous as compared with the LED type. In addition, power consumption is increased because the cold cathode fluorescent lamps are turned ON at a high voltage. Consequently, a heat value is also increased when the cold cathode fluorescent lamps are ON. Therefore, it is advantageous to employ the backlight device of the LED type which can easily carry out a control in a fine area and a high-speed flashing control, and furthermore, can lessen a power consumption and a heat value more greatly than the backlight device of the CCFL type.

The backlight device of the LED type includes a plurality of light-emitting diode substrates having one surface on which a plurality of light-emitting diodes are mounted, a support case for accommodating and supporting the light-emitting diode substrates, and a power board for emitting light from the light-emitting diodes.

The applicant of the present invention developed a backlight device of an LED type including a plurality of light-emitting diode substrates, each of which has a plurality of light-emitting diodes mounted on one surface and takes a shape of a strip connected in a line, a support case for accommodating and supporting the light-emitting diode substrates in a plurality of lines apart from each other in a vertical direction, a shaft member such as a rivet for fixing both ends of the light-emitting diode substrate, a connector for connecting the light-emitting diode substrates which are adjacent to each other, a plurality of lenses attached to one surface of the light-emitting diode substrate opposite to the light-emitting diode for diffusing light emitted from the light-emitting diode, a reflection sheet mounted on one of the surfaces of the light-emitting diode substrate for reflecting the light diffused by the lens, and a support pin for suppressing a flexure of the diffusion plate.

The backlight device of the LED type is assembled in accordance with the following steps (1) to (5).

(1) The support case is put flatly on a working table with an open side turned upward, and the light-emitting diode substrates which are adjacent to each other in a transverse direction are juxtaposed in a plurality of lines in the support case.

(2) The light-emitting diode substrates which are adjacent to each other are connected to each other through the connector, and a power connecting connector is connected to the end of the light-emitting diode substrate on an end side.

(3) Both ends of the light-emitting diode substrates which are juxtaposed are fixed to the support case by means of the shaft member such as a rivet.

(4) The reflection sheet is mounted on one of the surfaces of the light-emitting diode substrate.

(5) The support pins are attached to the support case from the reflection sheet side.

The support case is formed by a metal plate and has a flat plate-shaped plate portion taking a square shape, a frame portion linked to a peripheral edge of the plate portion and having one of sides opened, and four collar pieces linked to an outer edge of the frame portion. The plate portion is provided with a first mounting hole in an opposite position to the both ends of the light-emitting diode substrates which are juxtaposed, and a second mounting hole in a position in which the support pin is to be disposed.

The light-emitting diode substrate takes a shape of a strip in which a circuit portion is provided on one surface, the light-emitting diode and a lens are mounted on the surface and a connecting portion is provided on one surface of both ends, and a through hole corresponding to the first mounting hole is provided on the both ends.

The light-emitting diode is formed in such a manner that an emitted light concentrates within a predetermined angle based on an optical axis from a front of the light-emitting diode.

The lens is opposed to a top of the light-emitting diode apart from each other, and takes a shape of a thick disk having a hemispherical recess portion for diffusing light applied from the light-emitting diode in all directions.

The reflection sheet takes a square shape corresponding to the plate portion of the support case and has a structure in which a first hole taking a larger shape than the lens is provided in an opposed position to the lens and a second hole taking a larger shape than the connector is provided in an opposed position to the connector, the lens is provided in the first hole and the connector is provided in the second hole when the reflection sheet is mounted over the surface of the light-emitting diode substrate, and a thermal expansion of the reflection sheet through the light-emitting diode can be absorbed.

The light source device includes a plurality of light-emitting diode substrates having one surface on which a plurality of light-emitting diodes are mounted and juxtaposed in a plurality of lines, a support body for accommodating and supporting the light-emitting diode substrates, a light reflection sheet disposed on the light-emitting diode substrate, and a lens disposed in a portion of the light reflection sheet which is opposed to the light-emitting diode.

The light reflection sheet expands or contracts through a thermal expansion due to a rise in a temperature in the light emission of the light-emitting diode, and a warp or a flexure is caused over the light reflection sheet due to the expansion or contraction. For this reason, Patent Document 1 describes the structure in which a small diameter hole is provided on a central part of a sheet surface, a plurality of large diameter holes are provided on a peripheral edge side apart from the small diameter hole in a direction along the sheet surface, the light reflection sheet is positioned with respect to the support body with a male screw to be inserted into the small diameter hole, and the light reflection sheet is attached to the support member relatively movably through a shaft member to be loosely fitted in the large diameter hole so that the expansion or contraction caused by the thermal expansion of the light reflection sheet is absorbed by the large diameter hole.

SUMMARY

Referring to the light source device including the light reflection sheet in which the small diameter hole is provided on the central part of the sheet surface and the large diameter hole is provided on the peripheral edge side as in Japanese Patent Application Laid-Open No. 2008-116832, however, the position of the light reflection sheet is shifted in a circumferential direction around the small diameter hole in some cases in which the light reflection sheet expands or contract due to the thermal expansion. Accordingly, the positional relationship between the light-emitting diode fixed to the support body through the light-emitting diode substrate and the lens fixed to the light reflection sheet is shifted so that a diffusing direction of light diffused by the lens is changed, resulting in a reduction in a luminance characteristic. Consequently, improvement measures have been demanded.

Moreover, the light source device in which the lens corresponding to the light-emitting diode is fixed to the light reflection sheet as in Japanese Patent Application Laid-Open No. 2008-116832 has the structure in which the light-emitting diode substrate and the light reflection sheet and lens are stacked in sequence. In the display device including the light source device, therefore, a thickness in an orthogonal direction to the display surface is increased. For this reason, improvement measures have been demanded.

For the latter improvement respects, the applicant of the present invention developed a light source device in which a lens is attached to a light-emitting diode substrate and a through hole corresponding to the lens is provided on a light reflection sheet so that a thickness in an orthogonal direction to a display surface can be reduced.

In the case in which the small diameter hole for positioning is provided on the light reflection sheet of the light source device which is improved, however, the positional relationship between the lens attached to the light-emitting diode substrate and the through hole provided on the light reflection sheet is shifted and a quantity of a gap between the lens and the through hole is varied so that a shadow tends to be generated in the hole edge portion of the through hole when the light reflection sheet expands or contracts due to a thermal expansion so that the position of the light reflection sheet is shifted in a circumferential direction around the small diameter hole. Consequently, further improvement measures have been demanded.

In consideration of the circumstances, it is a main object of the present invention to provide a light reflection sheet, a light source device and a display device in which the position of the light reflection sheet expanding or contracting due to a thermal expansion can be prevented from being shifted in a direction along a sheet surface and a circumferential direction, and a proper position of the light reflection sheet can be maintained.

A light reflection sheet according to the present invention is characterized in that a through hole and a long slot in a separating direction from the through hole are provided.

In the present invention, a position of the light reflection sheet can be prevented from being shifted in a direction along a sheet surface at a position setting portion to be inserted into the through hole, and the position of the light reflection sheet can be prevented from being shifted in a circumferential direction at the position setting portion to be inserted into the slot. In addition, an expansion or contraction of the light reflection sheet to expand or contract due to a thermal expansion can be absorbed into the slot. Therefore, it is possible to prevent the position of the light reflection sheet expanding or contracting due to the thermal expansion from being shifted, thereby maintaining a proper position of the light reflection sheet.

Moreover, it is preferable that the light reflection sheet according to the present invention should have a structure in which the through hole is provided on a central side and the slot is provided on a peripheral edge side.

In the present invention, it is possible to set a position with respect to a support body on the central side of a sheet surface. Therefore, a quantity of an expansion or contraction due to a thermal expansion from the through hole to a peripheral edge of the sheet surface can be equalized, and furthermore, a distance between the through hole and the slot can be increased and the position of the light reflection sheet can be prevented from being shifted in the circumferential direction with still more difficulty.

Furthermore, it is preferable that the light reflection sheet according to the present invention should have a structure in which a plurality of second through holes are provided in a peripheral edge portion, the through hole is smaller than the second through hole, and a width of the slot is smaller than that of the second through hole.

In the present invention, it is possible to prevent the position of the light reflection sheet from being shifted in the direction along the sheet surface via the through hole, it is possible to prevent the position of the light reflection sheet from being shifted in the circumferential direction via the slot, and furthermore, the light reflection sheet can be attached to the support body to enable a relative movement by means of an attaching member to be inserted into the second through hole. When the light reflection sheet expands or contracts due to a thermal expansion, moreover, the expansion or contraction can be absorbed into the slot and the second through hole.

In addition, it is preferable that the light reflection sheet according to the present invention should have such a structure as to include a flat portion taking an almost square shape and provided with the through hole, and a frame portion connected to enable bending at a folded part formed on a peripheral edge of the flat portion and a flange piece connected to a peripheral edge of the frame portion, the slot being provided on the flange piece.

In the present invention, the slot is provided on the flange piece in the peripheral edge portion which is not concerned in a light reflection. Therefore, it is possible to eliminate a reduction in a light reflectance due to the slot. Consequently, it is possible to obtain a light reflection sheet having a still higher light reflectance.

Moreover, the light reflection sheet according to the present invention is characterized in that a through hole and a slot connected to an edge of the through hole are provided.

In the present invention, a position setting portion to be inserted into the through hole and a position setting portion to be inserted into the slot can be formed integrally. Therefore, it is possible to eliminate a situation in which the position setting portion is not inserted into the slot.

Moreover, a light source device according to the present invention is characterized by comprising a light source, a support body for supporting the light source, the light reflection sheet according to the invention which reflects light emitted from the light source, a first position setting portion fitted in the through hole for setting a position of the light reflection sheet with respect to the support body, and a second position setting portion fitted in the slot to enable a relative movement in a longitudinal direction of the slot for setting a position of the light reflection sheet with respect to the support body.

In the present invention, the position of the light reflection sheet can be prevented from being shifted in a direction along a sheet surface by the first position setting portion to be inserted into the through hole, and the position of the light reflection sheet can be prevented from being shifted in a circumferential direction by the second position setting portion to be inserted into the slot. In addition, when the light reflection sheet expands or contracts due to a thermal expansion, the expansion or contraction can be absorbed into the slot. Therefore, the position of the light reflection sheet expanding or contracting due to the thermal expansion can be prevented from being shifted from the light source. Consequently, it is possible to maintain an excellent luminance characteristic.

Furthermore, it is preferable that the light source device according to the present invention should have a structure in which the first position setting portion is a first shaft member having a setting shaft portion smaller than the through hole, the second position setting portion is a second shaft member having a setting shaft portion smaller than a width of the slot, and two position setting holes in which the first shaft member and the second shaft member are to be fitted are provided on the support body.

In the present invention, the first shaft member is inserted into the through hole and is fitted in one of the position setting holes so that the setting shaft portion of the first shaft member is fitted in the through hole. Consequently, it is possible to prevent the position of the light reflection sheet from being shifted in a direction along a sheet surface. The second shaft member is inserted into the slot and is fitted into the other position setting hole so that the setting shaft portion of the second shaft member is fitted in the slot. Consequently, the position of the light reflection sheet can be prevented from being shifted in a circumferential direction. Thus, the first shaft member and the second shaft member have the setting shaft portions. Therefore, the position of the light reflection sheet can be shifted in the direction along the sheet surface and the circumferential direction with still more difficulty.

In addition, it is preferable that the light source device according to the present invention should have a structure in which the light source is a light-emitting diode and a plurality of circuit boards are provided, each of which has the light-emitting diodes mounted and juxtaposed thereon.

In the present invention, also in the case in which the light-emitting diode is disposed like a grid, for example, a corresponding lens to the light-emitting diode is attached to a circuit board and a corresponding hole to the lens is provided on a light reflection sheet, the positional relationship between the lens and the hole can be maintained without an influence of the expansion or contraction of the light reflection sheet due to a thermal expansion so that an excellent luminance characteristic can be maintained.

Moreover, it is preferable that the light source device according to the present invention should have a structure in which the support body has a plate portion taking an almost square shape and supporting the light source, and a frame portion connected to a peripheral edge of the plate portion and a flange portion connected to a peripheral edge of the frame portion, and the flange portion is provided with the second position setting portion.

In the present invention, the second position setting portion can be formed integrally with the support body. Therefore, it is possible to prevent the position of the light reflection sheet from being shifted in the circumferential direction without using another member such as a shaft member.

Furthermore, a display device according to the present invention is characterized by comprising a display portion having a display surface on one of sides, and the light source device according to the invention which is provided on the other side of the display portion.

In the present invention, the position of the light reflection sheet can be prevented from being shifted in a direction along a sheet surface by the first position setting portion to be inserted into the through hole, and the position of the light reflection sheet can be prevented from being shifted in a circumferential direction by the second position setting portion to be inserted into the slot. In addition, when the light reflection sheet expands or contracts due to a thermal expansion, the expansion or contraction can be absorbed into the slot. Therefore, the position of the light reflection sheet expanding or contracting due to the thermal expansion can be prevented from being shifted from the light source. Consequently, it is possible to maintain an excellent luminance characteristic.

According to the present invention, the position of the light reflection sheet can be prevented from being shifted in the direction along the sheet surface by the position setting portion to be inserted into the through hole, the position of the light reflection sheet can be prevented from being shifted in the circumferential direction by the position setting portion to be inserted into the slot. In addition, the expansion or contraction of the light reflection sheet to expand or contract due to the thermal expansion can be absorbed into the slot. Therefore, it is possible to prevent the position of the light reflection sheet expanding or contracting due to the thermal expansion from being shifted, thereby maintaining a proper position of the light reflection sheet.

The above and further objects and features will more fully be apparent from the following detailed description with accompanying drawings.

BRIEF DESCRIPTION OF THE SEVERAL VIEWS OF THE DRAWINGS

FIG. 13B is an exploded perspective view showing the configuration of the shaft body.

FIG. 15 is an enlarged cross-sectional view taken along line XV-XV of FIG. 13A.

FIG. 21 is a perspective view showing a configuration of a lead hole portion in a substrate support body.

FIG. 24 is a front view showing another configuration of the portion that faces the connector of the reflection sheet.

FIG. 35 is an enlarged front view showing a configuration of the main components of the reflection sheet.

FIG. 37 is a cross-sectional view showing a configuration of a display device including a light source device according to the embodiment 1.

FIG. 54 is a plan view that illustrates still another structure of a slit portion of the reflection sheet installed in the light source device of the embodiment 2.

FIG. 56 is a plan view that illustrates still another structure of a slit portion of the reflection sheet installed in the light source device of the embodiment 2.

FIG. 57 is a plan view that illustrates still another structure of a slit portion of the reflection sheet installed in the light source device relating to the present invention of the embodiment 2.

FIG. 62 is a front view that schematically illustrates light-emitting diodes and a light-emitting diode substrate on which the reflection sheet of the embodiment 3 is formed.

FIG. 63 is a cross-sectional view taken along line I-I of FIG. 62, which schematically illustrates a rivet of the embodiment 3.

FIG. 65 is a cross-sectional view taken along line III-III of FIG. 62, which schematically illustrates a supporting rivet of the embodiment 3.

FIG. 72 is an enlarged plan view that illustrates one portion of the light source device of the embodiment 4.

FIG. 73 is a perspective view that illustrates a structure of a light-emitting diode substrate with lenses attached thereto of the embodiment 4.

FIG. 74 is a perspective view that illustrates a structure of a light-emitting diode substrate with lenses attached thereto of the embodiment 4.

FIG. 75 is a cross-sectional view that illustrates one example of a fixture of the embodiment 4.

FIG. 80 is a schematic longitudinal cross-sectional diagram showing a display device of an embodiment 5.

FIG. 92A is a cross-sectional diagram showing the structure of a second shaft portion of the embodiment 6 as viewed from the side.

FIG. 92B is a cross-sectional diagram showing the structure of the second shaft portion of the embodiment 6 as viewed from the top.

FIG. 93 is a cross-sectional diagram showing the structure of a third shaft portion of the embodiment 6 as viewed from the top.

FIG. 96 is a plan diagram showing another structure of a hole for preventing the position from shifting as viewed from the top.

FIG. 97 is a cross-sectional diagram showing another structure of the first shaft portion and the second shaft portion as viewed from the side.

FIG. 100 is a cross sectional view showing main parts of a structure of a light source device of an embodiment 7.

FIG. 104 is a partially enlarged plan view of the light source device of the embodiment 7.

FIG. 105 is an enlarged perspective view of a connector of the embodiment 7.

FIG. 106 is a plan view schematically showing a structure of the connector of the embodiment 7.

FIG. 108 is a perspective view showing a configuration of light-emitting diode substrates of the embodiment 7, onto which lenses are attached.

FIG. 109 is a cross sectional view showing an example of a fixture of the embodiment 7.

FIG. 114 is a plan view of the light source device of the embodiment 8 with its part disassembled.

FIG. 115 is a plan view of a part of the light source device of the embodiment 8.

FIG. 116 is a partially enlarged plan view of the light source device of the embodiment 8.

FIG. 117 is a perspective view showing a configuration of light-emitting diode substrates of the embodiment 8, onto which lenses are attached.

FIG. 118 is a cross sectional view showing a structure of rivets of the embodiment 8.

FIG. 119 is a plan view along a line V-V in FIG. 118.

FIG. 120 is a cross sectional view of a positional relationship of the rivets and the lenses of the embodiment 8.

FIG. 121 is a cross sectional view showing a configuration of a display device including the light source device of the embodiment 8.

FIG. 122 is a plan view showing a rear face side of a head portion of a rivet in another light source device of the embodiment 8.

FIG. 123 is a partially enlarged plan view of another light source device of the embodiment 8.

FIG. 124 is a plan view showing a rear face side of a head portion of a rivet in another, second light source device of the embodiment 8.

FIG. 125 is a vertical cross sectional view showing a partial configuration of a display device including a light source device of the embodiment 9.

Figure 126:
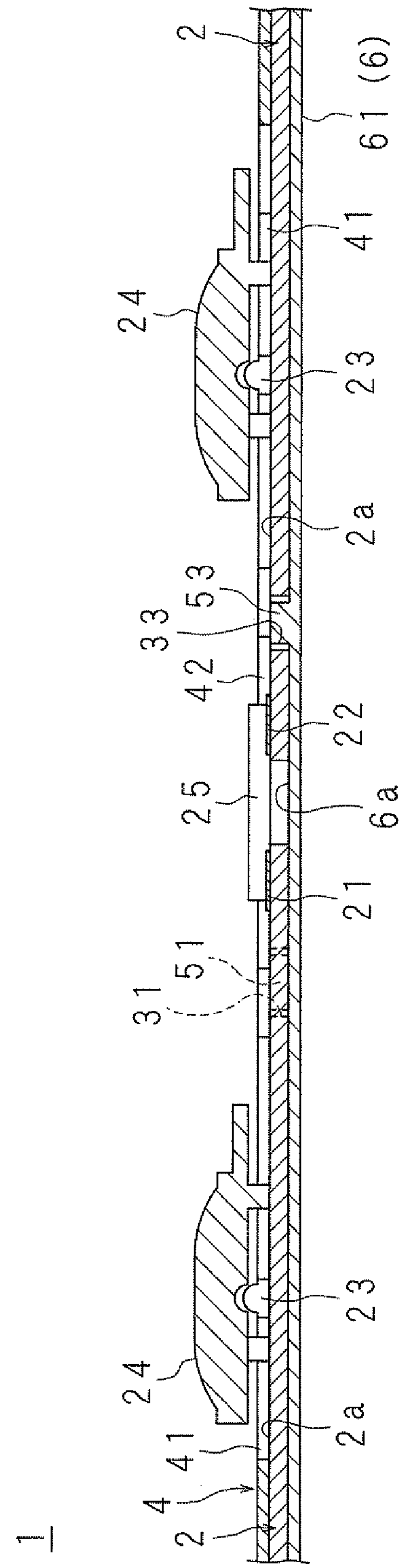

FIG. 126 is a horizontal cross sectional view showing a configuration of a connecting portion of circuit boards that the light source device of the embodiment 9 includes.

Figure 127A:
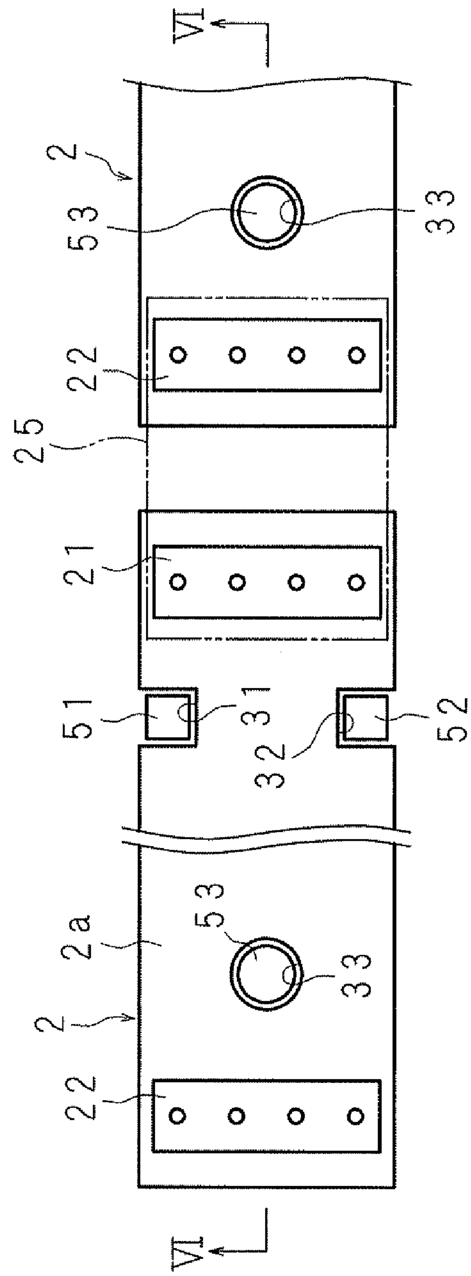

FIG. 127A is a front view showing the configuration of the connecting portion of the circuit boards that the light source device of the embodiment 9 includes.

Figure 127B:
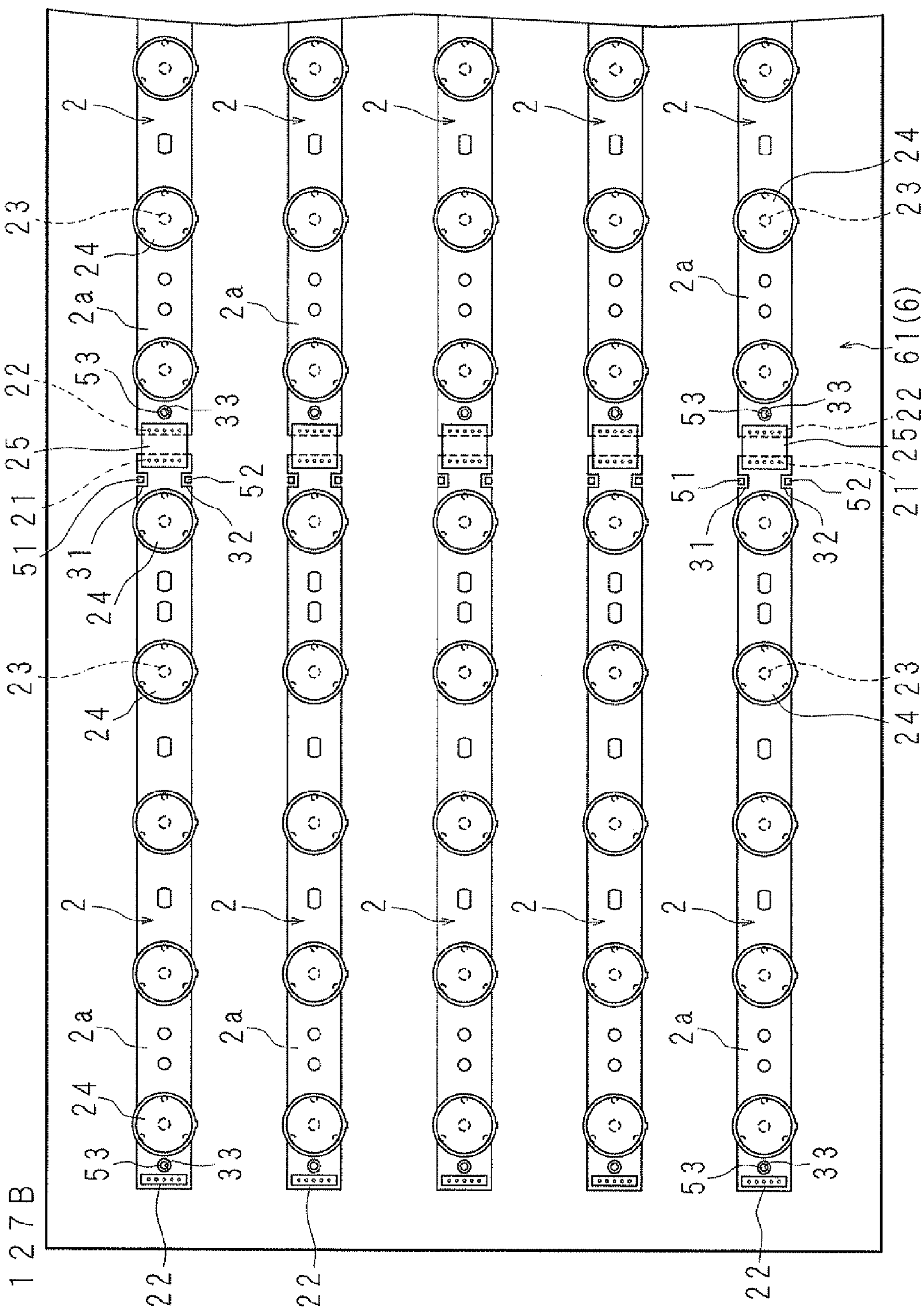

FIG. 127B is a front view showing a relationship of the circuit boards and attachment members that the light source device of the embodiment 9 includes.

Figure 128:
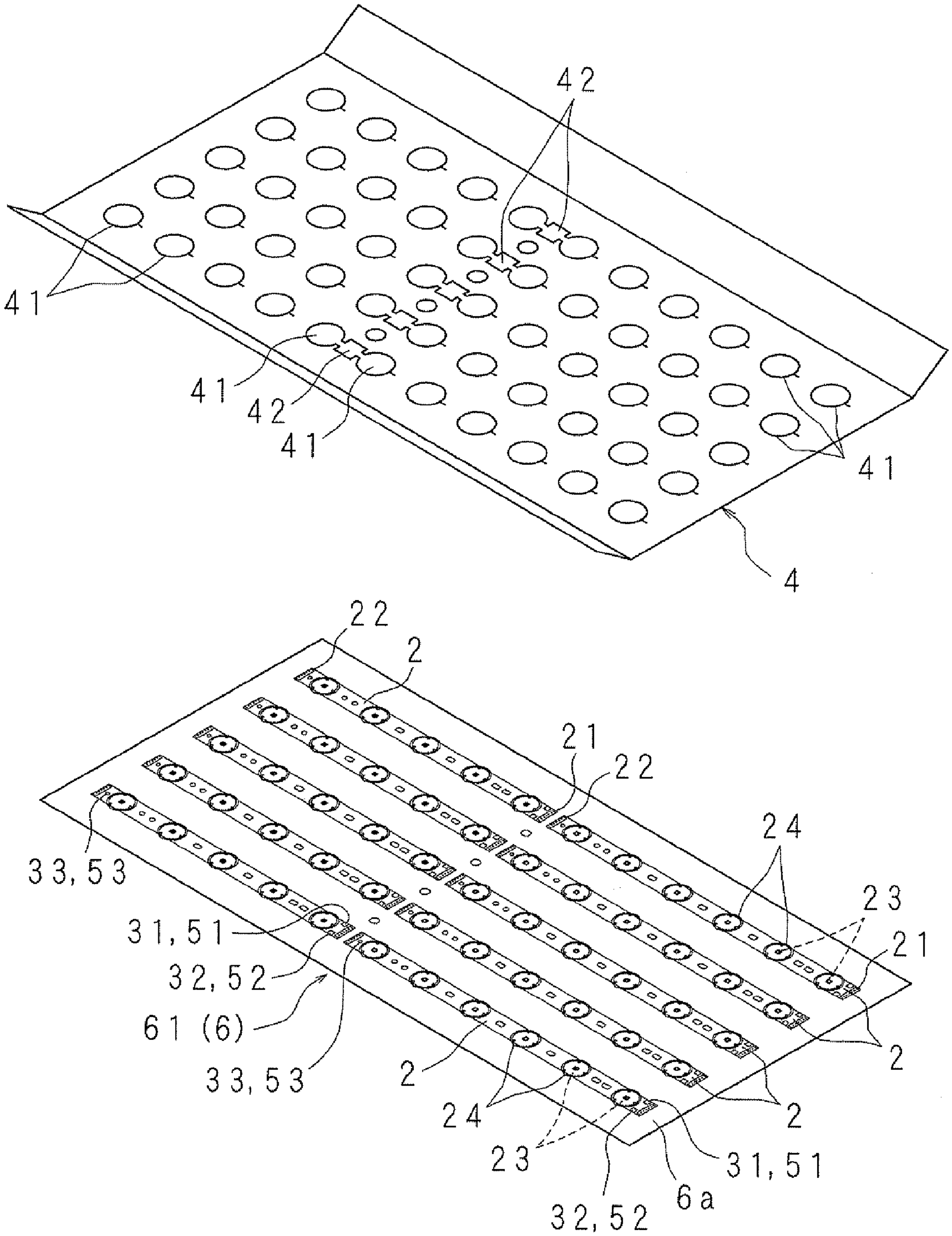

FIG. 128 is a perspective view schematically showing a state in which the circuit boards included in the light source device of the embodiment 9 are arranged in parallel.

Figure 129:
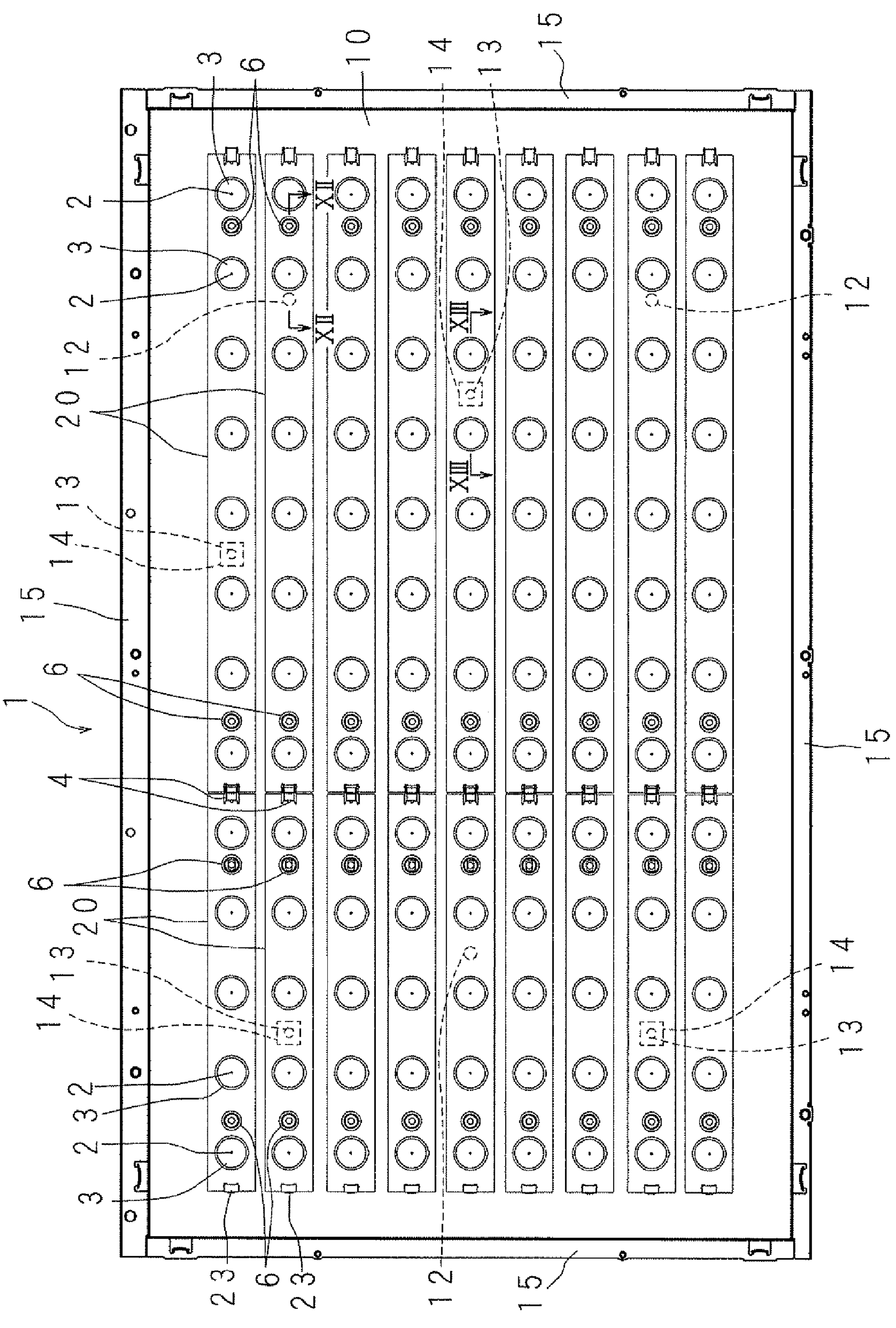

FIG. 129 is a plan view of an illumination device in accordance with an embodiment 10.

Figure 130:
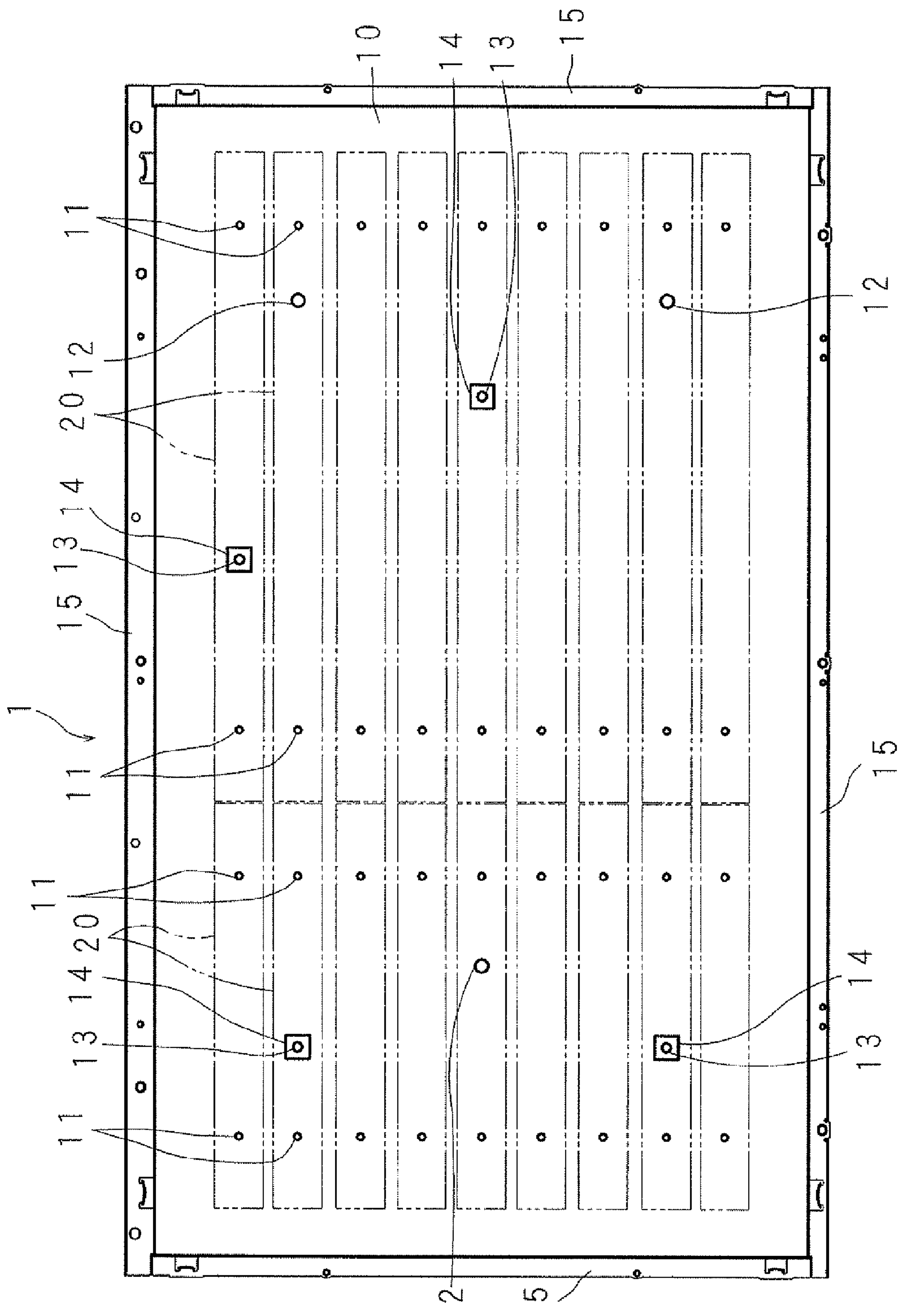

FIG. 130 is a plan view of the backlight chassis in accordance with the embodiment 10.

Figure 131:
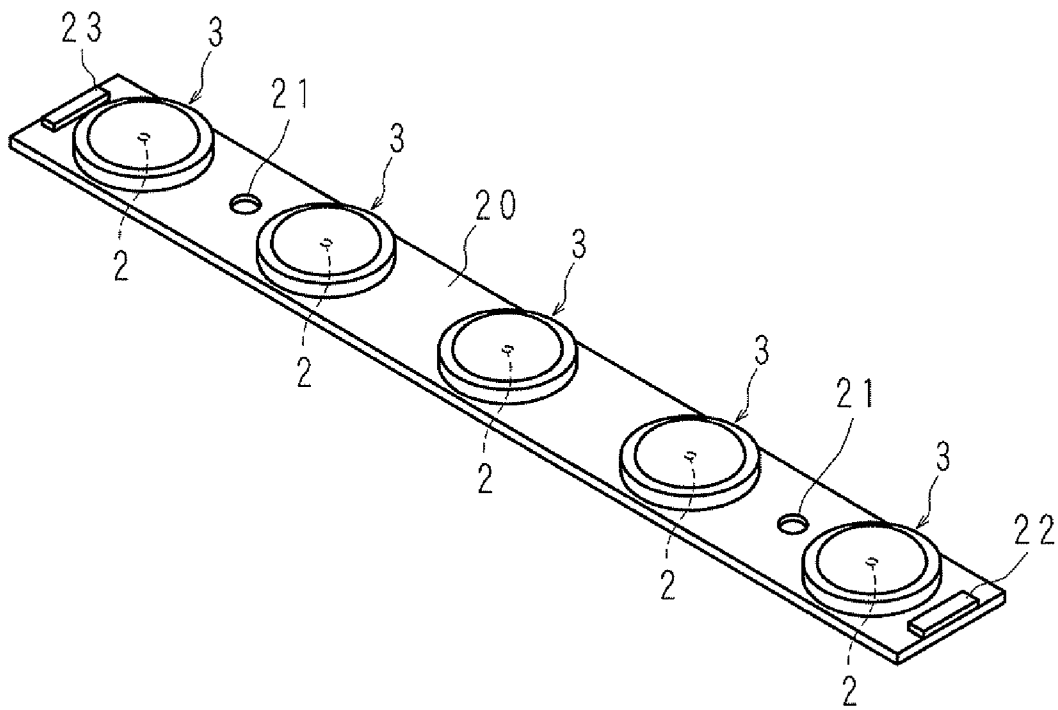

FIG. 131 is a perspective view showing an outer appearance of the LED substrate in accordance with the embodiment 10.

Figure 132:
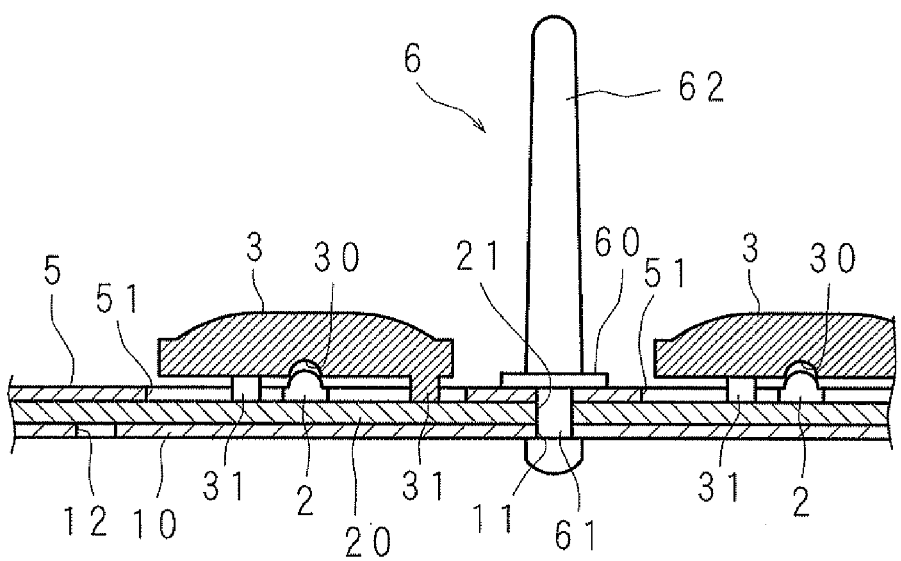

FIG. 132 is an enlarged cross sectional view showing an attached portion of the LED substrate in accordance with the embodiment 10.

FIG. 133 is an enlarged cross sectional view showing an attached portion of the LED substrate in accordance with the embodiment 10.

Figure 134:
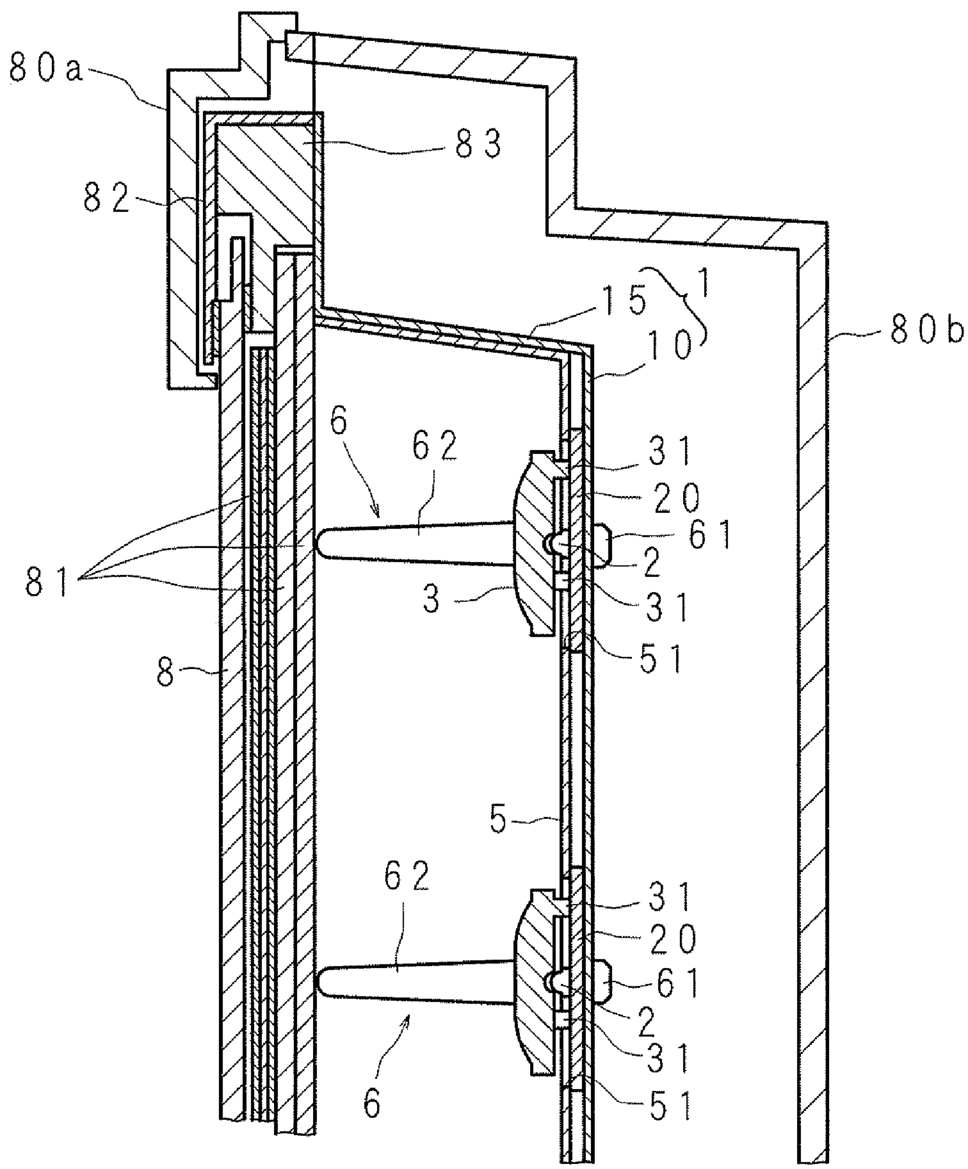

FIG. 134 is a cross sectional view of a liquid crystal display device in accordance with the embodiment 10.

Figure 135:
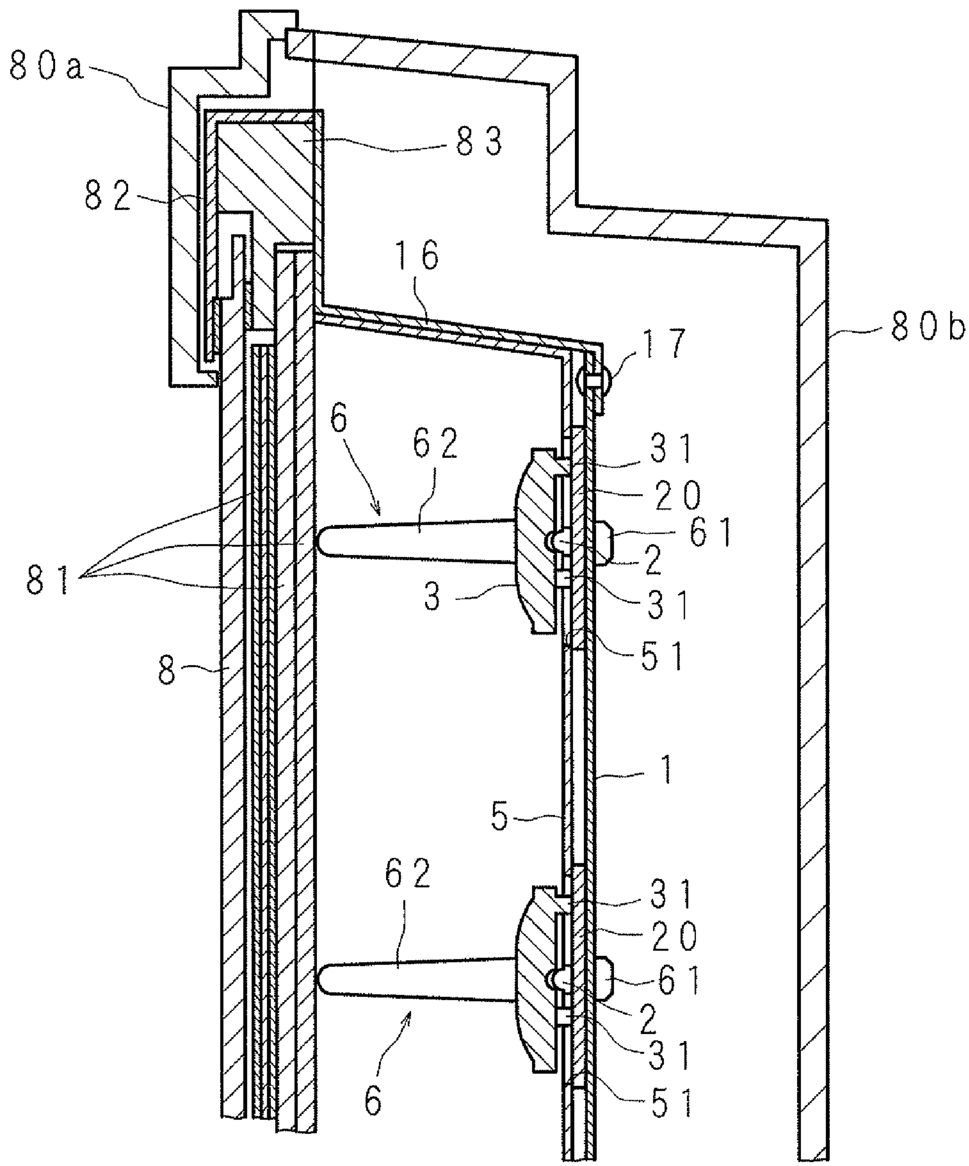

FIG. 135 is a cross sectional view showing another embodiment of the liquid crystal display device in accordance with the embodiment 10.

Figure 136:
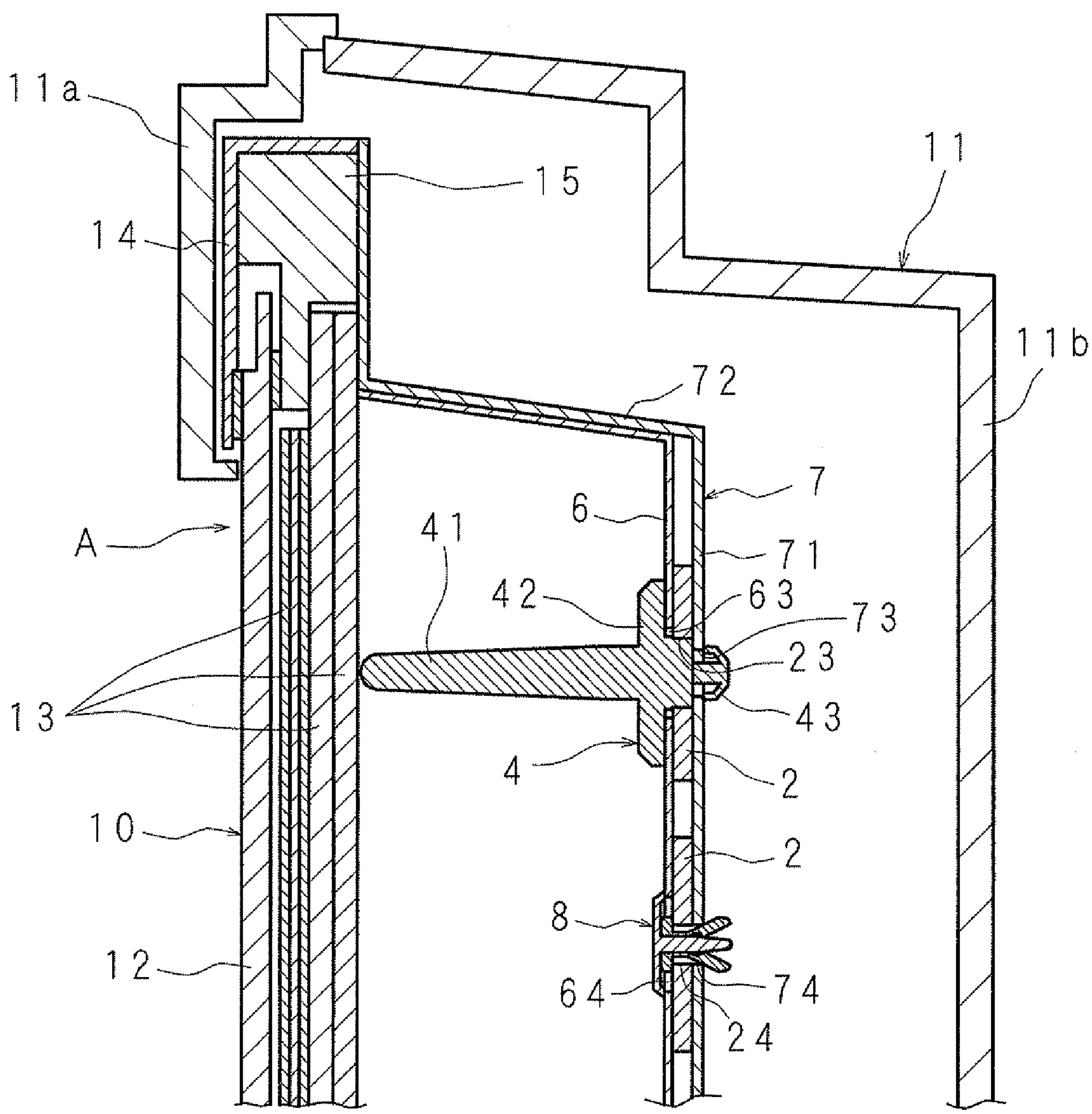

FIG. 136 is a cross sectional view showing a partial structure of the display device provided with the backlight device in accordance with an embodiment 11.

Figure 137:
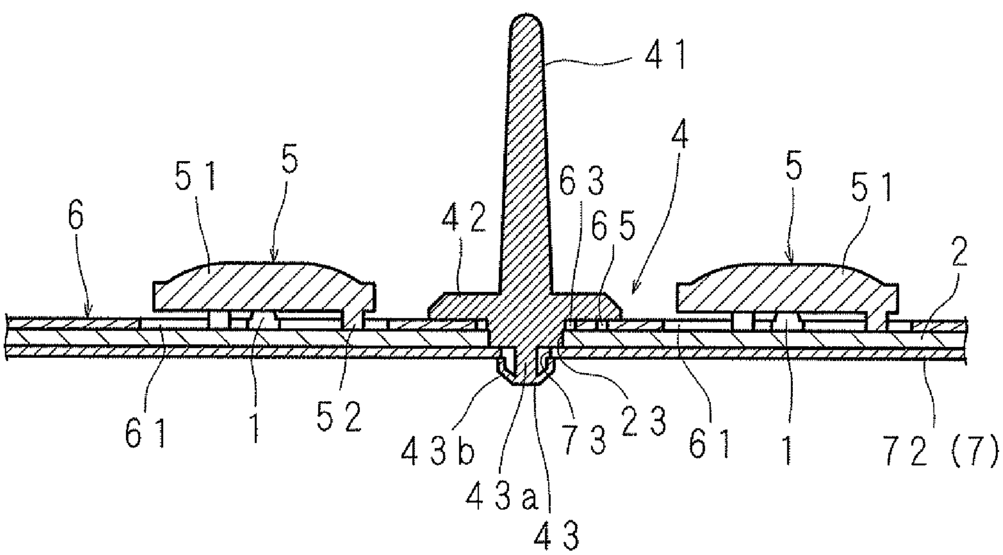

FIG. 137 is a partially enlarged cross sectional view showing a structure of the backlight device in accordance with the embodiment 11.

Figure 138:
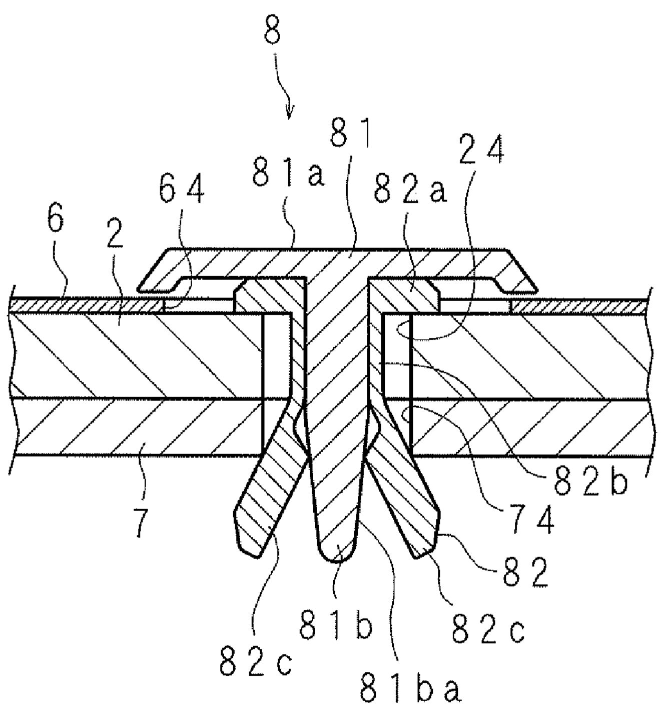

FIG. 138 is a cross sectional view showing a structure of a rivet of the backlight device in accordance with the embodiment 11.

Figure 139:
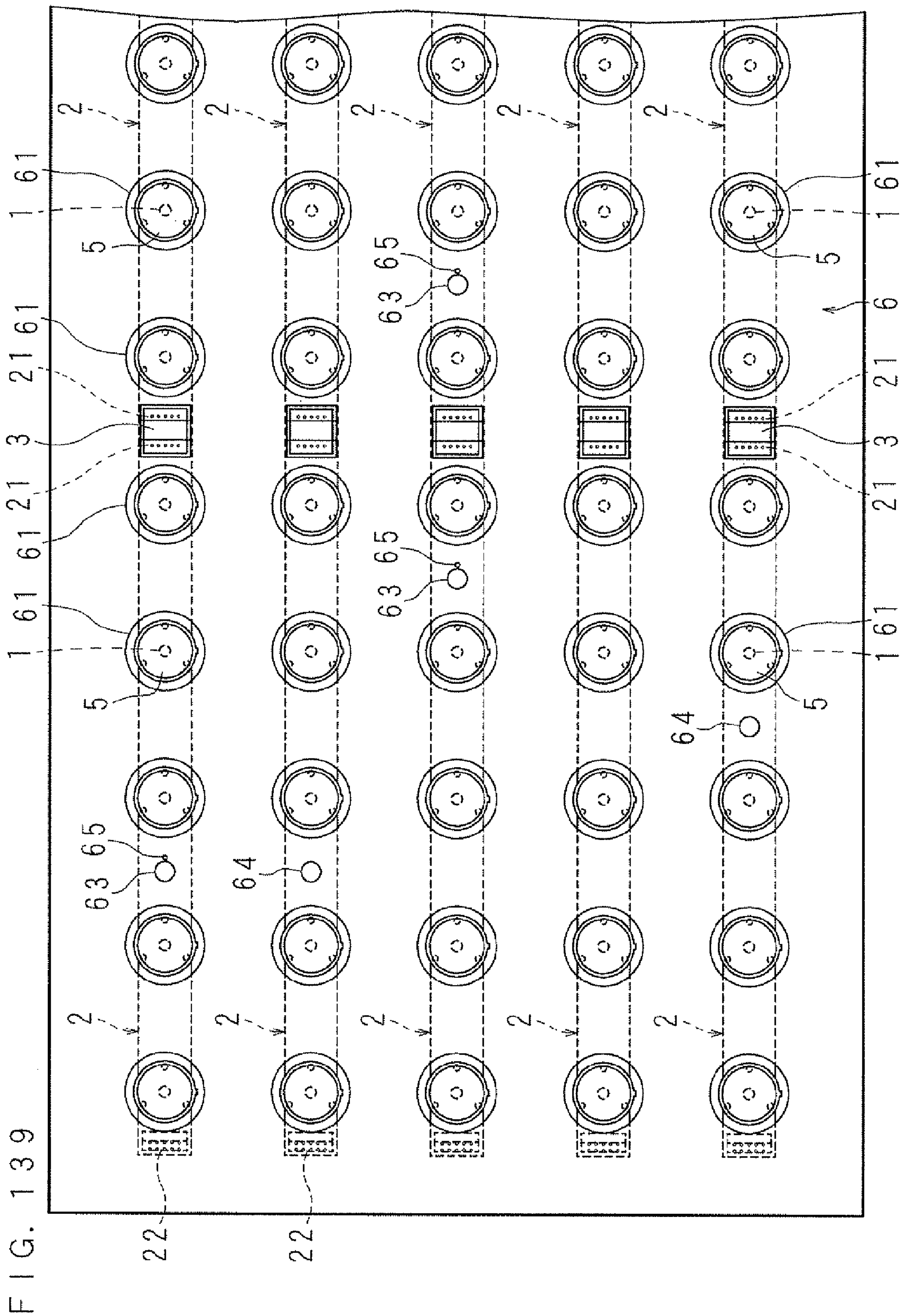

FIG. 139 is a partly omitted plan view of the backlight device in accordance with the embodiment 11.

Figure 140:
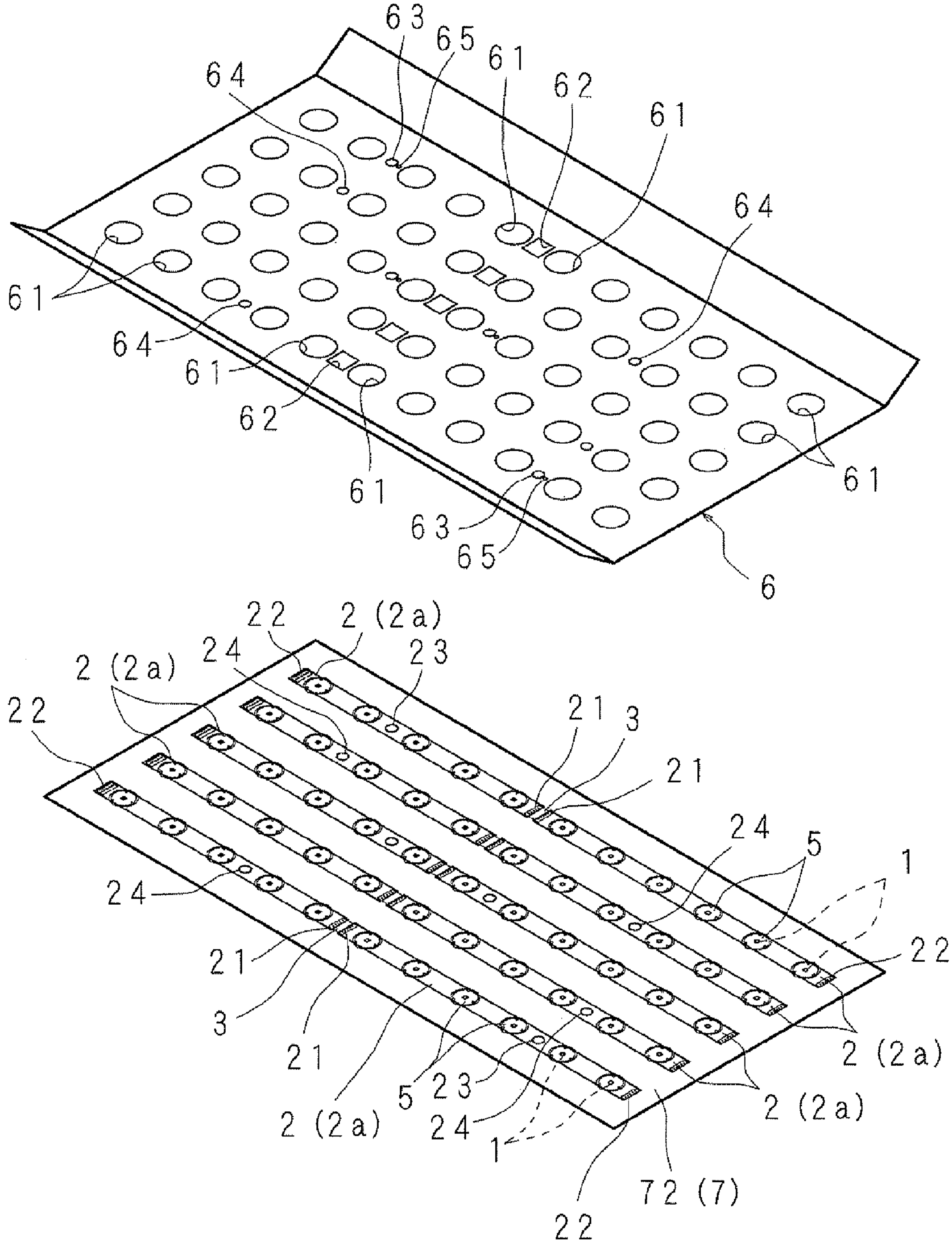

FIG. 140 is a partly exploded schematic perspective view of the backlight device in accordance with the embodiment 11.

FIG. 141A is a partly enlarged plan view showing a structure of a reflection sheet of the backlight device in accordance with the embodiment 11.

FIG. 141B is a partly enlarged plan view showing a structure of a reflection sheet of the backlight device in accordance with the embodiment 11.

Figure 142:
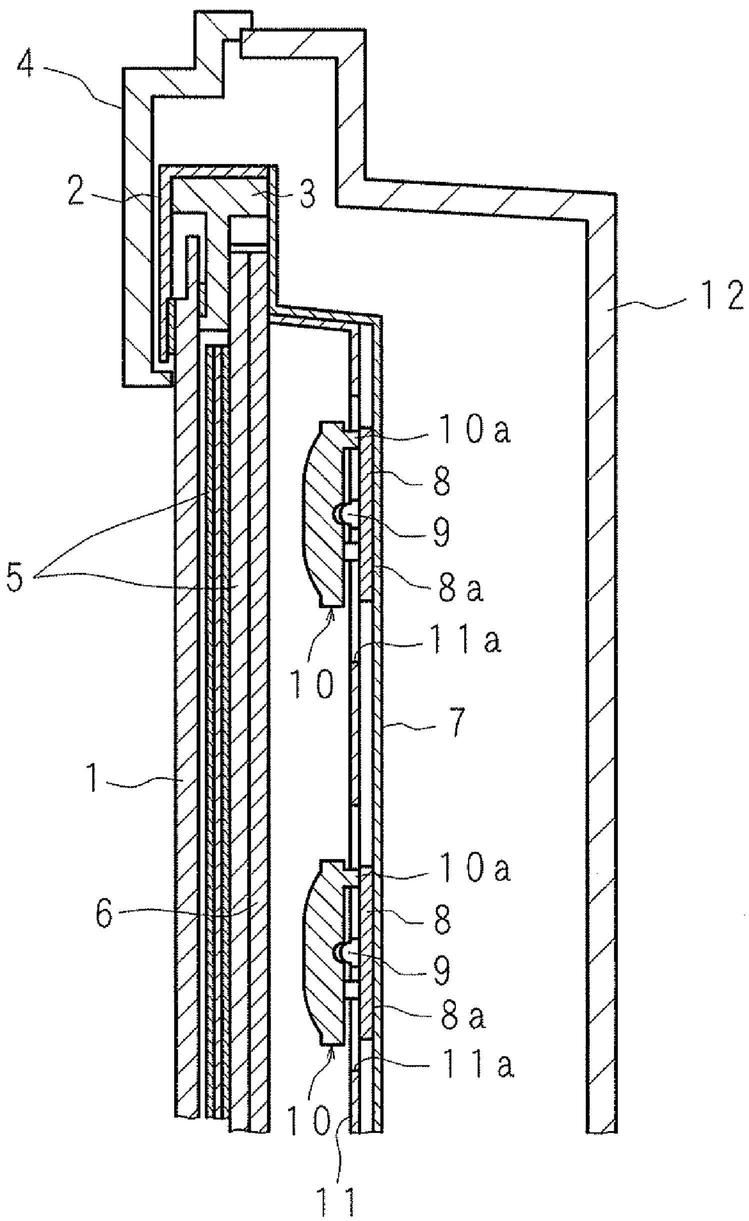

FIG. 142 is a vertical cross sectional view schematically showing the display device in accordance with an embodiment 12.

Figure 143:
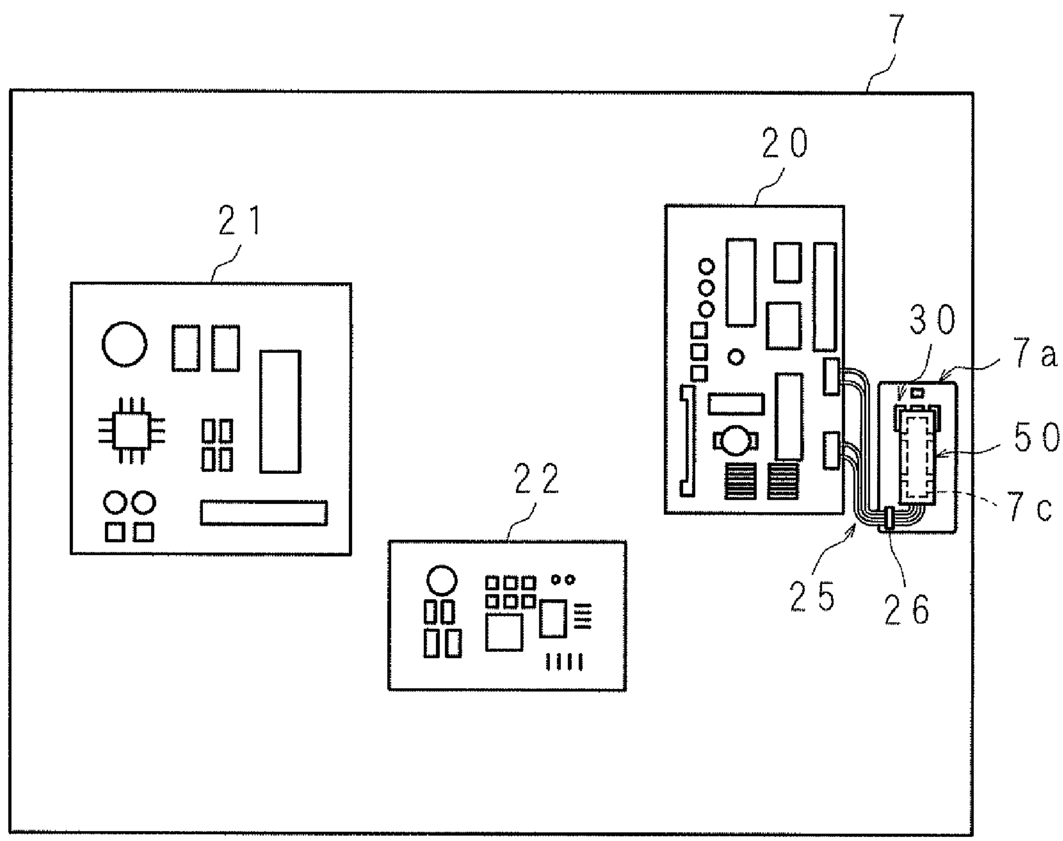

FIG. 143 is a schematic back elevational view in which the support plate is seen from a rear side in accordance with an embodiment 12.

FIG. 144 is a perspective view which schematically shows a through hole provided in an opening manner in the vicinity of an edge of the support plate in accordance with an embodiment 12.

Figure 145:
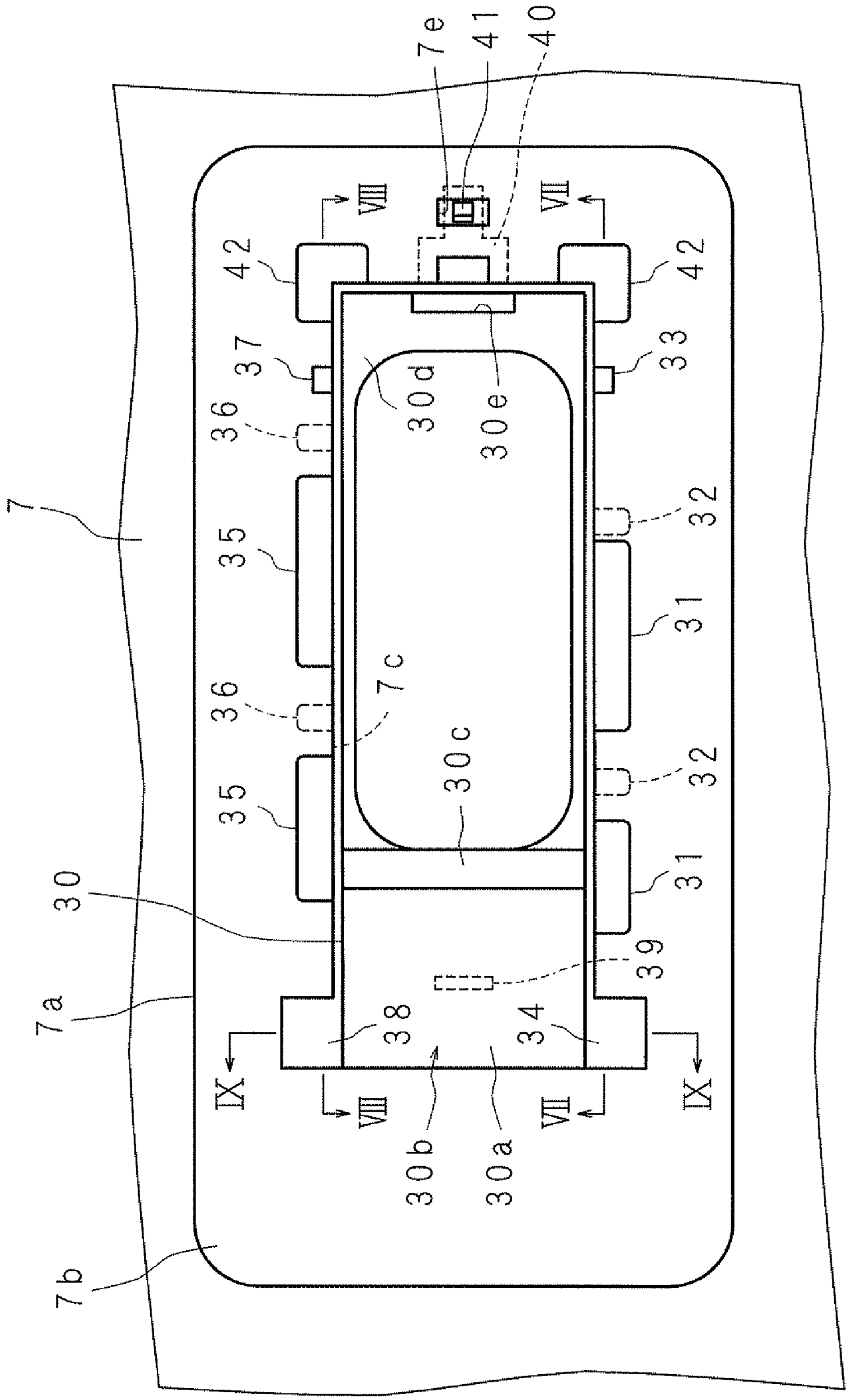

FIG. 145 is a plan view which schematically shows the protection tube fitted to the through hole.

Figure 146:
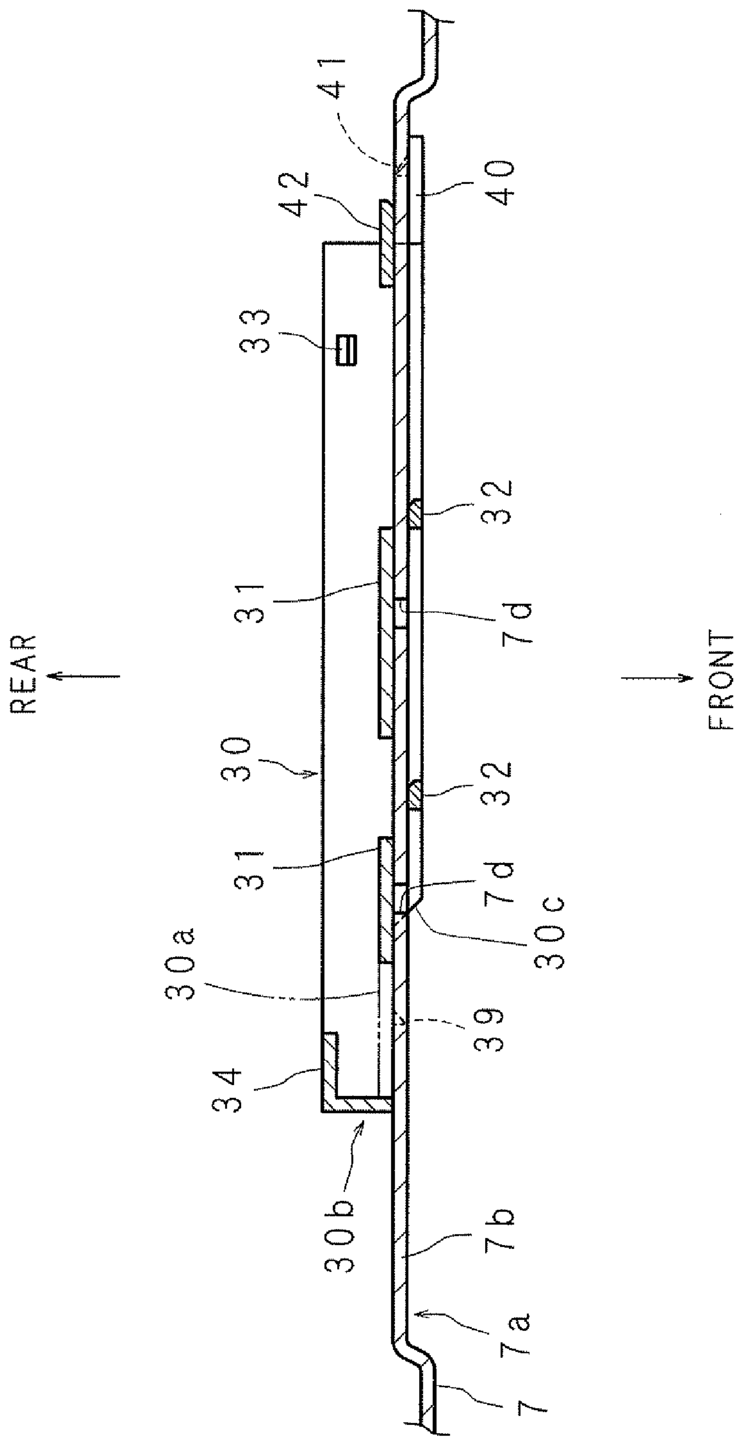

FIG. 146 is a schematic cross sectional view in a line VII-VII described in FIG. 145.

Figure 147:
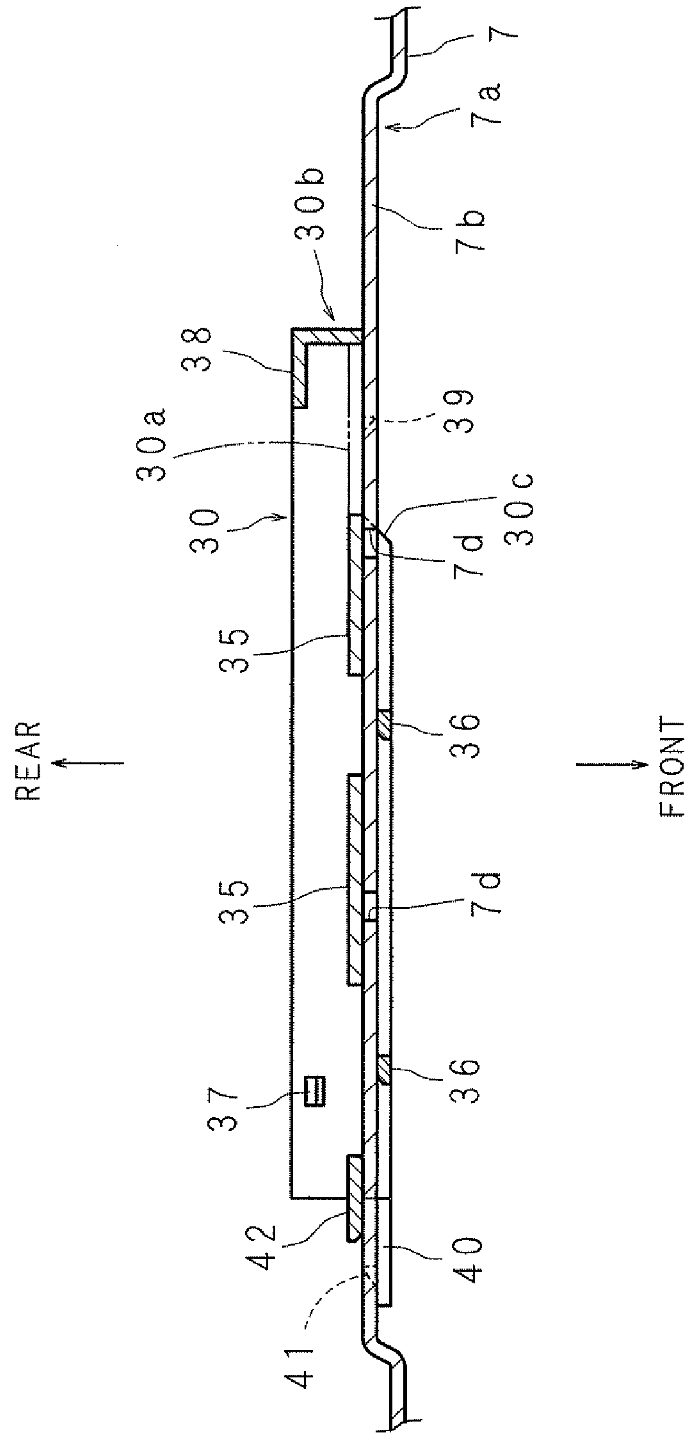

FIG. 147 is a schematic cross sectional view in a line VIII-VIII described in FIG. 145.

FIG. 148 is a schematic cross sectional view in a line IX-IX described in FIG. 145.

Figure 149:
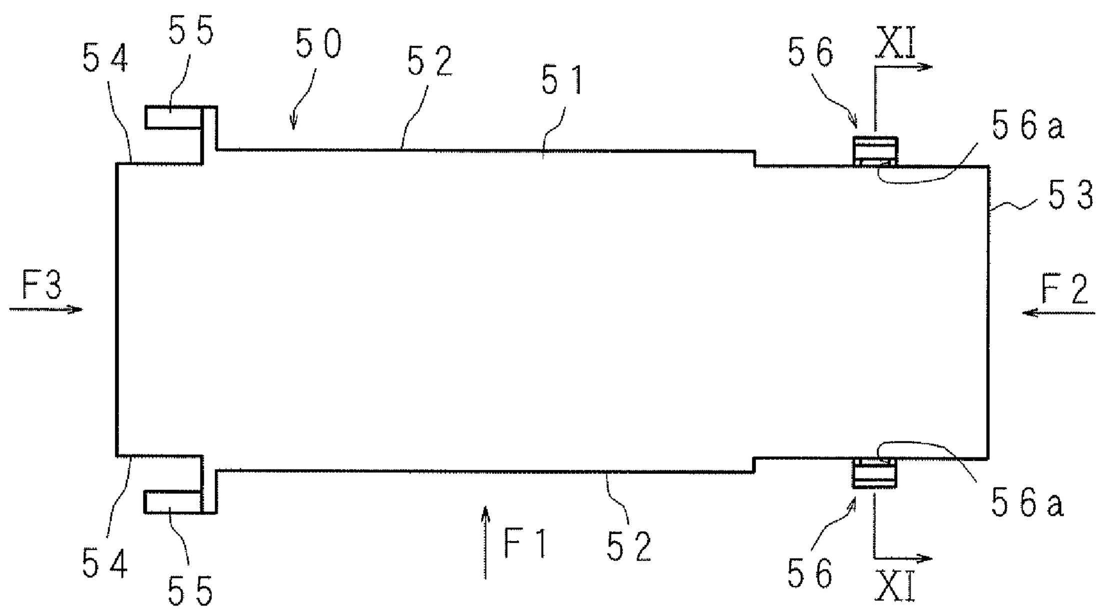

FIG. 149 is a plan view schematically showing the lid.

Figure 150:
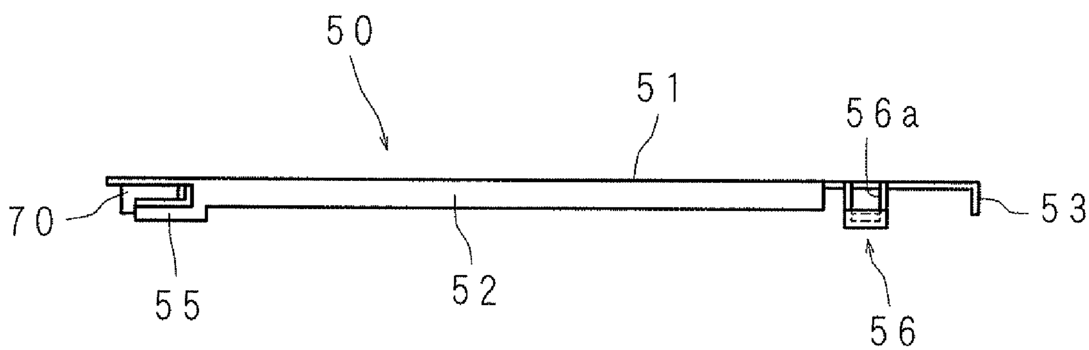

FIG. 150 is a schematic side elevational view as seen from a direction of F1 described in FIG. 149.

FIG. 151 is a schematic side elevational view as seen from a direction of F2 described in FIG. 149.

Figure 152:
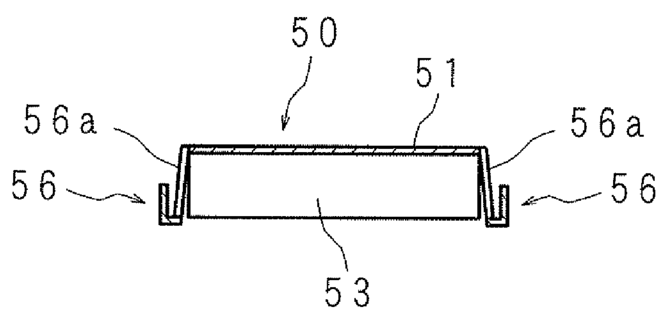

FIG. 152 is a schematic cross sectional view in a line XI-XI described in FIG. 149.

Figure 153:
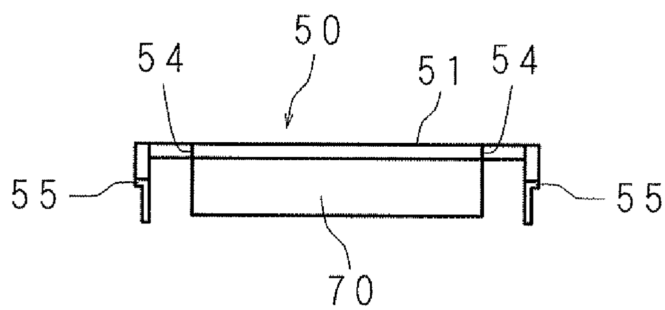

FIG. 153 is a schematic side elevational view as seen from a direction of F3 described in FIG. 149.

Figure 154:
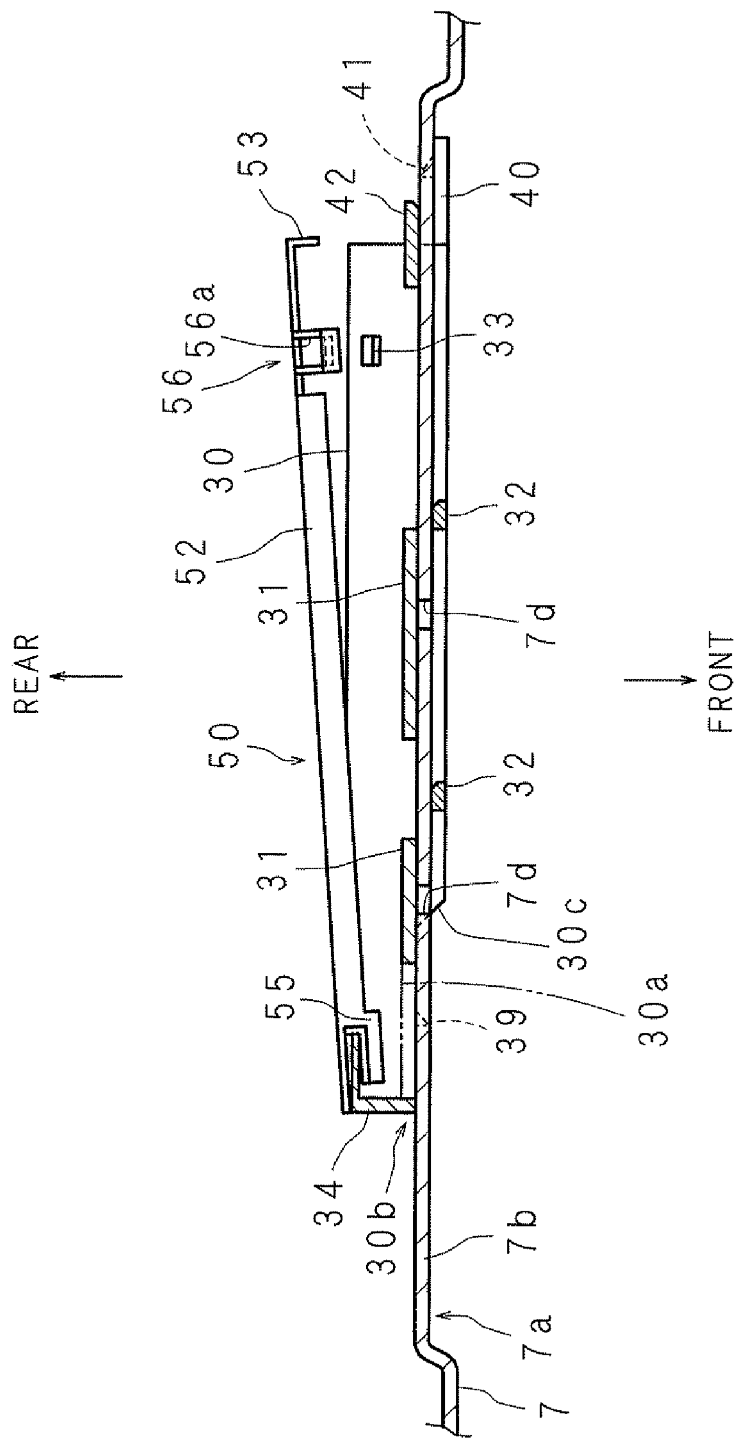

FIG. 154 is an explanatory view explaining the attachment of the lid to the protection tube.

Figure 155:
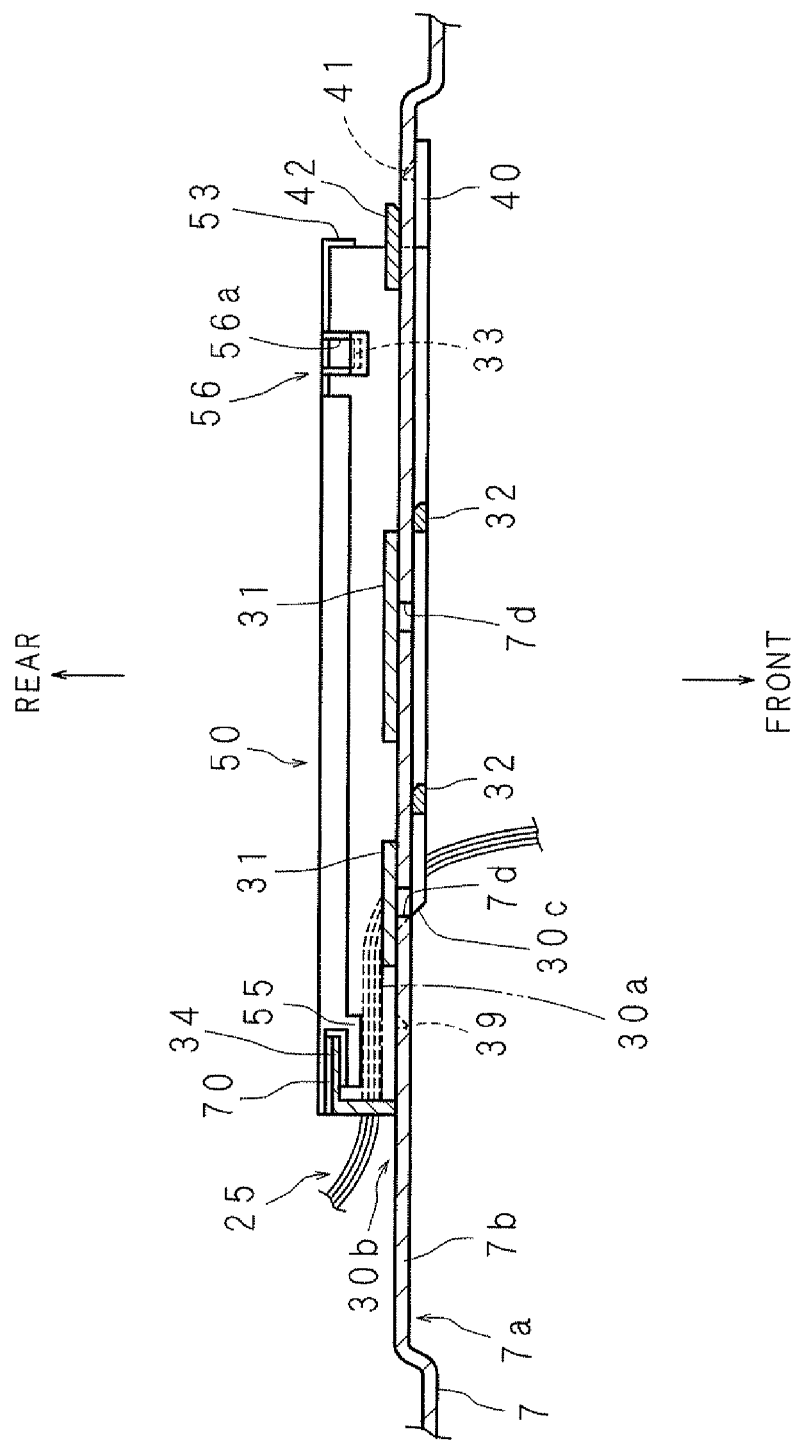

FIG. 155 is an explanatory view explaining the attachment of the lid to the protection tube.

Figure 156:
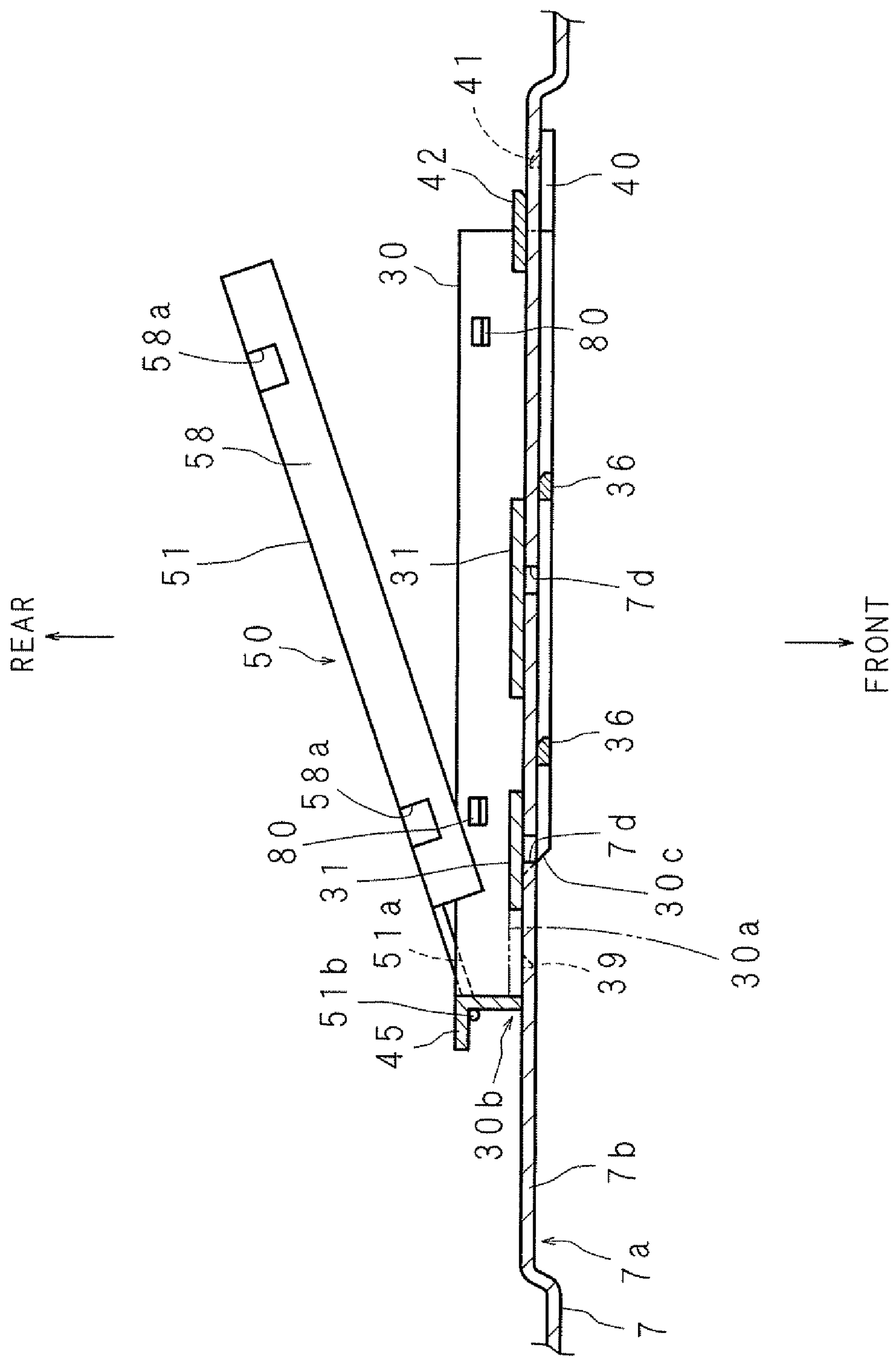

FIG. 156 is an explanatory view explaining an attachment of the lid to the protection tube of the display device in accordance with an embodiment 12.

Figure 157:
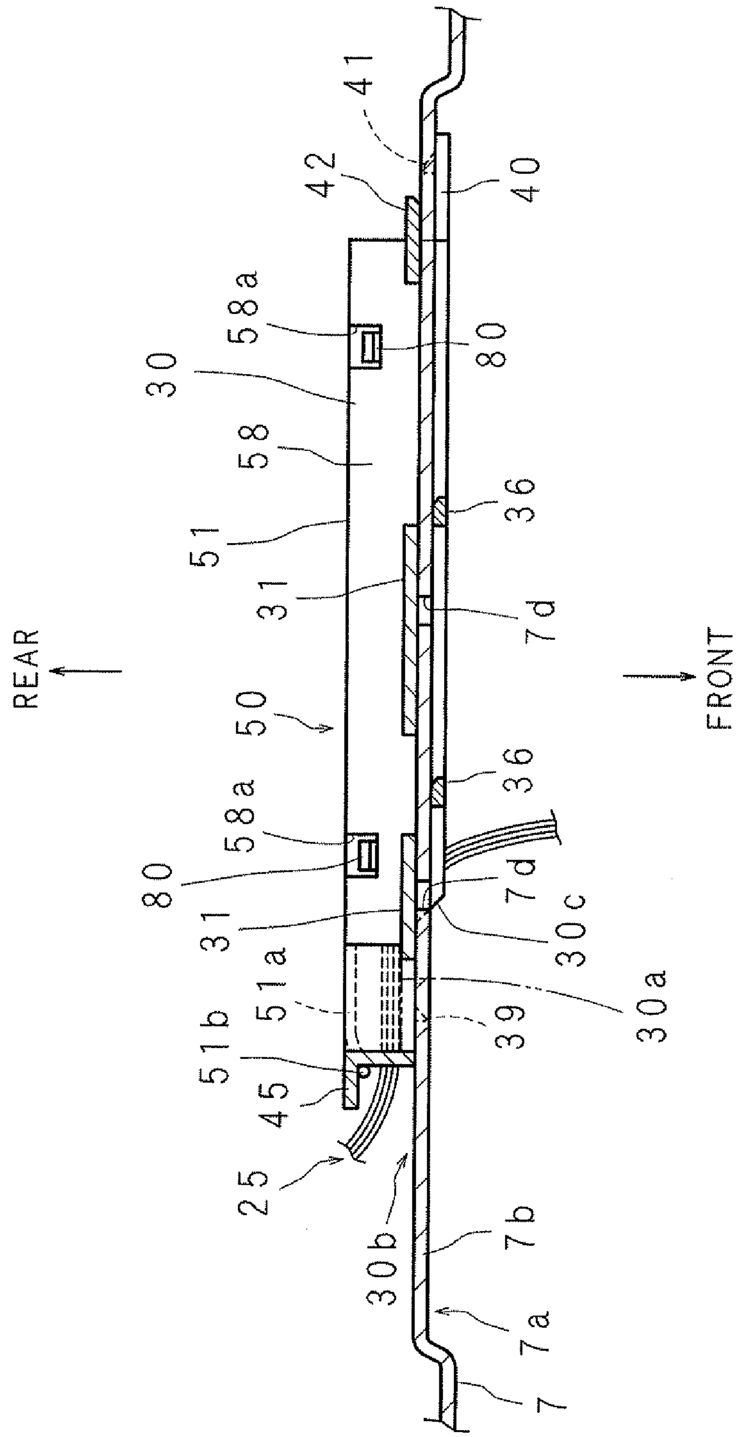

FIG. 157 is an explanatory view explaining an attachment of the lid to the protection tube of the display device in accordance with an embodiment 12.

FIG. 158 is a perspective view schematically showing the vicinity of an engaging shaft in an enlarged manner.

DETAILED DESCRIPTION

The following will describe in detail embodiments of the present invention with reference to the drawings.

Figure 1:
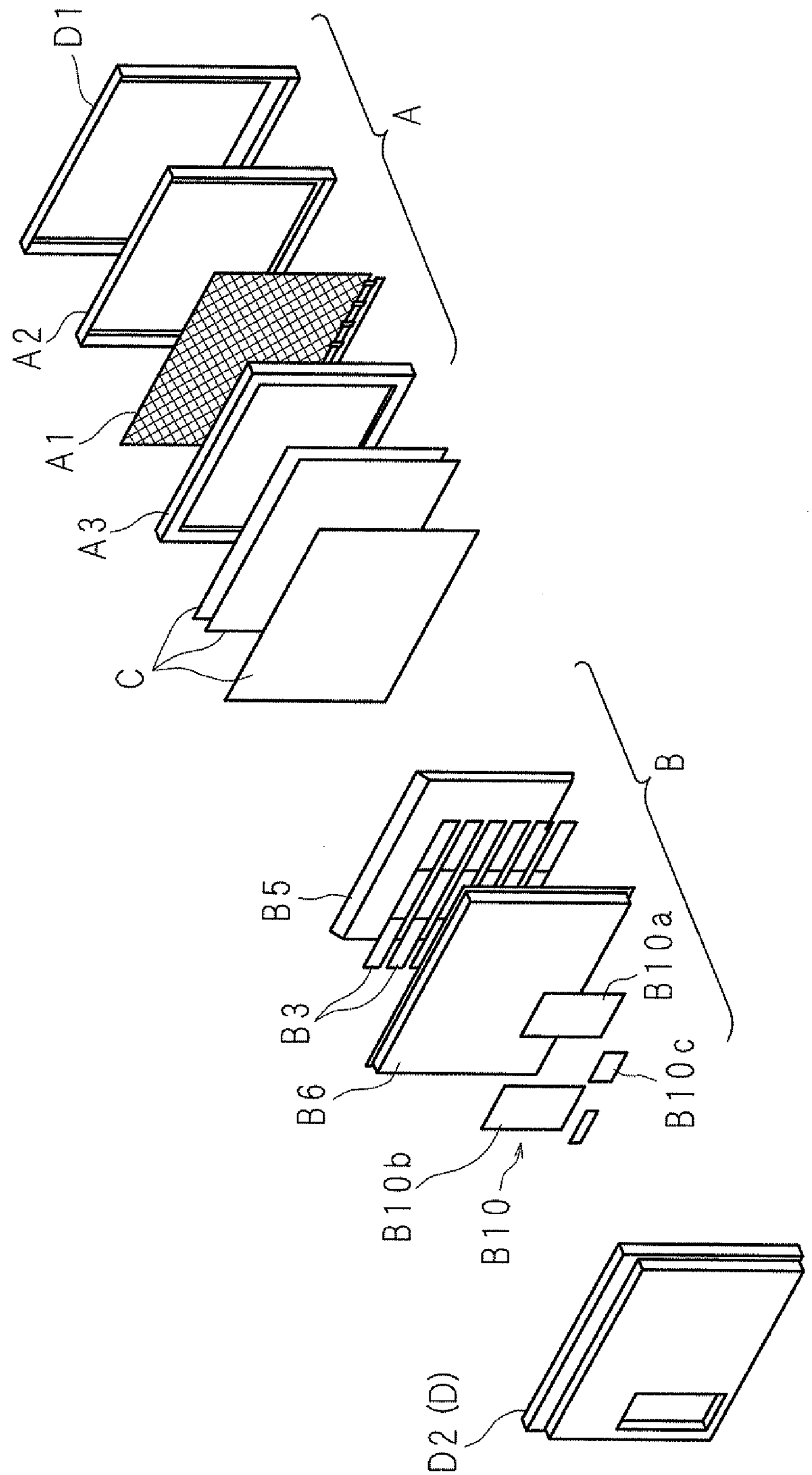
FIG. 1 is a schematic exploded perspective view of a configuration of a display device according to the present invention.
Figure 2:
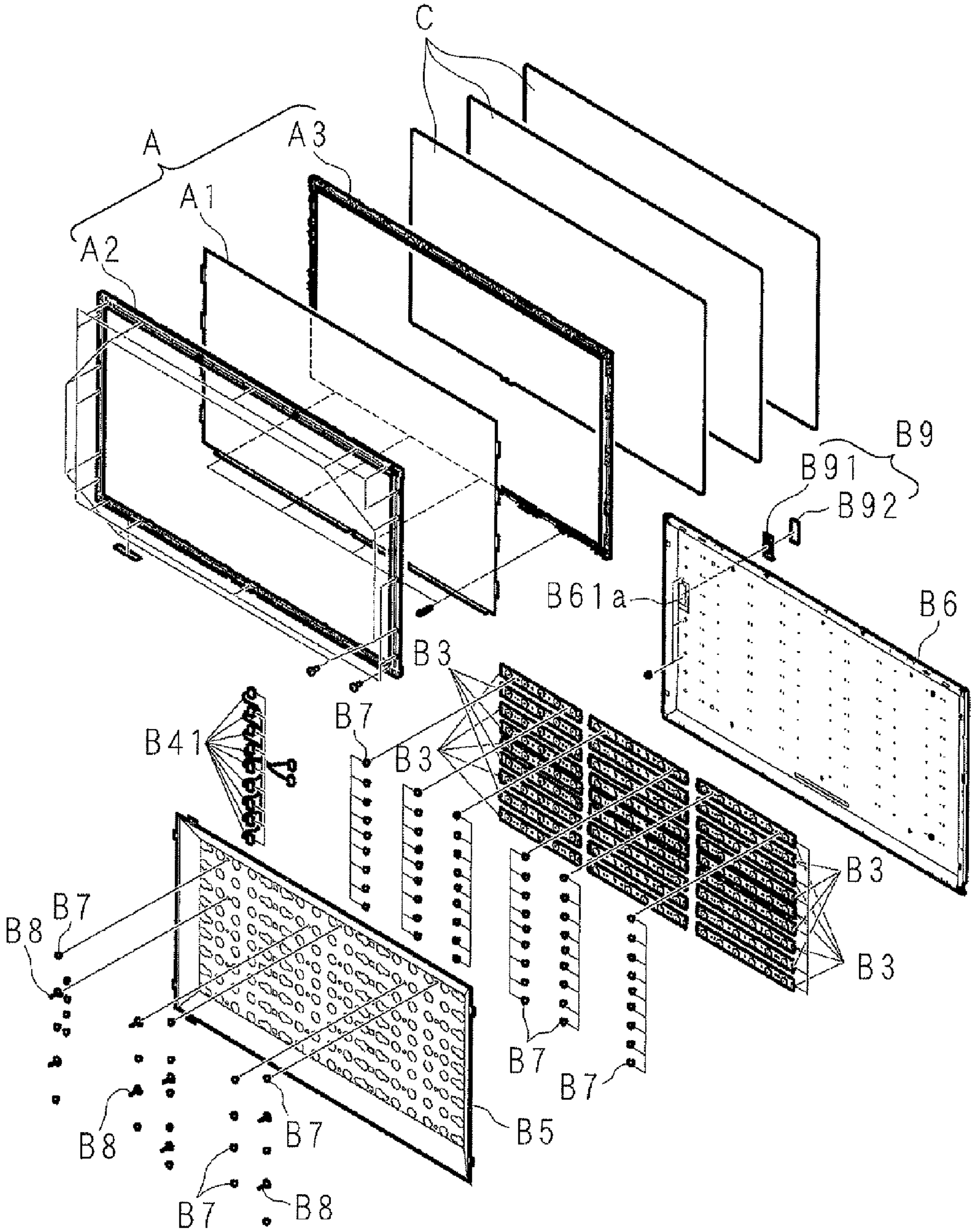
FIG. 2 is an exploded perspective view showing a configuration of the display device according to the present invention in condition where its cabinet is omitted.
Figure 3:
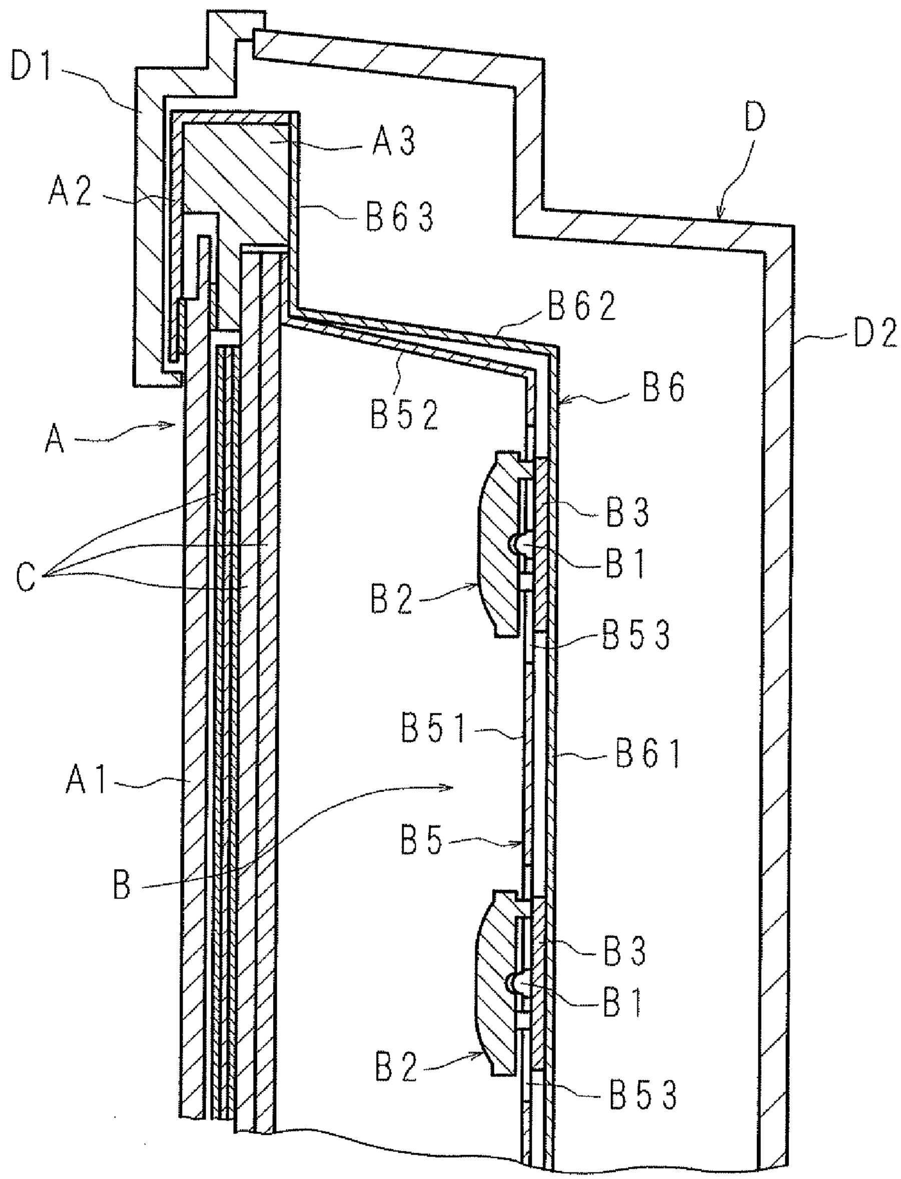
FIG. 3 is a partial vertical cross-sectional view of the configuration of the display device according to the present invention.
Figure 4:
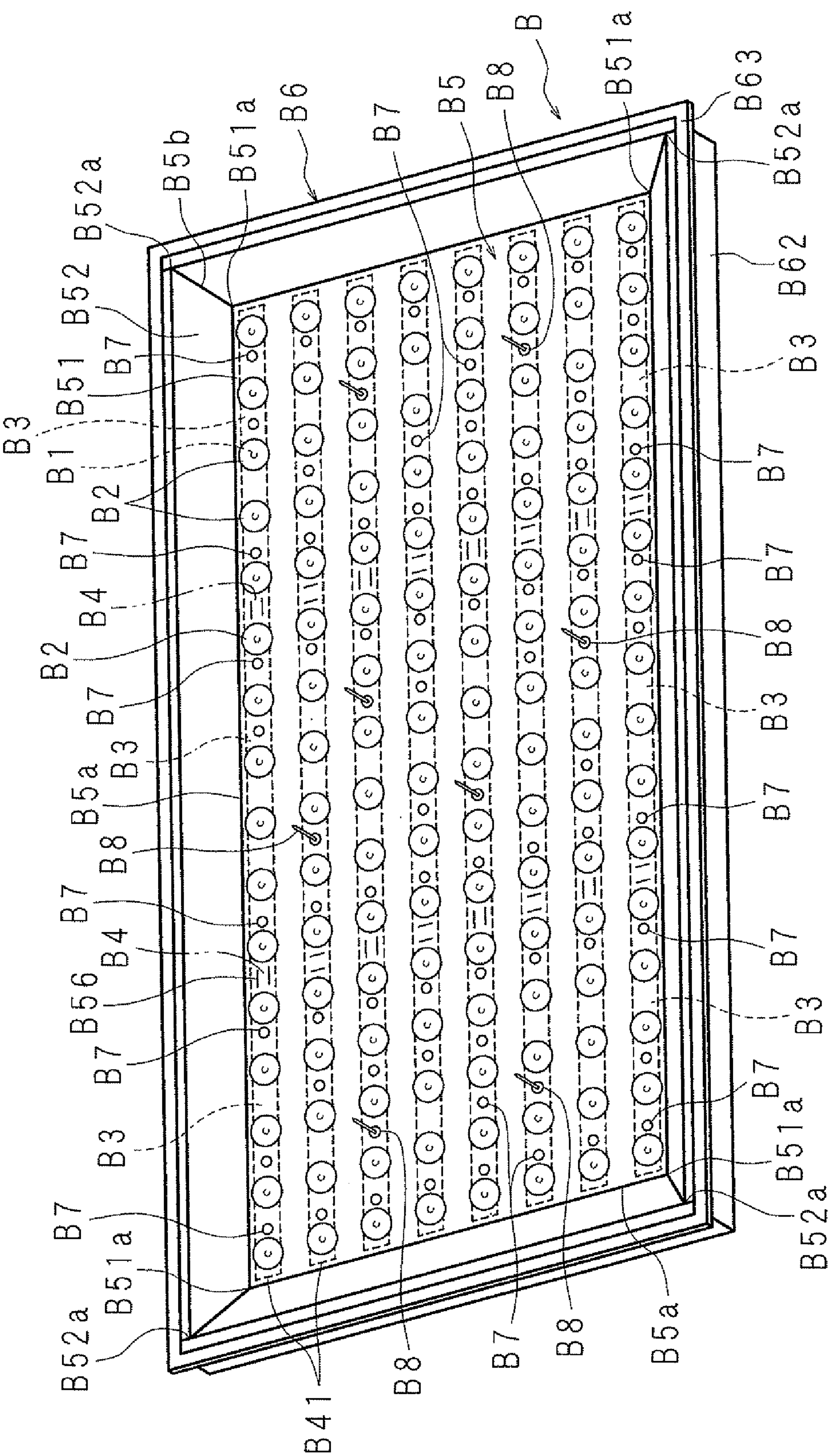
FIG. 4 is a schematic perspective view showing a configuration of a light source device according to the present invention.
Figure 5:
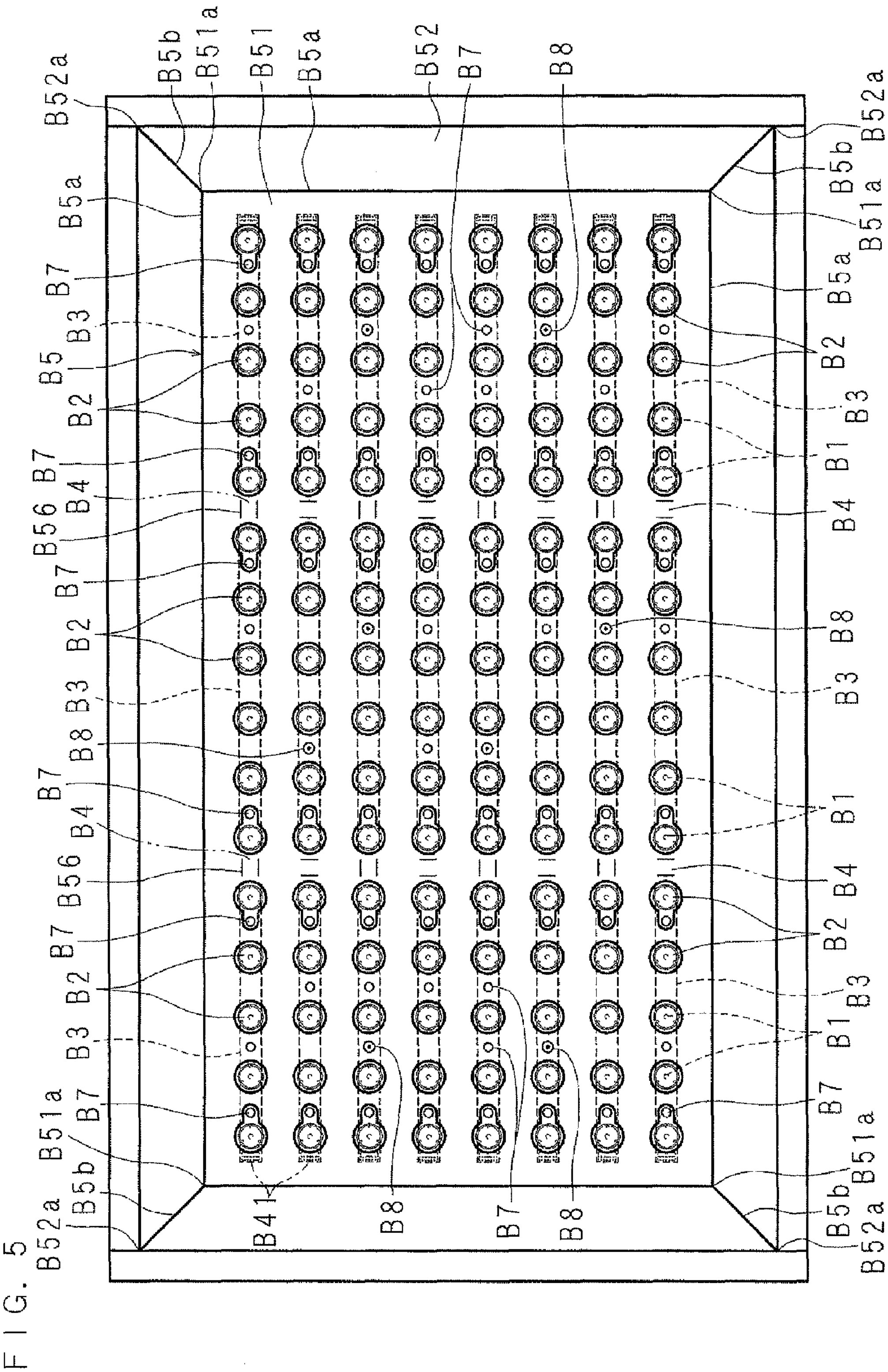
FIG. 5 is a front view showing the configuration of the light source device according to the present invention.
Figure 6:
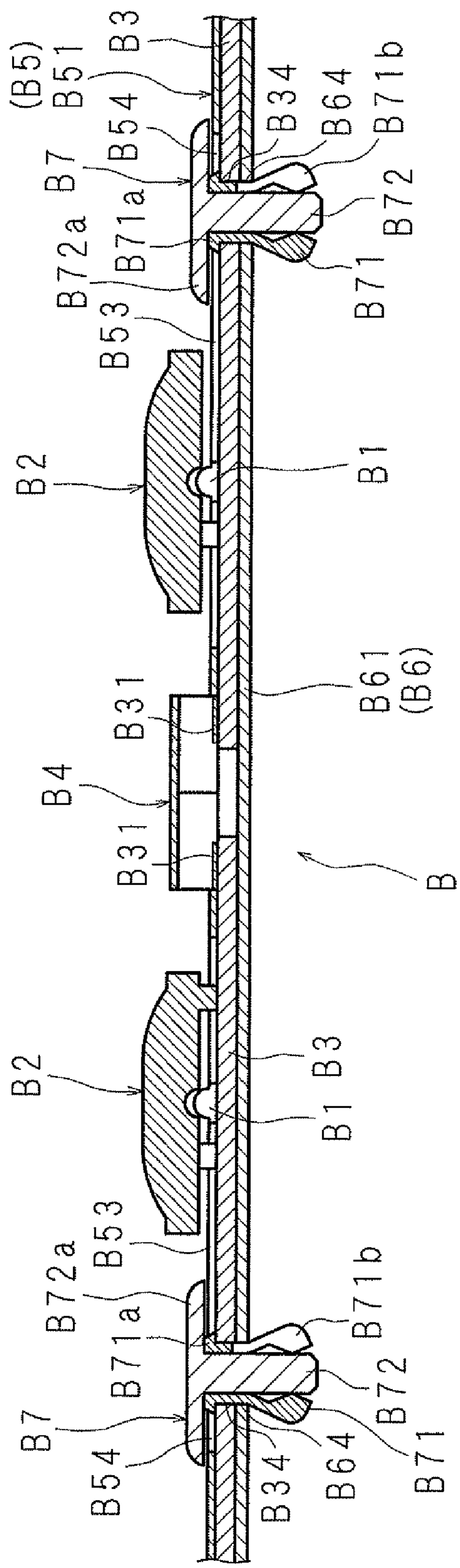
FIG. 6 is a partial vertical cross-sectional plan view showing the configuration of the light source device according to the present invention.
Figure 7:
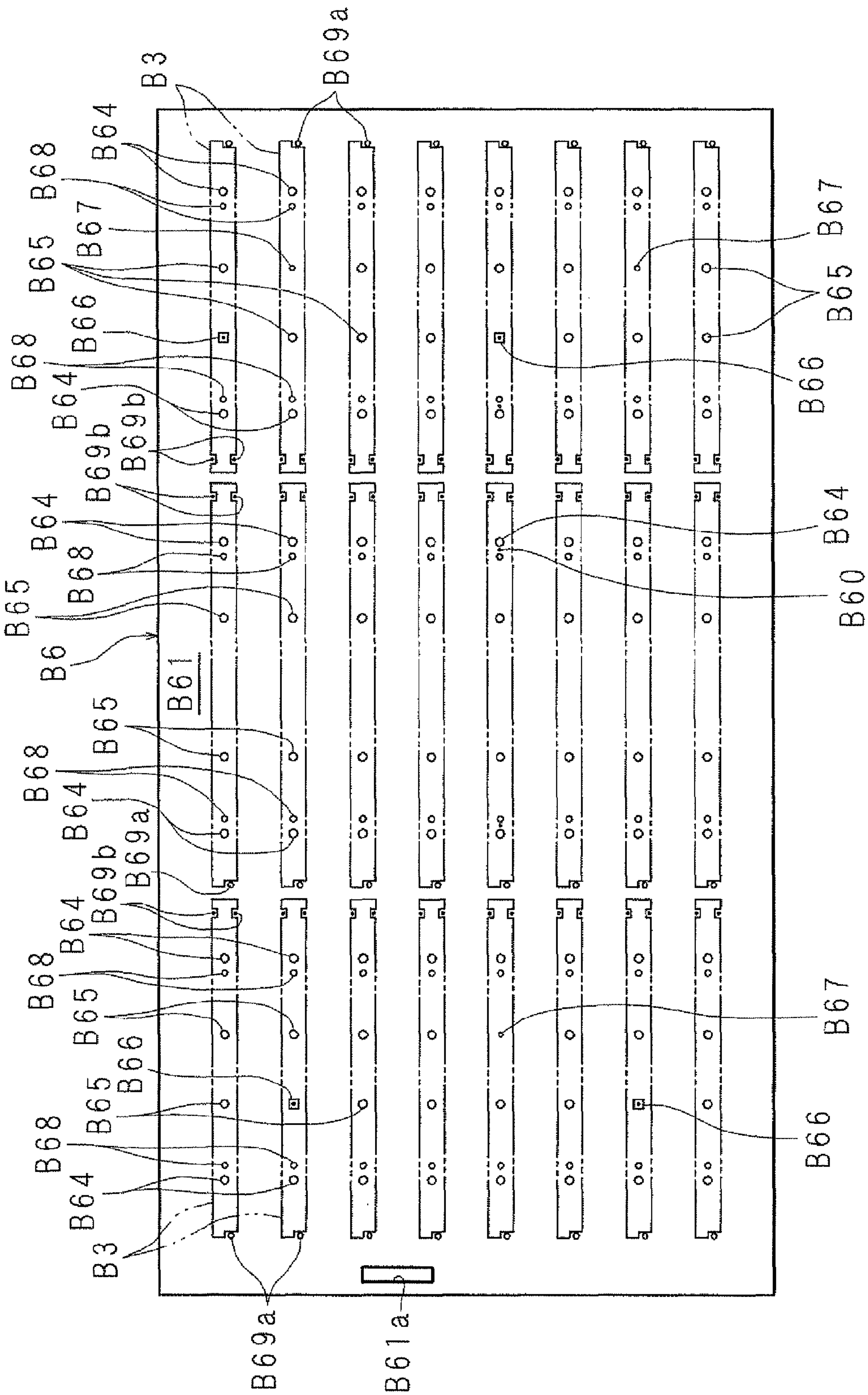
FIG. 7 is a schematic front view showing a configuration of a substrate support body.
Figure 8:
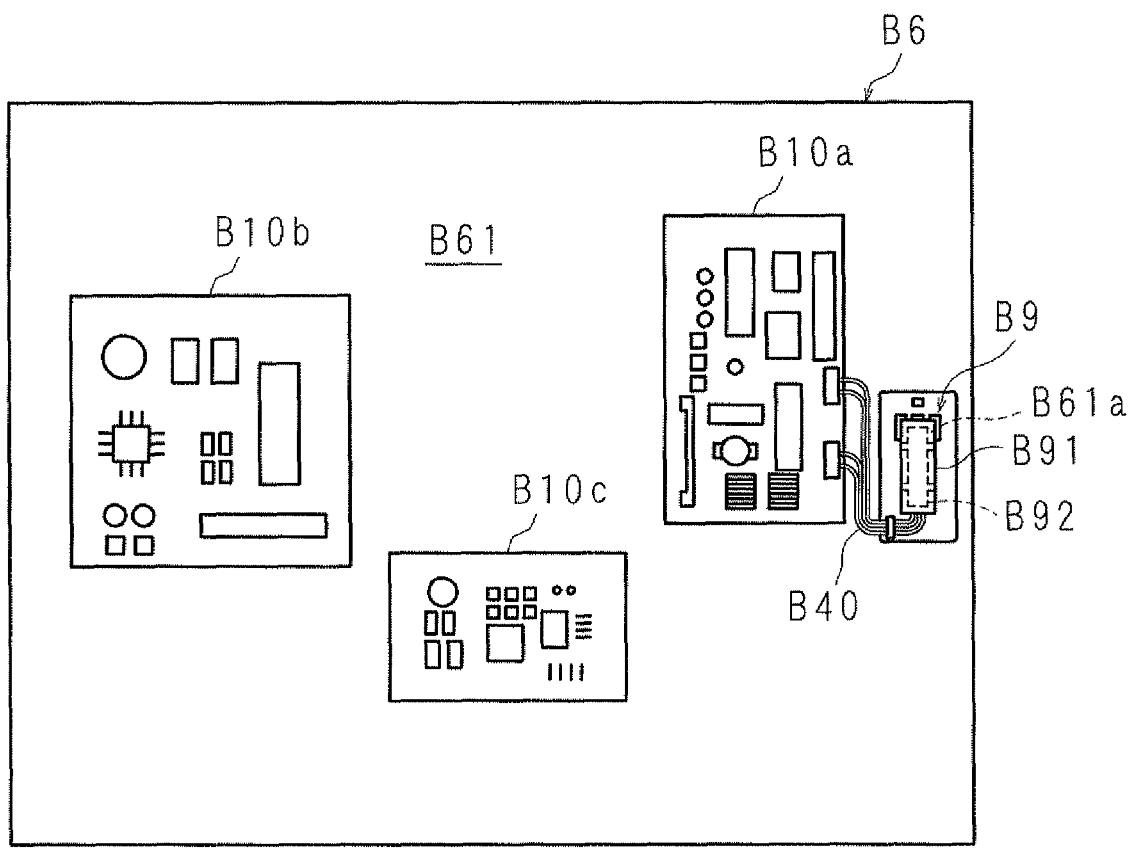
FIG. 8 is a schematic back view showing the configuration of the light source device.
Figure 9:
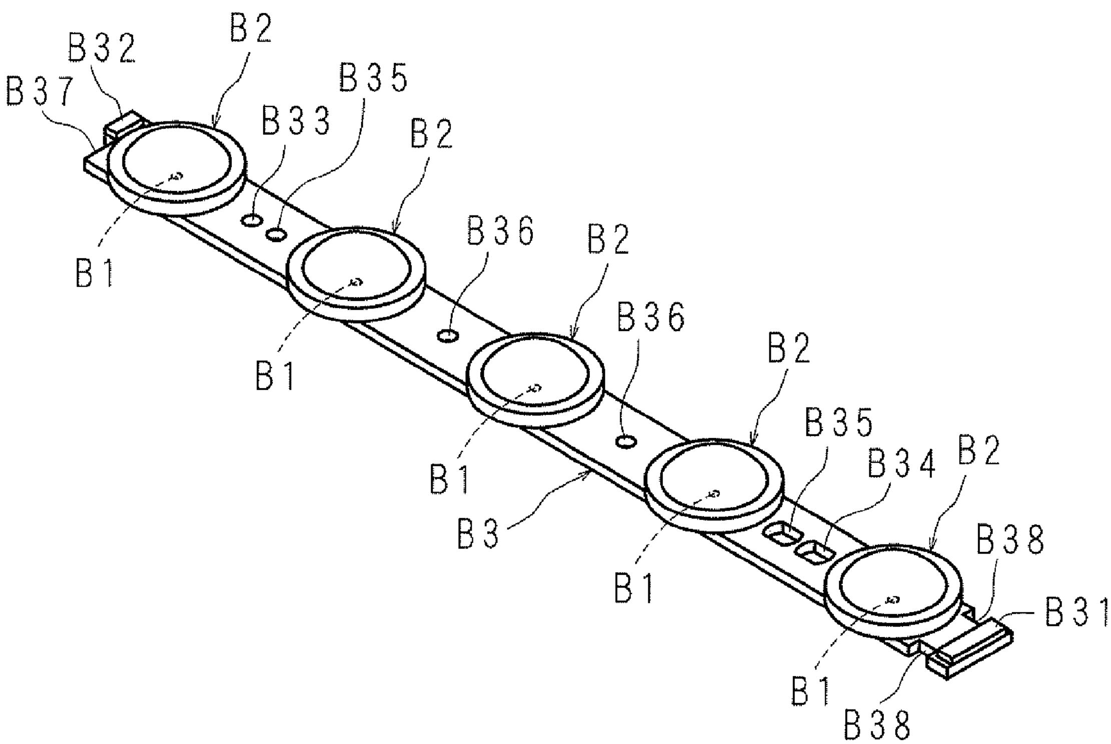
FIG. 9 is a perspective view showing a configuration of a light-emitting diode substrate.
Figure 10:
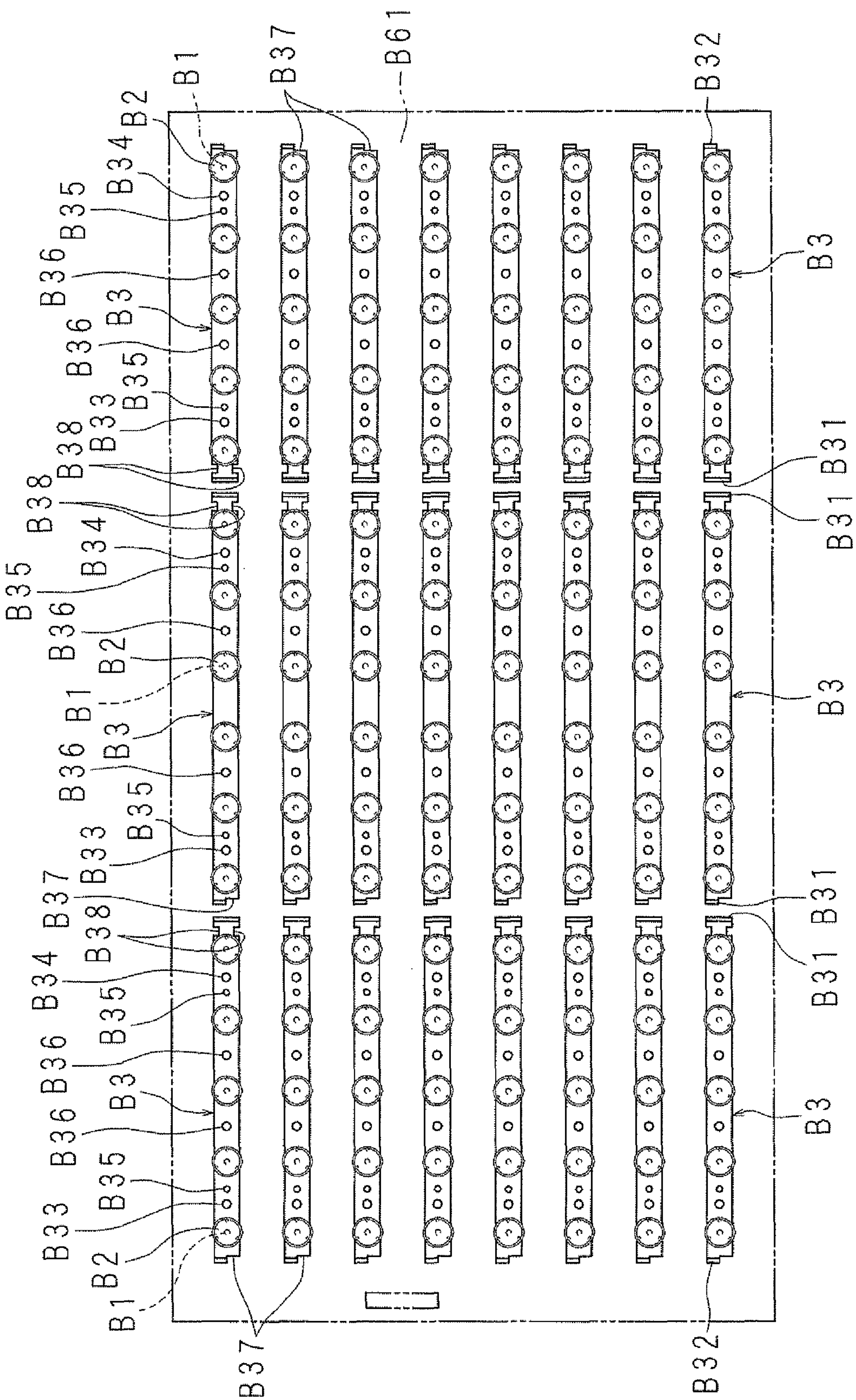
FIG. 10 is a schematic front view showing a layout of a light-emitting diode substrate.
Figure 11:
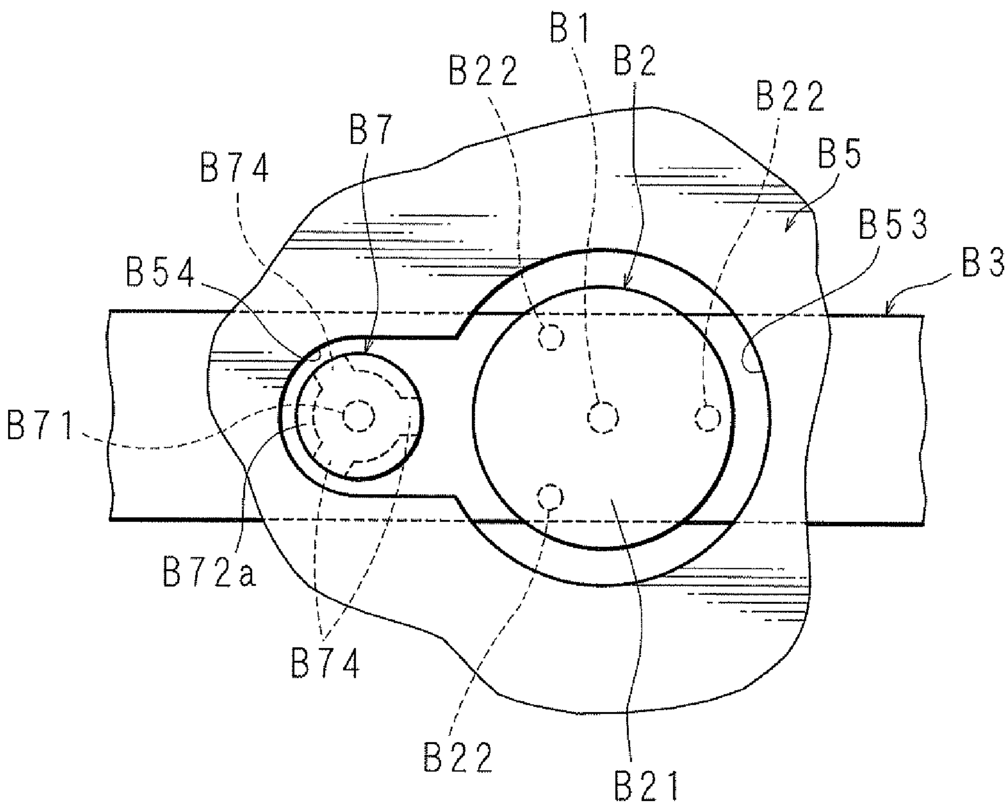
FIG. 11 is an enlarged front view showing a configuration of a lens and a shaft body portion.
Figure 12:
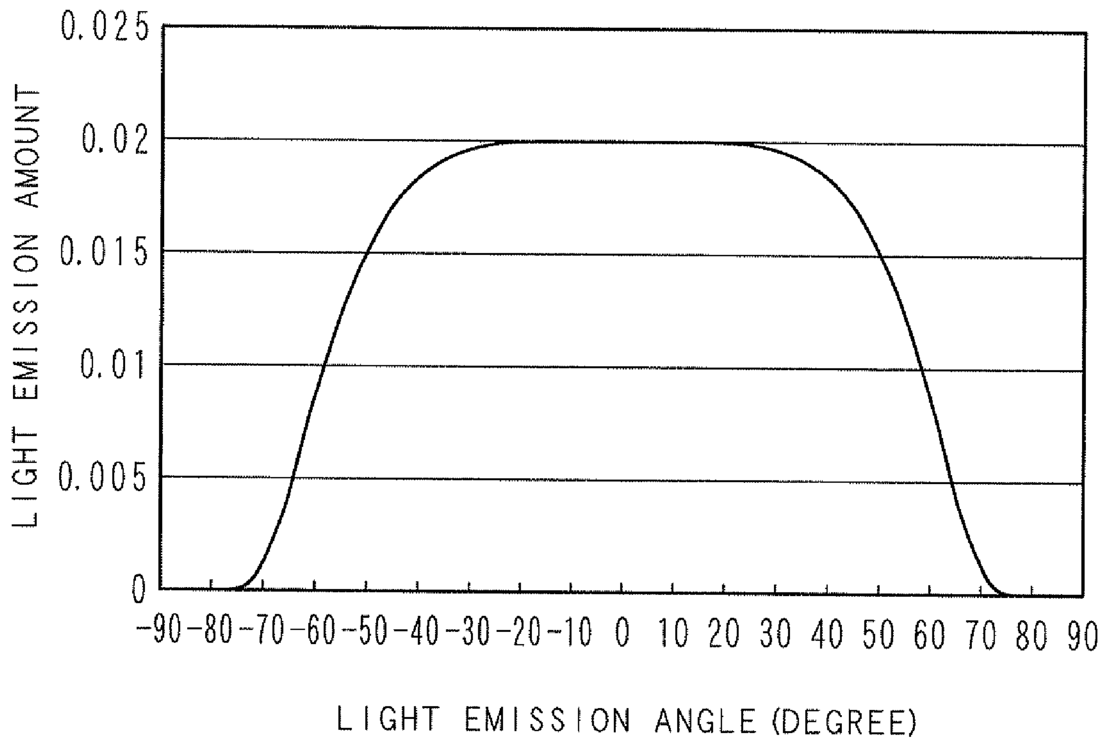
FIG. 12 is a graph showing a light emission amount as a function of a light emission angle of light emitted from the light-emitting diode.
Figure 13A:
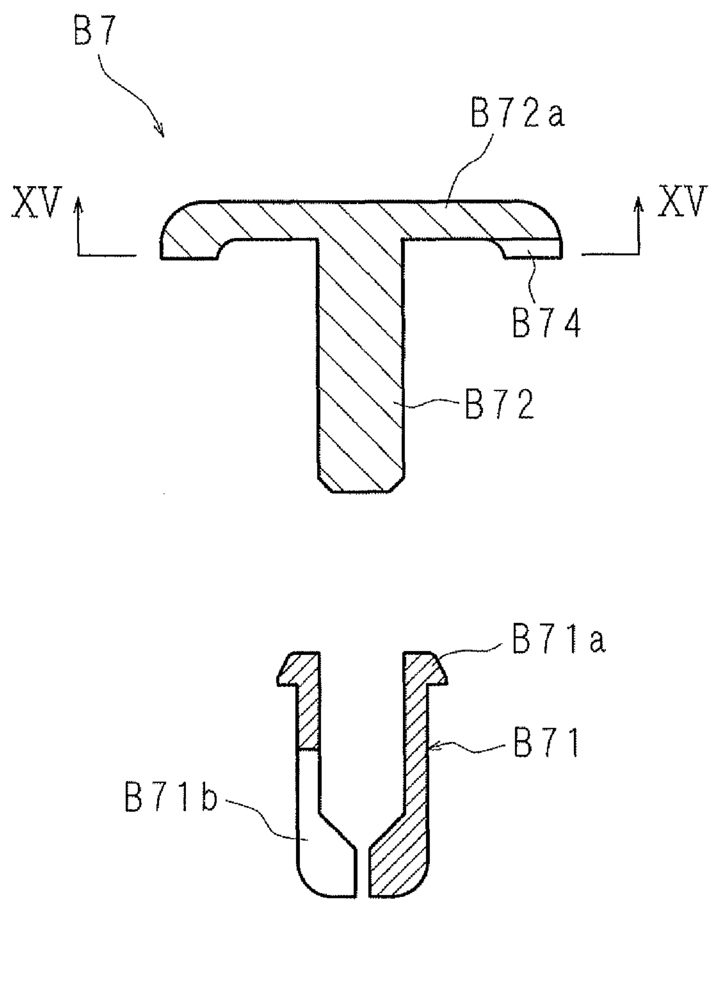
FIG. 13A is an exploded cross-sectional view showing a configuration of a shaft body.
Figure 14A:
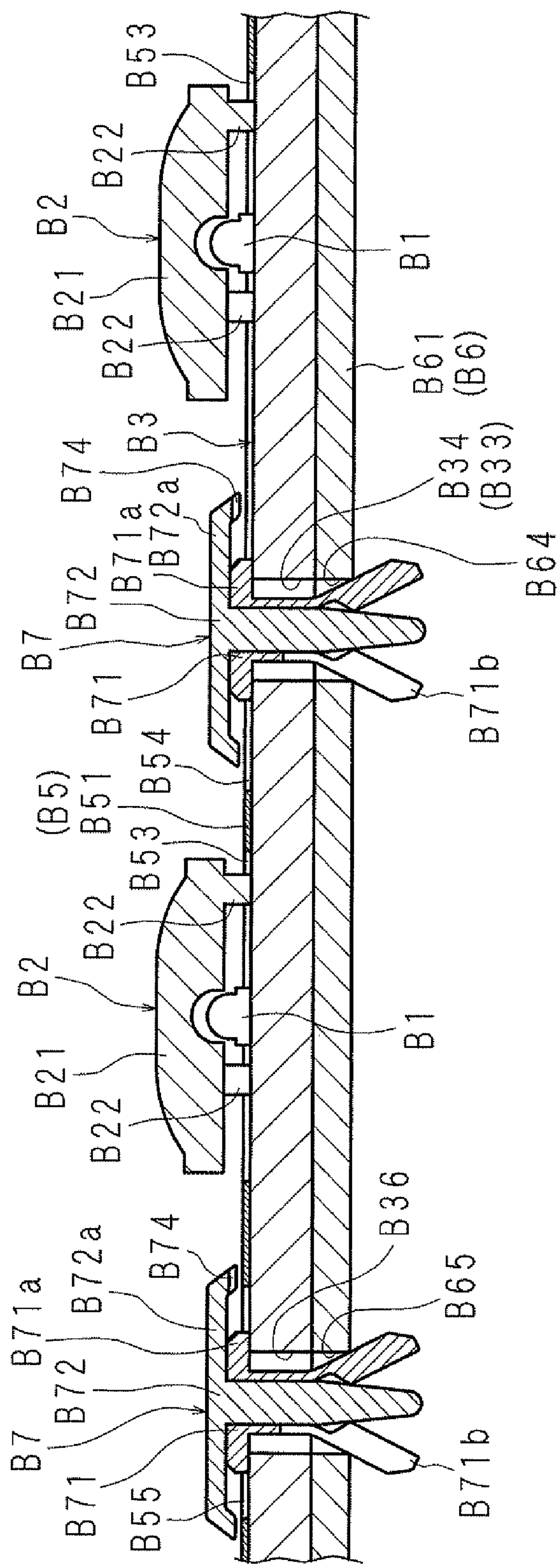
FIGS. 14A and 14B are exploded cross-sectional views showing the configuration of the shaft body portion.
Figure 14B:
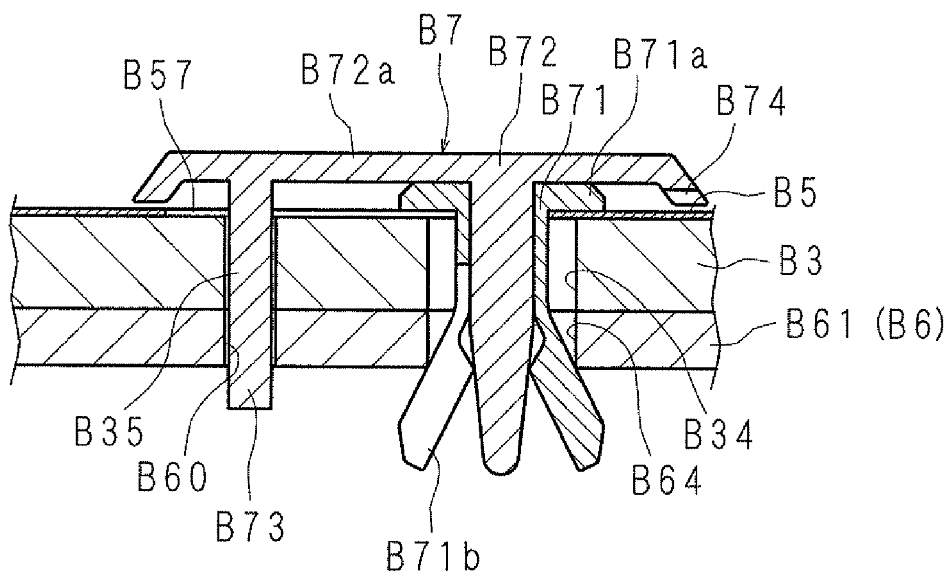
Figure 16:
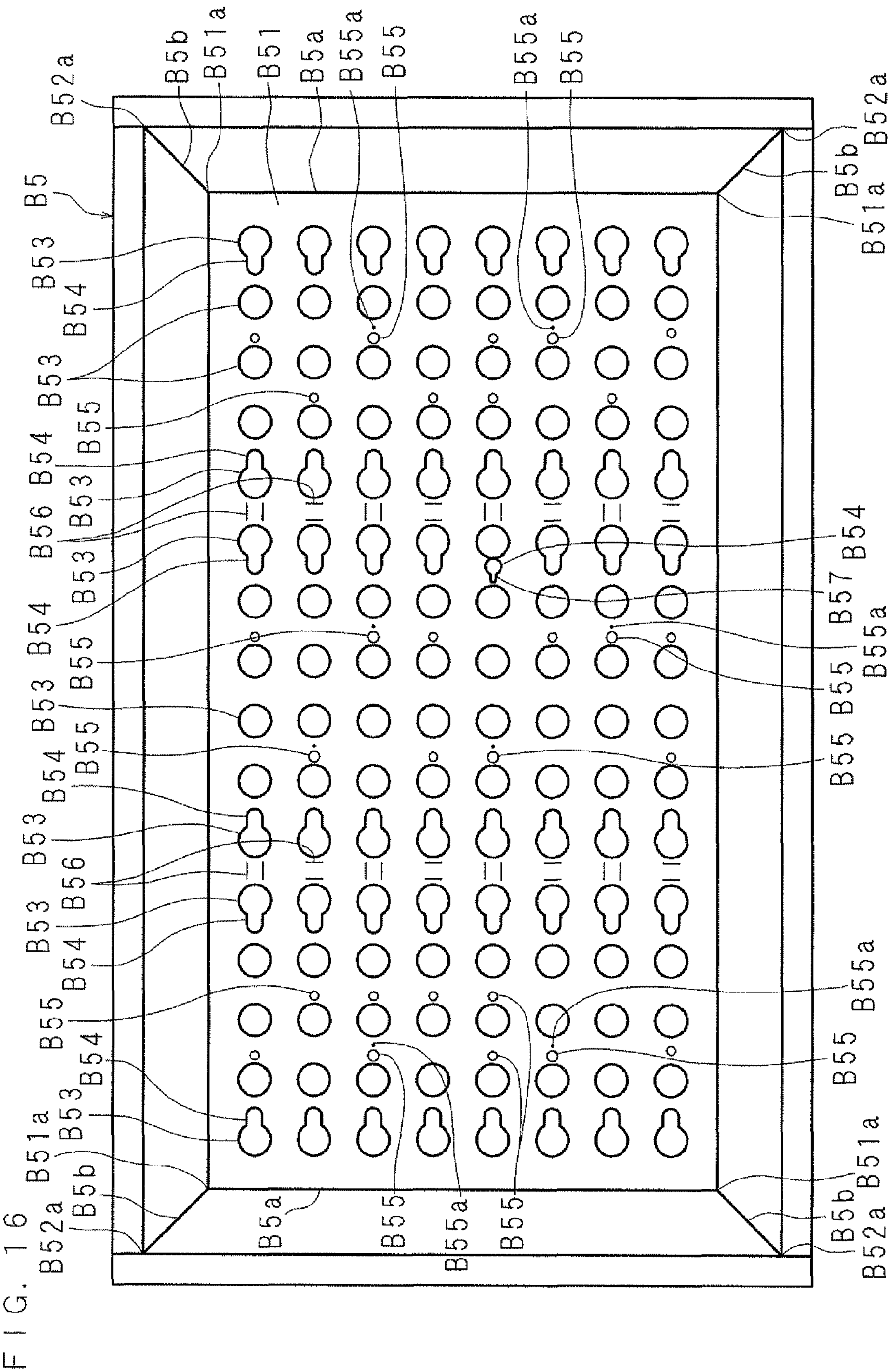
FIG. 16 is a front view showing a configuration of a reflection sheet.
Figure 17:
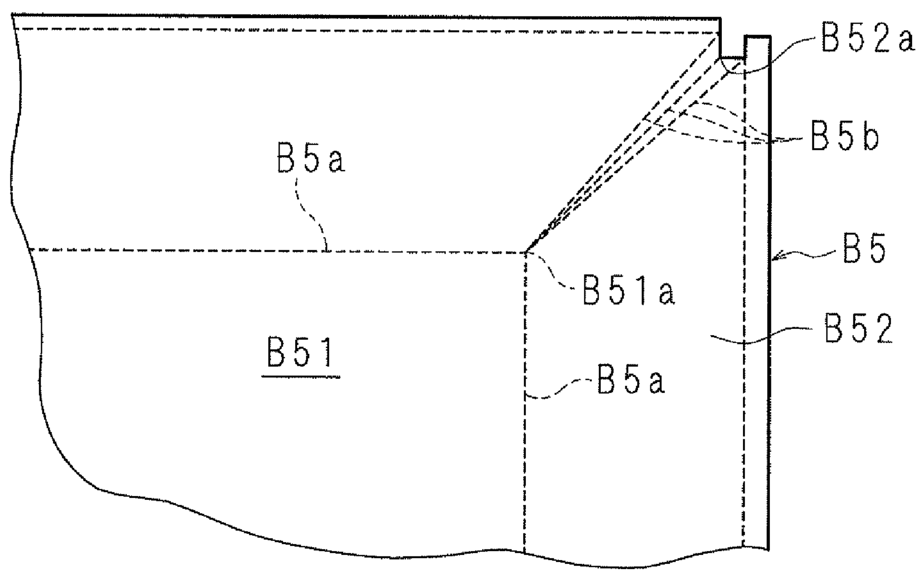
FIG. 17 is a development view showing a configuration of a corner portion of the reflection sheet.
Figure 18:
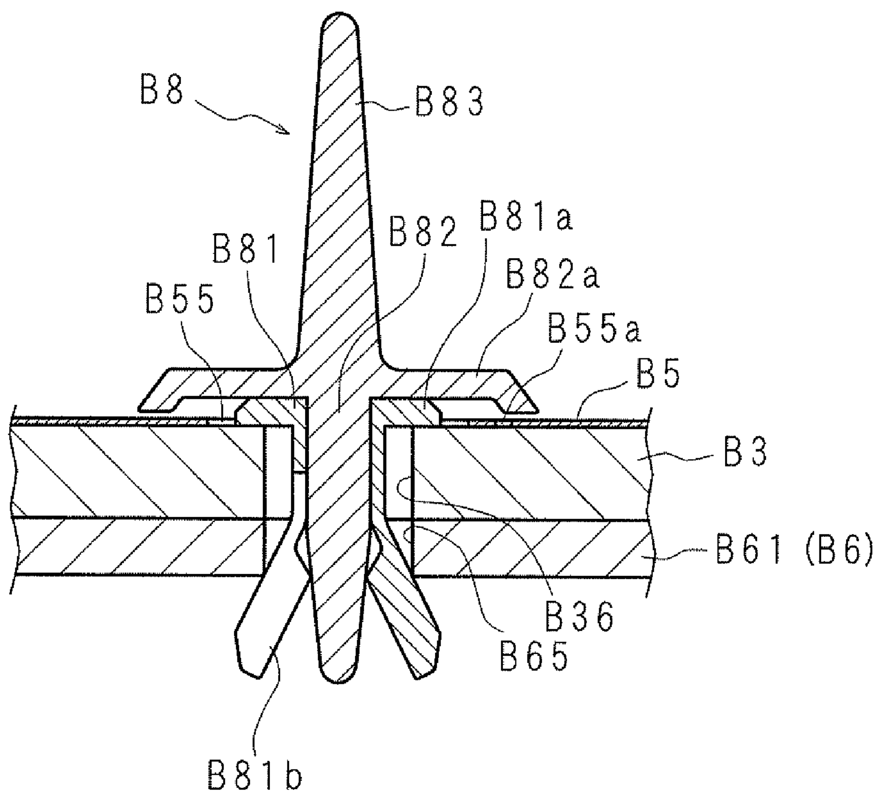
FIG. 18 is a cross-sectional view showing a configuration of a support pin.
Figure 19:
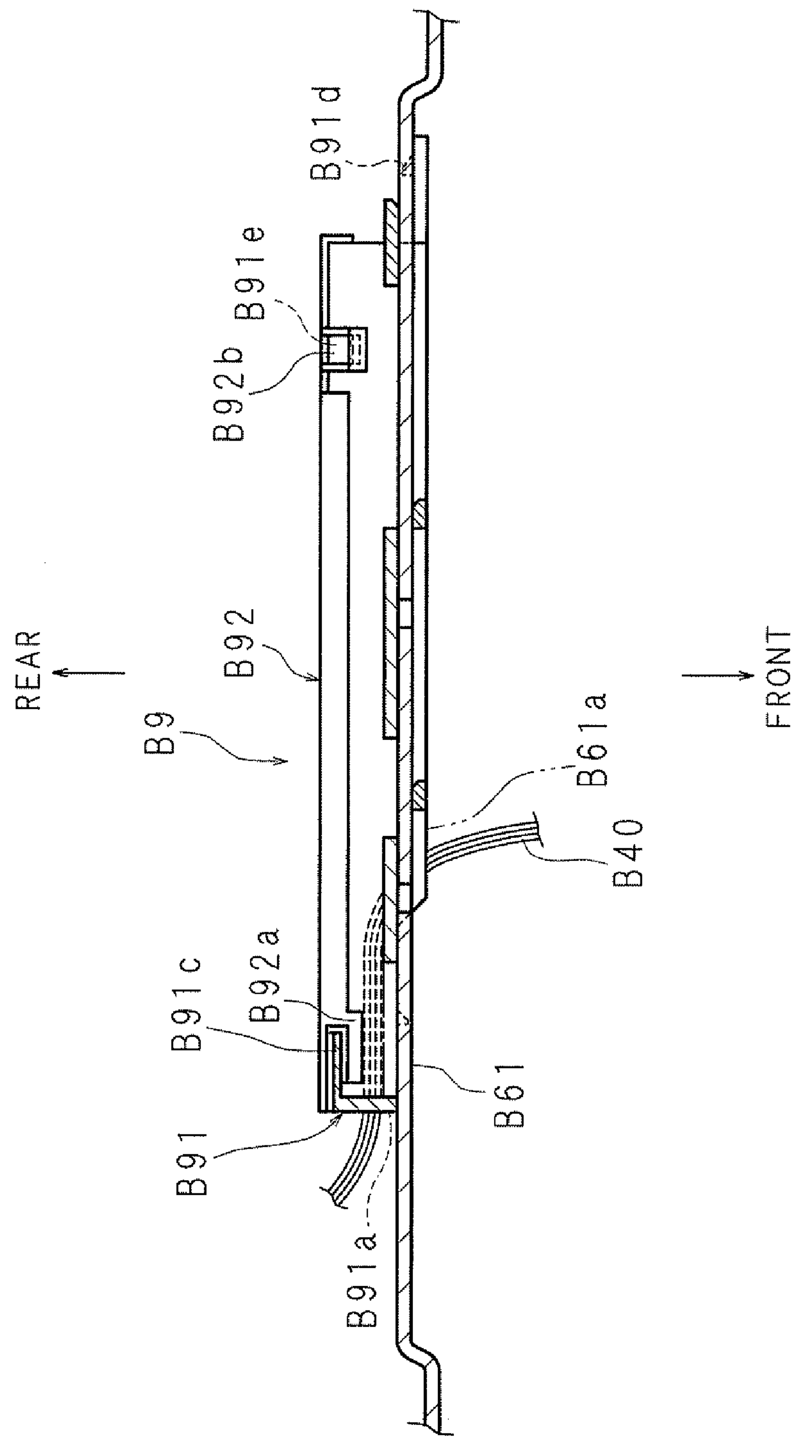
FIG. 19 is a cross-sectional view showing a configuration of a lead wire holding jig.
Figure 20:
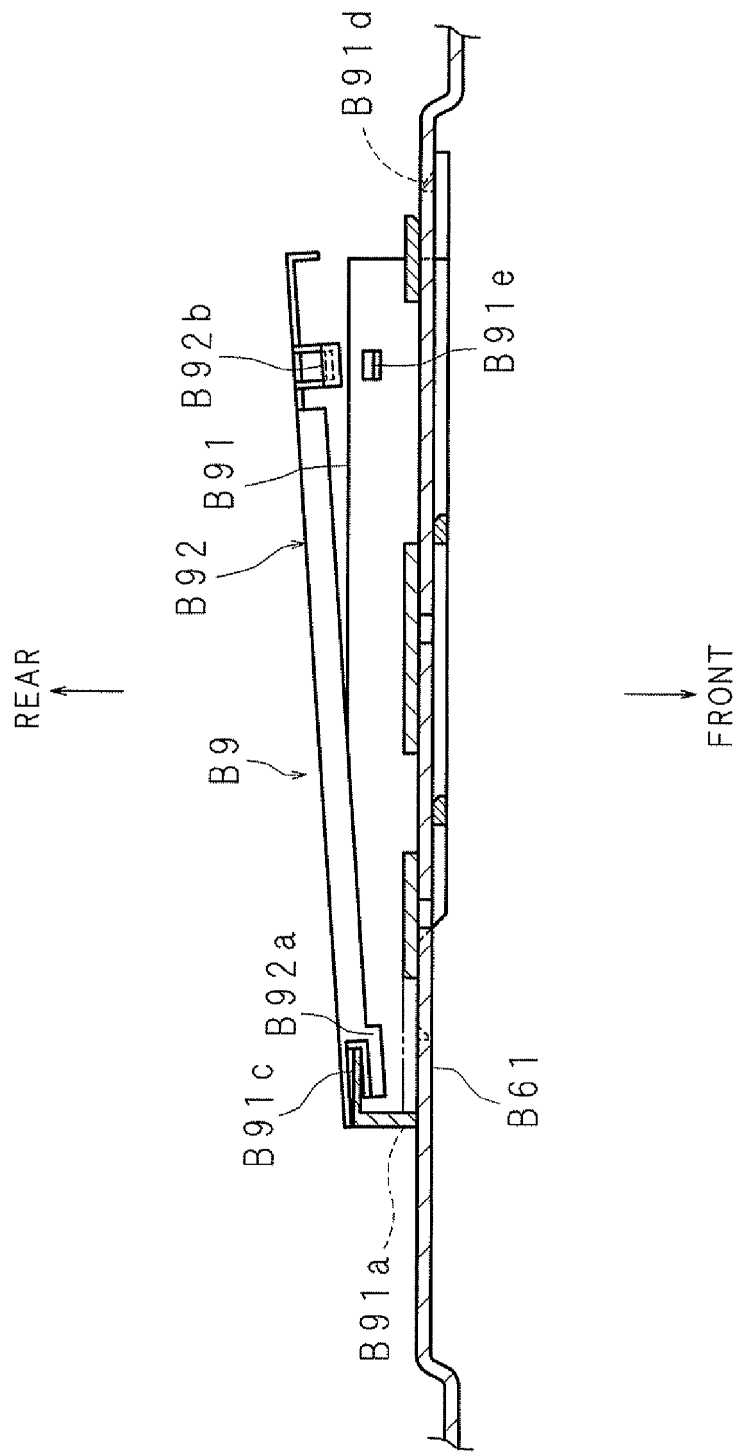
FIG. 20 is a cross-sectional view showing the lead wire holding jig in condition where its lid is opened.
Figure 22:
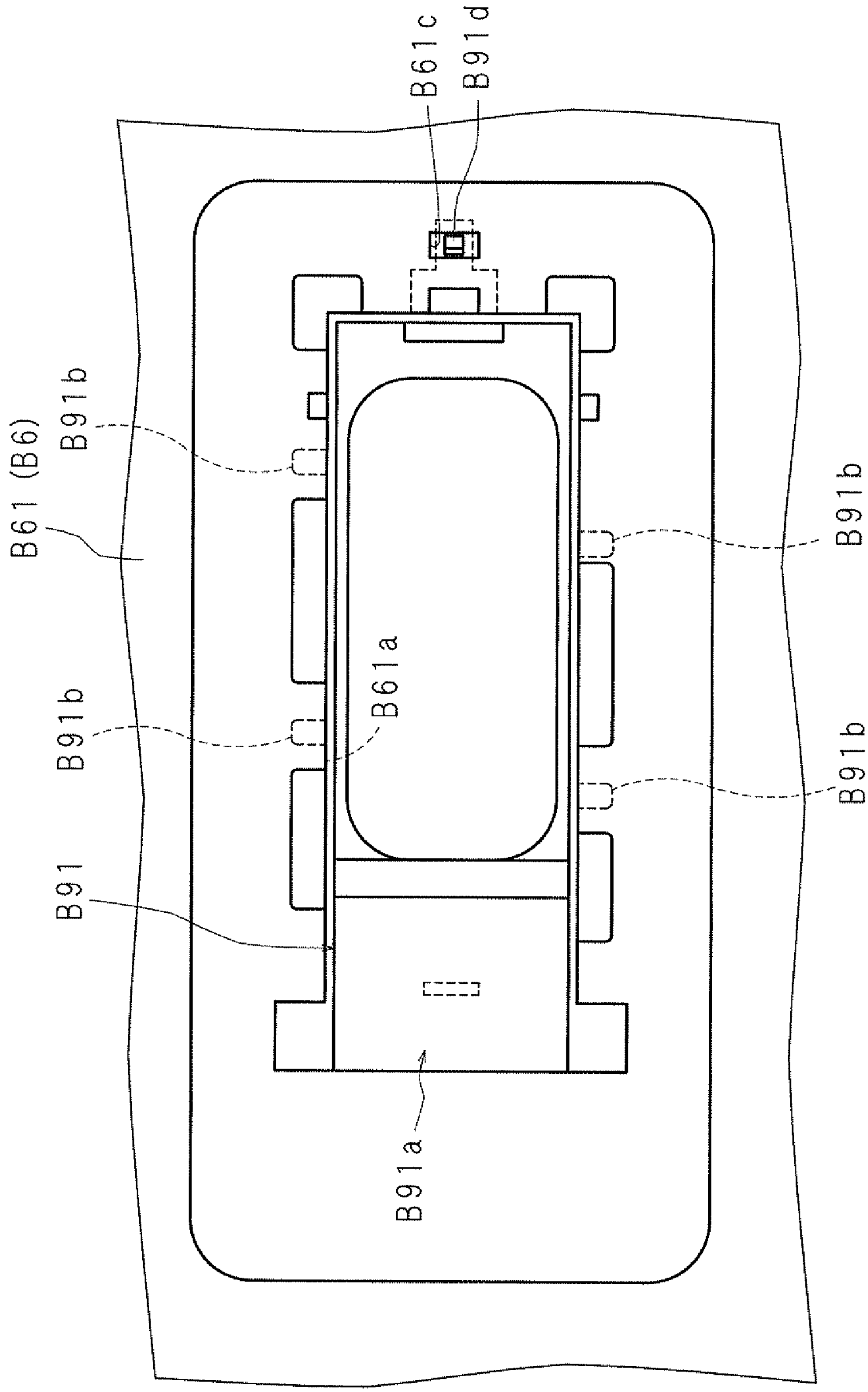
FIG. 22 is a partially enlarged view showing the lead wire holding jig in condition where its lid is removed.

FIG. 1 is a schematic exploded perspective view of a configuration of a display device according to the present invention, FIG. 2 is an exploded perspective view showing a configuration of the display device in condition where its cabinet is omitted, FIG. 3 is a partial vertical cross-sectional view of the configuration of the display device, FIG. 4 is a schematic perspective view showing a configuration of a light source device, FIG. 5 is a front view showing the configuration of the light source device, FIG. 6 is a partial vertical cross-sectional plan view showing the configuration of the light source device, FIG. 7 is a schematic front view showing a configuration of a substrate support body, FIG. 8 is a schematic back view showing the configuration of the light source device, FIG. 9 is a perspective view showing a configuration of a light-emitting diode substrate, FIG. 10 is a schematic front view showing a layout of the light-emitting diode substrate, FIG. 11 is an enlarged front view showing a configuration of a lens and a shaft body portion, FIG. 12 is a graph showing a light emission amount as a function of a light emission angle of light emitted from the light-emitting diode, FIG. 13A is an exploded cross-sectional view showing a configuration of a shaft body, FIG. 13B is an exploded perspective view showing the configuration of the shaft body, FIGS. 14A and 14B are exploded cross-sectional views showing the configuration of the shaft body portion, FIG. 15 is an enlarged cross-sectional view taken along line XV-XV of FIG. 13A, FIG. 16 is a front view showing a configuration of a reflection sheet, FIG. 17 is a development view showing a configuration of a corner portion of the reflection sheet, FIG. 18 is a cross-sectional view showing a configuration of a support pin, FIG. 19 is a cross-sectional view showing a configuration of a lead wire holding jig, FIG. 20 is a cross-sectional view showing the lead wire holding jig in condition where its lid is opened, FIG. 21 is a perspective view showing a configuration of a lead hole portion in a substrate support body, and FIG. 22 is a partially enlarged view showing the lead wire holding jig in condition where its lid is removed.

The display device shown in FIGS. 1 to 3 includes a roughly rectangular solid-shaped display unit A having a display surface displaying a TV image on its front side, a roughly rectangular solid-shaped light source device B disposed behind this display unit A, an optical sheet C disposed between the light source device B and the display unit A, and a cabinet D for shielding a rim of the display unit A and a rear side of the light source device B.

<Configuration of Display Unit A>

As shown in FIGS. 1 to 3, the display unit A has a roughly rectangular solid-shaped liquid crystal display panel A1 having the display surface and a front holding frame body A2 and a rear holding frame body A3 for holding the rim of this display panel A1 in condition where it is sandwiched by them between the front and the rear, in a configuration that the rim of the display panel A1 is held as sandwiched between the front and the rear by binding the front holding frame body A2 and the rear holding frame body A3 by using a plurality of male screws. A portion of the display unit A that is not sandwiched by the front holding frame body A2 and a rear holding frame body A3 has a plurality of holes formed in it for attaching the rim of the display unit A to the light source device B.

<Configuration of Light Source Device B>

As shown in FIGS. 1 to 6, the light source device B includes a plurality of light-emitting diodes B1 serving as a light source that are spaced in two directions perpendicular to each other and arranged in a grid, a group of circuit boards that have a plurality of light-emitting diode substrates 83 arranged in one direction and thoroughly mounted on its one surface with these light-emitting diodes B1 and lenses B2 each of which faces the top of each of the light-emitting diodes B1 and that are arranged in a plurality of lines, a plurality of connectors B4 connecting the neighboring light-emitting diode substrates B3 on the circuit board group, a reflection sheet B5 facing the one surface and one surface of the connector B4 for reflecting light diffused by the lens B2, a substrate support body B6 for supporting the circuit board group arranged in a plurality of lines on its one surface, a plurality of shaft bodies B7 for fixing both ends of each of the light-emitting diode substrates B3 to the substrate support body B6, a plurality of support pins B8 for suppressing flexure of the optical sheet C, a lead wire holding jig B9 for bundling and holding midsections of a plurality of lead wires B40 connected to the light emitting diode substrate B3, and a plurality of circuit boards B10 disposed on an outer surface of the substrate support body B6.

<Configuration of Substrate Support Body B6>

The substrate support body B6 is made of a metal plate and, as shown in FIGS. 2 to 4, shaped like a case and includes a roughly rectangular plate-shaped plate portion B61 and four collar pieces B63 that connect to a frame portion B62 connecting to the rim of this plate portion B61 and having an open front and to outer edges of this frame portion B62.

As shown in FIG. 7, the plate portion B61 includes a plurality of first attachment holes B64 into which the shaft bodies B7 for fixing both ends of the light-emitting diode substrate B3 are fitted, a plurality of second attachment holes B65 for attachment of the shaft bodies B7 so that the support pin B8 or the reflection sheet B5 may be inhibited from deviating in a direction in which it separates from the light-emitting diode substrate B3, a plurality of third attachment holes B66 for attachment of accessories such as the circuit board B10 to the other surface of the plate portion B61, a plurality of positioning holes B67 for positioning the substrate support body B6 to a form block for forming it, a plurality of positioning convex portions B68 for positioning the light-emitting diode substrate B3, convex-shaped first and second indexes B69*a* and B69*b* for preventing a mistake in assembly of the light-emitting diode substrate B3, and a whirl-stop hole B60 disposed around one of the first attachment holes B64.

The first attachment holes B64 are spaced and arranged in one direction in a configuration that the plurality of attachment holes B64 arranged in one direction make a hole string and a plurality of the hole strings are arranged in parallel with each other. The second attachment hole B65 is formed between the two first attachment holes B64 formed in one of the light-emitting diode substrates B3 and disposed at a plurality of positions separate from each other and having the same size as the first attachment hole B64.

The third attachment hole B66 is formed at a position that faces the light-emitting diode substrate B3 between the two first attachment holes B64 formed in one of the light-emitting diode substrates B3 and arranged to be blocked up by the light-transmitting diode substrate B3. The periphery of the third attachment hole B66 is depressed toward the other surface side so that the end of a shaft part fitted into the third attachment hole B66 from this other surface side may not abut against the light-emitting diode substrate B3. The positioning hole B67 is arranged to be blocked up by the light-emitting diode substrate B3 as it is formed between the two first attachment holes B64 formed in one of the light-emitting diode substrate B3 and disposed at three positions separate from each other and facing the light-emitting diode substrate B3. The positioning convex portion B68 is formed so that it may project on the one surface at part of the position facing the rim of each of the light-emitting diode substrates B3. The whirl-stop hole B60 has a diameter smaller than the first attachment hole B64 and is formed at a position slightly separate from the first attachment hole B64 disposed at the midsection of the plate portion B61.

On one surface of the plate portion B61 the circuit board group is housed and supported in a plurality of lines, while on the other surface of the plate portion B61 and on one length-directional side, as shown in FIG. 8, a power supply circuit board B10*a* is mounted which is connected via a second connector B41 to one light-emitting diode substrate B3 among the circuit board group and on the other length-directional side a control circuit board B10*b* is mounted which drives and controls the display unit A.

On one length-directional side of the plate portion B61, as shown in FIG. 8, a lead hole B61*a* is formed for leading a lead wire B40 of each of the connectors B41 to the other side of the plate portion B61, outside which lead hole B61*a* the lead wire holding jig B9 is attached. At the inner edge of the lead hole B61*a*, a plurality of recess portions B61*b* are formed and around the lead hole B61*a* a recess lock portion B61*c* is provided as shown in FIG. 21.

On the lower side at the length-directional midsection on the other surface of the plate portion B61, a signal processing circuit board B10*c* is mounted which processes an image signal displayed on the display surface of the display unit A. At a plurality of circumference directional positions of the collar piece B63, an attachment hole corresponding to the hole in the display unit A is formed and arranged to bind the display unit A to the substrate support body B6 through tightening of the male screws.

<Configuration of Light-Emitting Diode Substrate B3>

As shown in FIG. 9, the light-emitting diode substrate B3 is shaped like an oblong having a circuit portion on its one surface as well as the light-emitting diode B1 and the lens B2 mounted on it and a male-type or female-type connecting portion B31 on one surface of its one end and a female-type or male-type connecting portion B32 on one surface of the other end. On the light-emitting diode substrate B3, through holes B33 and B34 corresponding to the first attachment holes B64 are formed on the respective two ends, positioning recesses B35 corresponding to the respective two positioning convex portions B68 are formed between the two positions of the through holes B33 and B34, a fit-in hole B36 corresponding to the second attachment hole B65 is formed between the positioning recesses B35, and a first recess marker B37 corresponding to the first index B69*a* is formed at one length-directional end so that the light-emitting diode substrates B3 having the different connecting portion structures at their respective two ends may not be disposed in a wrong direction, and, further, a second recess marker B38 corresponding to the second index B69*b* is formed in both width-directional sides of one length-directional end so that the later-described two kinds of light-emitting diode substrates B3 (first substrate and second substrate) may not be disposed mistakenly. One of the positioning recesses B35 is formed at a position facing the whirl-stop hole B60. The circuit board group is configured by arranging the plurality of light-emitting diode substrates B3 having the same or different lengths in one direction as shown in FIG. 10. The group of the circuit boards having the different lengths can be formed by, for example, selecting any one of the light-emitting diode substrate B3 from among three kinds of a short light-emitting diode substrate mounted with the evenly spaced five light-emitting diodes B1, a medium-length light-emitting diode substrate mounted with the evenly spaced six light-emitting diodes B1, and a long light-emitting diode substrate mounted with the evenly spaced seven or eight light-emitting diodes B1 and combining it in one direction as shown in FIGS. 5 and 10.

The light-emitting diodes B1 have large irregularities in luminance, so that the circuit board groups has the high-luminance light-emitting diode B1 and the low-luminance light-emitting diode B1 arranged alternately in order to make the luminance uniform, in a configuration that the light-emitting diode substrate B3 includes a first substrate on which the light-emitting diodes B1 are arranged in a descending order of luminance and a second substrate on which the light-emitting diodes B1 are arranged in an ascending order of luminance, those two first and second substrates being colored differently so that they can be distinguished from each other at first glance.

The through hole B33 formed at the one end of the light-emitting diode substrate B3 is formed smaller in diameter than the through hole B34 formed at the other end, a gap between the small-sized through hole B33 and the shaft body B7 fit into it is decreased, and a gap between the larger-sized through hole B34 and the shaft body B7 fitted into it is increased to enable moving the side of larger-sized through hole B34 in the width-direction around the shaft body B7 fitted into the smaller-sized through hole B33 so that no overload may be applied to the connector B4 that interconnects the ends of the respective light-emitting diode substrates B3 arranged in the line direction.

The distance between the positioning recesses B35, B35 formed at the respective two positions on one light-emitting diode substrate B3 changes with the changing length of the light-emitting diode substrate B3 and is small for the short light-emitting diode substrate B3, medium for the medium-length light-emitting diode substrate B3, and large for the long light-emitting diode substrate B3 so that the light-emitting diode substrates B3 having the different lengths may not be arranged mistakenly.

The first marker B37 is formed by caving in a portion of the length-directional end to place the first index B69*a* into this marker B37 so that if the light-emitting diode substrate B3 having the different connecting portion structure of the both ends is allocated in a wrong direction, the first index B69*a* may be shielded by the light-emitting diode substrate B3 and cannot be recognized visually to confirm the mistake in allocation direction of the light-emitting diode substrate B3. The second marker B38 is formed by caving in width-directional two sides of the one length-directional end place, the second index B69*b* is arranged into this marker B38 so that if the first and second substrate of the light-emitting diode substrate B3 are arranged mistakenly, the second index B69*b* may be shielded by the light-emitting diode substrate B3 and cannot be recognized visually to confirm the mistake in kind of the light-emitting diode substrate B3.

<Configuration of Lens B2>

As shown in FIGS. 6 and 11, the lens B2 faces the top of the light-emitting diode B1 apart from it and includes a thick disc-shaped translucent portion B21 having a hemispherical recess portion for diffusing light emitted from this light-emitting diode B1 in all directions and three projections B22 that project toward the light-emitting diode substrate B3 from a face of this translucent portion B21 that faces the light-emitting diode B1 in a configuration that the tip of this projection B22 is attached around the light-emitting diode B1 on one surface of the light-emitting diode substrate B3 by using an adhesive agent. FIG. 12 shows a light emission amount as a function of a light emission angle of light emitted by the light-emitting diode. The light emission amount is measured at a position 20 mm apart from the light-emitting diode B1. FIG. 12 shows that no light is emitted at a light emission angle of at least 70 degrees with respect to a light emission angle of zero degree (at the top of the light-emitting diode B1).

<Configuration of Shaft Body B7>

The shaft body B7 fitted into the first attachment hole B64 to fix the both ends of the light-emitting diode substrate B3 is common to the shaft body B7 fitted into the second attachment hole B65 to inhibit the reflection sheet B5 from deviating in a direction away from the light-emitting diode substrate B3. Since the through holes B33 and B34 are formed at the respective two ends of the light-emitting diode substrate B3, the shaft body B7 is fitted through those through holes B33 and B34 at those ends into the first attachment hole B64 so that in a configuration that the plurality of light-emitting diode substrates B3 are arranged as shown in FIG. 10, both ends of the light-emitting diode substrate B3 can be fixed securely without forgetting to fit in the shaft body B7 or fitting it mistakenly. As shown in FIGS. 13A, 13B, 14A, and 14B, the shaft body B7 has a synthetic resin-made flexible tube B71 and a synthetic resin-made pin B72 fitted into this flexible tube B71. The flexible tube B71 has a small-diameter head portion B71*a* at its one end and a plurality of axis length-directional slits B71*b* and an inward expanding bulgy portion, in a configuration that a portion piece between the slits B71*b* is axially flexible, the flexible tube B71 is fitted into the through hole B33 or B34 and the first attachment hole B64, and the head portion B71*a* comes in contact with one surface of the light-emitting diode substrate B3 to press the light-emitting diode substrate B3 to the plate portion B61.

The pin B72 faces the head portion B71*a* of the flexible tube B71 in the axis length direction and has a head portion B72*a* at its one end which head portion is larger in diameter than this head portion B71*a* in such a configuration that if this head portion B72*a* is fitted into the flexible tube B71, the portion piece between the slits B71*b* of the flexible tube B71 may expand axially outward outside the attachment hole B64 so cannot come out of the attachment hole B64 to give rise to a space larger in length than the thickness of the reflection sheet B5 between the inner rim surface of the head portion B72*a* and one surface of the light-emitting diode substrate B3 so that if the reflection sheet B5 expands thermally owing to heat occurring upon emission of light by the light-emitting diode B1, expansion and contraction of the reflection sheet B5 owing to the thermal expansion may be tolerated to prohibit the reflection sheet B5 from getting wrinkles. As shown in FIGS. 14A and 14B, the pin B72 may come in a type having the circular head portion B72*a* and a type having the oval head portion B72*a*. The pin B72 having an oval head portion B72*a* has a whirl-stop hole B60 and a whirl-stop pin B73 integrally formed on one side in the length direction of the head portion B72*a* which pin B73 is fitted into one of the positioning recesses B35.

The shaft body B7 is formed so that its size from one surface of the light-emitting diode substrate B3 to the top of the head portion B72*a* may be smaller in length than its size from the one surface of the light-emitting diode substrate B3 to the top of the lens B2 as shown in FIG. 6 to inhibit light diffused by the lens B2 from interfering with the head portion B72*a* of the shaft body B7 so that the shaft body B7 can be prevented from giving rise to irregularities in luminance.

An inner surface of the head portion B72*a* that faces one surface of the light-emitting diode substrate B3 has a plurality of recesses B74 that cave in toward the top except one circumferential portion and are open to the rim as shown in FIG. 15. Between the recess B74 and one surface of the light-emitting diode substrate B3, a space where the peak of a tool such as a standard screwdriver is inserted is provided by the recess B74 and configured so that the pin B72 can be easily pulled out of it with the tool. Although the recesses B74 are evenly spaced to three positions as shown in FIG. 13B, they may be evenly spaced to four positions or the number of them is not limited in particular and may be one or two.

<Configuration of Reflection Sheet B5>

The reflection sheet B5 is formed of a synthetic resin-made sheet material having high reflectivity and, as shown in FIGS. 5 and 16, has a roughly rectangular flat portion B51 and a frame portion B52 that is bent at a first fold B5*a* formed at a rim of this flat portion B51 and, when is bent at it, shaped like a case.

The flat portion B51 has formed in it with a first hole B53 in which each of the lenses B2 arranged in a grid is disposed, a second hole B54 (slot) into which the shaft body B7 fixing the light-emitting diode substrate B3 is fitted, and a third hole B55 into which the shaft body B7 inhibiting the support pin B8 or the reflection sheet B5 from deviating in the direction away from the light-emitting diode substrate B3 is fitted and has a pair of slits B56 facing each other in parallel and apart from each other along the sheet surface which are formed at a position facing each of the connector B4 in a configuration that if the reflection sheet B5 is placed on the plurality of light-emitting diode substrates B3 connected with the connector B4, a portion between the pair of slits B56 may deviate in the thickness direction and the reflection sheet B5 can reflect light also at the portion facing the connector B4 and also continues to the one central second hole B54 to have a long hole B57 (slot) formed in it that faces the whirl-stop hole B60 via one of the positioning recesses B35 as shown in FIG. 16.

As shown in FIG. 17, between a corner B51*a* of the flat portion B51 and the rim of a corner B52*a* of the frame portion B52, three divergent second folds B5*b* are formed ranging from the corner B51*a* of the flat portion B51 to the rim of the corner B52*a* of the frame portion B52 so that no gap or step may occur at the corner B52*a* of the frame portion B52 by folding the flat portion B51 at the second fold B5*b*.

As shown in FIG. 11, the first hole B53 is formed somewhat larger in diameter than a translucent portion B21 of the lens B2 and the translucent portion B21 is disposed on the side of the optical sheet C more than the flat portion B51 so that expansion and contraction of the reflection sheet B5 due to thermal expansion, if any, of the reflection sheet B5 caused by light emitted from the light-emitting diode B1 may be tolerated by the gap between the rim of the translucent portion B21 and the first hole B53. The second hole B54 is smaller than the first hole B53 but larger than the head portion B72*a* and continues to one side of the neighboring first hole B53, thereby enabling absorbing expansion and contraction of the reflection sheet B5 owing to its thermal expansion. Further, the one central second hole B54, that is, the second hole B54 to which the long hole B57 continues is separate from the first hole B53.

The third hole B55 is formed smaller than the second hole B54 and the head portion B71*a* of the flexible tube B71. A minute-hole identification portion B55*a* is formed around the third hole B55 into which the support pin B8 is inserted but not around the third hole B55 into which the shaft body B7 that inhibits the reflection sheet B5 from deviating in a direction away from the light-emitting diode substrate B3 is fitted. The identification portion B55*a* is disposed at a position where it is larger in diameter than the head portion B72*a* of the shaft body B7 so that if the shaft body B7 is fitted into the third hole B55 mistakenly instead of the support pin B8, the identification portion B55*a* may be exposed so that the mistake can be recognized.

As shown in FIG. 16, the pairs of slits B56 are formed apart in a direction (perpendicular to the lines) in which the group of circuit boards are arranged in a plurality of lines in condition where the facing direction of each of the pairs may be different alternately so that those slits B56, B56 may deviate in the thickness direction starting from a non-slit portion between their respective ends and the deviating portion may face each of the connectors B4. In this configuration, the portion facing each connector B4 has the high-reflectivity reflection sheet B5 and deviates starting from the non-slit portion between the respective ends of the slits B56, B56, so that an angle of a portion ranging from the top of the deviating portion to the non-slit portion inclined with respect to the flat portion B51 can be reduced. Therefore, as shown in FIG. 4, even in a case where the number of the connectors B4 arranged is relatively large, it is possible to reduce the inclination angle due to the deviation of the portion that faces each connector B4 to raise the light reflectivity in a direction perpendicular to the sheet surface, thereby maintaining even more appropriate luminance characteristics.

As shown in FIG. 14B, the one central second hole B54 with which the long hole B57 continues is smaller in diameter than the head portion B71*a* of the flexible tube B71, so that only the periphery of one of the second holes B54 in the reflection sheet B5 is pressed by the head portion B71*a* to one surface of the light-emitting diode substrate B3 so that the reflection sheet B5 may be positioned irrespective of expansion or contraction of the reflection sheet B5 caused by its thermal expansion. The long hole B57 serving as a misalignment prevention hole has mostly the same width size as the whirl-stop pin B73 and long in a direction away from the one central second hole B54 so that it can come in contact with the circumference surface of the whirl-stop pin B73 to prevent the reflection sheet B5 from being misaligned in the circumferential direction of the reflection sheet B5, thereby maintaining its positional relationship with the lens B2 in the first hole B53.

<Configuration of Support Pin>

As shown in FIG. 18, the support pin B8 has a synthetic resin-made flexible tube B81, a synthetic resin-made pin B82 fitted into this flexible tube B81, and a columnar portion B83 integrally formed with this pin B82. The flexible tube B81 has a small-diameter head portion B81*a* at its one end and, at the other end, a plurality of axis length-directional slits B81*b* and an inward expanding bulgy portion, in a configuration that a portion piece between the slits B81*b* is axially flexible, the flexible tube B81 is fitted into the third hole B55 and the second attachment hole B65, and the head portion B81*a* comes in contact with one surface of the light-emitting diode substrate B3 to press the light-emitting diode substrate B3 to the plate portion B61.

The pin B82 faces the head portion B81*a* of the flexible tube B81 in the axis length direction and has a head portion B82*a* at its one end which head portion B82*a* is larger in diameter than this head portion B81*a* and the head portion B72*a* of the shaft body B7 in such a configuration that if this head portion B82*a* is fitted into the flexible tube B81, the portion piece between the slits B81*b* of the flexible tube B81 may flex axially outward outside the second attachment hole B65 so cannot come out of the second attachment hole B65 to give rise to a space larger in length than the thickness of the reflection sheet B5 between the inner rim surface of the head portion B82*a* and one surface of the light-emitting diode substrate B3 so that if the reflection sheet B5 expands thermally owing to heat occurring upon emission of light by the light-emitting diode B1, expansion and contraction of the reflection sheet B5 owing to the thermal expansion may be tolerated to prohibit the reflection sheet B5 from getting wrinkles. The columnar portion B83 is roughly shaped like a cone from the head portion B82*a* and configured so that its tip may face the optical sheet C somewhat apart from it to inhibit the optical sheet C from flexing toward the light-emitting diode substrate B3. The head portion B82*a* is formed to be large enough to shield the identification portion B55*a* of the reflection sheet B5 when the support pin B8 is fitted into the third hole B55 so that if the shaft body B7 is fitted into the third hole B55 mistakenly, the identification portion B55*a* may be exposed out of the head portion B82*a*.

<Configuration of Lead Wire Holding Jig>

As shown in FIGS. 19, 20, and 22, the lead wire holding jig B9 has a roughly rectangular protection tube B91 that is attached around the lead hole B61*a* by fitting and a lid B92 that blocks up an open end of this protection tube B91. Inside the protection tube B91, a recess B91*a* disposed in parallel with the plate portion B61 and continuing to the lead hole B61*a* is formed so that the lead wires B40 lead from the lead hole B61*a* can be bundled. A convex-shaped to-be-engaged portion B91*b* which is inserted into the recess B61*b* to engage with the edge portion of the lead hole B61*a* by sliding is provided at the open end on one side of the protection tube B91, a pivotally supporting convex portion B91*c* is provided on one side of the protection tube B91, and a to-be-locked portion B91*d* which is locked to the lock portion B61*c* is provided on the other side of the protection tube B91, so that the protection tube B91 is attached to the periphery of the lead hole B61*a* by the to-be-engaged portion B91*b* and the to-be-locked portion B91*d*. At the open portion on the other side of the protection tube B91, a plurality of recess-shaped retaining portion B91*e* are provided.

The lid B92 is shaped like a plate and has a to-be-locked portion B92*a* which is locked to the pivotally supporting convex portion B91*c* on one side of its rim and a convex-shaped to-be-retained portion B92*b* which is retained to the retaining portion B91*e* on the other side, in a configuration that when the lid B92 is swung in the closing direction using the to-be-locked portion B92*a* as a supporting point in order to block up the open end of the protection tube B91, the lead wires B40 bundled in the recess B91*a* may be sandwiched between the recess B91*a* in the protection tube B91 and the lid B92. Accordingly, as shown in FIG. 2, it is possible to quickly bundle and hold in the recess B91*a* the lead wires B40 of the connector B2 connected to the circuit board group, thereby simplifying processing to wire the lead wires B40.

<Configuration of Optical Sheet C>

The optical sheet C is a stack obtained by stacking a relatively thick diffusion plate for diffusing light emitted by the light-emitting diode B1 serving as the light source and relatively thin synthetic resin sheets such as a reflective polarization plate, a prism sheet, and a diffusion sheet and has its rim supported by the collar piece B63 of the substrate support body B6.

<Configuration of Cabinet D>

The cabinet D has a cabinet front divided unit D1 for shielding the front side of the rim of the display unit A and a bowl-shaped cabinet rear divided unit D2 for shielding the rim and the rear side of the light source device B and is attached to the collar piece B63 of the substrate support body B6 with male screws.

The display device having such a configuration is assembled in the following steps of (1) to (8).

(1) The display panel A1 is placed on the rear holding frame A3 flatly placed on a work station, the front holding frame A2 is placed on this display panel A1, and those front holding frame A2 and rear holding frame A3 are bound with male screws to form the display unit A.

(2) The substrate support body B6 on which the circuit board B10 is not mounted is flatly placed on another work station in condition where its open end turns up and the plurality of light-emitting diode substrates B3 neighboring each other in one direction are arranged in a plurality of lines on one surface of the plate portion B61 of this substrate support body B6 as shown in FIG. 7. In this case, of the light-emitting diode substrates B3 neighboring each other in the one direction, for example, the short light-emitting diode substrates each of which is mounted with the five light-emitting diodes B1 are arranged in a plurality of lines, then the medium-length light-emitting diode substrates each of which is mounted with the six light-emitting diodes B1 are arranged in a plurality of lines, and then the short light-emitting diode substrates each of which is mounted with the five light-emitting diodes B1 are arranged in a plurality of lines, thereby configuring the circuit board group. To the short light-emitting diode substrates arranged first, the second connector B41 is connected beforehand, the medium-length light-emitting diode substrates are connected with the connector B4, and to the short light-emitting diode substrates arranged last, a short connector is connected.

The plate portion B61 has the positioning convex portion B68 as well as the first index B69*a* and the second index B69*b* formed on it and the light-emitting diode substrate B3 has the positioning recess B35 as well as the first marker 37 and the second marker 38 formed on it, so that when configuring the circuit board group, by engaging the positioning recess B35 in the light-emitting diode substrate B3 with the positioning convex portion B68, the light-emitting diode substrates B3 having the different lengths can be simply arranged to appropriate positions, and by aligning the first marker 37 with the first index B69*a* and the second marker 38 with the second index B69*b*, it is possible to simply arrange to appropriate positions the light-emitting diode substrates B3 that are different in connecting portion structure at both ends and in order in which the high-luminance and low-luminance light-emitting diodes B1 are arranged. When arranging the light-emitting diode substrates to which the second connector B41 is connected, the lead wire B40 of the second connector B41 is led from the lead hole B61*a* to the outside of the substrate support body B6.

(3) Both ends of each of the light-emitting diode substrates B3 arranged in the substrate support body B6 are fixed to the plate portion B61 by the shaft body B7. In this case, the shaft body B7 is inserted sequentially through the through holes B33 and B34 formed in both ends of each of the light-emitting diode substrates B3 and fitted into the attachment hole B64 in the plate portion B61, thereby fixing each of the light-emitting diode substrates B3 to the substrate support body B6. In this case, the shaft body B7 is fitted into the through hole B33 formed in one end of the light-emitting diode substrate B3 and then fitted into the through hole B34 formed in the other end of the light-emitting diode substrate B3. The through hole B33 into which the shaft body B7 is fitted first is smaller than the through hole B34 into which it is fitted later, so that even if the through hole B34 formed in the other end is somewhat shifted with respect to the attachment hole B64, this shift in position can be absorbed to fix the light-emitting diode substrate B3, thereby preventing overloads from being applied to the connector B4. The shaft body B7 is fitted in the next process into the one central attachment hole B64 into which the shaft body B7 having the whirl-stop pin B73 is to be fitted.

(4) The reflection sheet B5 is placed on one surface of the light-emitting diode substrate B3 fixed to the plate portion B61 of the substrate support body B6 and the rim of this reflection sheet B5 is placed on the collar piece B63 of the substrate support body B6. In this situation, the lens B2 is disposed in the first hole B53 in the reflection sheet B5.

(5) Either one of the support pin B8 and the shaft body B7 that inhibits the reflection sheet B5 from deviating in a direction away from the light-emitting diode substrate B3 is fitted into the third hole B55 in the reflection sheet B5 and the fit-in hole B36 and the second attachment hole B65 sequentially. In this situation, the head portion B72*a* of the shaft body B7 is larger in diameter than the third hole B55 and the inner face of this head portion B72*a* faces the periphery of the third hole B55 in the reflection sheet B5, so that the reflection sheet B5 can be prevented from deviating in a direction away from the light-emitting diode substrate B3.

The flexible tube B71 of the shaft body B7 having the whirl-stop pin B73 is fitted into the one central second hole B54 in the reflection sheet B5, so that the whirl-stop pin B73 can be fitted into the long hole B57, the one positioning recess B35, and the whirl-stop hole B60, thereby preventing the reflection sheet B5 from being shifted in the circumferential direction of the reflection sheet B5.

(6) The optical sheet C is placed on the rim of the reflection sheet B5 placed on the collar piece B63 of the substrate support body B6, the display unit A is placed on this optical sheet C, a male screw is inserted through the insertion hole formed in the rim of this display unit A and screwed into the attachment hole formed in the collar piece B63 to thereby sandwich the optical sheet C between the display unit A and the substrate support body B6 and fix the display unit A to the substrate support body B6. In this situation, the support pin B8 can inhibit the optical sheet C from flexing.

(7) The display unit A turns down, the substrate support body B6 is turned over on the work station so that it may turn up, the plurality of circuit boards B10 are attached to the third attachment hole B66 in the plate portion B61, and the lead wires B40 of the second connector B41 are bundled and held by the lead wire holding jig B9.

(8) The display unit A is placed on the cabinet front divided unit D1 flatly placed on the work station so that it may turn down, the cabinet rear divided unit D2 is placed on the substrate support body B6, the rim side of the cabinet rear divided unit D2, the collar piece B63 of the substrate support body B6, and the rim side of the cabinet front divided unit D1 are bound with male screws to form the display device.

<Another Configurations of Display Device>

Figure 23:
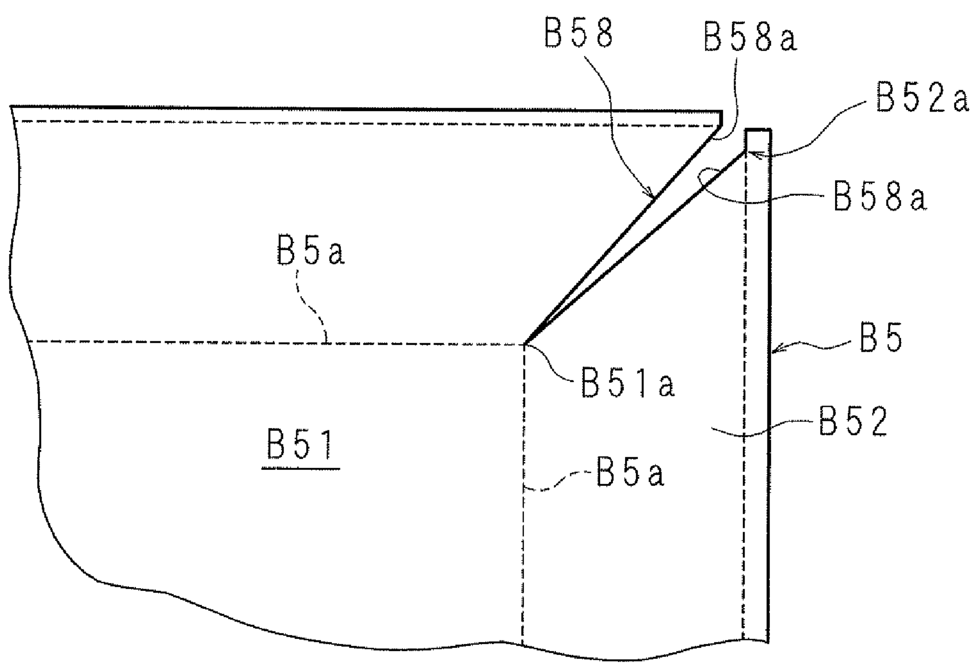
FIG. 23 is a development view showing another configuration of the corner of the reflection sheet.
Figure 25:
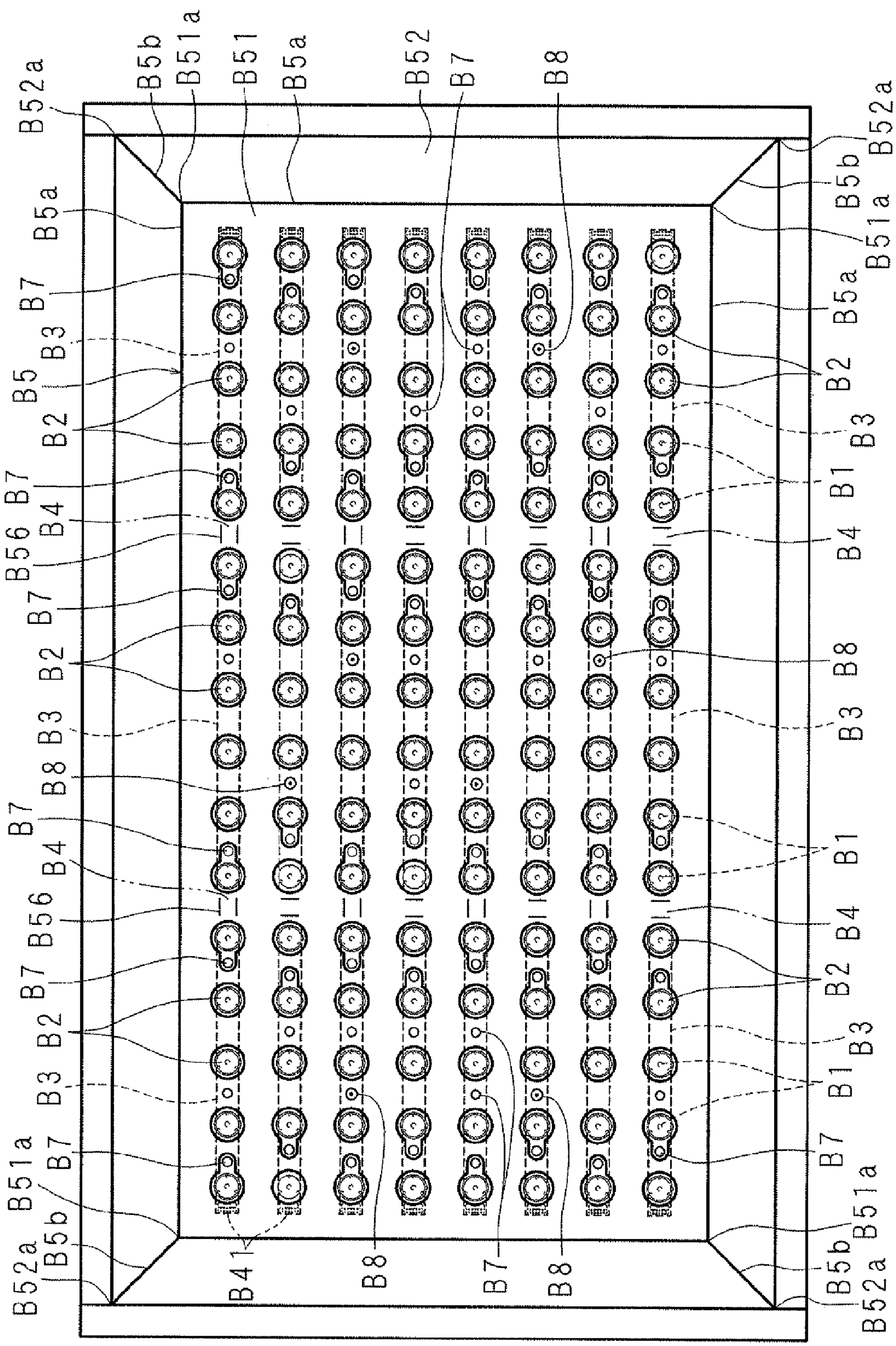
FIG. 25 is a front view showing another configuration of the light source device.
Figure 26:
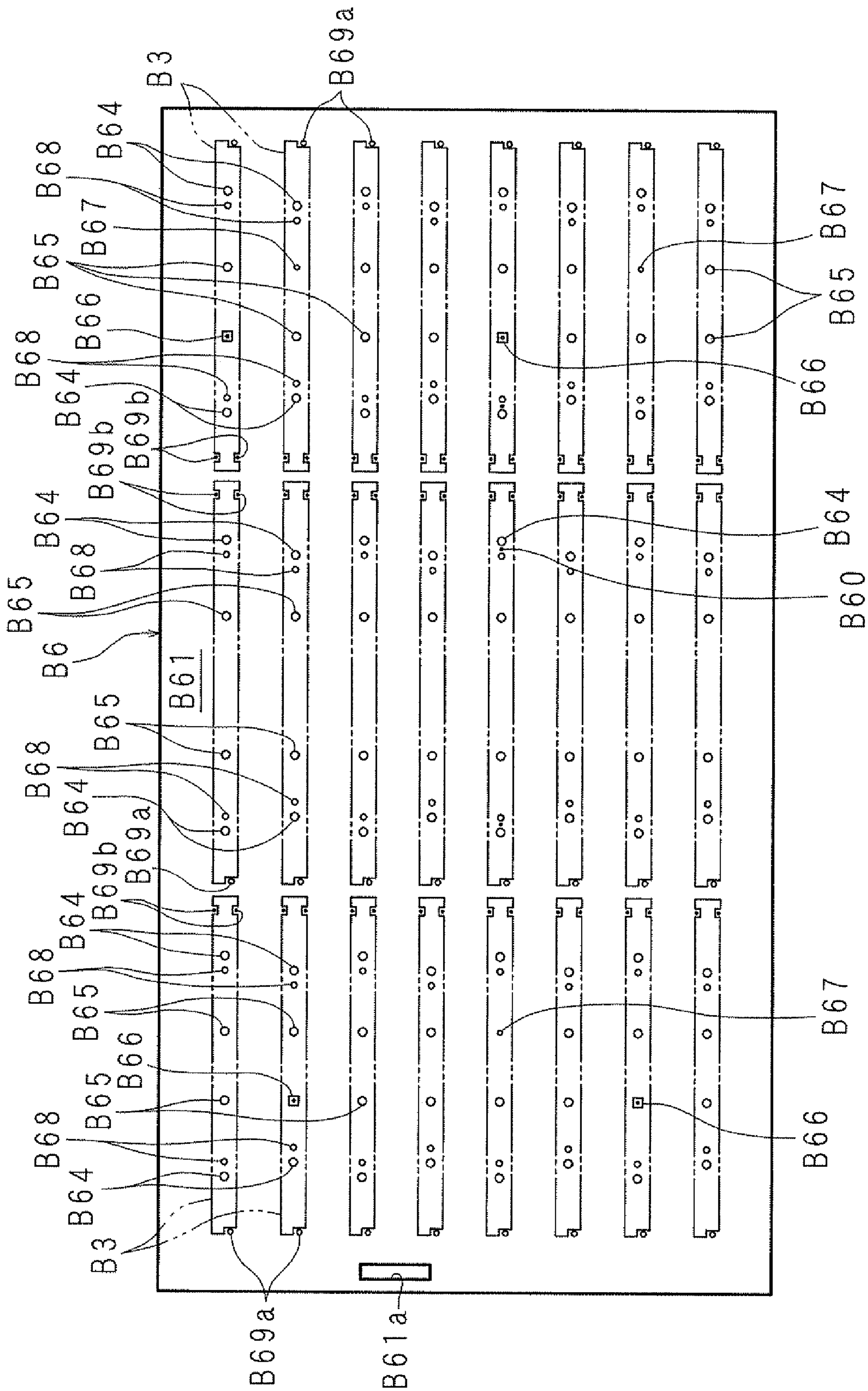
FIG. 26 is a schematic front view showing another configuration of the substrate support body.
Figure 27:
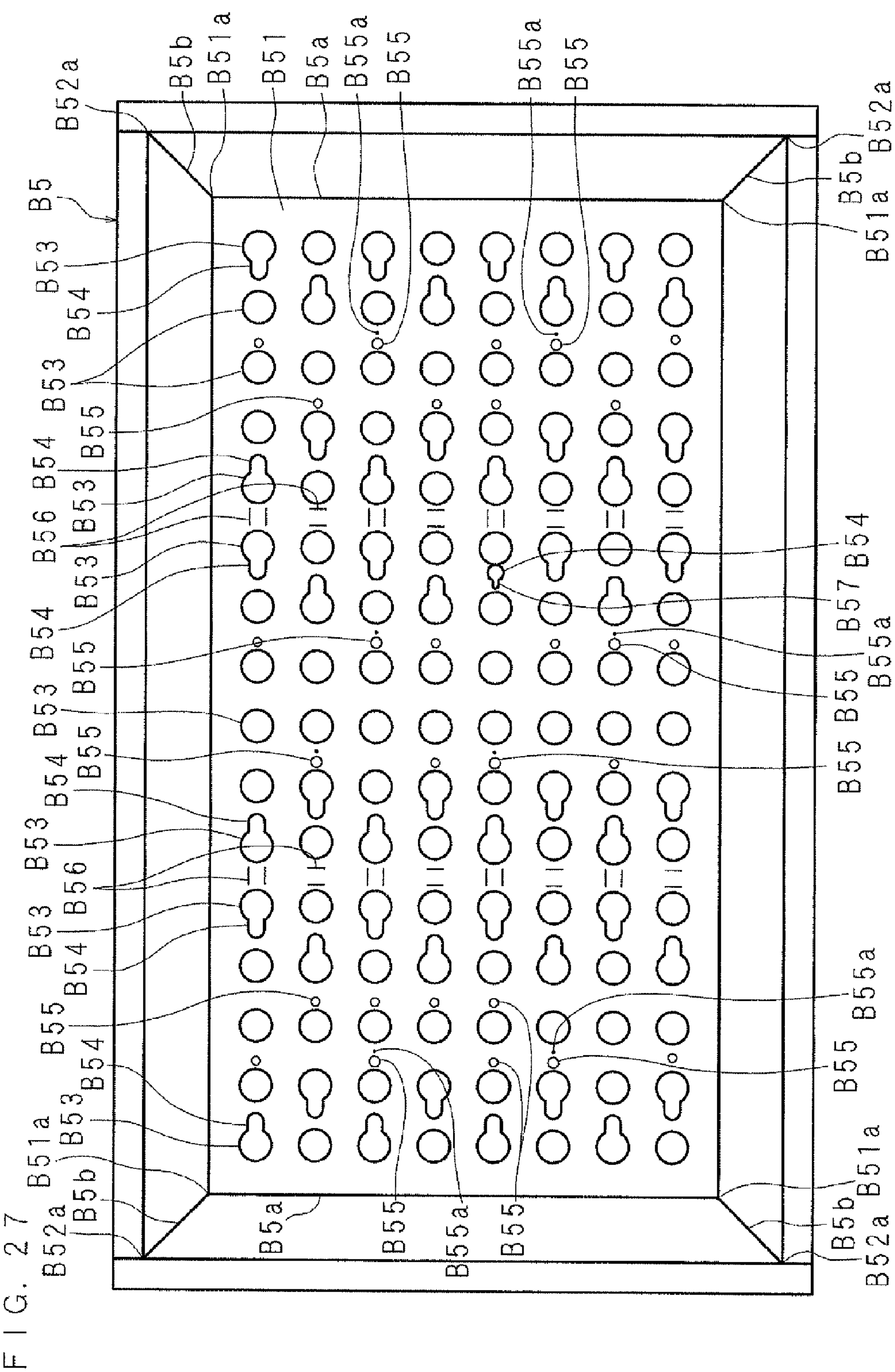
FIG. 27 is a schematic front view showing another configuration of the reflection sheet.
Figure 28:
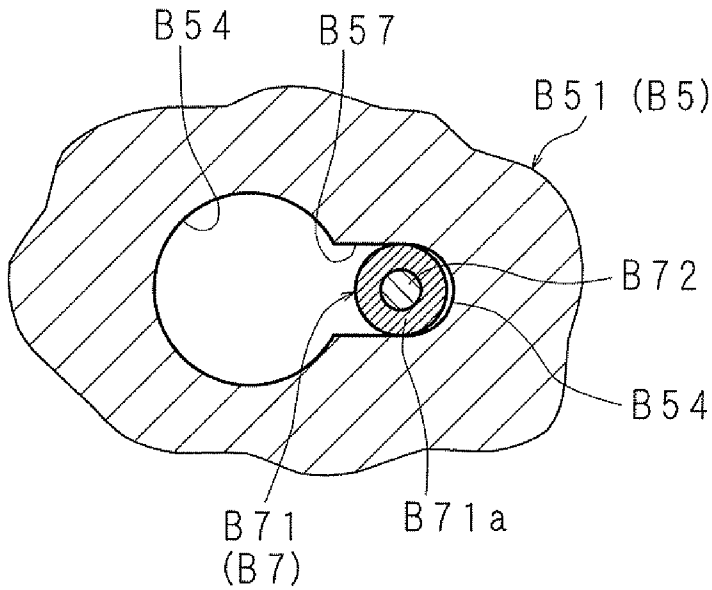
FIG. 28 is a cross-sectional view showing another relationship between the reflection sheet and the shaft body.

FIG. 23 is a development view showing another configuration of the corner of the reflection sheet, FIG. 24 is a front view showing another configuration of the portion that faces the connector of the reflection sheet, FIG. 25 is a front view showing another configuration of the light source device, FIG. 26 is a schematic front view showing another configuration of the substrate support body, FIG. 27 is a schematic front view showing another configuration of the reflection sheet, and FIG. 28 is a cross-sectional view showing another relationship between the reflection sheet and the shaft body.

<Another Configuration of Reflection Sheet B5>

As shown in FIG. 23, a roughly V-shaped defect portion B58 may be formed at the corner B52*a* of the frame portion B52 of the reflection sheet B5 so that when the four frame portions B52 continuing to the four sides of the flat portion B51 at the first fold B5*a* are obliquely folded with respect to the flat portion B51, two edges B58*a* of the defect portion B58 may agree and this agreement condition may be held by binding means such as double-faced tape.

As shown in FIG. 24, a portion of the reflection sheet B5 that faces the connector B4 may have two slits B59 formed in it that are shaped like letter C and each have longer sides facing the sheet surface apart from it in a direction along it and two shorter sides extending from this longer side's two ends respectively along a direction in which they get near each other respectively and deviate in parallel with the sheet surface starting from two deviation start points between the slits B59, B59, thereby improving performance of deviation in the thickness direction of the portion that faces the connector B4.

<Another Relationship Between the Shaft Body B7 and Reflection Sheet B5>

Since the shaft body B7 fixing both ends of the light-emitting diode substrate B3 has worse optical reflectivity than the reflection sheet B5, the shaft body B7 fixing one end of the light-emitting diode substrates B3 arranged in a plurality of lines as shown in FIG. 25 may be disposed in a zigzag manner in a direction perpendicular to the line direction and the shaft body B7 fixing the other end of the light-emitting diode substrate B3 may be disposed in a zigzag manner in a direction that orthogonally intersects with the line direction so that a position where irregularities in luminance occur owing to the shaft bodies B7 can be expanded and hardly be recognized.

In this situation, the first attachment hole B64 and the positioning convex portion B68 neighboring each other in the direction that orthogonally intersects with the line direction of the light-emitting diode substrates B3 deviate in this line direction and are arranged in a zigzag manner as shown in FIG. 26. The light-emitting diode substrate B3 includes a first light-emitting diode substrate that has a smaller size from both ends to the through holes B33 and B34 and a second light-emitting diode substrate that has a larger size from both ends to the through holes B33 and B34 in a configuration that the first and second light-emitting diode substrates are alternately arranged in a direction perpendicular to the line direction, to arrange the through holes B33 and B34 in a zigzag manner corresponding to the first attachment holes B64 arranged in a zigzag manner, finally arranging the shaft bodies B7 fitted into the through holes B33 and B34 in a zigzag manner in a direction perpendicular to the line direction.

Besides the configuration in which the long hole B57 for preventing the reflection sheet B5 from shifting circumferentially continues to one second hole B54 disposed at the midsection of the reflection sheet B5, another configuration may be employed in which the long hole B57 would be one of the second holes B54 disposed on the rim side of the reflection sheet B5 as shown in FIG. 28. In this case, the long hole B57 has mostly the same-sized width as the head portion B71*a* of the shaft body B7 and is longer in a direction away from the one second hole B54 disposed at the midsection so comes in contact with the circumferential surface of the head portion B71*a* to prevent the reflection sheet B5 from shifting circumferentially, while into the second hole B54 disposed at the midsection of the reflection sheet B5, the shaft body B7 having the circular head portion B72*a* is fitted instead of the pin B72 having the oval head portion B72*a*. Besides the configuration in which the long hole B57 continues to the first hole B53 in the reflection sheet B5 as shown in FIG. 28, another configuration may be employed in which it is separate from the first hole B53.

The following will describe in detail the embodiments 1-1 to 12-2 of the present invention with reference to the drawings. The reference numerals denoting components corresponding to those in FIGS. 1 to 28 are parenthesized here to clearly define their equivalence to those in FIGS. 1 to 28.

Embodiment 1-1

Figure 29:
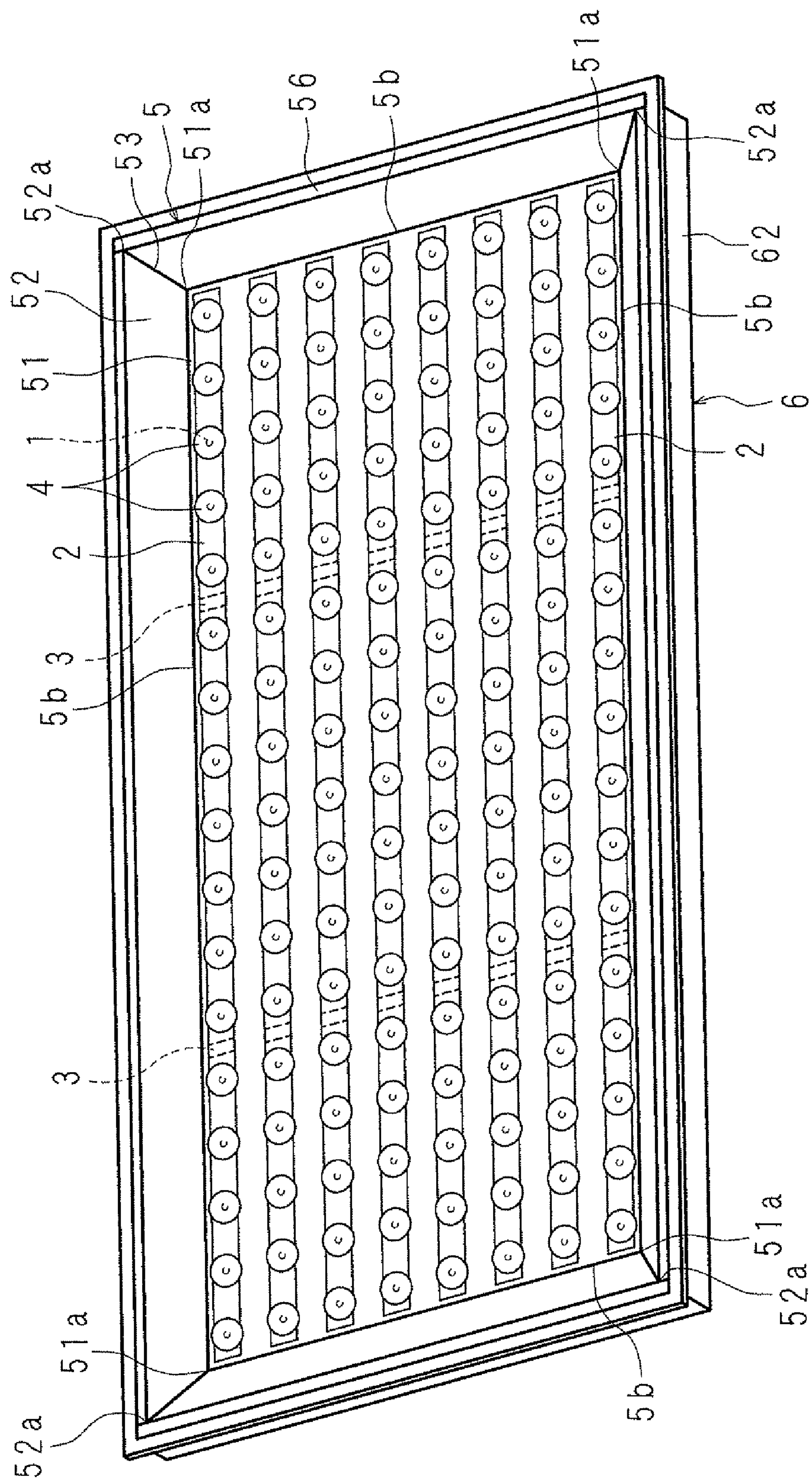
FIG. 29 is a perspective view showing a configuration of a light source device according to an embodiment 1.
Figure 30:
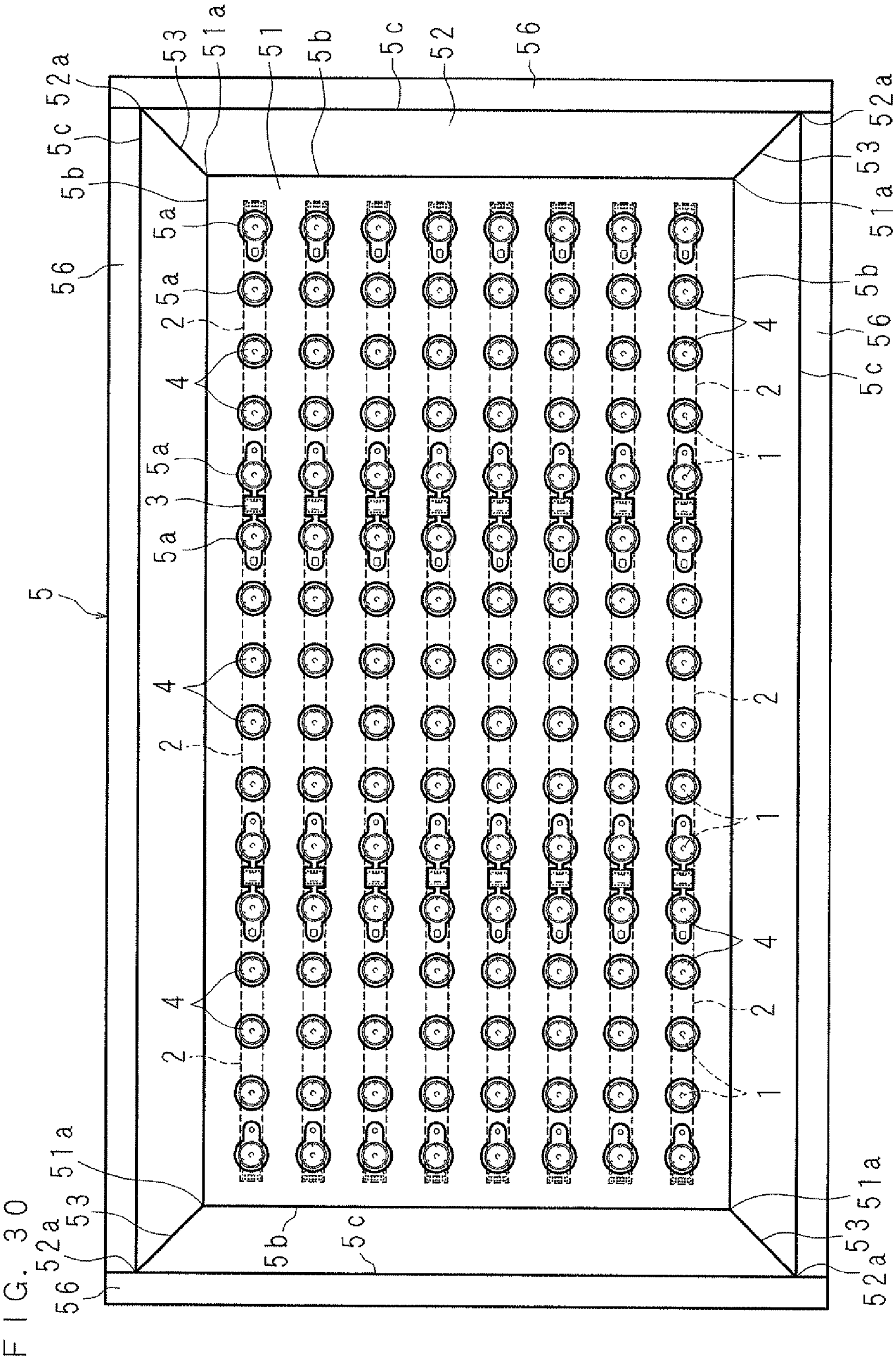
FIG. 30 is a plan view showing the configuration of the light source device according to the embodiment 1.

FIG. 29 is a perspective view showing a configuration of a light source device according to the present invention, FIG.

Figure 31:
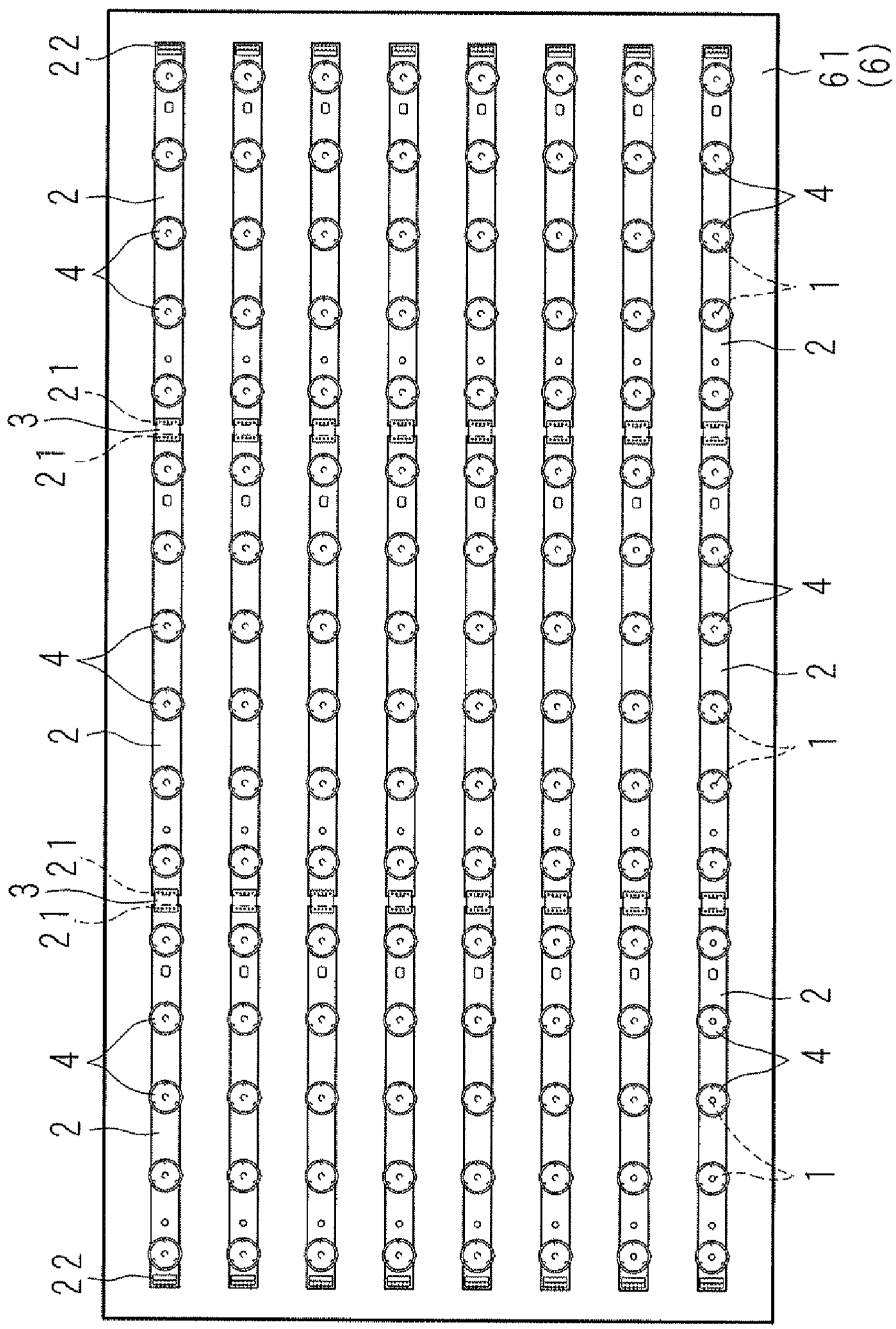
FIG. 31 is a plan view showing a configuration of the light source device according to the embodiment 1 in which a reflection sheet of the light source device is omitted.
Figure 32:
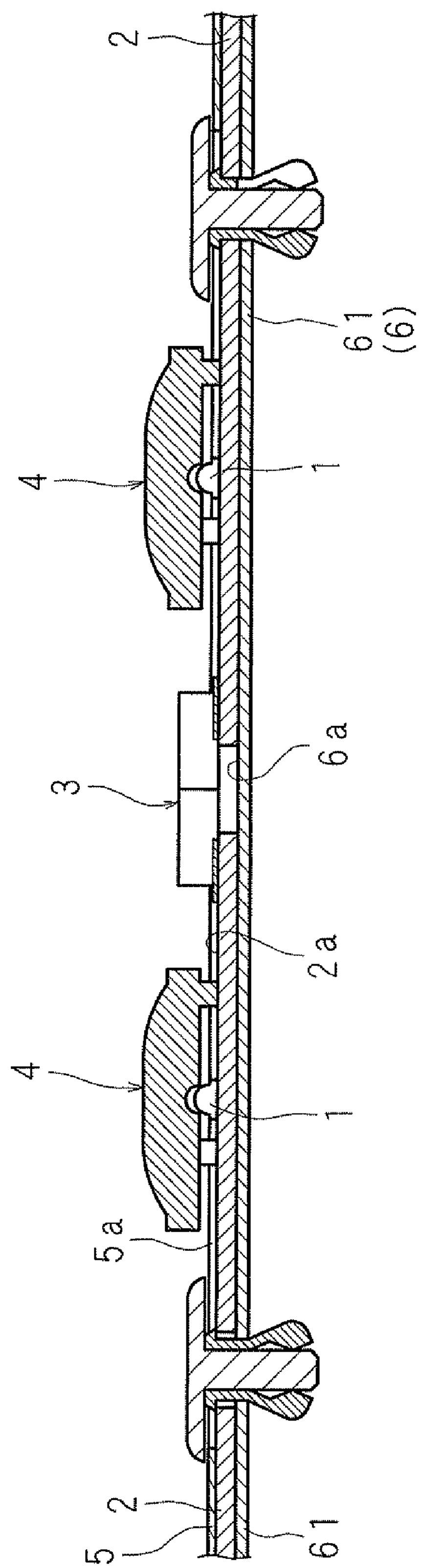
FIG. 32 is a partially enlarged cross-sectional view showing the configuration of the light source device according to the embodiment 1.

30 is a plan view showing the configuration of the light source device, FIG. 31 is a plan view showing a configuration in which a reflection sheet of the light source device is omitted, and FIG. 32 is a partially enlarged cross-sectional view showing the configuration of the light source device.

The shown light source device (B) includes a plurality of light-emitting diodes 1 (B1) that are mounted on the rear side of a roughly rectangular solid-shaped display unit (A) of a thin-type display device including a display surface on its front side and this display unit and that serve as light sources arranged on a grid, a plurality of light-emitting diode substrates 2 (B3) mounted with those light-emitting diodes 1 on one surface 2*a* and arranged in a plurality of lines, a plurality of connectors 3 (B4) interconnecting the neighboring light-emitting diode substrates 2, a plurality of lenses 4 (B2) mounted on the one surface 2*a* of the light-emitting diode substrate 2 so that they may face the top of the light-emitting diode 1 and diffuse light emitted by this light-emitting diode 1, a reflection sheet 5 (B5) having a through hole 5*a* (first hole B53) in which the lens 4 is disposed and facing the one surface 2*a* and one surface of the connector 3 to reflect light diffused by the lens 4, and a support case 6 (substrate support body B6) housing and supporting the light-emitting diode substrates 2 in condition where they are arranged in a plurality of lines.

The light-emitting diode substrates 2 are each shaped like an oblong having a circuit portion on its one surface 2*a* and arranged on one surface 6*a* of the roughly rectangular support case 6 in condition where they are arranged in a plurality of lines apart from each other in a length direction and a width direction. On the one surface 2*a* of each of the light-emitting diode substrates 2, the plurality of light-emitting diodes 1 are mounted apart from each other in the length direction and connecting portions 21 and 22 (B31, B32) are provided at the length-directional two ends of the one surface 2*a* as shown in FIG. 31.

Of the light-emitting diode substrates 2 arranged in the plurality of lines so that their respective one length-directional ends may face each other, the light-emitting diode substrates 2 in each line have the neighboring two connecting portions 21, 21 connected by the connector 3 to each other in a configuration that the connecting portion 22 on one light-emitting diode substrate 2 is connected by a second connector (B41) to a power supply circuit board mounted on the rear surface of the support case 6 and a short connector is connected to the connecting portion 22 of the other light-emitting diode substrate 2.

The support case 6 is formed of a metal plate and has a roughly rectangle-shaped flat plate portion 61 (B61) and a frame portion 62 (B62) that continues to the rim of this plate portion 61 and is open at its front end in a configuration that the light-emitting diode substrates 2 are housed and supported on a front surface 6*a* of the plate portion 61 as arranged in a length direction and a width direction. The frame portion 62 is formed by folding frame pieces that continue to the four sides of the plate portion 61 respectively.

The plate portion 61 is mounted on its rear surface with a plurality of circuit boards (B10) such as a power supply circuit board connected with the second connector to the connecting portion 22 of the light-emitting diode substrate 2, a control circuit board for driving and controlling the display unit and the like.

Figure 33:
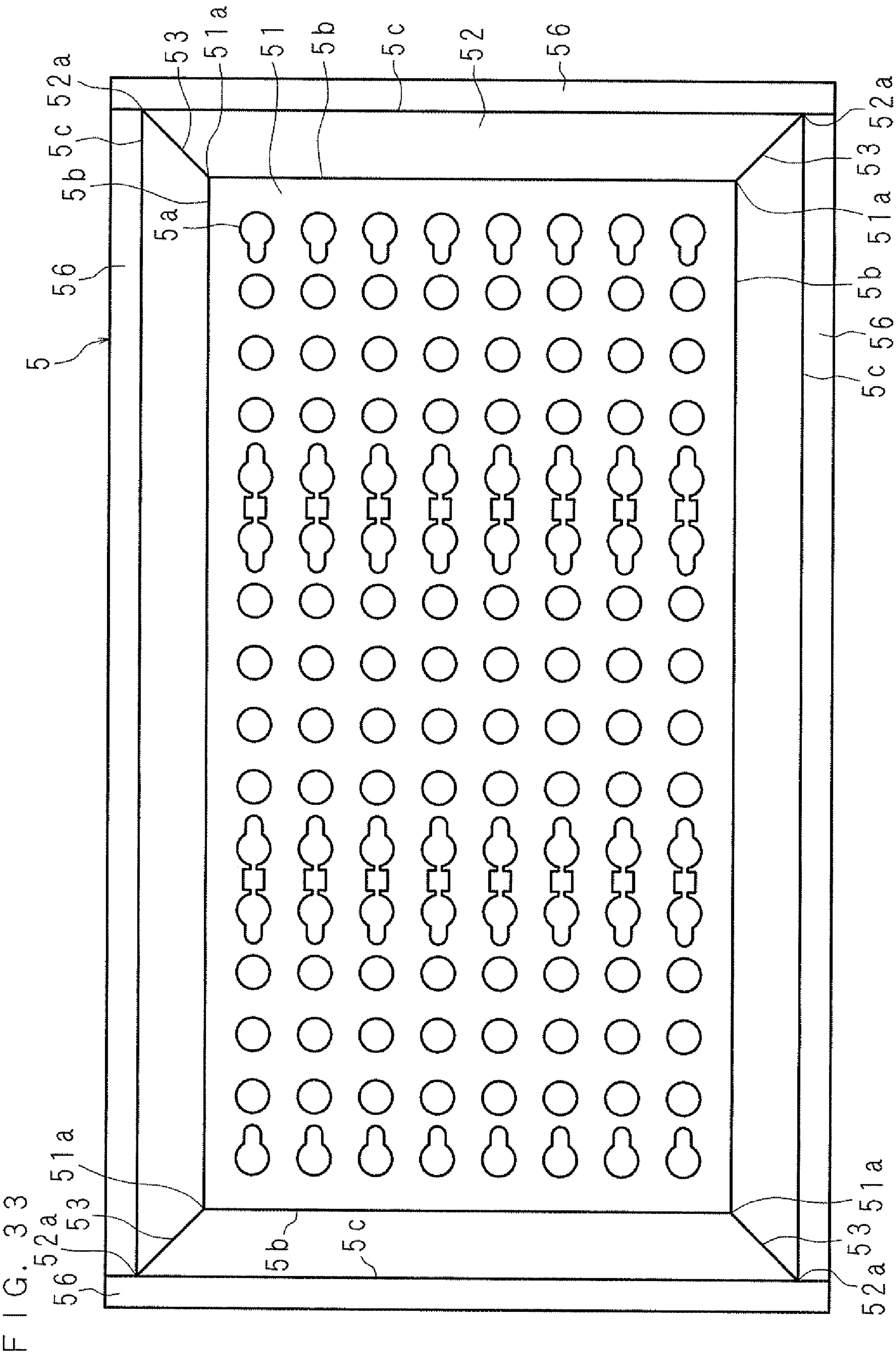
FIG. 33 is a plan view showing a configuration of the reflection sheet included in the light source device according to the embodiment 1.
Figure 34:
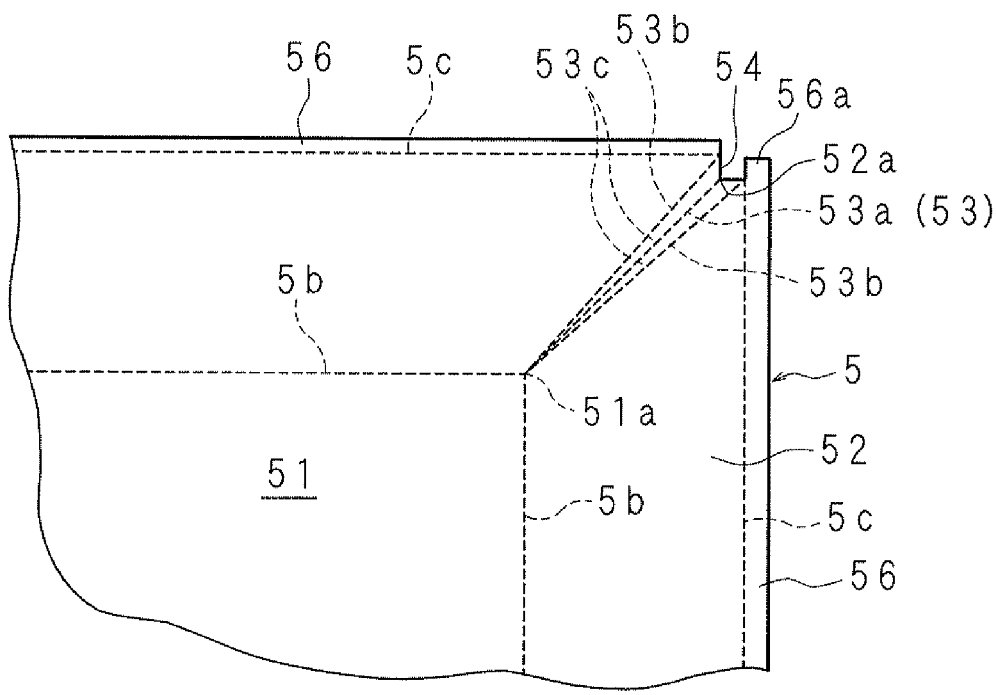
FIG. 34 is an enlarged front view showing a configuration of main portions in condition where the reflection sheet is spread out.
Figure 36:
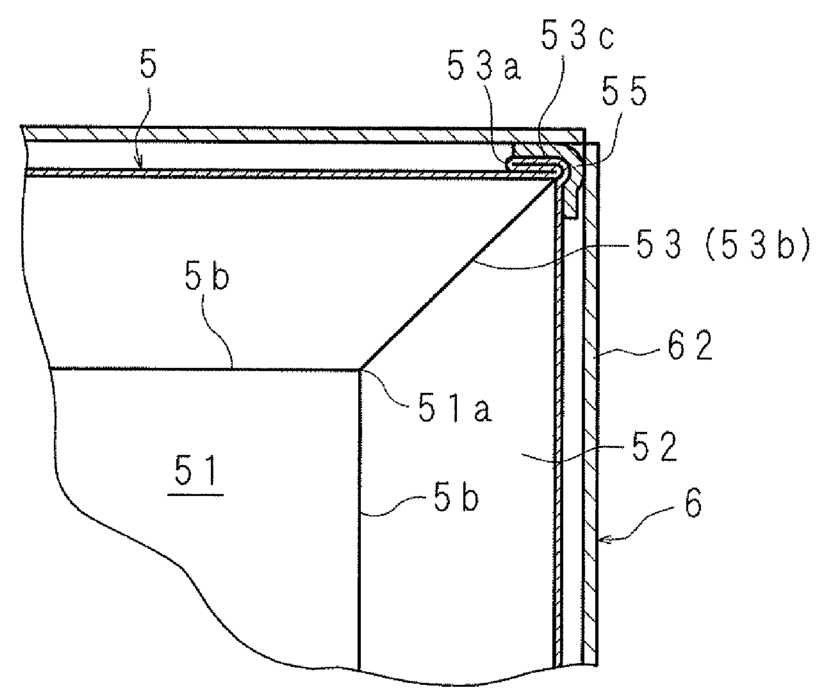
FIG. 36 is an enlarged lateral plan view showing a configuration of a reflection sheet portion.

FIG. 33 is a plan view showing a configuration of the reflection sheet, FIG. 34 is an enlarged front view showing a configuration of main portions in condition where the reflection sheet is spread out, FIG. 35 is an enlarged front view showing a configuration of the main components of the reflection sheet, and FIG. 36 is an enlarged lateral plan view showing a configuration of a reflection sheet portion. The reflection sheet 5 (B5) is made of one rectangular synthetic resin-made sheet material having high reflectivity and has a flat portion 51 (B51) smaller than the plate portion 61 of the support case 6 and a frame portion 52 (B52) continuing to all rims of this flat portion 51 at four first folds 5*b* (B5*a*) at which it can be folded as well as a second fold 53 (B5*b*) perforated between a corner 51*a* (B51*a*) of each flat portion 51 and a corner 52*a* (B52*a*) of the frame portion 52 so that if it is folded at the first fold 5*b* and the second fold 53, the frame portion 52 may tilt outward with respect to the frat portion 51 to provide a case shape with the front side being open. The first fold 5*b* and the second fold 53 are perforations.

There are the three second folds 53 divergent from the corner 51*a* of the flat portion 51 toward the rim of the corner 52*a* of the frame portion 52, so that if the sheet is valley-folded at the central fold 53*a* and mounted-folded at the two folds 53*b*, 53*b* on its both sides, those folds 53*b*, 53*b* on both sides agree without a thickness-directional step. At the outer edge of the corner 52*a* of the frame portion 52, an L-shaped defect portion 54 is formed.

Two folded portions 53*c*, 53*c* folded at the three folds 53*a*, 53*b*, and 53*b* are combined into the shape of a plate and bound with adhesive tape 55 such as double-faced tape so that the folded condition of the frame portion 52, in other words, the shape of the frame portion 52 can be maintained.

A site of the flat portion 51 that faces the outer edge of the connector 3 is provided with a deviation portion that can deviate in the thickness direction at a plurality of slits that mutually face apart from each other in a direction along the sheet surface, while a site of the flat portion 51 that corresponds to each of the lenses 4 has the through hole 5*a* (first hole B53) formed in it that is somewhat larger in diameter than this lens 4 so that the lens 4 is disposed in this through hole 5*a*.

The reflection sheet 5 continues to the four sides of the frame portion 52 having a rectangular rim via a third fold 5*c* and is integrally formed with four collar portions 56 that extend outward in parallel with the flat portion 51.

The two collar portions 56, 56 that face each other in the length direction of the reflection sheet 5 has a projecting portion 56*a* that projects from both ends of those collar portions 56 in the length direction of the collar portions 56, 56 rather than the defect portion 54 so that when the corners 52*a* agree at the three second folds 53, one side edge of this projecting portion 56*a* may abut against both end edges of the remaining two collar portions 56, 56, giving rise to no gap between the two ends of each of the collar portions 56.

As shown in FIG. 31, for example, the five or six light-emitting diodes 1 are mounted on the light-emitting diode substrate 2 in condition where they are apart in its length direction in a configuration that for each of the light-emitting diodes 1, the five or six lenses 4 are attached to the one surface 2*a* with an adhesive agent.

The lens 4 (B2) faces the top of the light-emitting diode 1 apart from it and has a translucent portion (B21) having a semispherical recess for diffusing light emitted from this light-emitting diode 1 in all directions and three positioning projections (B22) that project toward the light-emitting diode substrate 2 from a face of this translucent portion that faces the one surface 2*a* so that the translucent portion may be positioned with respect to the light-emitting diode substrate 2, in a configuration that the tip of this positioning projecting portion is attached to the one surface 2*a* with an adhesive agent. This positioning projection makes a distance between the translucent portion and the light-emitting diode substrate 2 somewhat larger than the thickness of the reflection sheet 5 so that thermal expansion of the reflection sheet 5 can be absorbed.

In the light source device having such a configuration, the support case 6 is placed on a work station so that its open side may turn up, the two light-emitting diode substrates 2 neighboring each other in the line direction are arranged in a plurality of lines in the front face of the plate portion 61 of the support case 6, the connector 3 is connected to the connecting portions 21, 21 provided at the neighboring ends of the light-emitting diode substrates 2 in each line, and the reflection sheets 5 are placed on the one surface 2*a* of the light-emitting diode substrate 2 in each line in condition where they face each other. Since the reflection sheet 5 is shaped like a case having the open front side, the flat portion 51 faces the one surface 2*a* of the light-emitting diode substrate 2 and the plate portion 61 of the support case 6 and the frame portion 52 faces the frame portion 62 of the support case 6, so that the entire surface in the support case 6 serves as a reflection surface.

The flat portion 51 and the frame portion 52 of the reflection sheet 5 are formed by folding one sheet of a synthetic resin-made sheet material at the first fold 5*b* and the second fold 53, so that the case-shaped reflection sheet 5 can be easily obtained without giving rise to a gap and, even if dust or dirt enters the support case 6, the dust or dirt in this support case 6 can be prevented from entering the reflection sheet 5. Further, the corners 52*a* of the frame portion 52 of the case-shaped reflection sheet 5 mutually agree at the three second folds 53 in such a manner as not to give rise to a thickness-directional step, so that it is possible to improve luminance characteristics at the corner 52*a* of the frame portion 52, thereby preventing a shadow from occurring at the corner 52*a* of the frame portion 52. Further, the rim of the corner 52*a* of the frame portion 52 has the roughly L-shaped defect portion 54, so that it is possible to prohibit the rim of the corners 52*a* agreeing at the second fold 53 from projecting to the outside.

FIG. 37 is a cross-sectional view showing a configuration of a display device including a light source device according to the present invention. The display device has a display surface for displaying a TV image on its front side and includes a roughly rectangular solid-shaped display unit 70 (A), a light source device A (B) disposed behind this display unit 70, and a cabinet 71 (D) for shielding the rim of the display unit 70 and the rear side of the light source device A.

The display unit 70 (A) has a display panel 72 (A1) having a display surface and an optical sheet 73 (C) disposed behind this display panel 72. The rim of the display panel 72 is held in condition where it is sandwiched by a front holding frame body 74 (A2) and a rear holding frame body 75 (A3) between the front and the rear, to configure a panel module in which the rear holding frame body 75 is attached to the rim of the support case 6.

The optical sheet 73 is a stack obtained by stacking a relatively thick diffusion plate for diffusing light emitted by the light-emitting diode 1 serving as the light source and relatively thin synthetic resin sheets such as a reflective polarization plate, a prism sheet, and a diffusion sheet.

The support case 6 has the frame body 62 that continues to the plate portion 61 and the rim of this plate portion 61 and supports the rim of the diffusion plate on this frame portion 62.

The cabinet 71 has a cabinet front divided unit 71*a* (D1) for shielding the front side of the rim of the display unit 70 and a bowl-shaped cabinet rear divided unit 71*b* (D2) for shielding the rim and the rear side of the light source device A and is attached to the frame portion 62 of the support case 6 with male screws.

Embodiment 1-2

Figure 38:
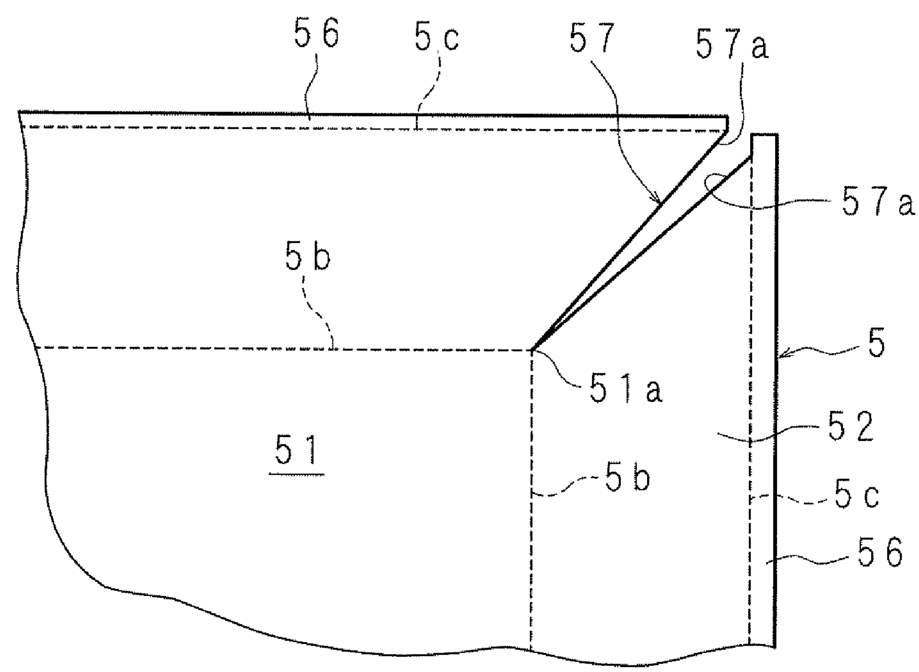
FIG. 38 is an exploded front view showing another configuration of main components of a reflection sheet included in a light source device according to the embodiment 1.

FIG. 38 is an exploded front view showing another configuration of main components of a reflection sheet included in a light source device according to the present invention. Instead of forming the three second folds 53 at a corner of a frame portion 52 in a reflection sheet 5 (B5), this light source device has a roughly V-shaped defect portion 57 at a corner 52*a* of the frame portion 52 so that when the four frame portions 52 continuing to the four sides of a flat portion 51 at a first fold 5*b* are obliquely folded with respect to a flat portion 51, two edges 57*a*, 57*a* of the defect portion 57 may agree and this agreement condition may be held by double-faced tape 55.

The reflection sheet 5 made of one rectangular synthetic resin-made sheet material has the flat portion 51 smaller than the plate portion 61 of the support case 6 and the four frame portions 52 continuing to the four sides of this flat portion 51 at the first folds 5*b*, so that by folding each of the frame portions 52 at the first fold 5*b* obliquely with respect to the flat portion 51, this sheet is shaped like a case in which the frame portions 52 are inclined outward with respect to the flat portion 51 and the two edges 57*a*, 57*a* of the defect portion 57 agree. By applying double-faced tape 55 to the outer surfaces of both ends of the neighboring frame portions 52 in this condition, the shape of the case can be maintained. By integrally forming a folded piece continuing at the fourth fold with one of the ends of the neighboring frame portions 52, it is possible to easily bind the folded piece and the other end of the neighboring frame portions 52 by using the double-faced tape.

The other configurations and functions are almost the same as those of the embodiment 1-1, so that identical reference numerals are given to identical components, and detailed description on the identical components and that on the functions and effects will be omitted.

Embodiment 1-3

Figure 39:
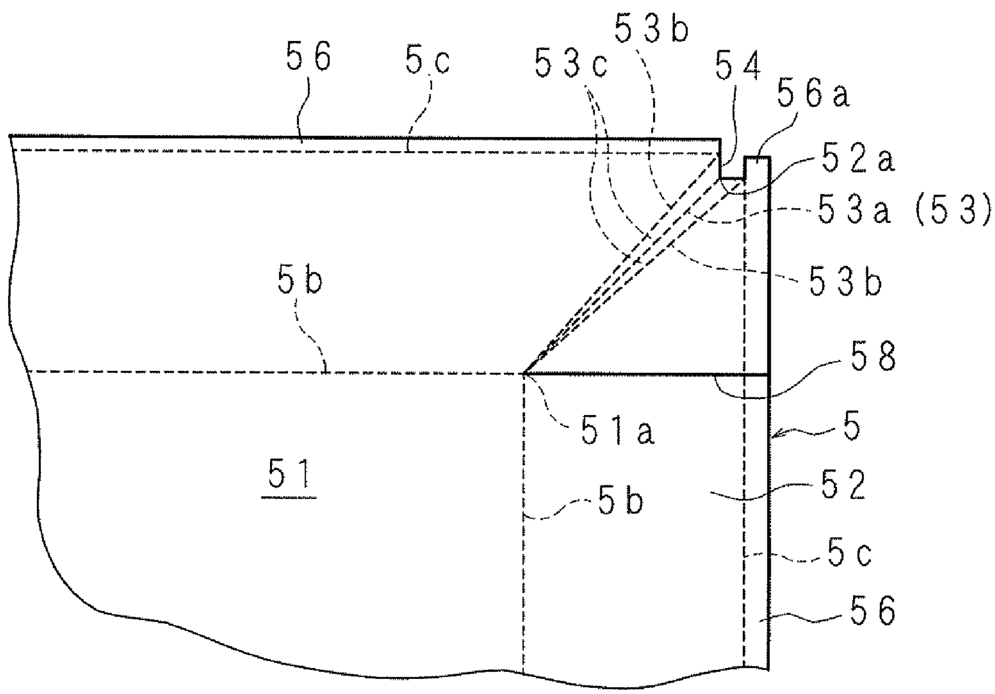
FIG. 39 is an exploded front view showing another configuration of the main components of the reflection sheet included in the light source device according to the embodiment 1.
Figure 40:
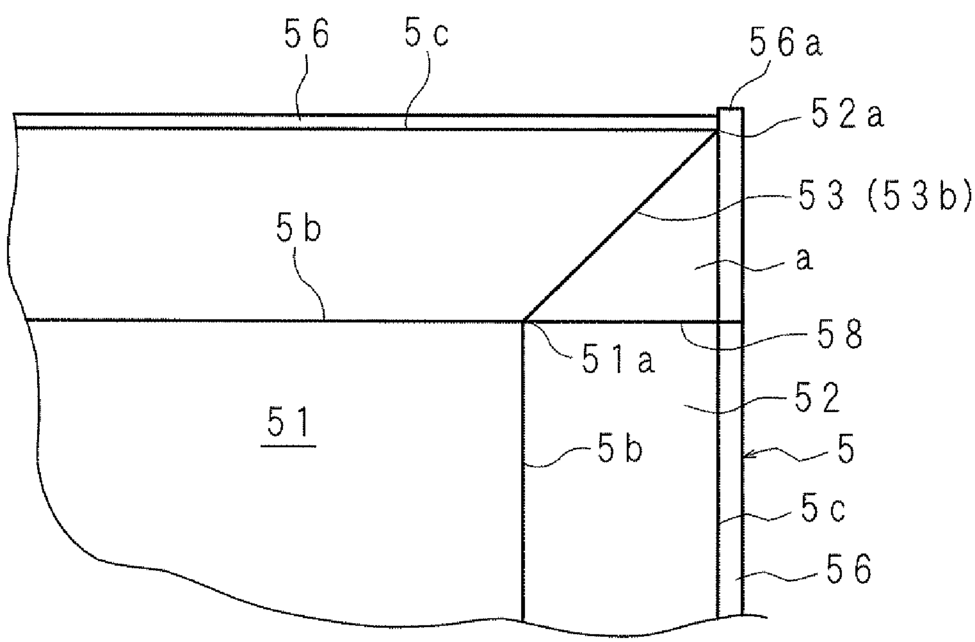
FIG. 40 is an enlarged front view showing a further configuration of the main components of the reflection sheet.

FIG. 39 is an exploded front view showing another configuration of the main components of the reflection sheet included in the light source device according to the present invention and FIG. 40 is an enlarged front view showing a further configuration of the main components of the reflection sheet. Instead of having the defect portion 57 at the corner 52*a* of the frame portions 52 on the flat portion 5, this light source device has three second folds 53 along the rim of the frame portion from a corner 51*a* of a flat portion 51 and one slit 58 in a configuration that the corner 52*a* of the frame portion 52 is formed at the second folds 53 and the ends of the frame portions 52 that neighbor each other at the slit 58 agree to hold the agreement condition and the corner 52*a* by using double-faced tape.

The slit 58 is formed along the facing two sides of the flat portion 51 from its corners 51*a* respectively, so that both ends of the two frame portions continuing to the facing two sides of the flat portion 51 have a projecting portion a that projects outward beyond the corner 51*a* from both ends of the other two frame portions, which the projecting portion faces both ends of the other two frame portions.

The projecting portion has three second folds formed in it that are divergent from the corner 51*a* toward the rim (corner of the projecting portion) of the corner 52*a*.

In the present embodiment, by folding each of the frame portions at the fold and folding the projecting portion at the three second folds, a case shape having an open front side is provided in which the frame portions are inclined outward with respect to the flat portion 51, so that two folded portions formed at the second folds are bound by a binding member such as double-faced tape and the edges of the neighboring frame portions owing to the slit are bound by adhesive tape, thereby holding the case shape.

The other configurations and functions are almost the same as those of the embodiment 1-1, so that identical reference numerals are given to identical components, and detailed description on the identical components and that on the functions and effects will be omitted.

Embodiment 1-4

Figure 41A:
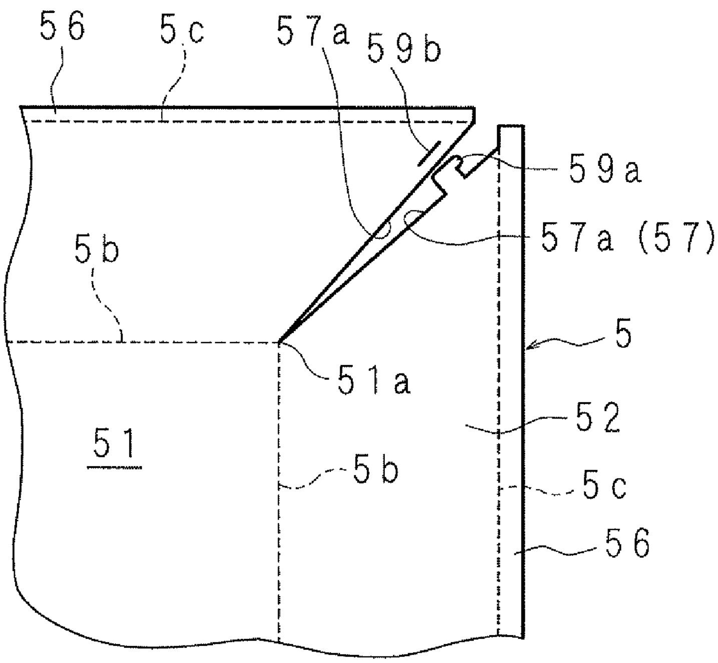
FIG. 41A is an exploded front view showing another configuration of the main components of the reflection sheet.
Figure 41B:
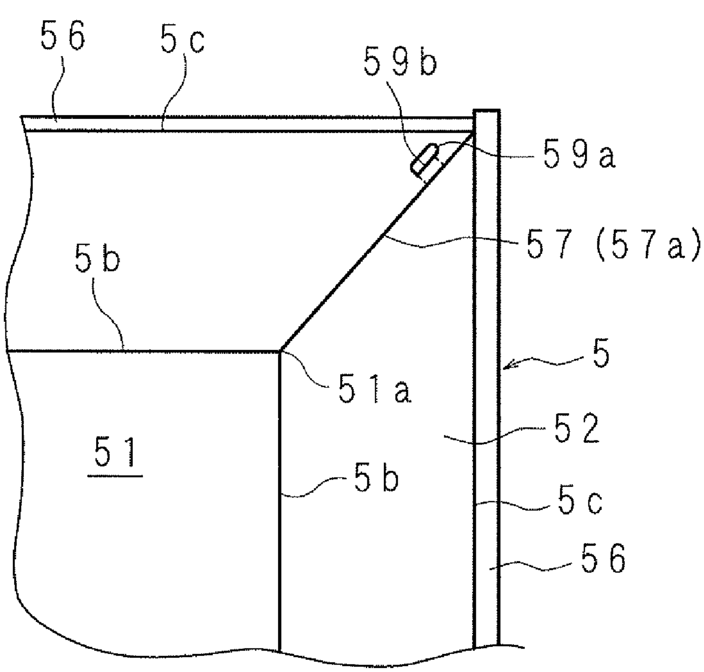
FIG. 41B shows a further configuration of the main components of the reflection sheet and is a front view of it in condition where it is shaped like a case.

FIG. 41A is an exploded front view showing another configuration of the main components of the reflection sheet and FIG. 41B shows a further configuration of the main components of the reflection sheet and is a front view of it in condition where it is shaped like a case. This light source device has a lock convex portion and a lock recess for locking this lock convex portion formed at a corner of a frame portion 52 instead of using double-faced tape as a binding member for biding the corners of the frame portion.

A roughly V-shaped defect portion 57 is formed at the corner 52*a* of the frame portion 52 so that when the four frame portions 52 continuing to the four sides of a flat portion 51 at a first fold 5*b* are obliquely folded with respect to a flat portion 51, two edges 57*a*, 57*a* of the defect portion 57 may agree and this agreement condition may be held by the lock convex portion 59*a* and the lock recess 59*b*.

The lock convex portion 59*a* has a retaining lock portion formed at its tip. The lock recess 59*b* is formed as a slit, so that if the lock convex portion 59*a* is fitted into the lock recess 59*b*, the condition in which the two edges 57*a*, 57*a* of the defect portion 57 agree with each other is held as shown in FIGS. 40A and 40B.

The other configurations and operations are almost the same as those of the embodiment 1-1, so that identical reference numerals are given to identical components, and detailed description on the identical components and that on the operations and effects will be omitted.

Embodiment 1-5

Figure 42:
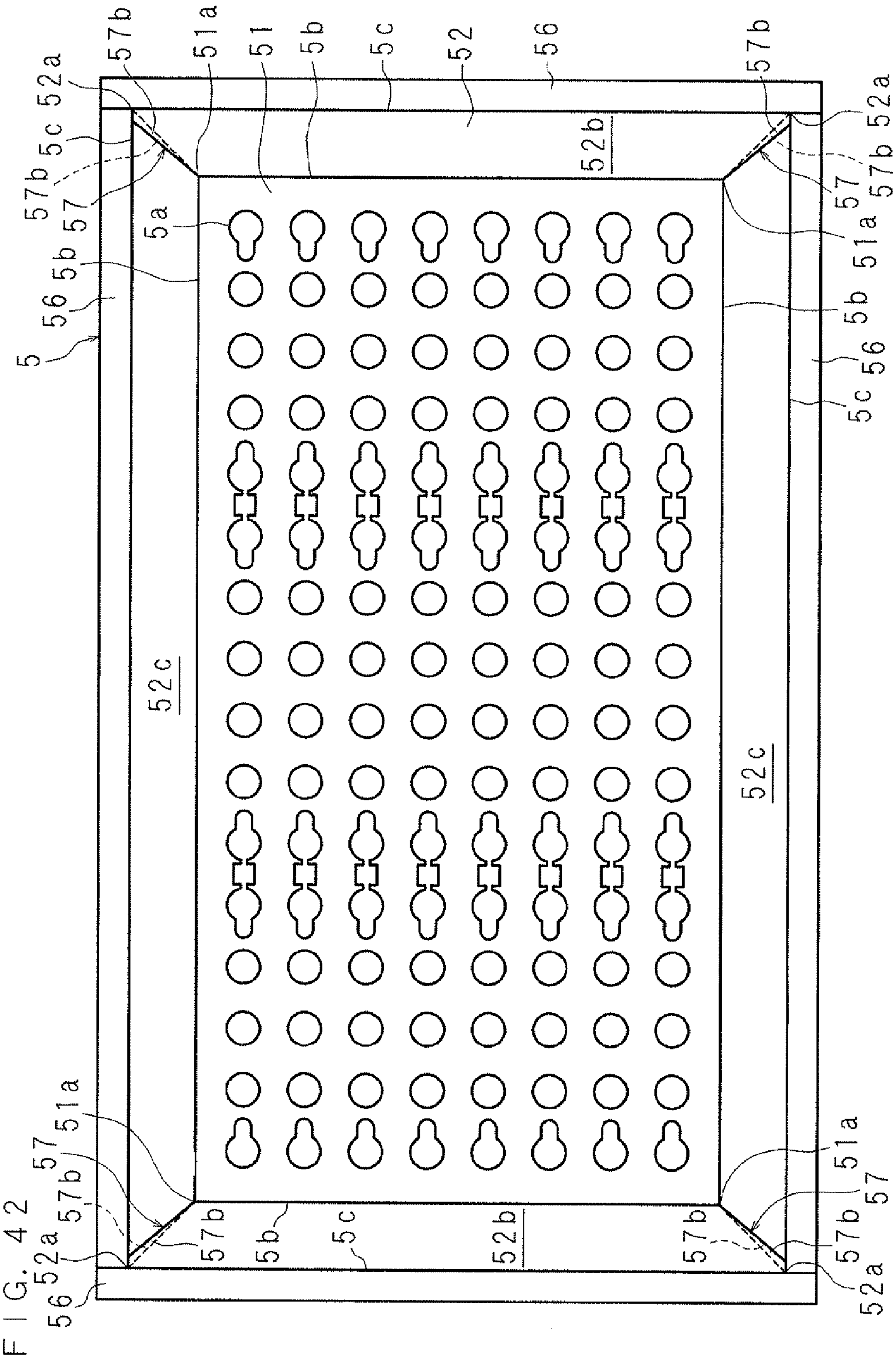
FIG. 42 is a plan view showing other configurations of the reflection sheet.
Figure 43:
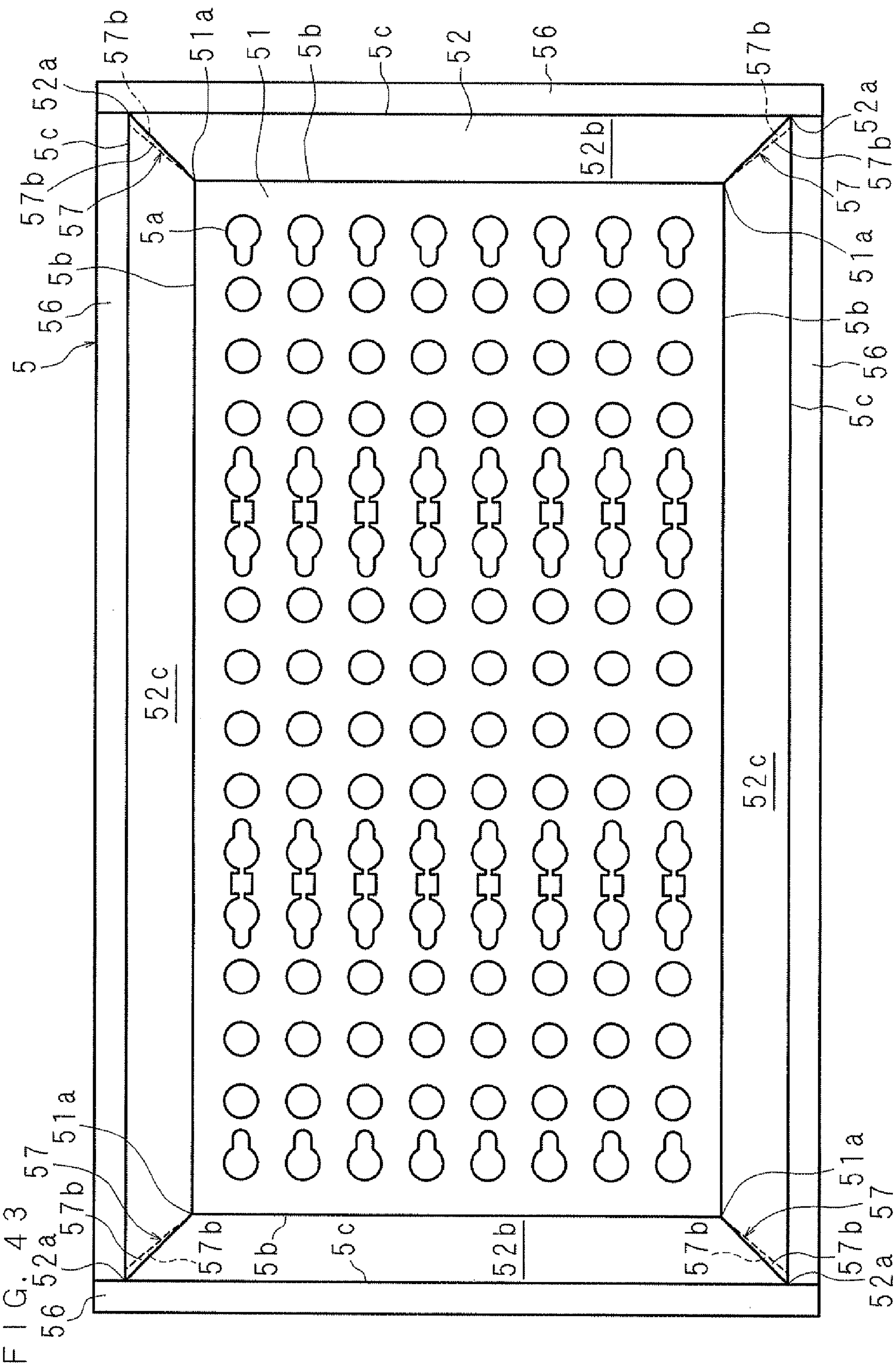
FIG. 43 is a plan view showing other configurations of the reflection sheet.

FIGS. 42 and 43 are plan views showing other configurations of the reflection sheet included in the light source device according to the present invention. This light source device has a roughly V-shaped defect portion 57 divergent from a corner 51*a* at a corner 52*a* of a frame portion 52 on the reflection sheet 5 (B5) so that when the four frame portions 52 continuing the four sides of a flat portion 51 at a first fold 5*b* are folded obliquely with respect to the flat portion 51, two edges 57*b*, 57*b* of the defect portion 57 may overlap in the thickness direction.

The edges 57*b* of the short frame portion 52*b* of the four frame portions 52 lap over the long frame portion 52*c* as shown in FIG. 42 and the edges 57*b*, 57*b* of the long frame portion 52*c* of the four frame portions 52 lap over the short frame portion 52*b* as shown in FIG. 43 so that no gap may occur between the corners 52*a* of the frame portion 52.

The other configurations and functions are almost the same as those of the embodiment 1-1, so that identical reference numerals are given to identical components, and detailed description on the identical components and that on the functions and effects will be omitted.

Although the embodiment 1 have used double-faced tape as the binding member for binding the corners 52*a* of the frame portion 52, it may be replaced by single-sided tape or clips. The corners 52*a* of the frame portion 52 may be bound by adhesive agent and the binding means is not limited in particular.

Embodiment 2-1

Figure 44:
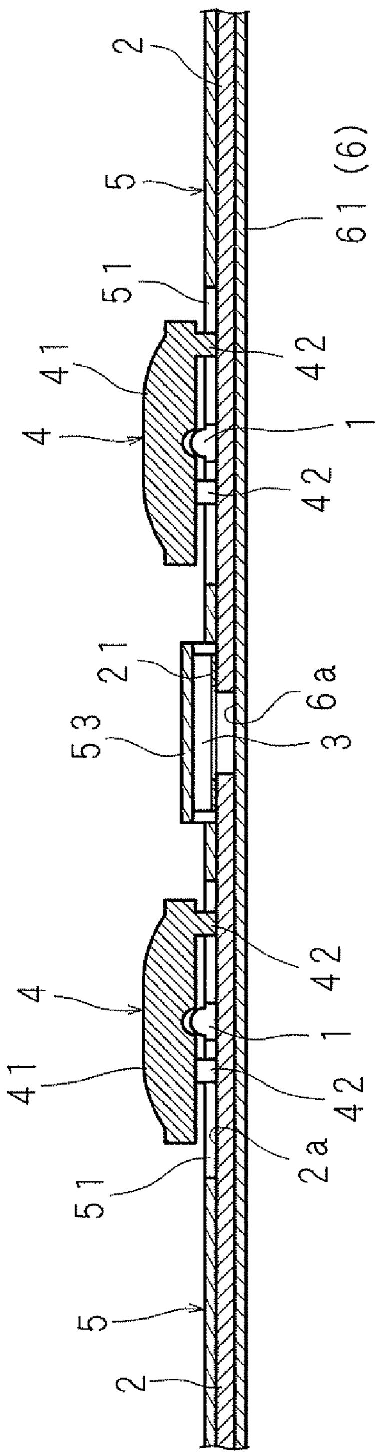
FIG. 44 is a partially enlarged schematic cross-sectional view illustrating a structure of a light source device in accordance with an embodiment 2.
Figure 45:
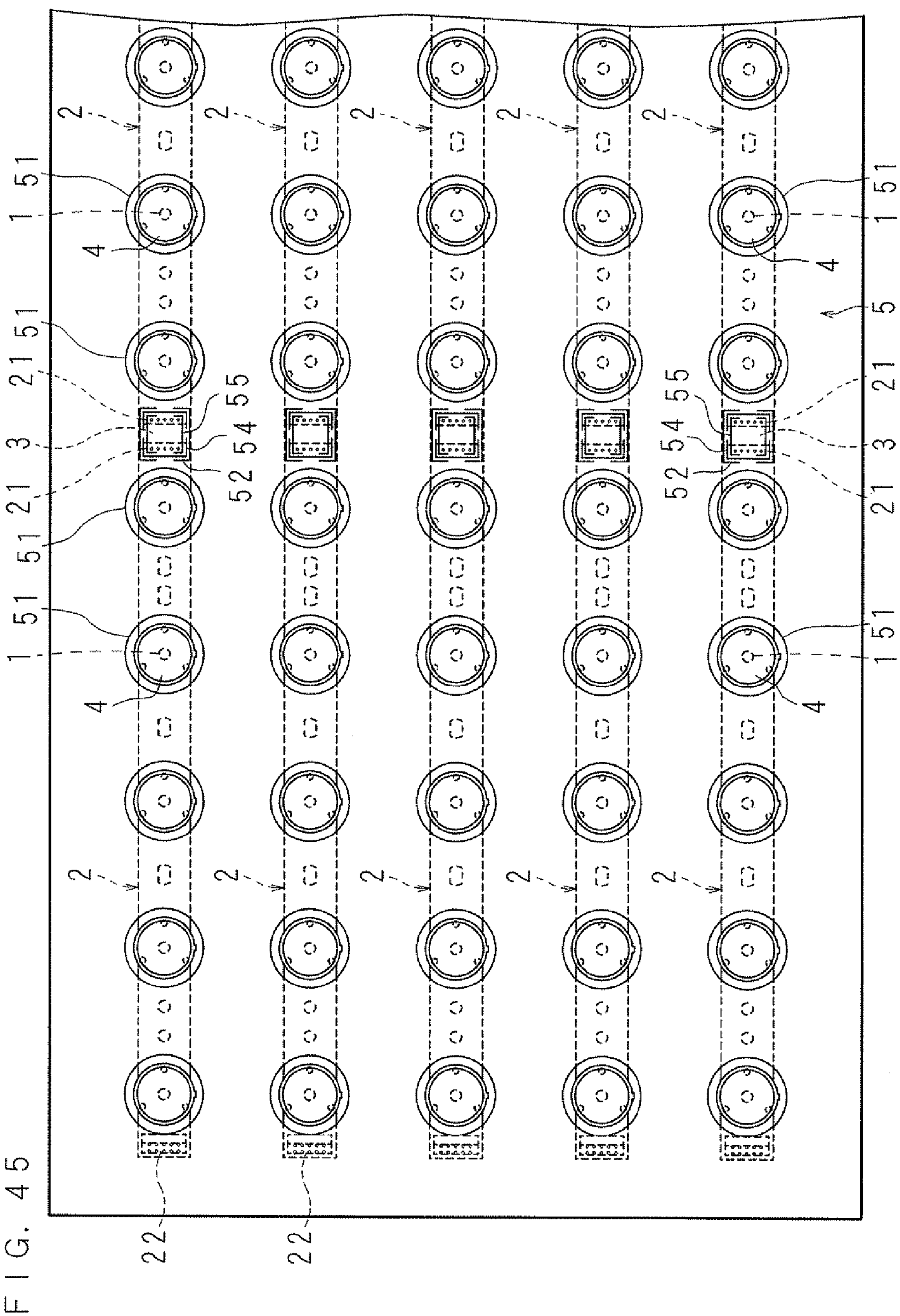
FIG. 45 is a plan view that illustrates the light source device of the embodiment 2 one portion of which is omitted.
Figure 46:
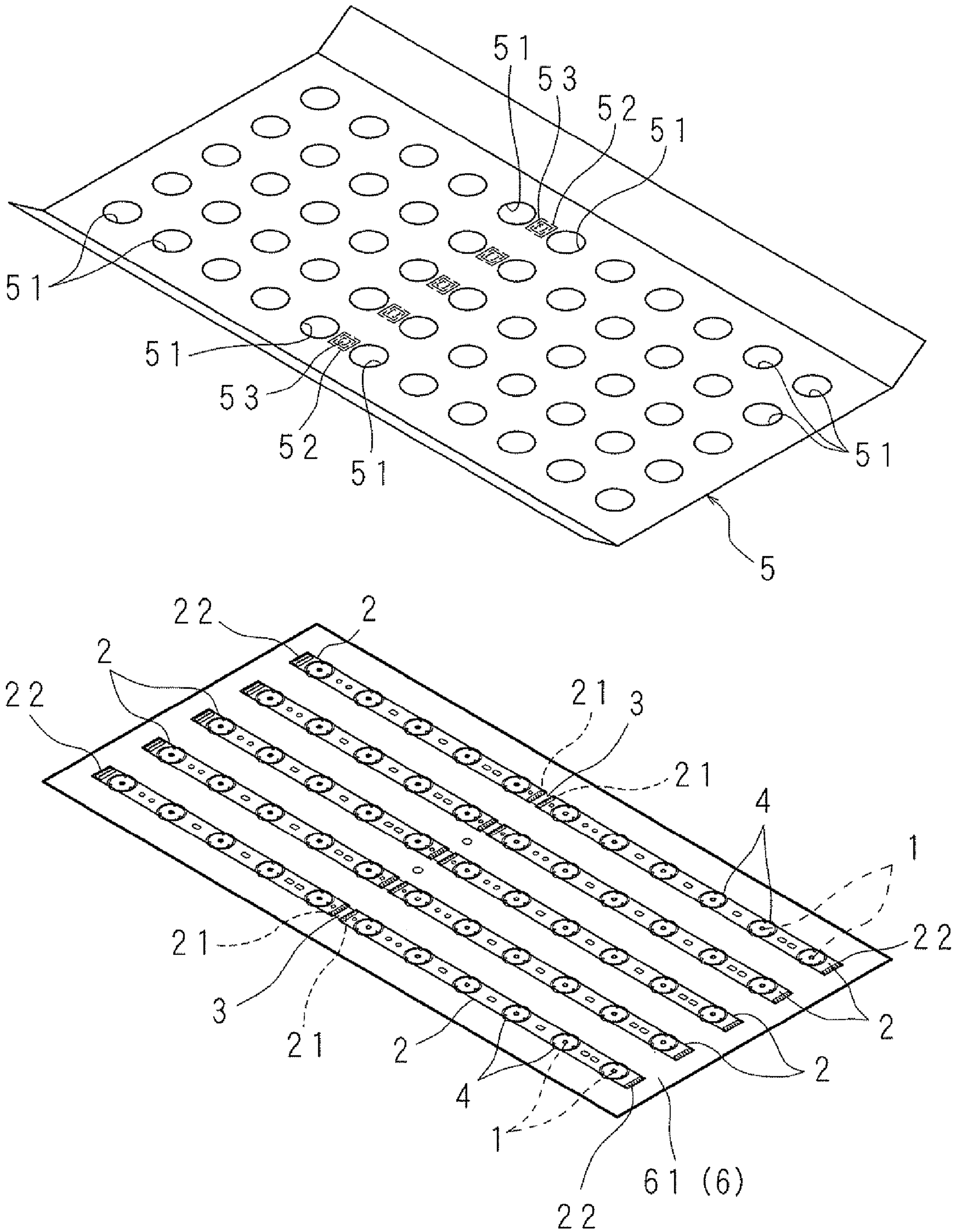
FIG. 46 is a schematic perspective view that illustrates the light source device of the embodiment 2 one portion of which is disassembled.
Figure 47:
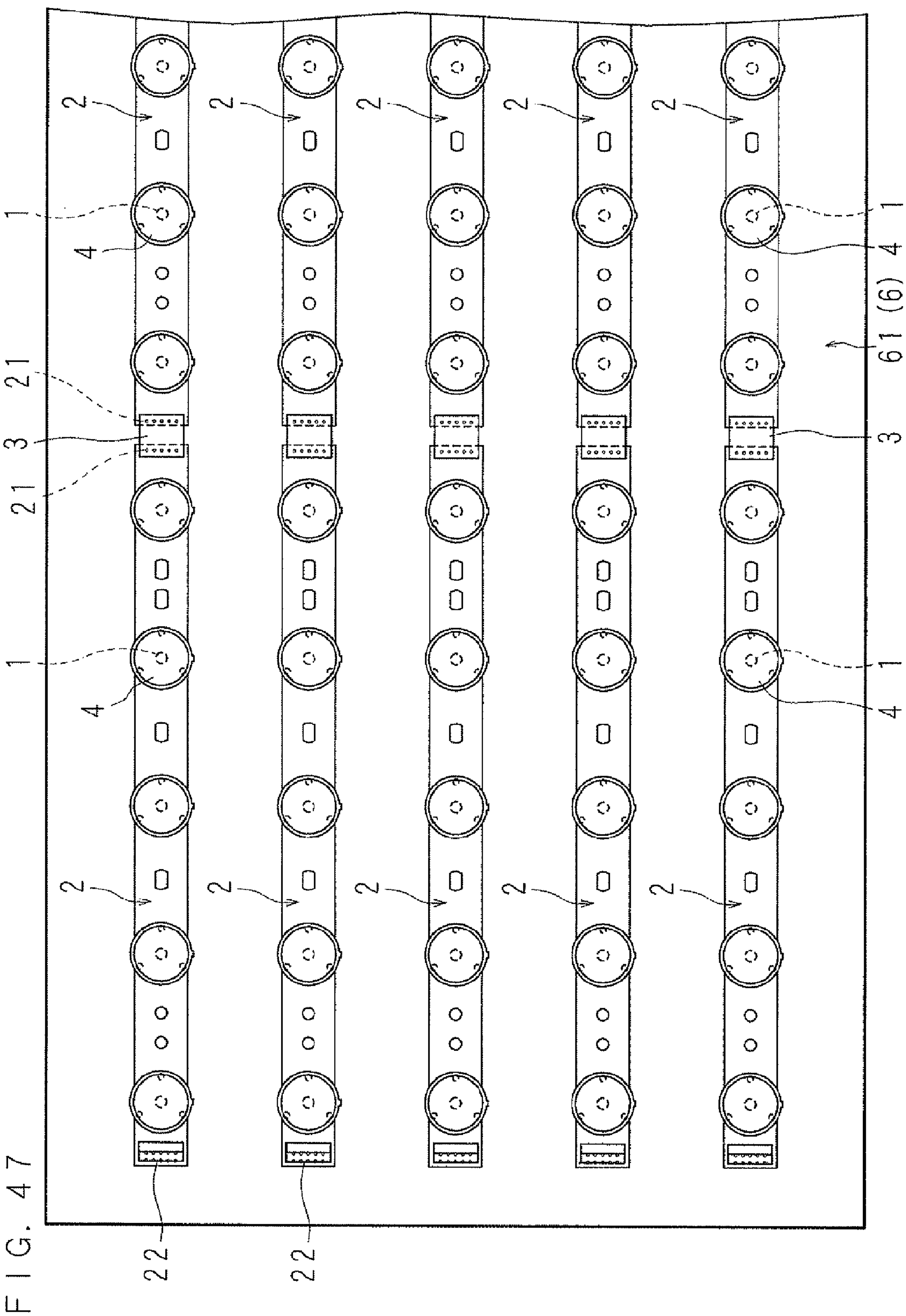
FIG. 47 is a plan view that illustrates the structure of the light source device of the embodiment 2 from which a reflection sheet is omitted.
Figure 48:
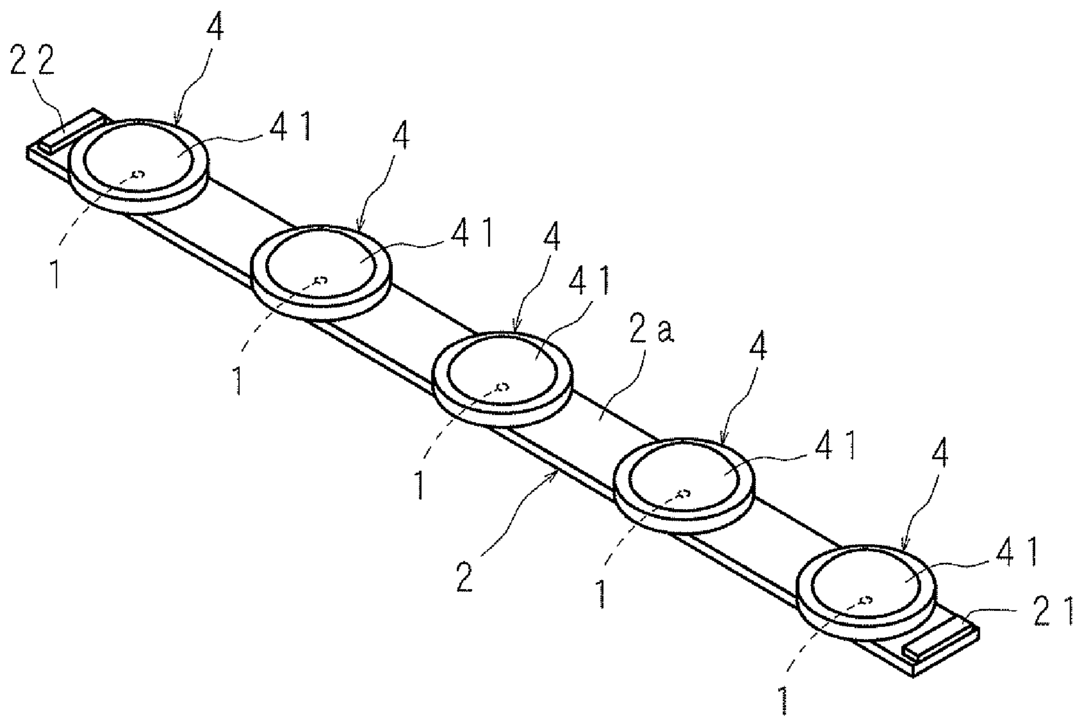
FIG. 48 is a perspective view that illustrates a structure of a light-emitting diode substrate on which lenses are attached of the light source device of the embodiment 2.
Figure 49:
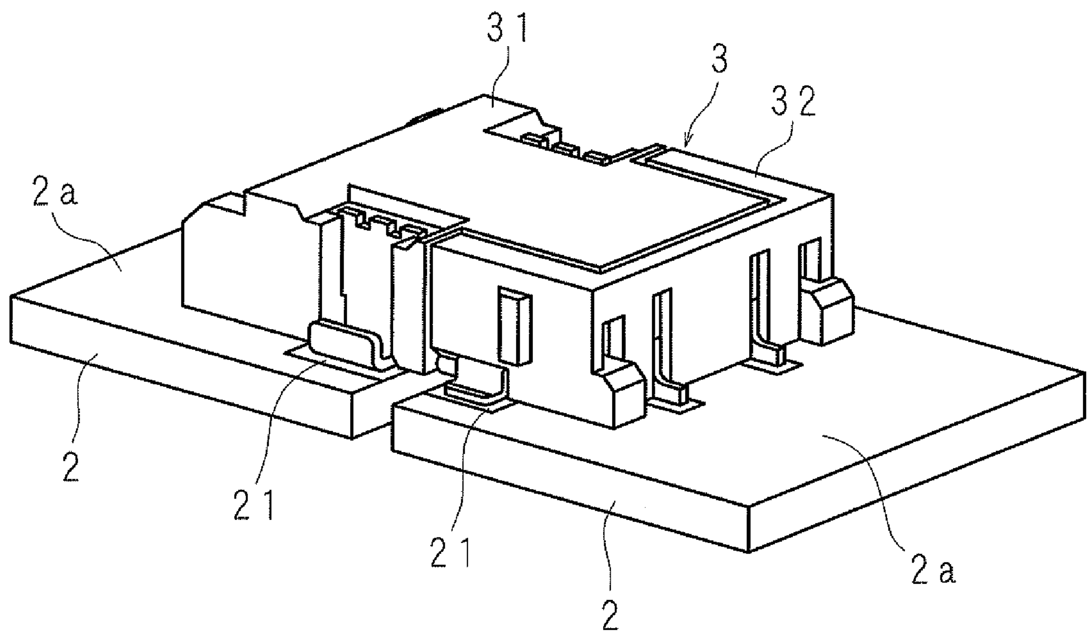
FIG. 49 is a perspective view that illustrates a structure of a connector of the light source device of the embodiment 2.

FIG. 44 is a partially enlarged schematic cross-sectional view illustrating a structure of a light source device in accordance with the present invention, FIG. 45 is a plan view that illustrates the light source device one portion of which is omitted, FIG. 46 is a schematic perspective view that illustrates one disassembled portion of the light source device, FIG. 47 is a plan view that illustrates the structure from which a reflection sheet is omitted, FIG. 48 is a perspective view that illustrates a structure of a light-emitting diode substrate to which lenses are attached, and FIG. 49 is a perspective view that illustrates a structure of a connector.

The illustrated light source device (B), which has a display surface on the front side, and is attached to the rear side of a display unit (A) of a thin display device provided with the display unit having a substantially rectangular parallelepiped shape, has a structure provided with a plurality of light-emitting diodes 1 (B1) that are arranged in a diced pattern and serve as light sources, a plurality of light-emitting diode substrates 2 (B3) having one surface 2*a* on which the light-emitting diodes 1 are assembled, which are arranged side by side into a plurality of rows, a plurality of connectors 3 (B4) that connect the adjacent light-emitting diode substrates 2 mutually with each other, a plurality of lenses 4 (B2) that are attached to the one surface 2*a* of each of the light-emitting diode substrates 2 so as to be opposed to top portions of the light-emitting diodes 1 in such a manner so as to diverge light emitted by the light-emitting diode 1, a reflection sheet 5 (B5) that has through holes 51 (B53) in which the lenses 4 are disposed, and is opposed to the one surface 2*a* and one surface of the connector 3 in such a manner as to reflect the light diverged by the lenses 4, and a support body 6 (B6) on which the light-emitting diode substrates 2 are arranged into a plurality of lines and supported.

Each of the light-emitting diode substrates 2 has a stripe pattern, with a circuit portion formed on each of the one surface 2*a*, and a plurality of those substrates are arranged into a plurality of lines on one surface 6*a* of the support body 6 having the rectangular parallelepiped shape, while being respectively spaced from one another in its longitudinal direction as well as in its width direction. On one of the surfaces 2*a* of each light-emitting diode substrate 2, a plurality of light-emitting diodes 1 are assembled in a manner so as to be spaced from one another in the length direction, as shown in FIG. 47, and connecting portions 21 and 22 are formed on the two ends in the length direction of the one surface 2*a*.

In the light-emitting diode substrates 2 arranged into a plurality of lines, with one end thereof facing another opposed end in the length direction, the light-emitting diode substrates 2 of each line are connected to each other, with the adjacent two connecting portions 21, 21 being connected with each other by the connector 3, and the connecting portion 22 of one of the light-emitting diode substrates 2 is connected to a power supply circuit board by a second connector (B41), with a short connector being connected to a connecting portion 22 of the other light-emitting diode substrate 2.

The connector 3 has a substantially rectangular parallelepiped shape with a plug 31 to be connected to one of the connecting portions 21, 21 and a receptacle 32 to be connected to the other connecting portion 21, such that, when connected to the connecting portions 21, 21, the other surface is joined onto one surface 2*a* of the light-emitting diode substrate 2, with the connector 3 being allowed to protrude from the one surface.

The reflection sheet 5 having a highly reflective property, which is composed of one sheet of synthetic resin sheet having a rectangular shape in association with the support member 6, has a structure in which two slits 52, 52 (B56, B59) that are separated from each other in a direction along the sheet surface so as to be opposed to each other, and formed at portions facing the outer edge of the connector 3, with a portion between the slits 52, 52 being formed as a bias portion 53 that can be biased in a thickness direction. Moreover, the reflection sheet 5 is provided with through holes 51 formed at portions corresponding to the lenses 4.

Figure 50:
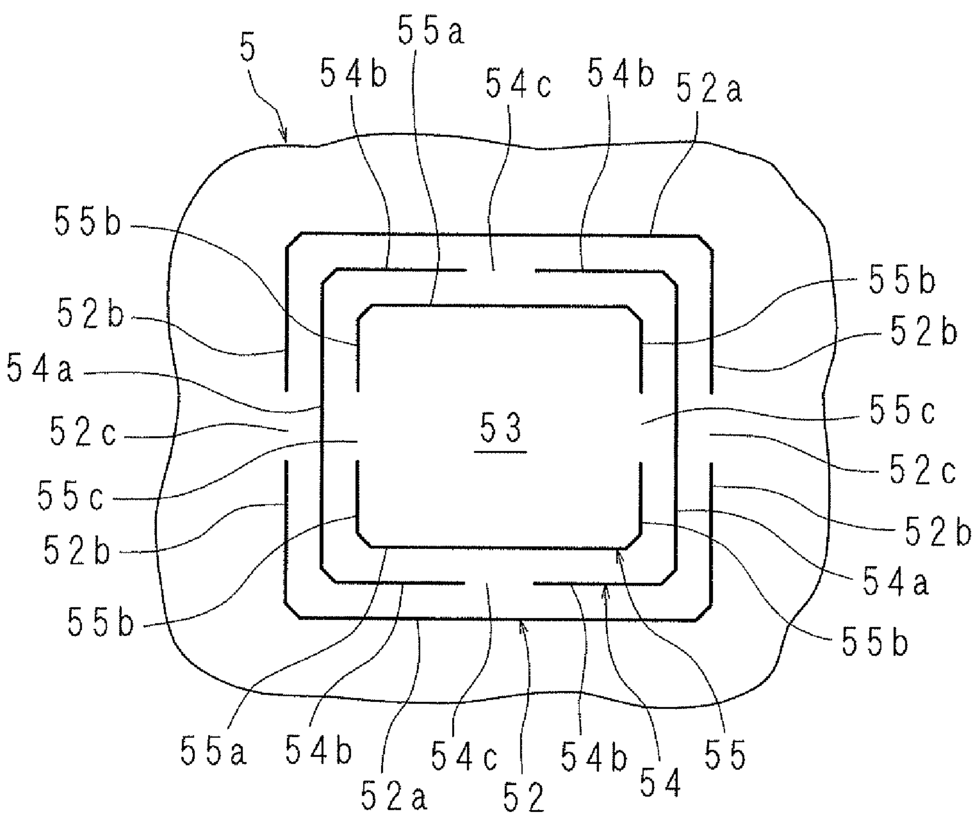
FIG. 50 is an enlarged plan view that illustrates a portion of the reflection sheet that is opposed to the connector of the light source device of the embodiment 2.
Figure 51:
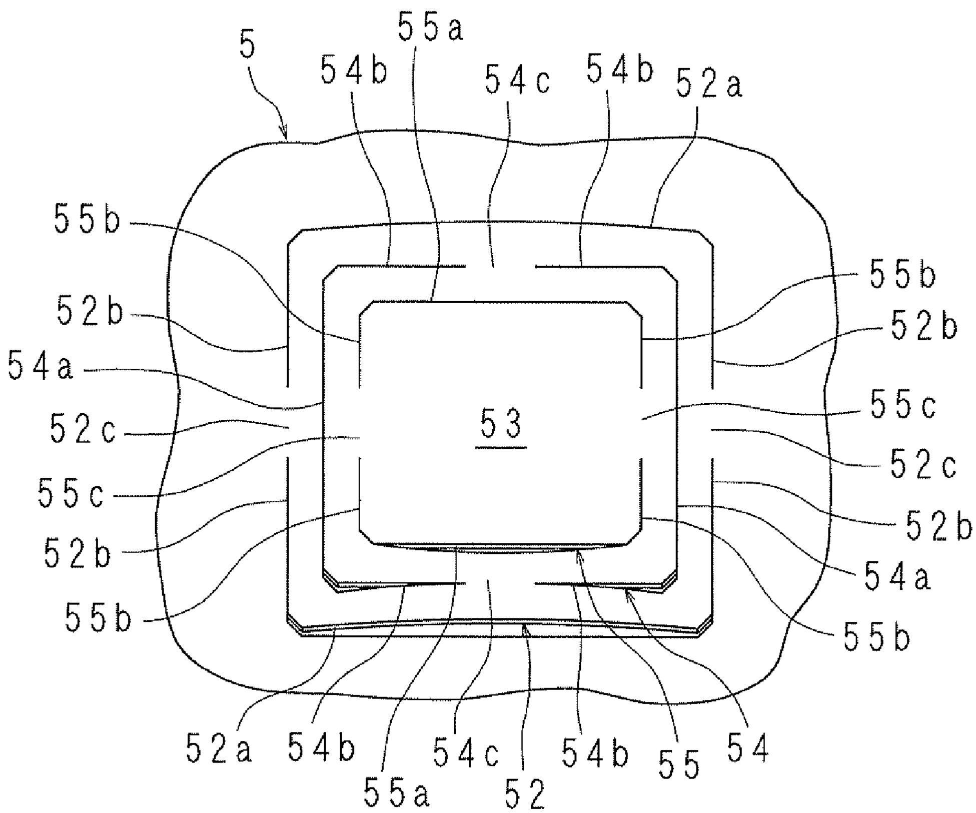
FIG. 51 is an enlarged perspective view that shows a state in which the portion of the reflection sheet facing the connector is biased in a thickness direction in the light source device of the embodiment 2.

FIG. 50 is an enlarged plan view that illustrates a portion of the reflection sheet that is opposed to the connector, and FIG. 51 is an enlarged perspective view that shows a state in which the portion of the reflection sheet facing the connector is biased in a thickness direction. The two slits 52 (B59) are formed into a U-letter shape by long sides 52*a*, 52*a* that are spaced from each other in directions along the sheet surface, and opposed to each other, and two short sides 52*b*, 52*b* that are directed toward sides that make separated distances from the two ends of the long sides 52*a*, 52*a* shorter, and non-slit portions 52*c*, 52*c* between the two ends of the slits 52, 52 are connected to the bias portion 53 between the slits 52, 52 so that the bias portion 53 can be biased in a thickness direction from the non-slit portions 52*c*, 52*c* serving as starting portions of the bias.

Between the two slits 52, 52, two second slits 54, 54 having a substantially U-letter shape are formed such that long sides 54*a*, 54*a* in the center are separated from short sides 52*b*, 52*b* and opposed thereto, with short sides 54*b*, 54*b* on the two ends being separated from the long sides 52*a*, 52*a* and opposed thereto. The second slits 54, 54 have such a structure that non-slit portions 54*c*, 54*c* between the two ends are connected to the center portion of the long sides 52*a*, 52*a* so that the bias portion 53 is biased in a thickness direction from the non-slit portions 54*c*, 54*c* serving as starting portions of the bias.

Between the two second slits 54, 54, two third slits 55, 55 having a substantially U-letter shape are formed such that long sides 55*a* in the center are separated from short sides 54*b*, 54*b*, and opposed thereto, with short sides 55*b*, 55*b* on the two ends being separated from the long sides 54*a*, 54*a*, and opposed thereto. The third slits 55, 55 have such a structure that non-slit portions 55*c*, 55*c* between the two ends are connected to the center portion of the long sides 54*c* so that the bias portion 53 is biased in a thickness direction from the non-slit portions 55*c*, 55*c* serving as starting portions of the bias.

The through holes 51, each having a round shape with a diameter slightly larger than that of the lens 4, are disposed in a diced pattern, with the lenses 4 being disposed therein.

As illustrated in FIG. 48, five or six of the light-emitting diodes 1 are assembled in the length direction of the light-emitting diode substrate 2, in a manner so as to be spaced apart from each other, and five or six of the lenses 4 are attached to the one surface 2*a* thereof with an adhesive in association with the respective diodes 1.

Each lens 4, which is spaced from the top portion of the light-emitting diode 1 to be opposed thereto, has a translucent portion 41 having a hemispheric recess used for diverging light emitted by the light-emitting diode 1 in all directions, and three positioning protrusions 42 that protrude from the surface of the translucent portion 41 opposed to the one surface 2*a* toward the light-emitting diode substrate 2, so as to determine the position of the translucent portion 41 relative to the light-emitting diode substrate 2, with the tip of each positioning projection 42 being attached to the one surface 2*a* with an adhesive agent.

The positioning projections 42 are used for placing the translucent portion 41 on an upper side from the reflection sheet 5, that is, for placing the reflection sheet 5 on the light-emitting diode substrate 2 side rather than on the translucent portion 41 side, and the distance between the translucent portion 41 and the light-emitting diode substrate 2 is consequently made slightly longer than the thickness of the reflection sheet 5 such a manner that a slight space is generated between the lower surface of the translucent portion 41 and the one surface of the light-emitting diode substrate 2 so that, even when the reflection sheet 5 is thermally expanded by heat generated upon light emission of the light-emitting diode 1, the expansion of the reflection sheet 5 due to this thermal expansion is permitted so as not to cause wrinkles on the reflection sheet 5.

The support body 6 is formed by processing a metal plate, and has a flat plate portion 61 having substantially a rectangular shape and a frame portion 62 that is connected to the peripheral edge of the plate portion 61, and on one surface 6*a* of the plate portion 61, the light-emitting diode substrates 2 are housed to be supported thereon side by side in the length direction, as well as in the width direction.

Onto one of the sides in the length direction on the other surface of the plate portion 61, a power supply circuit board to be connected to the second connecting portion 22 of the light-emitting diode substrate 2 by a second connector is attached, and onto the other side in the length direction, a control circuit board, which carries out driving and controlling operations on the display unit, is attached. Moreover, a signal processing circuit board, which processes image signals to be displayed on the display surface of the display unit, is attached to the center portion in the length direction of the other surface of the plate portion 61.

In the light source device having the above-mentioned structure, the support body 6 is mounted on a work bench with its open side facing up, and sets of two light-emitting diode substrates 2 that are adjacent to each other in the line direction, are arranged in a plurality of lines, on the one surface 6*a* of the plate portion 61 in the support body 6, with the connector 3 being connected to the connecting portions 21, 21 formed on the adjacent end portions of adjacent light-emitting diode substrates 2 on the respective lines, and reflection sheets 5 are mounted on the respective surfaces of the light-emitting diode substrates 2 on the respective lines so as to be opposed thereto. The biasing portion 53 between the slits 52, 52 of the reflection sheet 5 is opposed to the other surface of the connector 3 so as to cover the connector 3 so that the lens 4 is fitted to each of the through holes 51 of the reflection sheet 5.

In this case, on each of the adjacent light-emitting diode substrates 2 on the respective lines, the connecting portions 21 and 22 are formed, with the connector 3 connected to the connecting portion 21 being overlapped with the one surface 2*a*, and since the connector 3 protrudes from the one surface 2*a*, the bias portion 53 of the reflection sheet 5, opposed to one of the surfaces of the connector 3, that is, in other words, the portion covering the connector 3, is gradually biased in the thickness direction starting from the non-slit portions 52*c*, 52*c*, the non-slit portions 54*c*, 54*c* and the non-slit portions 55*c*, 55*c*, serving as starting points. In this manner, since portions of the reflection sheet 5 opposed to the connector 3 are gradually biased by the slits 52, 52, the second slits 54, 54 and the third slits 55, 55, it is possible to enhance the light reflectance of light emitted from the light-emitting diode 1 and reflected in a direction orthogonal to the sheet surface, and consequently to uniform its luminance.

Figure 52:
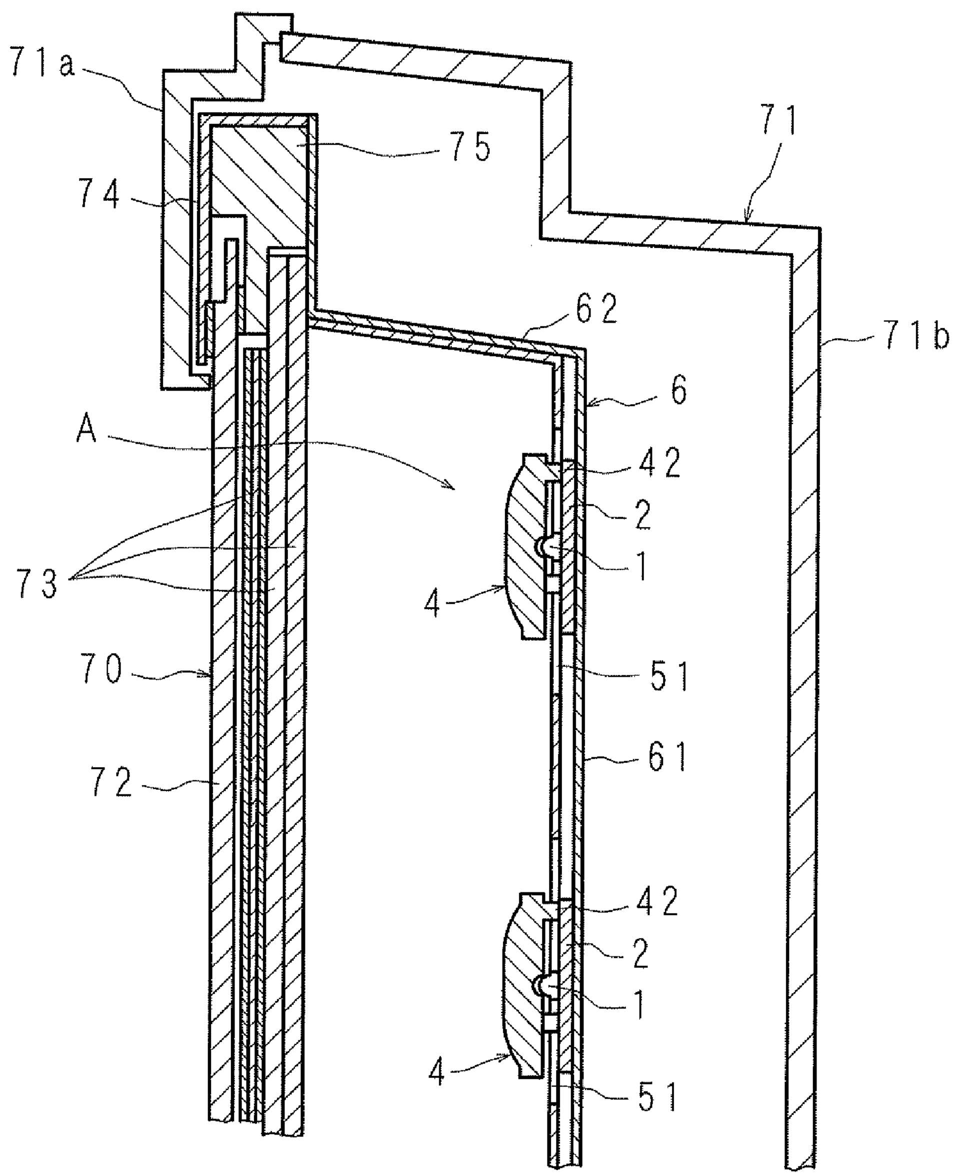
FIG. 52 is a cross-sectional view that illustrates a structure of a display device in which the light source device of the embodiment 2 is installed.

FIG. 52 is a cross-sectional view that illustrates a structure of a display device provided with a light source device in accordance with the present invention. This display device has a display unit 70 (A) having a display surface for use in displaying a television image thereon on its front side, a light source device A (B) placed on the rear side of the display unit 70, and a cabinet 71 (D) that conceals the peripheral portion of the display unit 70 and the rear side of the light source device A.

The display unit 70 has a display panel 72(A1) having a display surface and an optical sheet 73(C) that is placed on the rear side of the display panel 72. The peripheral edge portion of the display panel 72 is sandwiched by a front-holding frame 74 (A2) and a rear-holding frame 75 (A3) in a front to rear direction to be held therein so that a panel module is formed, with the rear-holding frame 75 being attached to the peripheral edge portion of the support body 6.

The optical sheet 73 is a laminated sheet formed by stacking a diffusion plate having a comparatively high thickness that diffuses light emitted by the light-emitting diode 1 as a light source, and synthesized resin sheets having comparatively low thicknesses, such as a reflective polarizing plate, a prism sheet and a diffusion sheet.

The support body 6 is provided with a plate portion 61 and a frame portion 62 that is connected with the peripheral edge of the plate portion 61, and supports the peripheral edge portion of the diffusion plate on the frame portion 62.

The cabinet 71 is provided with a cabinet front divided unit 71*a* (D1) that conceals the peripheral edge portion on the front side of the display unit 70, and a cabinet rear divided unit 71*b* (D2) having a deep dish shape so as to conceal the peripheral edge portion and the rear side of the light source device A, and is attached to the frame portion 62 of the support member 6 with male screws.

Embodiment 2-2

Figure 53:
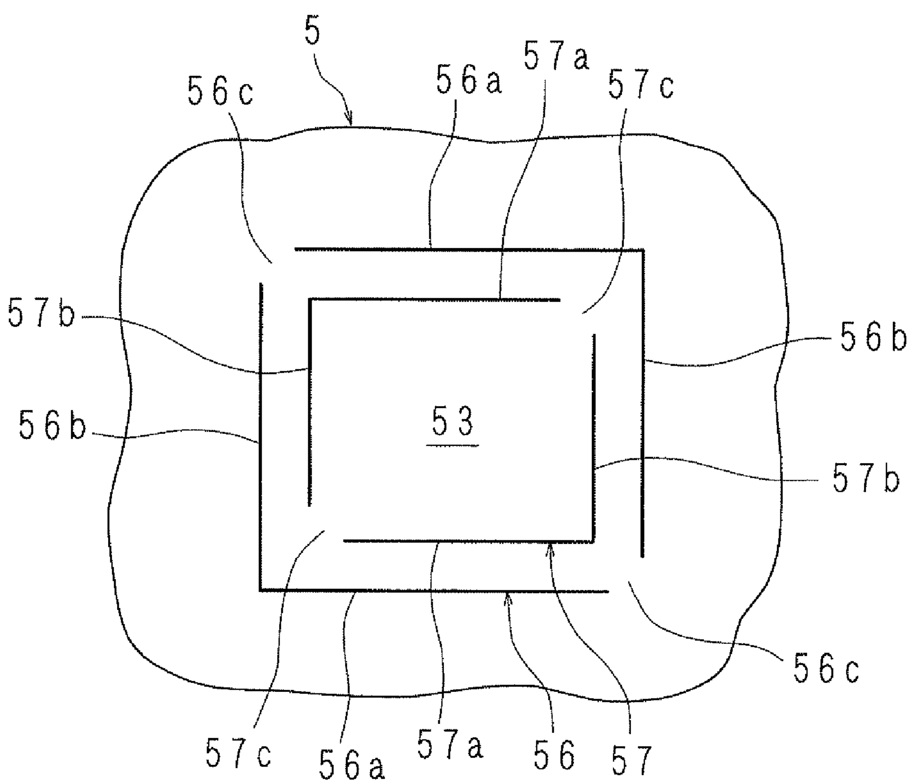
FIG. 53 is an enlarged plan view that illustrates another structure of a slit portion of the reflection sheet installed in the light source device of the embodiment 2.

FIG. 53 is an enlarged plan view that illustrates another structure of the slit portions of a reflection sheet that is installed in the light source device. In this light source device, instead of forming the two slits 52, 52 of the reflection sheet 5 into a substantially U-letter shape, slits 56, 56 having a substantially L-letter shape by long sides 56*a*, 56*a* that are spaced from each other in directions along the sheet surface and two short sides 56*b*, 56*b* each of which is directed from one end of each of the long sides 56*a*, 56*a* toward the side that makes the spaced distance shorter, and the slits 56, 56 are placed to be opposed to each other, with the respective long sides 56*a*, 56*a* and the respective short sides 56*b*, 56*b* being mutually opposed to each other so as to form a substantially square shape. The slits 56, 56 are arranged such that non-slit portions 56*c*, 56*c* between the respective ends are connected to a bias portion 53 between the slits 56, 56 so that the bias portion 53 can be biased in a thickness direction from the non-slit portions 56*c*, 56*c* serving as starting points.

Between the two slits, two slits 57, 57, each having a substantially L-letter shape, which are placed so as to be opposed to each other, with the respective long sides 57*a*, 57*a* and the respective short sides 57*b*, 57*b* being mutually made to form a substantially square shape, are formed with an opening, with the respective corner portions being opposed to the non-slit portions 56*c*, 56*c* between the respective two ends of the slits 56, 56. The slits 57, 57 are arranged such that non-slit portions 57*c*, 57*c* between the respective two ends are connected to a center portion between the slits 56, 56 so that the bias portion 53 can be biased in a thickness direction from the non-slit portions 57*c*, 57*c* serving as starting points.

In the present embodiment, the bias portion 53 of the reflection sheet 5, opposed to the connector 3, is gradually biased in a thickness direction from the non-slit portions 56*c*, 56*c* and the non-slit portions 57*c*, 57*c* serving as starting points. Since portions of the reflection sheet 5, opposed to the connector 3, are gradually biased by the slits 56, 56 and the slits 57, 57, it is possible to enhance the light reflectance of light emitted from the light-emitting diode 1 and reflected in a direction orthogonal to the sheet surface, and consequently to uniform its luminance.

Since the other structures and functions are the same as those of the embodiment 2-1, the same parts are indicated by the same reference numerals, and the detailed description thereof and the explanation of the functions and effects will be omitted.

Embodiment 2-3

FIG. 54 is a plan view that illustrates another structure of the slit portions of a reflection sheet that is installed in the light source device. In this light source device, instead of forming the two slits 52, 52 of the reflection sheet 5 into a substantially U-letter shape, or instead of forming the slits 56, 56 thereof into a substantially L-letter shape, paired slits 58, 58 (B56), which are spaced from each other in the direction along the sheet surface, and opposed to each other in parallel, are prepared, and the paired slits 58, 58 are separated from each other in the parallel arranging direction of light-emitting diode substrates 2 that are parallel arranged into a plurality of lines (in a direction orthogonal to the line, or an intersecting direction) so that the opposing direction is alternately made different. In other words, portions opposed to the connector 3 to be connected to the light-emitting diode substrate 2 on one line are separated from each other in the line direction so as to be opposed to each other, while portions opposed to the connector 3 to be connected to the light-emitting diode substrate 2 on the adjacent line are separated from each other in the direction orthogonal to the line direction, so that the paired slits 58, 58 that are opposed to each other in these different directions are alternately placed with the parallel arranged interval of the plurality of lines. In the case when the opposing direction of the paired slits 58, 58 that are separated from each other in the parallel arranging direction of the light-emitting diode substrates 2 is the same, the paired slits 58, 58 are arranged in parallel with each other such that the non-slit portions 58*a*, 58*a* between the slits 58, 58 are set in the same direction, with the result that the dispersing property of reflected light at the bias portion is lowered; however, in the case when the paired slits 58, 58 are alternately placed with the parallel arranged interval of the plurality of lines, the dispersing property of reflected light at the bias portion can be improved so that the luminance characteristic can be appropriately maintained.

The two slits 58, 58 that are opposed in parallel with each other are biased in the thickness direction from the non-slit portions 58*a*, 58*a* between the two ends of the slits 58, 58 serving as starting points. The adjacent two slits 58, 58 have their non-slit portions 58*a*, 58*a* arranged in the orthogonal direction.

In this embodiment, even when the number of parallel arranged light-emitting diode substrates 2 parallel placed into a plurality of lines is comparatively high, that is, even when the number of parallel arranged connectors 3 is high, the degree of slant due to the biased portion opposed to each connector 3 can be made smaller so that it becomes possible to enhance the light reflective property in a direction orthogonal to the sheet surface, and consequently to maintain the luminance property appropriately.

Since the other structures and functions are the same as those of the embodiment 2-1, the same parts are indicated by the same reference numerals, and the detailed description thereof and the explanation of the functions and effects will be omitted.

Embodiment 2-4

Figure 55:
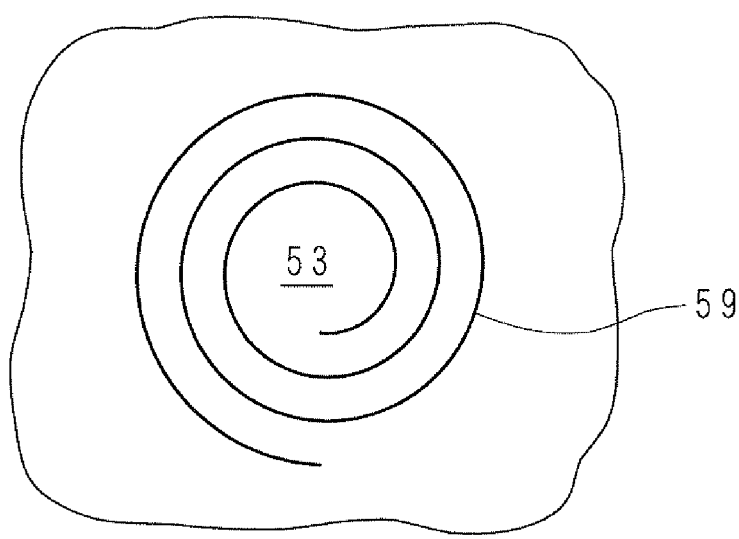
FIG. 55 is a plan view that illustrates still another structure of a slit portion of the reflection sheet installed in the light source device of the embodiment 2.

FIG. 55 is a plan view that illustrates another structure of the slit portions of a reflection sheet that is installed in the light source device. In this light source device, instead of forming bias portions 53 by using slits that are spaced from each other and opposed to each other, each bias portion 53 is formed by using a slit 59 having a spiral shape.

The slit 59 has a spiral shape from its starting point to its end point, and is designed so that, when made in contact with the connector 3, the gap between the two ends of the slit 59 is gradually biased as a whole.

Since the other structures and functions are the same as those of embodiment 2-1, the same parts are indicated by the same reference numerals, and the detailed description thereof and the explanation of the functions and effects will be omitted.

Embodiment 2-5

FIG. 56 is a plan view that illustrates another structure of the slit portions of a reflection sheet that is installed in the light source device. In this light source device, instead of forming the bias portion 53 by using a slit 59 having a round spiral shape, each bias portion 53 is formed by using a slit 50 having a substantially square spiral shape.

The slit 50 has a substantially square spiral shape from its starting point to its end point, and is designed so that, when made in contact with the connector 3, the gap between the two ends of the slit 50 is gradually biased as a whole.

In this embodiment, even when the number of parallel arranged light-emitting diode substrates 2 parallel placed into a plurality of lines is comparatively high, that is, even when the number of parallel arranged connectors 3 is high, the spaced distance between the slits 50 can be ensured so that the number of arranged slits 50 is increased.

Since the other structures and functions are the same as those of the embodiment 2-1, the same parts are indicated by the same reference numerals, and the detailed description thereof and the explanation of the functions and effects will be omitted.

Embodiment 2-6

FIG. 57 is a plan view that illustrates another structure of the slit portions of a reflection sheet that is installed in the light source device. In this light source device, instead of providing the structure in which the two slits 52, 52, each having a substantially U-letter shape, are opposed to each other, with the two ends thereof being close to each other, one of two slits 52, 52, each having a substantially U-letter shape, is biased in a direction intersecting the opposing direction of the slits 52, 52, so that short sides 52*b*, 52*b* of the two ends of the respective slits 52, 52 are separated in a direction intersecting the opposing direction so as to be opposed to each other.

The short sides 52*b*, 52*b* of the two ends of the two slits 52, 52 are opposed to the two corner portions of the respective slits 52, 52, with non-slit portions 52*c*, 52*c* between the two ends of the two slits 52, 52 and the two corner portions of the slits 52, 52 are connected to a bias portion 53 between the slits 52, 52 so that the bias portion 53 can be biased in the thickness direction from the non-slit portions 52*c*, 52*c* serving as starting points.

In this embodiment, since the bias portion 53 is located between the slits 52, 52 each having a substantially U-letter shape so that the distance between the non-slit portions 52*c*, 52*c* can be made comparatively longer, the bias portion 53 of the reflection sheet 5 that is opposed to the connector 3 can be gradually biased in the thickness direction from the non-slit portions 52*c*, 52*c* serving as starting points. In this manner, since the portion opposed to the connector 3 of the reflection sheet 5 is gradually biased along a comparatively long distance between the non-slit portions 52*c*, 52*c*, it becomes possible to enhance the light reflective property of light that is emitted by the light-emitting diode 1 and reflected in a direction orthogonal to the sheet surface, and consequently to uniform the luminance.

Since the other structures and functions are the same as those of the embodiment 2-1, the same parts are indicated by the same reference numerals, and the detailed description thereof and the explanation of the functions and effects will be omitted.

Figure 58:
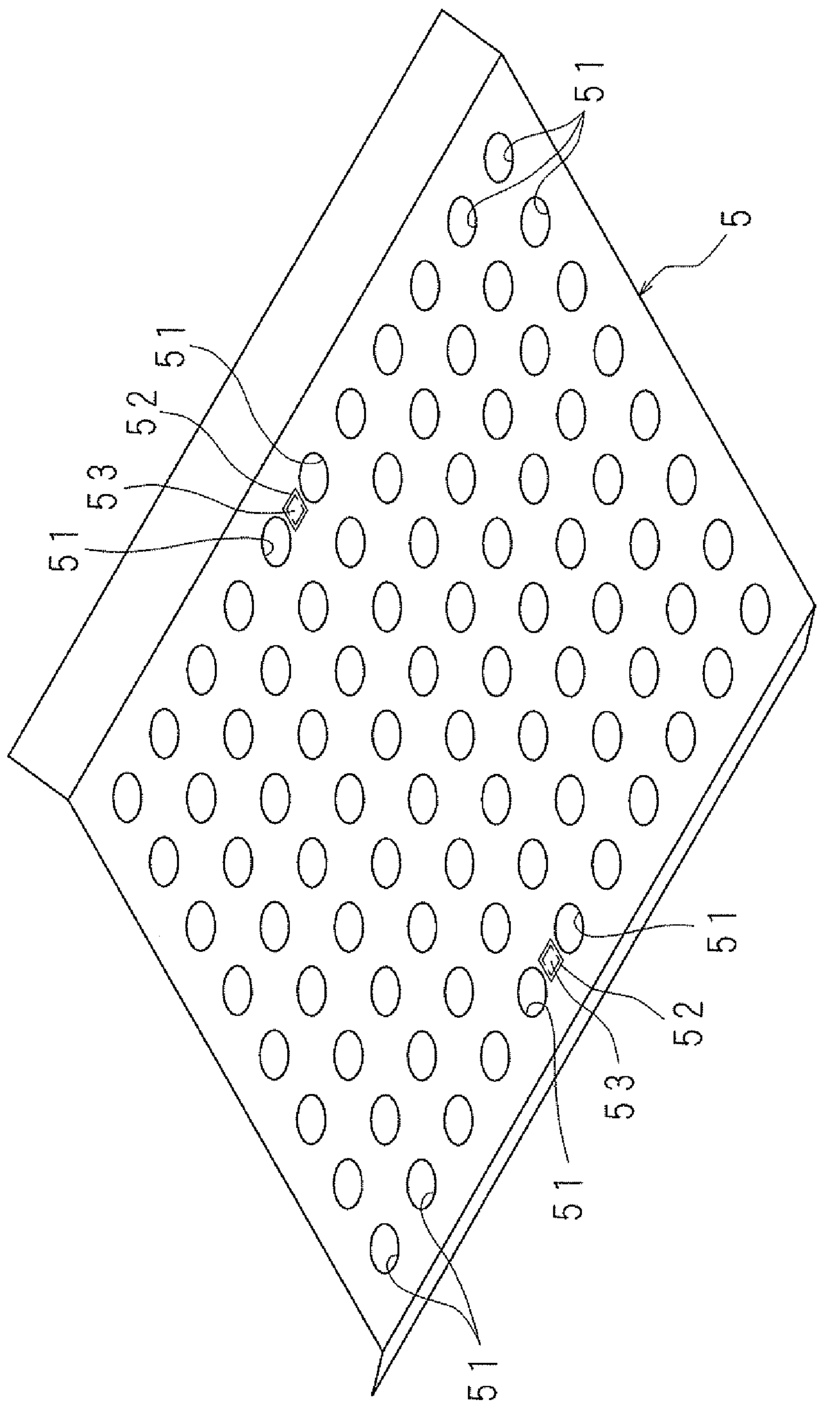
FIG. 58 is a perspective view that illustrates another structure of the reflection sheet installed in the light source device of the embodiment 2.
Figure 59:
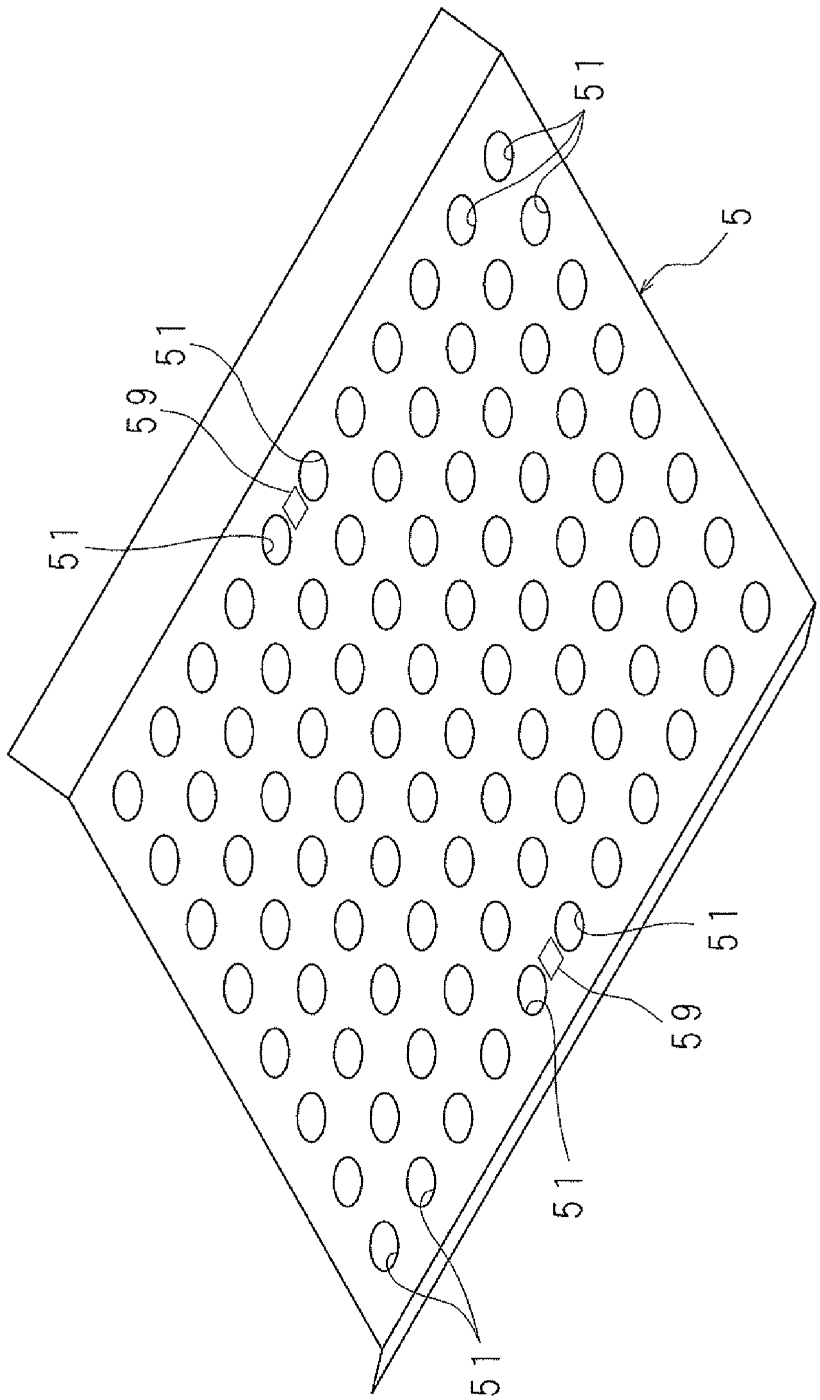
FIG. 59 is a perspective view that illustrates still another structure of the reflection sheet installed in the light source device of the embodiment 2.
Figure 60:
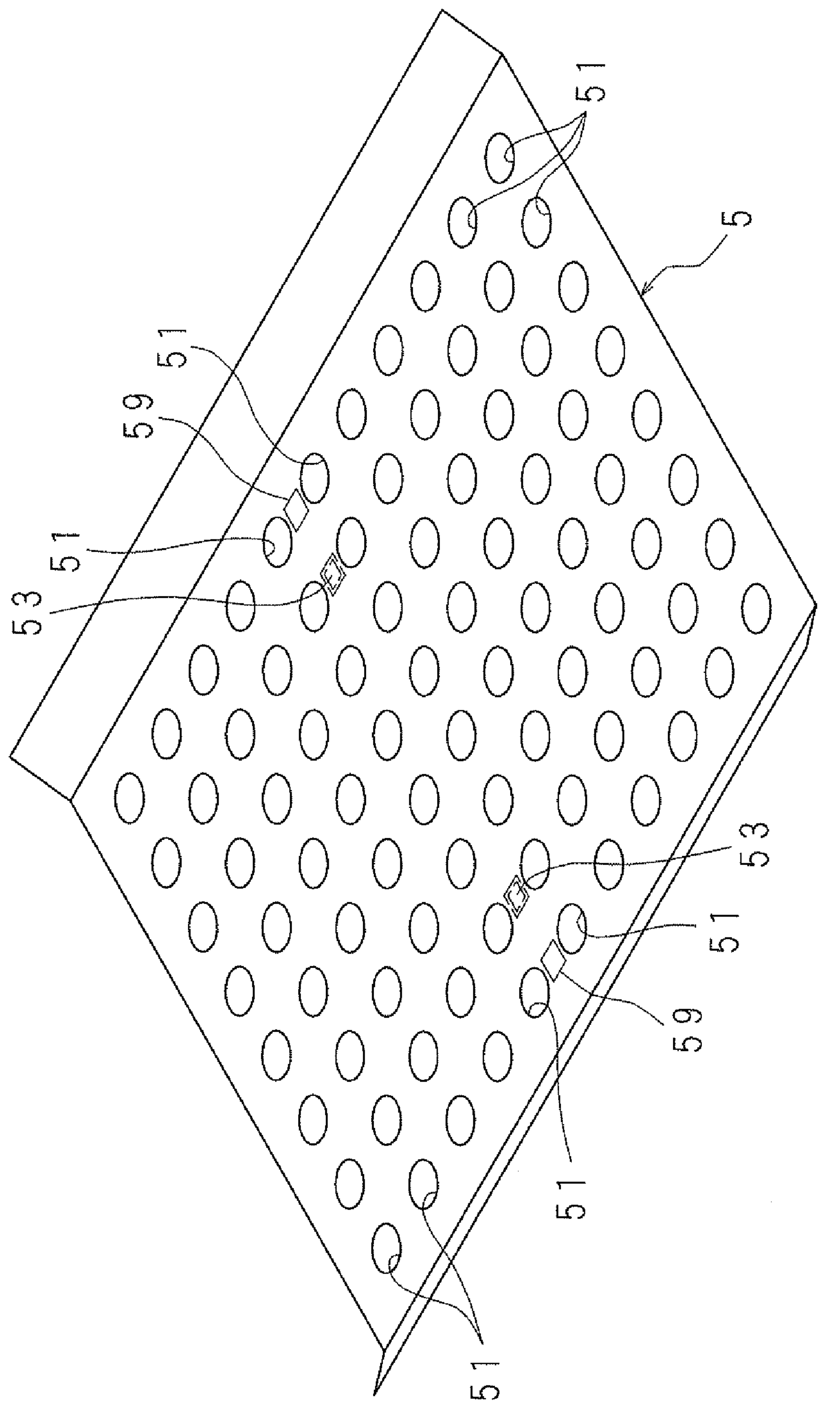
FIG. 60 is a perspective view that illustrates still another structure of the reflection sheet installed in the light source device of the embodiment 2.

In the above-mentioned embodiments 2-1 to 2-6, as shown in FIGS. 45 and 46, bias portions 53, prepared by the slits 52 or the like, are placed on all the portions in association with the number of parallel arranged light-emitting diode substrates 2 that are parallel arranged into a plurality of lines; however, in addition to this structure, the bias portion 53 may be arranged as shown in FIGS. 58 and 60, or as shown in FIG. 59, another structure may be proposed in which in place of the bias portions 53, through holes may be formed by omitting the bias portions 53. FIGS. 58 to 60 are perspective views that show another structure of a reflection sheet. In FIG. 58, bias portions 53, prepared by the slits 52 or the like, are placed only on portions corresponding to the light-emitting diode substrates 2 on the two ends in the parallel arranging direction of the light-emitting diode substrates 2 that are parallel arranged into a plurality of lines. In FIG. 59, through holes 59 each of which is larger than the connector are placed only on portions corresponding to the light-emitting diode substrates 2 on the two ends in the parallel arranging direction of the light-emitting diode substrates 2 that are parallel arranged into a plurality of lines. In FIG. 60, through holes 59 each of which is larger than the connector are placed on portions corresponding to the light-emitting diode substrates 2 on the two ends in the parallel arranging direction of the light-emitting diode substrates 2 that are parallel arranged into a plurality of lines, and bias portions 53, prepared by the slits 52 or the like, are placed on portions corresponding to the light-emitting diode substrates 2 that are adjacent to the light-emitting diode substrates 2 on the two ends in the parallel arranging direction. In the embodiments of FIGS. 58 and 60, since the connector is disposed within the bias portion 53, the reflection sheet 5 can be properly positioned relative to the support body 6 so that it becomes possible to prevent the reflection sheet 5 from being deviated. In the embodiment of FIG. 59, since the connector is disposed within the through hole 59, the reflection sheet 5 can be properly positioned relative to the support body 6 so that it becomes possible to prevent the reflection sheet 5 from being deviated.

Embodiment 3-1

Figure 61:
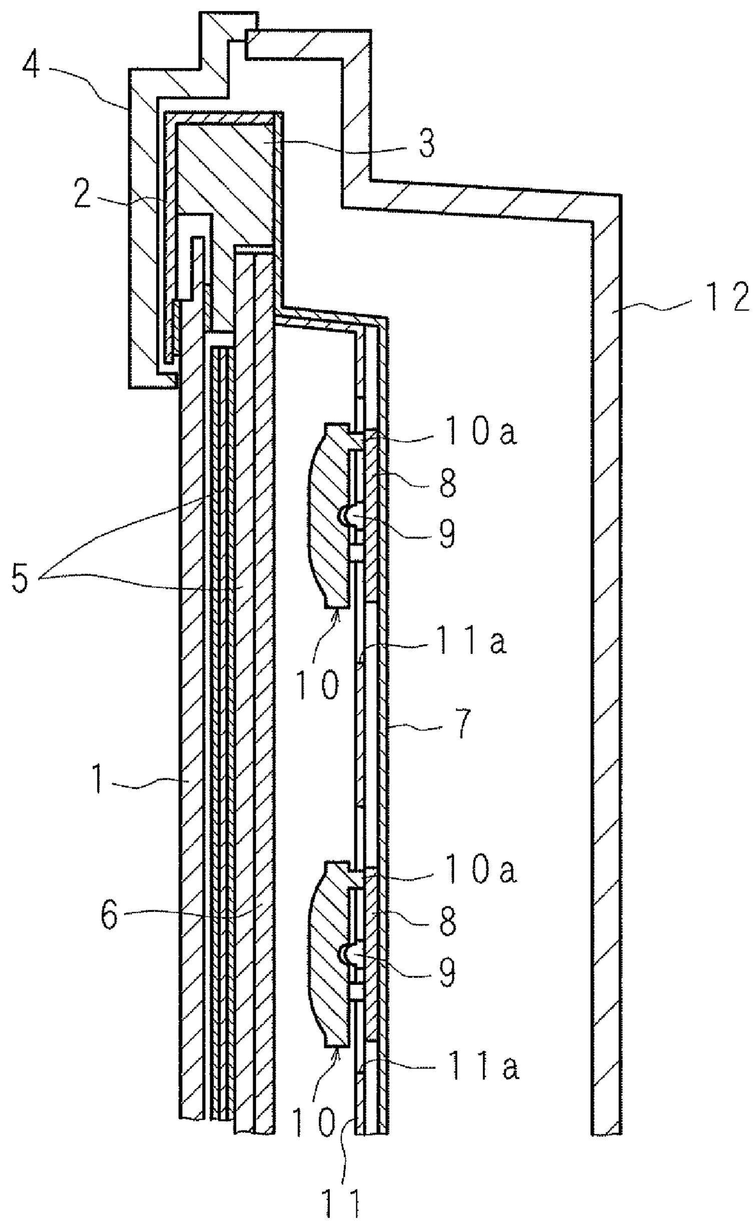
FIG. 61 is a longitudinal cross-sectional view that schematically illustrates a display device in accordance with an embodiment 3.

FIG. 61 is a longitudinal cross-sectional view that schematically illustrates a display device.

In this figure, reference numeral 1 represents a display panel (A1) that is provided with liquid crystal and has a rectangular shape, and the display panel 1 is designed so that by controlling a voltage to be applied to the liquid crystal, the transmittance of light is adjusted to display an image. The display panel 1 is supported by a front-holding frame 2 (A2) and a rear-holding frame 3 (A3) at its peripheral edge portion, and housed in a front cabinet 4 (D1) having a rectangular frame shape. The front cabinet 4 is disposed on the periphery of the front-holding frame 2 and the rear-holding frame 3. The front cabinet 4 is provided with an opening having a rectangular shape, and the dimension of the opening corresponds to the dimension of the display panel 1. On the rear side of the display panel 1, a plurality of optical sheets 5(C) that converge light of an LED 9 (light-emitting element) to be described later toward the display panel 1 are installed.

On the rear side of the optical sheets 5(C), a diffusion plate 6 that uniformly diffuses light of the LED 9 (B1) is installed. The diffusion plate 6 is supported by an edge portion of a support plate 7 (B6) having a deep dish shape. A plurality of LED substrates 8 (B3) are arranged in parallel with one another on the front surface of the support plate 7 (B6), and on the rear surface of each of the LED substrates 8, a film-shaped heat radiating pattern (not shown), made of a thermal conductive material, such as a metal material, is formed so that heat generated in the LED substrate 8 due to lighting-on of the LED 9 is radiated from the heat radiating pattern to the support plate 7 so that the heat radiating property of the LED substrates 8 can be improved.

On the front surface of each of the LED substrates 8, a plurality of LEDs 9, 9, . . . , 9 (B1) are assembled, and lenses 10, 10, . . . 10 (B2) for use in diffusing light are respectively arranged on the front sides of the respective LEDs 9, 9, . . . , 9. Three protrusions 10*a* (B22), which protrude toward the LED substrate 8 side, are disposed side by side in a circumferential direction on the peripheral edge portion of the lens 10, and the tip of each protrusion 10*a* is attached to the front surface of each LED substrate 8 by an adhesive agent.

On the right and left sides of the support plate 7, supporting bases (not shown) for supporting a reflection sheet 11 (B5) having a deep dish shape are installed separately. A plurality of sheet holes 11*a* (B53) to which the lenses 10 are inserted are formed on the bottom surface of the reflection sheet 11. Each of the lenses 10 is allowed to protrude to the front side through the sheet hole 11*a*.

A rear cabinet 12 (D2) having a deep dish shape is installed on the rear side of the support plate 7. The longitudinal and lateral dimensions of the rear cabinet 12 are substantially the same as the longitudinal and lateral dimensions of the front cabinet 4, and the edge portion of the rear cabinet 12 and the edge portion of the front cabinet 4 are opposed to each other. An engaging convex portion and an engaging recess, not shown, are respectively formed on the edge portions of the front cabinet 4 and the rear cabinet 12 so that by engaging the engaging convex portion and the engaging recess with each other, the front cabinet 4 is secured to the rear cabinet 12. Additionally, a plurality of circuit boards (not shown), such as a control circuit board for use in driving and controlling the display panel 1 and a signal processing circuit board for use in processing an image signal for displaying an image on the display surface of the display panel 1, are housed in the rear cabinet 12, and based upon output signals from the circuit boards, the display panel 1 can be driven.

FIG. 62 is a front view that schematically illustrates the LEDs 9 and the LED substrates 8 on which reflection sheets are formed, and FIG. 63 is a cross-sectional view taken along I-I of FIG. 62, which schematically illustrates rivets.

On each LED substrate 8 (B3), a plurality of substrate holes 8*a* (B33, B34) are formed side by side with equal intervals in the longitudinal direction of the LED substrate 8. On the support plate 7 (B6), as shown in FIG. 63, a plurality of through holes 7*a* (B64) are formed at positions corresponding to the substrate holes 8*a*. The diameter of each through hole 7*a* is substantially equal to the diameter of each substrate hole 8*a*. On the reflection sheet 11 (B5), insertion holes 11*b* (B54) are formed at positions corresponding to the substrate holes 8*a*, and each insertion hole 11*b* has a diameter larger than that of the substrate hole 8*a*.

As shown in FIG. 62, rivets 20 (B7) made from a synthetic resin, positioning rivets 30 and supporting rivets 40 (B8) are respectively attached between the respective lenses.

For use in the substrate holes 8*a* and through holes 7*a*, for example, metal rivets may be used instead of the rivets 20 made from synthetic resin; however, rivets 20 made from a carbon material may be inserted therein so that the LED substrates 8 may be secured onto the support plate 7 by the rivets 20. Each of the rivets 20 made from synthetic resin is composed of a reception rivet 22 (B71) and an insertion rivet 21 (B72).

The reception rivet 22 is provided with an engaging stop portion 22*a* (B71*a*) having a ring shape whose diameter is larger than the diameter of each substrate hole 8*a*, and the outer circumferential portion of the engaging stop portion 22*a* is engaged with the edge of the substrate hole 8*a* on the inside of the insertion hole 11*b* located outside of the substrate hole 8*a*, and stopped therein. A plurality of elastic portions 22*b* are arranged side by side in the circumferential direction on the inner circumferential portion of the engaging stop portion 22*a*. The elastic portions 22*b* are allowed to protrude in the axis direction of the engaging stop portion 22*a* so as to be inserted through the substrate hole 8*a* and the through hole 7*a*. The dimension in the axis direction of each elastic member 22*b* is made larger than the dimension in the axis direction of the substrate hole 8*a* and the through hole 7*a*, and the protruding tip of each of the elastic portions 22*b* is extended in the axis direction from the through hole 7*a*.

The protruding tip of each of the elastic portions 22*b* is provided with a contact portion 22*c* that is extended inward in the radial direction of the engaging stop portion 22*a* so as to be integrally formed together with each elastic portion 22*b*, and a gap (B71*b*) is formed between the contact portions 22*c*, 22*c*.

A leg portion 21*b* to be described later is made in contact with the inside of the contact portion 22*c*, and the elastic portion 22*b* is consequently curved outward by the contact with the leg portion 21*b* so that the elastic portion 22*b* is made in contact with the edge portion of the through hole 7*a*. For this reason, the LED substrate 8 and the support plate 7 are sandwiched between the engaging stop portion 22*a* and the elastic portion 22*b* from the front and rear sides.

The insertion rivet 21 is provided with a head portion 21*a* (B72*a*) having a diameter larger than that of the insertion hole 11*b*, and in the center of the head portion 21*a*, a column shaped leg portion 21*b*, which makes right angles with the head portion 21*a*, is formed. The tapered portion 21*ba* is formed on the tip of the leg portion 21*b* so that the diameter of the leg portion 21*b* becomes gradually smaller toward the tip. The diameter of the leg portion 21*b* near the head portion 21*a* has substantially the same size as the inner diameter of the engaging stop portion 22*a* so as to be greater than the dimension between the contact portions 22*c* in the case when no leg portion 21*b* is inserted therein. Additionally, the edge portion of the head portion 21*a* is extended toward the leg portion 21*b* side, and the extending width of the edge portion of the head portion 21*a* becomes smaller than the dimension in the axis direction of the engaging stop portion 22*a*, that is, the thickness dimension of the engaging stop portion 22*a*.

The leg portion 21*b* of the insertion rivet 21 is inserted into the engaging stop portion 22*a* so that the tip portion of the leg portion 21*b* is inserted into a gap between the contact portions 22*c*. Since the tapered portion 21*ba* is formed on the tip portion of the leg portion 21*b*, the gap is pushed to be widened by the insertion of the leg portion 21*b*. The elastic portion 22*b* is curved outward to be made in contact with the edge portion of the through hole 7*a*.

The head portion 21*a* is made in contact with the engaging stop portion 22*a*, and the head portion 21*a* is not made in contact with the reflection sheet 11. A slight gap is prepared between the edge portion of the head portion 21*a* extended toward the leg portion 21*b* side and the reflection sheet 11 so that, even when the reflection sheet 11 is thermally expanded by light emitted by the LED 9, the extension and contraction of the reflection sheet 11 due to the thermal expansion is permitted so as not to cause wrinkles on the reflection sheet 11. The reflection sheet 11 is held by the edge portion of the head portion 21*a* so that the reflection sheet 11 is prevented from being biased in the thickness direction. The support plate 7 and the LED substrate 8 are sandwiched by the elastic portion 22*b* and the engaging stop portion 22*a* with an appropriate pressure so that the LED substrate 8 and the support plate 7 are tightly made in contact with each other.

Figure 64:
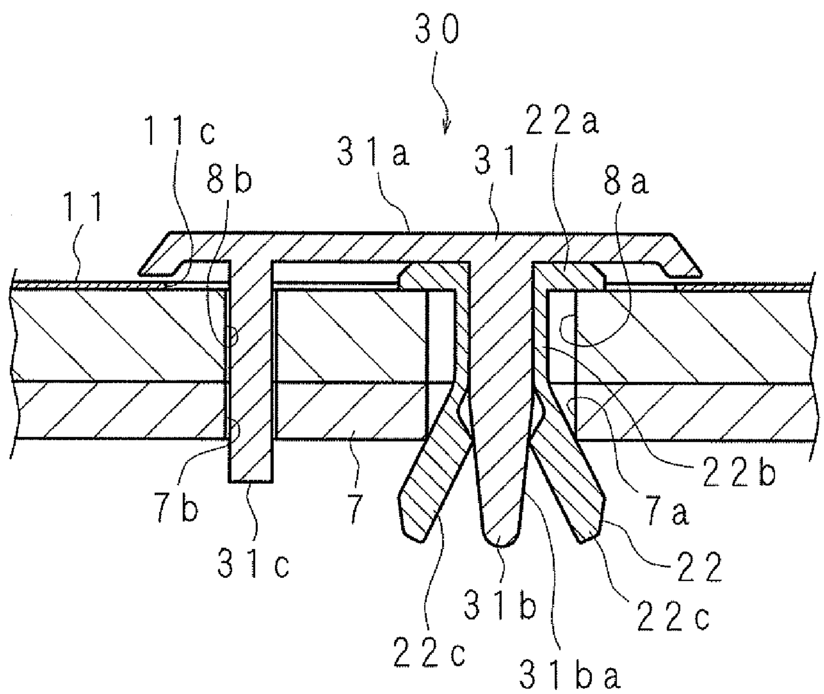
FIG. 64 is a cross-sectional view taken along line II-II of FIG. 62, which schematically illustrates a positioning rivet of the embodiment 3.

The following description will discuss the positioning rivet 30. FIG. 64 is a cross-sectional view taken along line II-II of FIG. 62 that schematically illustrates the positioning rivet 30. Positioning holes 7*b* and 8*b* (B60, B35) are respectively formed at corresponding positions of the support plates 7 and the LED substrates 8, and the respective positioning holes are respectively adjacent to the through holes 7*a* and the substrate holes 8*a*. The respective positioning holes are coaxially disposed with the support plates 7 and the LED substrates 8.

As shown in FIG. 62, insertion holes 11*c* (B57), each having a keyhole shape, with one portion of its circle extended outward, are formed on the reflection sheet 11, and the through hole 7*a* and the substrate hole 8*a* are located within the circle of the insertion hole 11*c*. The positioning holes 7*b* and 8*b* are located at the extended portion of the insertion hole 11*c*. The width dimension of the extended portion of the insertion hole 11*c* is made slightly larger than each of the positioning holes 7*b* and 8*b*. The positioning rivets 30 (B7, B73) are inserted through the through holes 7*a* and substrate holes 8*a*, as well as through the positioning holes 7*b* and 8*b*.

Each of the positioning rivets 30 is provided with a reception rivet 22 (B71) and an insertion rivet 31 (B72). Additionally, the reception rivet 22 of the positioning rivet 30 has the same structure as that of the reception rivet of the aforementioned rivet 21, and is indicated by the same reference numeral, and the detailed description thereof will be omitted.

The insertion rivet 31 is provided with a head portion 31*a* (B72*a*) having a diameter larger than that of the insertion hole 11*c*, and the head portion 31*a* has an elliptical shape. A column shaped leg portion 31*b*, which makes right angles with the head portion 31*a*, is formed on one end of the head portion 31*a*. A tapered portion 31*ba* is formed on the tip of the leg portion 31*b* so that the diameter of the leg portion 31*b* becomes gradually smaller toward the tip. The diameter of the leg portion 31*b* near the head portion 31*a* has substantially the same size as the inner diameter of the engaging stop portion 22*a* so as to be greater than the dimension between the contact portions 22*c* in the case when no leg portion 31*b* is inserted therein. A column shaped positioning portion 31*c* (B73), which makes right angles with the head portion 31*a*, is formed on the other end of the head portion 31*a*. The diameter of the positioning portion 31*c* is slightly smaller than the diameter of the positioning holes 7*b* and 8*b*. The dimension between the positioning portion 31*c* and the leg portion 31*b* is substantially the same as the dimension between the through hole 7*a* as well as the substrate hole 8*a* and the positioning holes 7*b*, 8*b*. Additionally, the edge portion of the head portion 31*a* is extended toward the leg portion 31*b* side, and the extending width of the edge portion of the head portion 31*a* becomes smaller than the dimension in the axis direction of the engaging stop portion 22*a*, that is, the thickness dimension of the engaging stop portion 22*a*.

The positioning portion 31*c* is inserted into the positioning hole 7*b* or 8*b*, and in the case when the reflection sheet is shifted in the width direction of the extended portion of the insertion hole 11*c*, since the positioning portion 31*c* and the edge of the extended portion of the insertion hole 11*c* are made in contact with each other, the reflection sheet is properly positioned.

The leg portion 31*b* of the insertion rivet 31 is inserted into the engaging stop portion 22*a*, and the tip portion of the leg portion 31*b* is inserted into a gap between the contact portions 22*c*. A tapered portion 31*ba* is formed on the tip of the leg portion 31*b* so that the gap is pushed and widened by the insertion of the leg portion 31*b*. The elastic portion 22*b* is curved outward to be made in contact with the edge portion of the through hole 7*a*.

The head portion 31*a* is made in contact with the engaging stop portion 22*a*, and the head portion 31*a* is not made in contact with the reflection sheet 11, with a slight gap being prepared between the head portion 31*a* and the reflection sheet 11 so that, even when the reflection sheet 11 is thermally expanded by light emitted by the LED 9, the extension and contraction of the reflection sheet 11 due to the thermal expansion is permitted so as not to cause wrinkles on the reflection sheet 11. The reflection sheet 11 is pressed by the edge portion of the head portion 31*a*. The support plate 7 and the LED substrate 8 are sandwiched by the elastic portion 22*b* and the engaging stop portion 22*a* with an appropriate pressure so that the LED substrate 8 and the support plate 7 are tightly made in contact with each other.

The following description will discuss the supporting rivet 40. FIG. 65 is a cross-sectional view taken along line III-III of FIG. 62 that schematically illustrates the supporting rivet 40.

The supporting rivet 40 (B8) is provided with a reception rivet 22 (B81) and an insertion rivet 41 (B82). Additionally, the reception rivet 22 of the supporting rivet 40 has the same structure as that of the rivet 21 or the reception rivet of the positioning rivet so that it is indicated by the same reference numeral and the detailed description thereof will be omitted. As shown in FIG. 62, insertion holes 11*d* (B55) are formed on the reflection sheet 11 at positions corresponding the substrate holes 8*a* (B65), and each insertion hole 11*d* has a diameter larger than that of the substrate holes 8*a* (B65).

The insertion rivet 41 is provided with a head portion 41*a* (B82*a*) having a diameter larger than that of the insertion hole 11*d*, and in the center of the head portion 41*a*, a column shaped leg portion 41*b*, which makes right angles with the head portion 41*a*, is formed. A tapered portion 41*ba* is formed on the tip of the leg portion 41*b* so that the diameter of the leg portion 41*b* becomes gradually smaller toward the tip. The diameter of the leg portion 41*b* near the head portion 41*a* has substantially the same size as the inner diameter of the engaging stop portion 22*a* so as to be greater than the dimension between the contact portions 22*c* in the case when no leg portion 41*b* is inserted therein. Additionally, the edge portion of the head portion 41*a* is extended toward the leg portion 41*b* side, and the extending width of the edge portion of the head portion 41*a* becomes smaller than the dimension in the axis direction of the engaging stop portion 22*a*, that is, the thickness dimension of the engaging stop portion 22*a*.

From the center of the head portion 41*a* on the side opposite to the engaging stop portion 22*a*, a cone-shaped support portion 41*c* (B83) having its tip formed into a curved surface is extended in the axis direction. The support portion 41*c* supports the diffusion plate 6.

The leg portion 41*b* of the insertion rivet 41 is inserted into the engaging stop portion 22*a* so that the tip portion of the leg portion 41*b* is inserted into a gap between the contact portions 22*c*. Since the tapered portion 41*ba* is formed on the tip portion of the leg portion 41*b*, the gap is gradually pushed to be widened by the insertion of the leg portion 41*b*. The elastic portion 22*b* is curved outward to be made in contact with the edge portion of the through hole 7*a*.

The head portion 41*a* is made in contact with the engaging stop portion 22*a*, and the head portion 41*a* is not made in contact with the reflection sheet 11, with a slight gap being prepared between the head portion 41*a* and the reflection sheet 11 so that, even when the reflection sheet 11 is thermally expanded by light emitted by the LED 9, the extension and contraction of the reflection sheet 11 due to the thermal expansion is permitted so as not to cause wrinkles on the reflection sheet 11. The reflection sheet 11 is pressed by the edge portion of the head portion 41*a*. The support plate 7 and the LED substrate 8 are sandwiched by the elastic portion 22*b* and the engaging stop portion 22*a* with an appropriate pressure so that the LED substrate 8 and the support plate 7 are tightly made in contact with each other.

In the display device relating to the embodiment 3-1, the reflection sheet 11 is disposed between the head portions of the rivets 20, the positioning rivets 30, as well as the supporting rivets 40, and one surface of the LED substrate 8, and since a gap is formed between the head portions and the reflection sheet 11, even upon occurrence of an abrupt thermal change, the reflection sheet 11 is allowed to expand or contract between the head portions and the reflection sheet 11 so that it is possible to prevent wrinkles from occurring on the reflection sheet 11.

Moreover, by making the head portions of the rivets 20, the positioning rivets 30 and the supporting rivets 40 in contact with the engaging stop portion 22*a*, the reflection sheet 11 is held, with a slight gap being formed between the edges of the head portions and the reflection sheet 11, so that it is possible to prevent wrinkles from occurring on the reflection sheet 11. Furthermore, in a state where the engaging stop portion 22*a* is engaged with the edge portion of the substrate hole 8*a* to be stopped thereon, the elastic portion 22*b* is inserted into the substrate hole 8*a* and the through hole 7*a*, and the leg portion of the rivet 20, the positioning rivet 30 or the supporting rivet 40 is inserted into the engaging stop portion 22*a* to be made in contact with the contact portion 22*c*. At this time, the elastic portion 22*b* is curved outward in the radial direction by elastic deformation, and since the curved elastic portion 22*b* is made in contact with the edge portion of the through hole 7*a*, the LED substrate 8 and the support plate 7 are sandwiched and held by the engaging stop portion 22*a* and the elastic portion 22*b*.

By inserting the positioning portion 31*c* into the positioning hole 7*b* or 8*b*, the reflection sheet 11 is made in contact with the positioning portion 31*c* even when the reflection sheet 11 is pivoted, so that the pivoting movement of the reflection sheet 11 can be disturbed. Thus, it becomes possible to positively carry out the positioning process of the reflection sheet 11.

Since the supporting rivets 40 support the diffusion plate 6 by the support portion 41*c*, as well as supporting the reflection sheet 11, it is possible to prevent the diffusion plate 6 from being curved, and also to reduce the number of parts.

In the display device in accordance with the embodiment 3-1, positioning holes 7*b* and 8*b* are respectively formed on the support plate 7 and the LED substrate 8; however, only the positioning hole 8*b* may be formed on the LED substrate 8. In this case, it is needless to say that the dimension in the axis direction of the positioning portion 31*c* is made to correspond to the dimension in the axis direction of the positioning hole 8*b*. Moreover, the LEDs 9 are used as the light-emitting elements of the display device relating to the embodiments; however, LDs (Laser Diodes), etc. may be used. Moreover, the support portion 41*c* may be further formed on each of the head portions 31*a* and 41*a* of the insertion rivets 21 and 31.

Embodiment 3-2

Figure 66A:
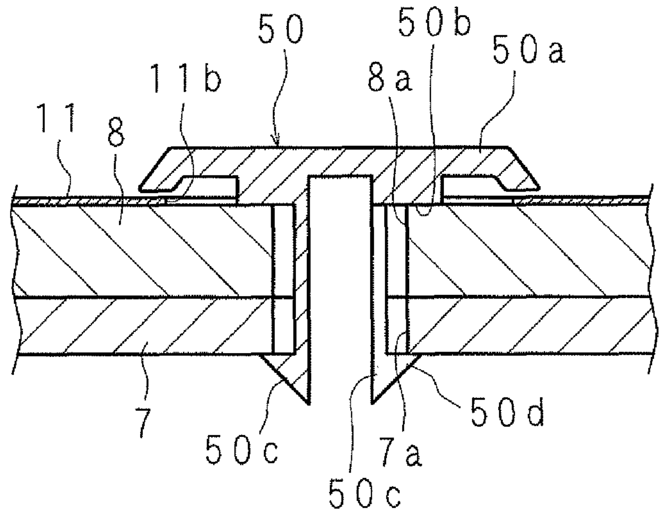
FIG. 66A is an enlarged cross-sectional view that illustrates another structure of a portion for use in securing the light-emitting diode substrate on a support plate of the embodiment 3.
Figure 66B:
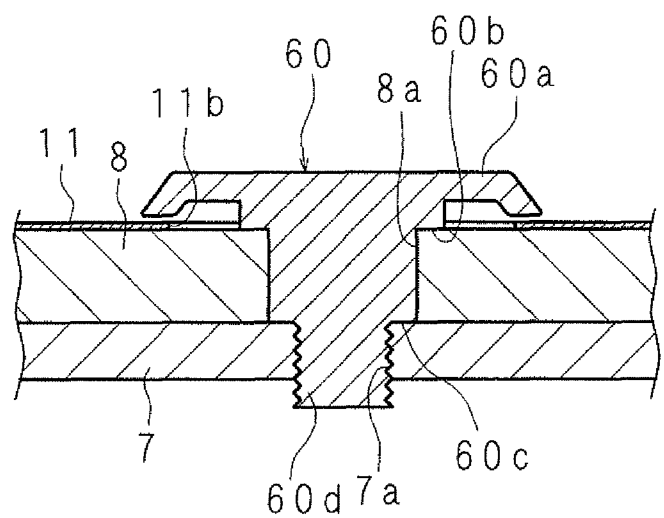
FIG. 66B is an enlarged cross-sectional view that illustrates still another structure of a portion for use in securing the light-emitting diode substrate on a support plate of the embodiment 3.

FIGS. 66A and 66B are expanded cross-sectional views that show another structure of a portion used in securing the LED substrate 8 onto the support plate 7. FIG. 66A shows a structure in which in place of the rivet 20 (B7) having the reception rivet 22 (B71) and the insertion rivet 21 (B72), a single rivet 50 (B7) is used in securing the LED substrate 8 (B3) onto the support plate 7 (B6), and FIG. 66B shows a structure in which in place of rivets, the LED substrate 8 is secured onto the support plate 7 by using male screws 60 (B7).

The rivet 50 (B7) of FIG. 66A is provided with a head portion 50*a* (B72*a*) having a diameter larger than the insertion hole 11*b*, a step portion 50*b* that is connected to the center portion of the head portion 50*a*, and has a diameter larger than the substrate hole 8*a* (B33*a*, B34*a*), and a plurality of leg portions 50*c* that are connected to the center portion of the step portion 50*b*, and inserted into through holes 7*a* (B64), and a claw portion 50*d* to be engaged with a hole edge of the through hole 7*a* is formed on the tip of the leg portion 50*c*.

In this structure, by inserting the leg portion 50*c* through the substrate hole 8*a* and the through hole 7*a* from the insertion hole 11*b*, the claw portion 50*d* is engaged with the hole edge of the through hole 7*a* to stop thereon, with the step portion 50*b* being made in contact with the hole edge of the substrate hole 8*a*, so that the LED substrate 8 can be secured onto the support plate 7. A slight gap is prepared between the edge portion of the head portion 50*a* and the reflection sheet 11 so that, even when the reflection sheet 11 is thermally expanded by light emitted from the LED 9, the extension and contraction of the reflection sheet 11 due to this thermal expansion is permitted to prevent wrinkles from occurring on the reflection sheet 11.

The male screw 60 (B7) of FIG. 66B is provided with a head portion 60*a* (B72*a*) having a diameter larger than the insertion hole 11*b*, a step portion 60*b* that is connected to the center portion of the head portion 60*a*, and has a diameter larger than the substrate hole 8*a* (B33*a*, B34*a*), a step portion 60*c* that is connected to the center portion of the step portion 60*b*, and has a diameter larger than the through hole 7*a* (B64), and a threaded shaft portion 60*d* that is connected to the center portion of the step portion 60*c*, and inserted into the through hole 7*a*.

In this structure, by inserting the threaded shaft portion 60*d* of the male screw 60 through the substrate hole 8*a* from the insertion hole 11*b*, with the threaded shaft portion 60*d* being screwed into the through hole 7*a*, the step portion 60*c* is made in contact with the hole edge of the through hole 7*a* so that the male screw 60 is secured into the support plate 7, and the step portion 60*b* is made in contact with the hole edge of the substrate hole 8*a* so that the LED substrate 8 can be secured onto the support plate 7. A slight gap is prepared between the edge portion of the head portion 60*a* and the reflection sheet 11 so that, even when the reflection sheet 11 is thermally expanded by light emitted from the LED 9, the extension and contraction of the reflection sheet 11 due to this thermal expansion is permitted to prevent wrinkles from occurring on the reflection sheet 11.

Embodiment 4

Figure 67:
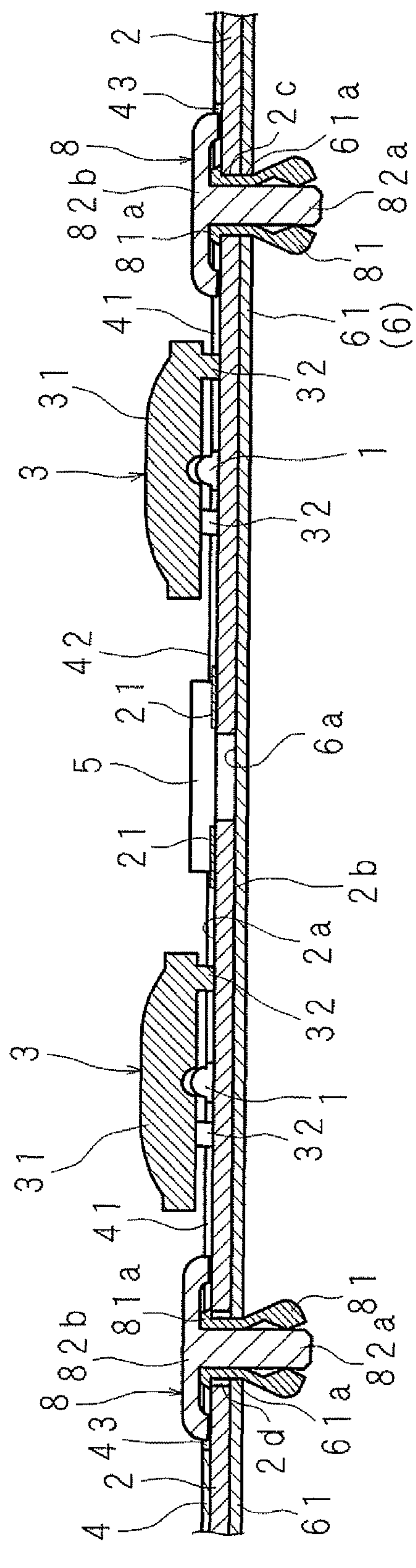
FIG. 67 is a cross-sectional view that illustrates a main portion of a structure of a light source device of an embodiment 4.
Figure 68:
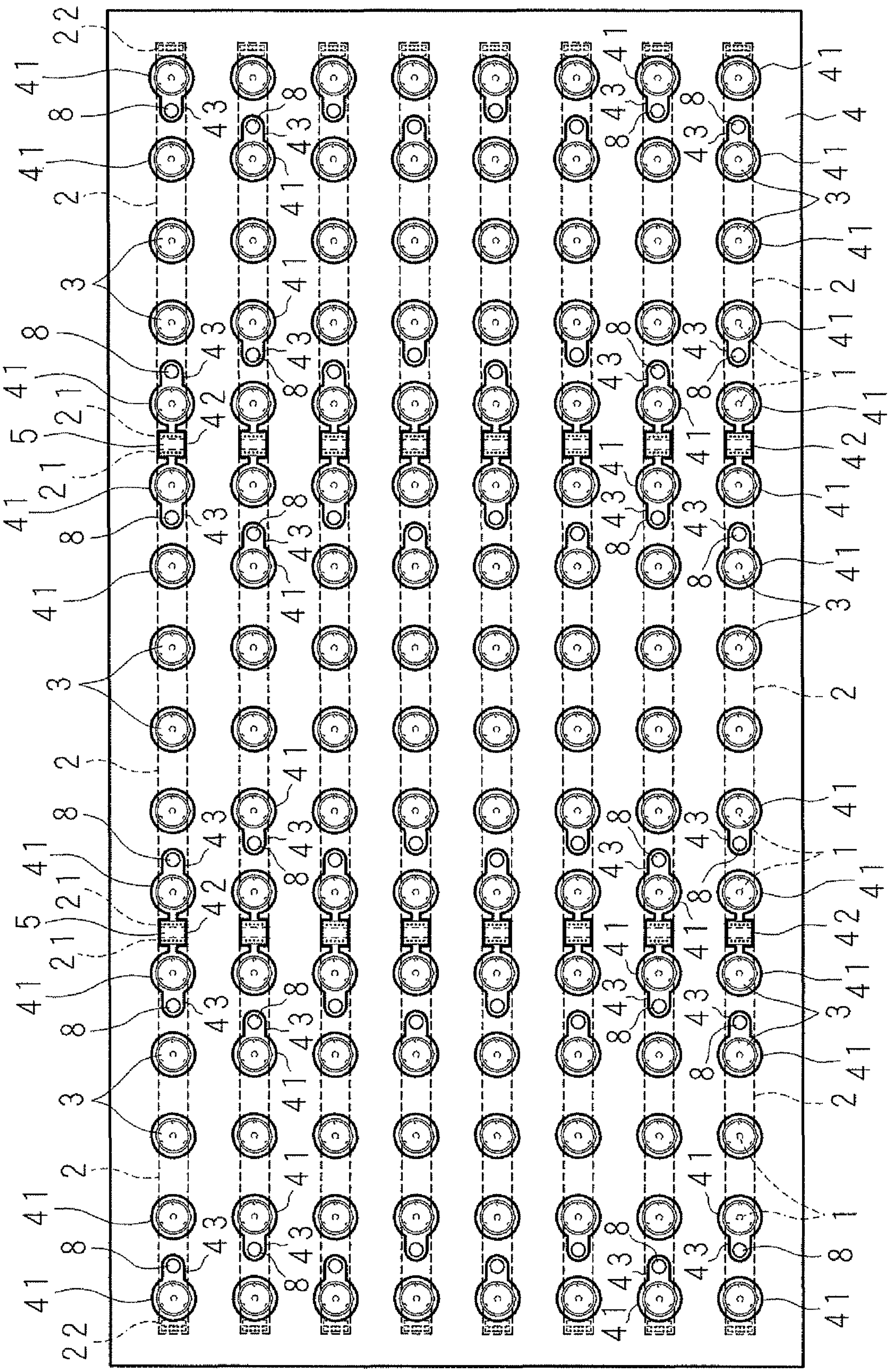
FIG. 68 is a plan view that illustrates one portion of the light source device of the embodiment 4.
Figure 69:
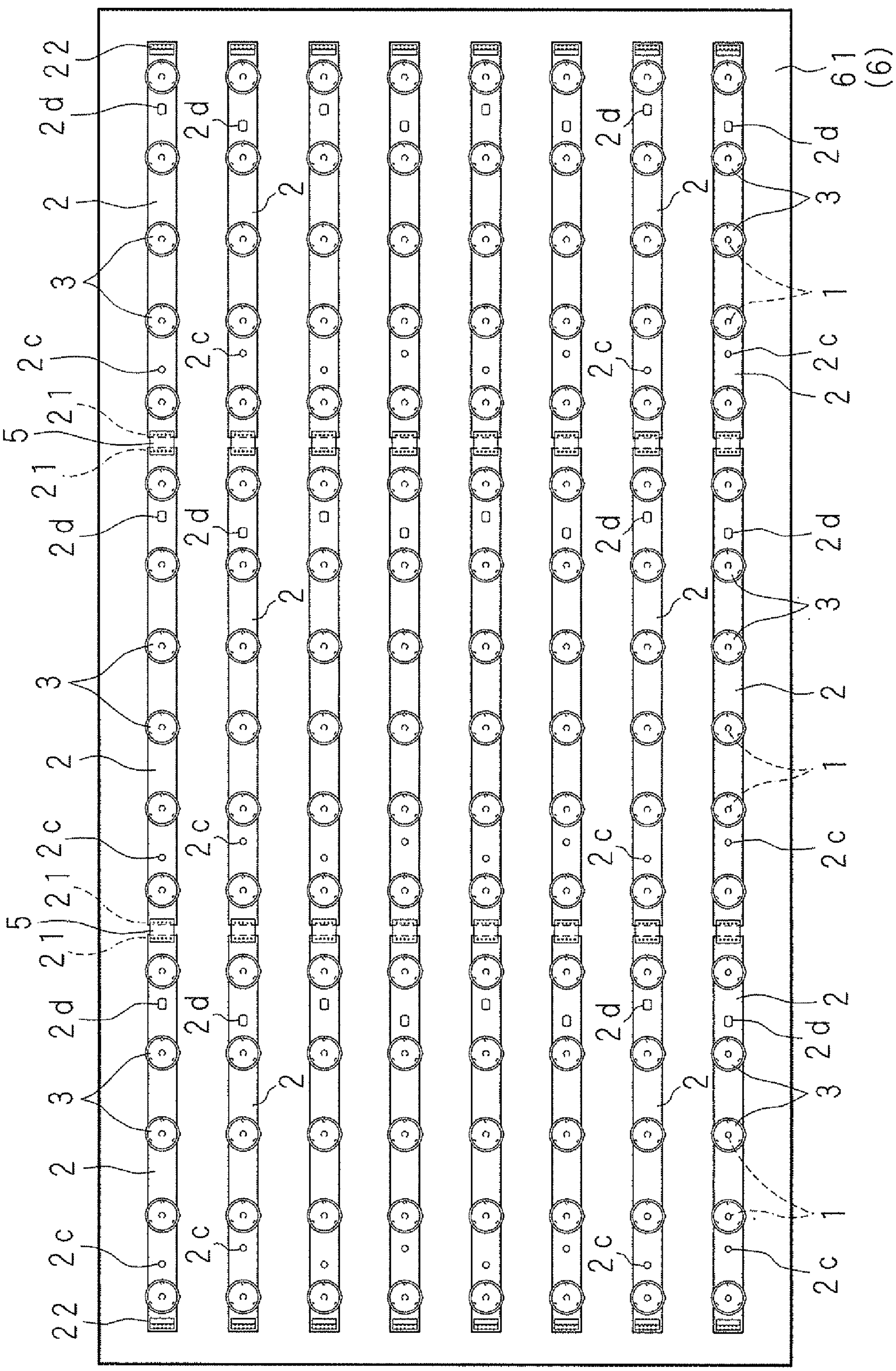
FIG. 69 is a plan view that illustrates one portion disassembled in the light source device of the embodiment 4.
Figure 70:
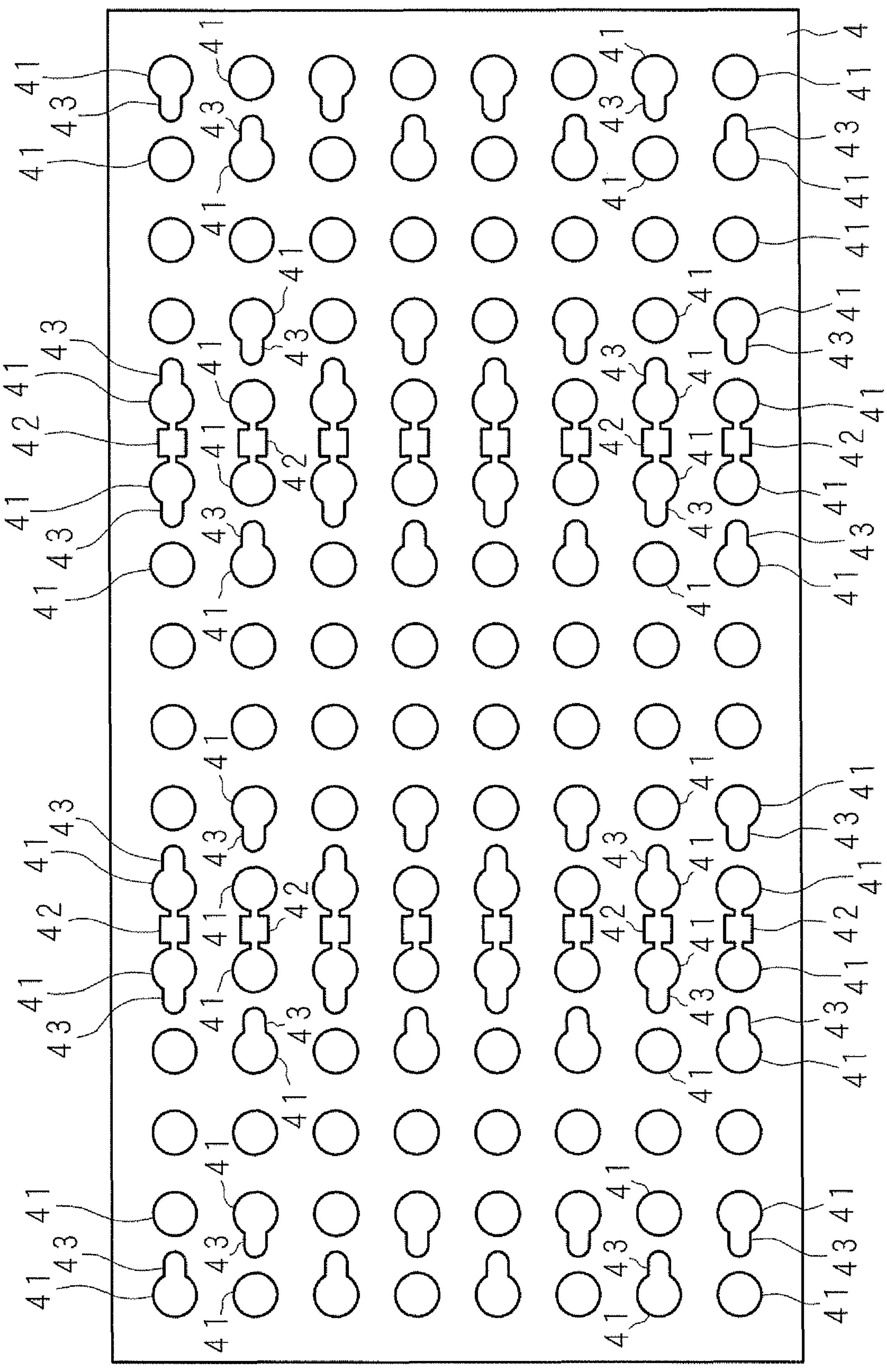
FIG. 70 is a plan view that illustrates partial members of the light source device of the embodiment 4.
Figure 71:
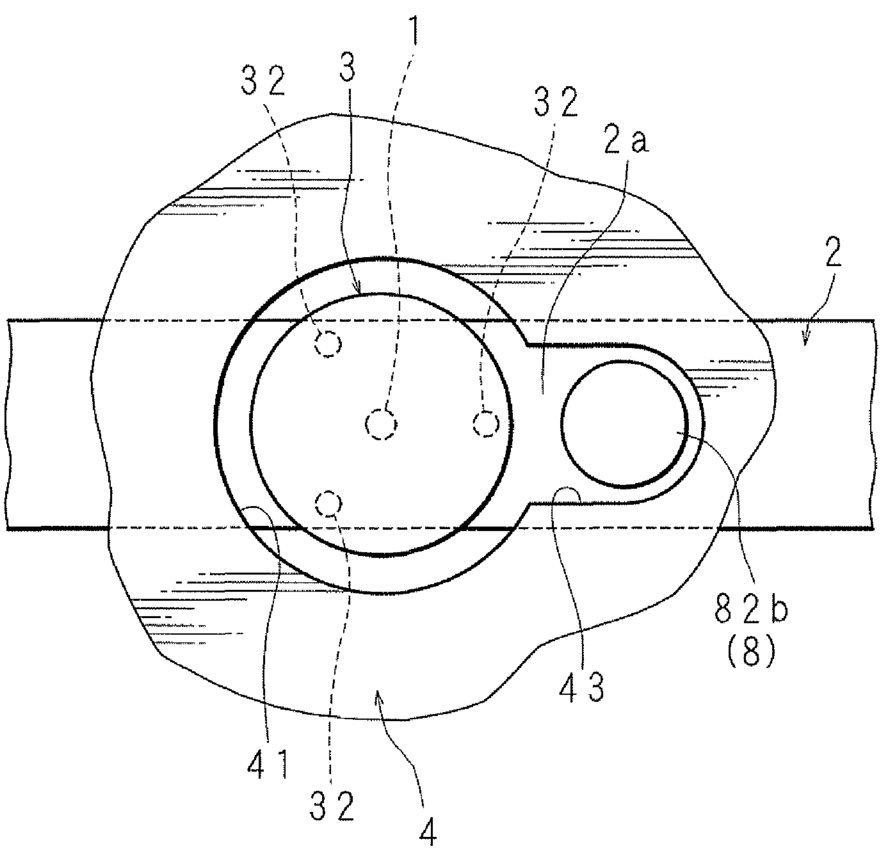
FIG. 71 is an enlarged plan view that illustrates one portion of the light source device of the embodiment 4.

FIG. 67 is a cross-sectional view that illustrates a main portion of a structure of a light source device in accordance with the present invention, FIG. 68 is a plan view that illustrates one portion of the light source device, FIG. 69 is a plan view that illustrates the light source device one portion of which is disassembled, FIG. 70 is a plan view that illustrates partial members of the light source device, FIGS. 71 and 72 are enlarged plan views that illustrate one portion of the light source device, FIGS. 73 and 74 are perspective views that show a structure of a light-emitting diode to which lenses are attached, and FIG. 75 is a cross-sectional view that illustrates one example of fixtures.

The light source device having one surface 2*a* on which a plurality of light-emitting diodes 1 (B1) are assembled is provided with a plurality of light-emitting diode substrates 2 (B3) that are spaced from one another, and arranged in parallel with one another, a plurality of lenses 3 (B2) that are attached to the one surface 2*a* of the light-emitting diode substrate 2 so as to be opposed to top portions of the respective light-emitting diodes 1, and used for diffusing light emitted by the light-emitting diodes 1, and through holes 41 (B53) in which the lenses 3 are arranged, and also has a reflection sheet 4 (B5) that is mounted on the one surface 2*a* of the light-emitting diode substrate 2, and reflects light emitted by the light-emitting diodes 1, a plurality of connectors 5 (B4) that connect the adjacent light-emitting diode substrates 2 with each other, and a support body 6 (B6) that is located on another surface 2*b* of the light-emitting diode substrate 2, and supports the plural light-emitting diode substrates 2.

The light-emitting diode substrate 2 (B3) has a circuit unit on the one surface 2*a*, and is formed into a rectangular shape (stripe shape) with its length having a ratio higher than that of its width. A plurality of the light-emitting diodes 1 are assembled on the one surface 2*a* of each of the light-emitting diode substrates 2, in a separated manner, with substantially the same interval in the longitudinal direction. The light-emitting diode substrate 2 is a one-sided substrate, with a conductor unit formed only on the one surface 2*a* side. A plurality of the rectangular light-emitting diode substrates 2 are arranged on one surface 6*a* of the support member 6 having a rectangular shape, while being spaced in the longitudinal direction as well as in the width direction, with the longitudinal directions thereof being aligned in the same direction.

FIG. 69 shows one example in which the light-emitting diode substrate 2 is placed in the center, with six light-emitting diodes 1 assembled thereon, and light-emitting diode substrates 2, each having five light-emitting diodes 1 assembled thereon, are disposed on the two sides thereof, so that three sheets of the light-emitting diode substrates 2 connected in one line are prepared, and eight lines of them are arranged in the width direction with substantially the same interval as the assembled interval of the light-emitting diodes 1 on the light-emitting diode substrate 2. The respective light-emitting diode substrates 2, arranged in a direction orthogonal to a line of the light-emitting diode substrates 2 arranged into one line, have substantially the same dimension in the longitudinal direction. Moreover, the light-emitting diodes 1 on all the light-emitting diode substrates 2 are arranged with substantially the same two-dimensional interval from one another.

Connecting portions 21 and 22 (B31, B32) are formed on two ends in the longitudinal direction of the one surface 2*a* of each light-emitting diode substrate 2. In three sheets of the light-emitting diode substrates 2 aligned into one line, the connecting portions 21, 21 of the adjacent light-emitting diode substrates 2 are mutually connected to each other by connectors 5 (B4). Moreover, as will be described later, the connecting portion 22 of the light-emitting diode substrate 2 located on one of the ends of a line is connected to a power supply circuit board by a connector (B41), while a short connector is connected to the connecting portion 22 of the light-emitting diode substrate 2 located on the other end of the line.

Each of the lenses 3 (B2) is provided with a translucent portion 31 (B21) that is spaced from a top portion of the light-emitting diode 1 to be opposed thereto, and has a hemispherical recess used for diffusing light emitted by the light-emitting diode 1 in all directions, and three positioning protrusions 32 (B22) that protrude from the surface of the translucent portion 31 opposed to the one surface 2*a* toward the light-emitting diode substrate 2, so as to determine the position of the lens 3 relative to the light-emitting diode substrate 2, with the tip of each positioning projection 32 being attached to the one surface 2*a* with an adhesive agent. The translucent portion 31 is formed into a shape that is slightly smaller than the through hole 41 of the reflection sheet 4.

The reflection sheet 4 (B5) having a highly reflective property, which is composed of a sheet of synthetic resin sheet having a rectangular shape in association with the support member 6, has a structure in which through holes 41 (B53) having a round shape, with a diameter that is slightly larger than that of the translucent portion 31, are formed in a diced pattern at positions corresponding to the respective lenses 3, and second through holes 42 having a rectangular shape, through which the connectors 5 are inserted, are formed at positions corresponding to the connectors 5.

Two through holes 2*c* and 2*d* (B33, B34) through which rivets 8 (B7) for use in supporting the light-emitting diode substrate 2 on the support body 6 are inserted are formed on one end and the other end in the longitudinal direction of the rectangular-shaped light-emitting diode substrate 2. The respective through holes 2*c* and 2*d* are located between the two adjacent lenses 3. The dimension in the substrate longitudinal direction of one through hole 2*c* (B33) of the two through holes 2*c*, 2*d* is smaller than the dimension of the other through hole 2*d* (B34). More specifically, one of the through holes 2*c* is a round hole, and the other through hole 2*d* has an elongated round shape that is long in the substrate longitudinal direction. In the end portions at which the light-emitting diode substrates 2 aligned into one line are connected to each other, the respective light-emitting diode substrates 2 are arranged so that the through hole 2*c* having a smaller dimension and the through hole 2*d* having a larger dimension are made adjacent to each other.

In the eight light-emitting diode substrates 2 that are adjacent to one after another in a direction orthogonal to the lines of the light-emitting diode substrates 2, each aligned into one line, eight insertion holes 2*c* on one end side are positioned in a zigzag pattern, while eight insertion holes 2*d* on the other end side are also positioned in a zigzag pattern. More specifically, the insertion holes 2*c* on the one end side are alternately located at positions closer to one side of two sets of lenses 3 located on one end, as well as at positions closer to the other side, and in the same manner, the insertion holes 2*d* on the other end side are alternately located at positions closer to one side of two sets of lenses 3 located on the other end, as well as at position closer to the other side thereof so that rivets 8, which are inserted through the insertion holes 2*c* and the insertion holes 2*d* so as to secure the two ends of the light-emitting diode substrate 2 onto the support body 6, are arranged in a zigzag pattern; thus, influences by the rivets 8 to cause a reduction of luminance are dispersed so that luminance irregularities in illumination light can be suppressed.

The support body 6 is formed by processing a metal plate, and has a flat plate portion 61 (B61) having substantially a rectangular shape and a frame portion 62 (B62) that is connected to the peripheral edge of the plate portion 61, and on one surface 6*a* of the plate portion 61, the light-emitting diode substrates 2 are housed to be supported thereon side by side in the length direction as well as in the width direction. On the plate portion 61 of the support body 6, through holes 61*a* (B64) are formed at positions corresponding to the respective insertion holes 2*c* and 2*d* of the light-emitting diode substrate 2.

As shown in FIG. 75, each of the rivets 8 (B7) has an outer diameter g1 capable of being inserted through the insertion holes 2*c*, 2*d* and the through hole 61*a*, a flange portion 81*a* (B71*a*) that is attached to one of the ends and is not capable of being inserted through the insertion holes 2*c* and 2*d* and the through hole 61*a*, a cylindrical part 81 (B71) whose inner diameter g3 of the other end is smaller than the inner diameter g2 of one of the ends, and a shaft part 82 (B72) having a shaft portion 82*a* that is capable of being inserted into the one of the ends of the cylindrical part 81, and has a diameter larger than the inner diameter g3 of the other end, and a head portion 82*b* (B72*a*) that is not capable of being inserted through the insertion holes 2*c*, 2*d* and the through hole 61*a*. The cylindrical part 81 and the shaft part 82 are made from a synthetic resin material.

On the reflection sheet 4, third through holes 43 (B54), which have a diameter larger than the diameter of the head portion 82*b* of the shaft part 82 so as to allow the rivets 8 to be inserted therein, and are formed into an elongated hole shape connected to the through hole 41, are formed at positions corresponding to the rivets 8. The third through holes 43, which are adjacent to one another in a direction orthogonal to the row of the light-emitting diode substrates 2, are positioned in a zigzag pattern, with their shapes being alternately changed as an elongated hole connected to one of the through holes 41 on the two sides and as an elongated hole connected to the other.

As described above, the rivets 8, inserted through the respective insertion holes 2*c* and 2*d* of the light-emitting diode substrate 2 as well as through the third through holes 43 of the reflection sheet 4, have an arrangement in which eight rivets 8, located on one end side of eight sheets of light-emitting diode substrates 2 that are adjacent to one another in a direction orthogonal to the rows of the light-emitting diode substrates 2, are positioned in a zigzag pattern, with eight rivets 8 on the other end side being also positioned in a zigzag pattern, so that influences by the rivets 8 to cause a reduction of luminance are dispersed, and luminance irregularities in illumination light can be consequently suppressed.

The following description will discuss a sequence of processes by which three sheets of the light-emitting diode substrates 2 connected to one after another into one line are supported on the support body 6 by using the rivets 8. First, after positioning the insertion holes 2*c* and 2*d* of the respective light-emitting diode substrates 2 onto the respective through holes 61*a* of the support body 6, the cylindrical part 81 is inserted through the insertion hole 2*c* having a smaller size and the through hole 61*a* from the one surface 2*a* of the respective light-emitting diode substrates 2 so that the flange portion 81*a* is made in contact with the one surface 2*a* of the light-emitting diode substrates 2. Next, when the shaft portion 82*a* of the shaft part 82 is inserted until the head portion 82*b* has come into contact with the flange portion 81*a* of the cylindrical part 81, the tip portion of the cylindrical part 81 is pushed and widened outward by the shaft portion 82*a* of the shaft part 82. The tip portion of the cylindrical part 81, pushed and widened outward, is allowed to press the shaft portion 82*a* of the shaft part 82 inward so as to be maintained, while the tip portion of the cylindrical part 81 with a widened diameter cannot be inserted through the through hole 61*a* of the support body 6, with the result that the respective light-emitting diode substrates 2 are secured on the support body 6 by the rivets 8.

After the rivets 8 have been attached to the insertion holes 2*c* having a smaller dimension, the rivets 8 are also attached to the insertion holes 2*d* having a larger dimension in the same manner, as described above, so that the respective light-emitting diode substrates 2 are secured onto the support body 6 by the rivets 8. At this time, in the case when, upon connecting the adjacent light-emitting diode substrates 2 to each other by the connectors 5, the positions of the two substrates are deviated from appropriate positions in the substrate width direction, each of the through holes 61*a* of the support body 6 is not positioned at the center of the inserting hole 2*d*; however, since the dimension of the through hole 2*d* in the substrate width direction is made larger, the through hole 61*a* is not deviated from the range of the insertion hole 2*d* so that each rivet 8 can be inserted through the insertion hole 2*d* and the through hole 61*a* so as to be attached.

After the rivets 8 have been attached to all the insertion holes 2*c* and 2*d* of the light-emitting diode substrates 2, lenses 3 are inserted into the through holes 41, the connectors 5 are inserted into the second through holes 42, and the respective rivets 8 are inserted into the third through holes 43, and in this state, the reflection sheet 4 is made face to face with the light-emitting diode substrates 2, and mounted thereon.

Figure 76:
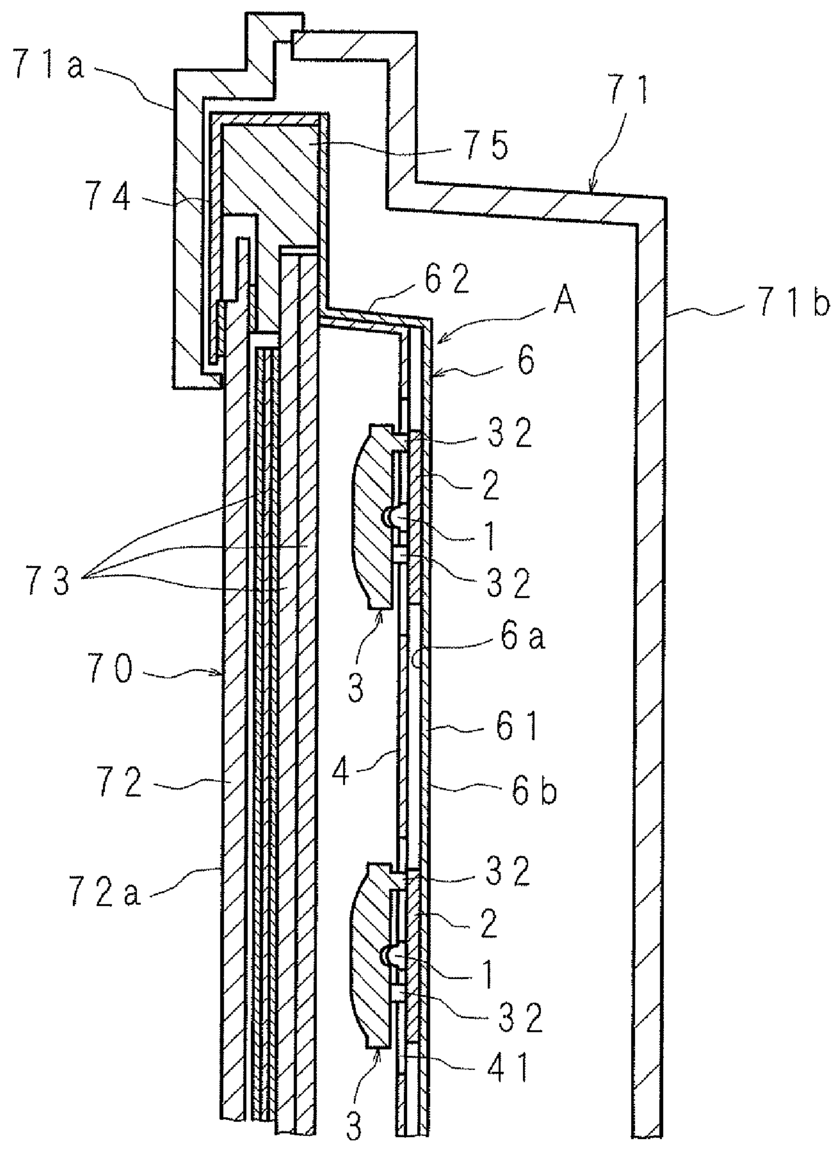
FIG. 76 is a cross-sectional view that illustrates a structure of a display device in which the light source device of the embodiment 4 is installed.

FIG. 76 is a cross-sectional view that illustrates a structure of a display device in which a light source device in accordance with the present invention is installed. The display device, which has a display surface 72*a* on its front side, is provided with a display unit 70 (A) having a substantially rectangular parallelepiped shape, a light source device A (B) disposed on the rear side of the display unit 70, and a cabinet 71 (D) that conceals the peripheral edge portion of the display unit 70 and the rear side of the light source device A.

The display unit 70 has a display panel 72 (A1) having a display surface 72*a*, and an optical sheet 73 (C) that is placed on the rear side of the display panel 72. The peripheral edge portion of the display panel 72 is sandwiched by a front-holding frame 74 (A2) and a rear-holding frame 75 (A3) in a front to rear direction to be held therein so that a panel module is formed, with the rear-holding frame 75 being attached to the peripheral edge portion of the support body 6.

The optical sheet 73 is a laminated sheet formed by stacking a diffusion plate having a comparatively high thickness that diffuses light emitted by the light-emitting diode 1 as a light source, and synthesized resin sheets having comparatively low thicknesses, such as a reflective polarizing plate, a prism sheet and a diffusion sheet. The peripheral edge portion of the optical sheet 73 is sandwiched and held by the frame portion 62 of the support body 6 and the rear-holding frame 75.

The cabinet 71 is provided with a cabinet front divided unit 71*a* (D1) that conceals the peripheral edge portion on the front side of the display unit 70, and a cabinet rear divided unit 71*b* (D2) having a deep dish shape so as to conceal the peripheral edge portion and the rear side of the light source device A, and is attached to the frame portion 62 of the support body 6 with male screws.

Although not shown, onto the other surface 6*b* of the plate portion 61, a plurality of circuit boards, such as a power supply circuit board to be connected to a connecting electrode unit 22 of the light-emitting diode substrate 2 by a second connector, a control circuit board, which carries out driving and controlling operations on the display unit, and a signal processing circuit board, which processes an image signal for use in displaying an image on the display surface of the display unit, are attached.

Figure 77:
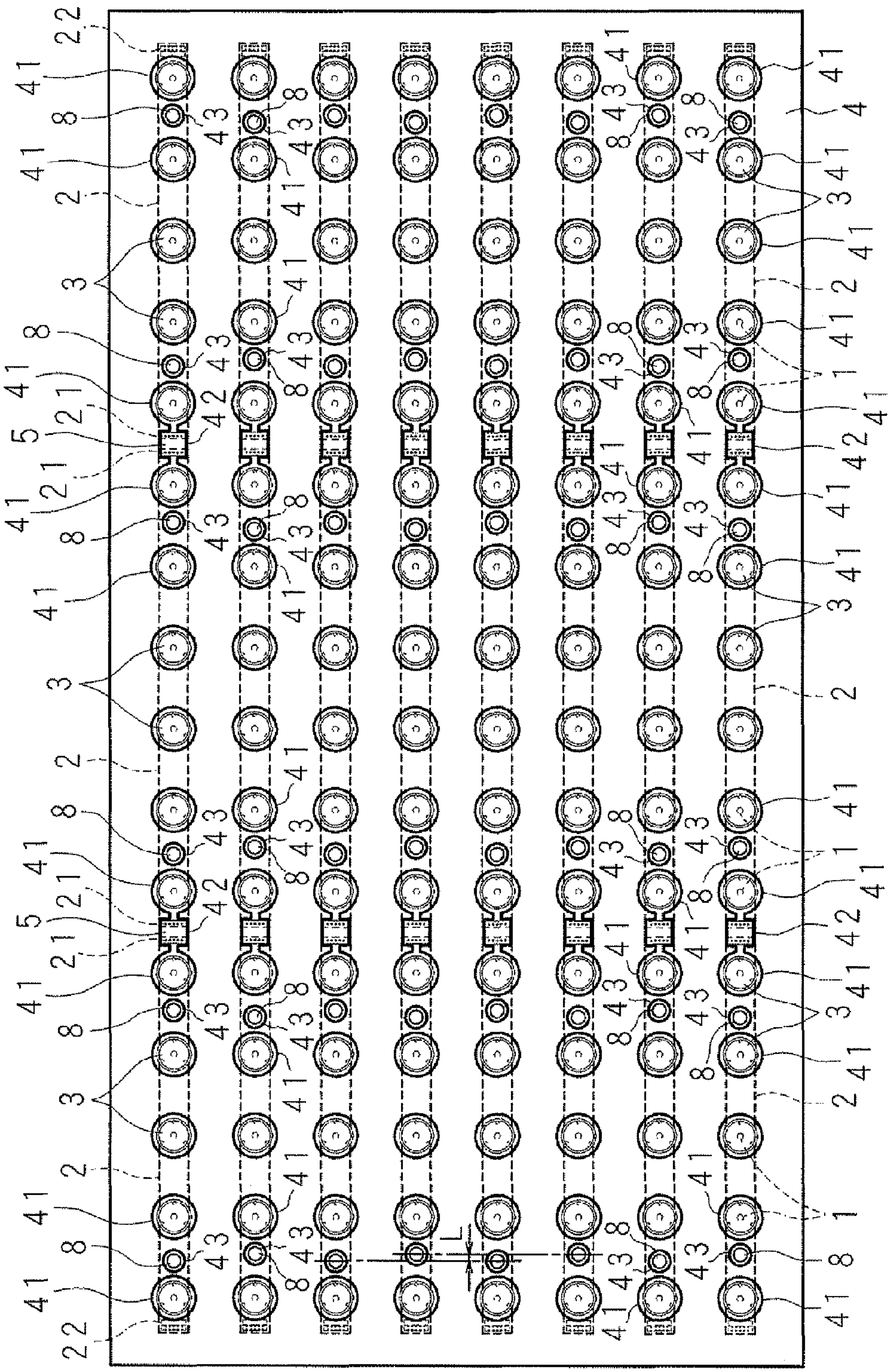
FIG. 77 is a plan view that illustrates one portion of a light source device in accordance with another embodiment of the embodiment 4.

A specific structure for use in arranging a plurality of fixtures (rivets 8) in a zigzag pattern is not necessarily limited to the above-mentioned the embodiment 4. FIG. 77 is a plan view illustrating one portion of a light source device in accordance with another embodiment of the present invention. In this embodiment, a spaced distance L between rivets 8 (B7) to be arranged in a zigzag pattern in the longitudinal direction of the light-emitting diode substrates 2 is made smaller than that of the aforementioned embodiments, and each of the third through holes 43 (B54) of the reflection sheet 4 through which the rivets 8 are inserted is a round hole separated from the through hole 41 (B53).

In the aforementioned the embodiment 4, two insertion holes 2*c* and 2*d* for use in inserting the rivets 8 are formed on the two ends in the longitudinal direction of the rectangular light-emitting diode substrate 2; however, another structure may be used in which insertion holes are respectively formed on the two ends in the longitudinal direction of the light-emitting diode substrate 2 as well as on positions inside the two ends thereof so that the respective insertion holes that are adjacent to each other in a direction orthogonal to the line of the light-emitting diode substrates 2 are located in a zigzag pattern.

Figure 78:
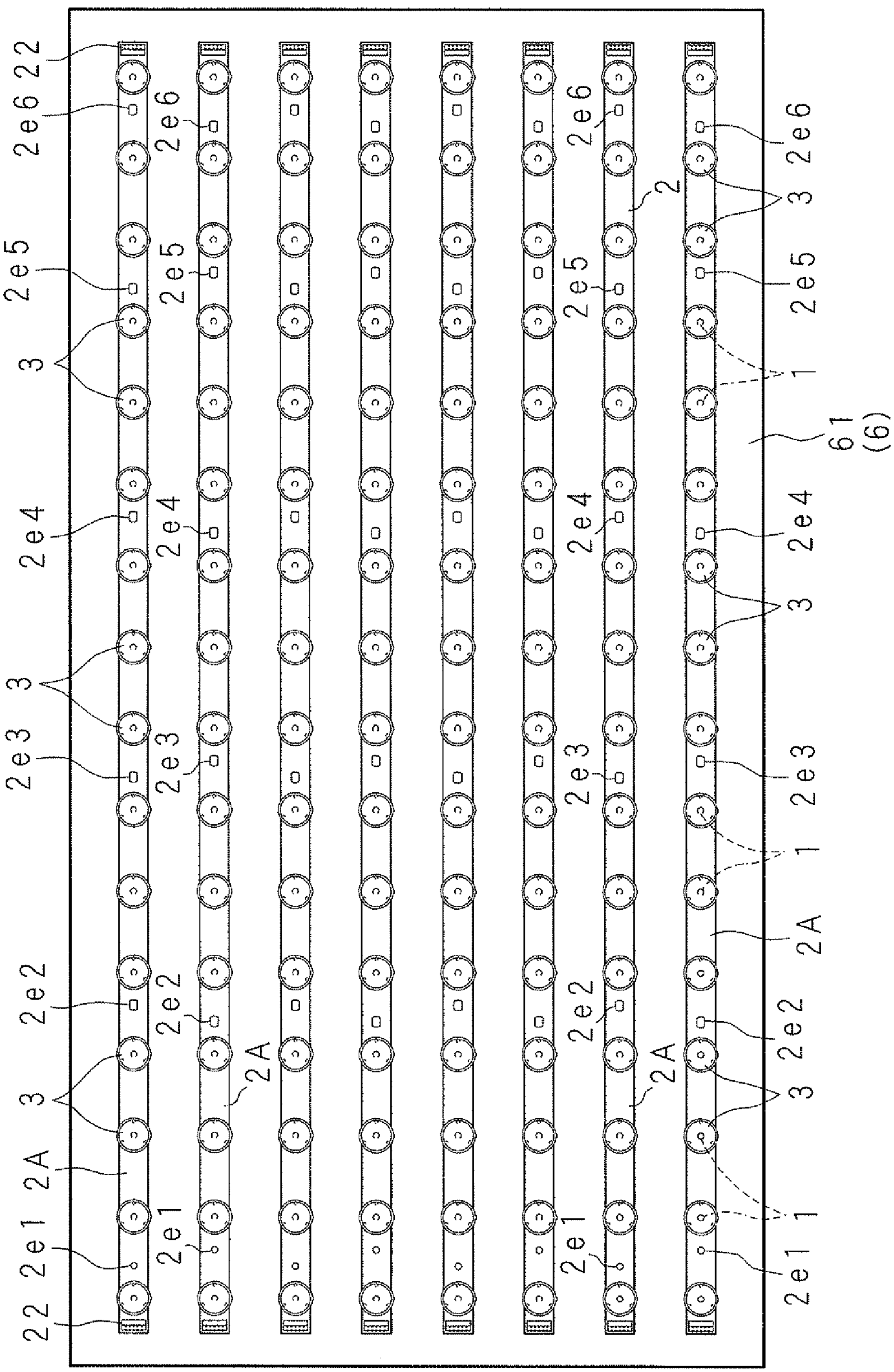
FIG. 78 is a plan view that illustrates one portion disassembled in the light source device in accordance with second other embodiment of the embodiment 4.
Figure 79:
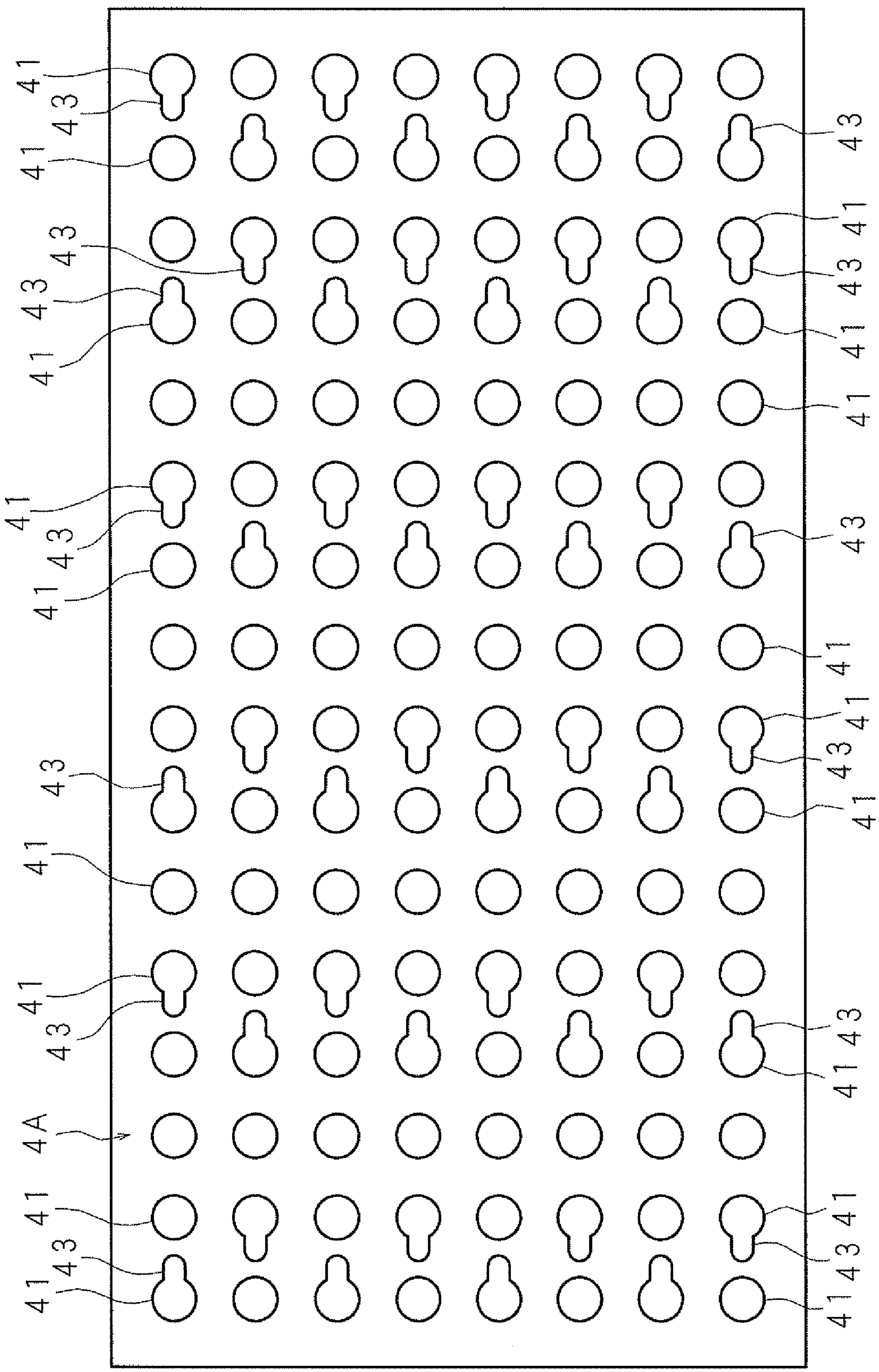
FIG. 79 is a plan view that illustrates partial members of the light source device in accordance with second other embodiment of the embodiment 4.

In the aforementioned the embodiment 4, a plurality of rectangular light-emitting diode substrates 2 are aligned in a longitudinal direction side by side in one line, and a plurality of lines are arranged in parallel with one another in the width direction; however, the structure of the light-emitting diode substrates is not necessarily limited to the embodiment 4. FIG. 78 is a plan view in which one portion of a light source device in accordance with a second other embodiment of the present invention is disassembled, and FIG. 79 is a plan view that illustrates partial members of the light source device in accordance with the second other embodiment. In this embodiment, a rectangular light-emitting diode substrate 2A (B3) is made longer than the light-emitting diode substrate 2 of the aforementioned embodiments, and eight light-emitting diode substrates 2A are arranged in parallel with one another in the substrate width direction with substantially the same interval as the assembling interval of the light-emitting diodes 1 on the light-emitting diode substrate 2A. The connecting portions 22 (B32) are formed on the two ends in the longitudinal direction of each light-emitting diode substrate 2A, and no connecting portions 21 (B31) for the connectors 5 are prepared.

Six insertion holes 2*e*1 to 2*e*6 for use in inserting the rivets 8 are formed at six positions in the longitudinal direction of each light-emitting diode substrate 2A. The insertion hole 2*e*1 on one end in the longitudinal direction of the light-emitting diode substrate 2A is a round hole in the same manner as in the insertion hole 2*c* of the aforementioned embodiments, and the other five insertion holes 2*e*2 to 2*e*6 are elongated holes in the same manner as in the insertion hole 2*d* of the aforementioned embodiments. In eight light-emitting diode substrates 2A that are adjacent to one another in the parallel arranging direction of the light-emitting diode substrates 2A, the insertion holes 2*e*1 to 2*e*6 at the respective six positions are arranged in a zigzag pattern. That is, eight insertion holes 2*e*1 on one end of the eight light-emitting diode substrates 2A arranged in parallel with one another are positioned in a zigzag pattern, and in the same manner, sets of eight insertion holes 2*e*2, eight insertion holes 2*e*3, eight insertion holes 2*e*4, eight insertion holes 2*e*4, eight insertion holes 2*e*5, and eight insertion holes 2*e*6 at the other positions are arranged in a zigzag pattern. Third insertion holes 43 are formed on the reflection sheet 4A in association with the positions of the respective insertion holes 2*e*1 to 2*e*6, and no second insertion holes 42 corresponding to the connectors 5 are prepared.

In the aforementioned the embodiment 4, the rivet 8 composed of two members of a cylindrical part 81 and an shaft part 82 is used as the fixture; however, the fixture may be prepared as a rivet made of a single member, or in addition to the rivet, vises, bolts and nuts, etc. may be used.

Moreover, in the aforementioned the embodiment 4, the third through hole 43 having a diameter larger than the diameter of the head portion 82*b* of the rivet 8 is formed, with the head portion 82*b* being placed inside the third through hole 43, so that the extension and contraction of the reflection sheet 4 due to thermal expansion can be permitted; however, in addition to this structure, another structure may be proposed in which the diameter of the head portion 82*b* is made larger than the diameter of the third through hole 43, and the outer circumferential portion of the head portion 82*b* is spaced from the circumference of the third through hole 43 of the reflection sheet 4, and opposed thereto so that the head portion 82*b* may be used for preventing the reflection sheet 4 from being biased in a separating direction from the light-emitting diode substrate 2.

In the aforementioned the embodiment 4, the light source device of the present invention is applied to illumination for a display panel of a liquid crystal display device; however, the light source device may be applied to illumination for a display panel of another display device having another light-emitting system different from the liquid crystal display device.

Embodiment 5-1

FIG. 80 is a schematic longitudinal cross-sectional diagram showing a display device.

In the figure, 1 is a rectangular display panel (A1) with liquid crystal, and this display panel 1 is formed so that the transmittance of light is adjusted by controlling the voltage applied to the liquid crystal, and thus an image is displayed. The display panel 1 has the peripheral portion sandwiched between a front supporting frame 2 (A2) and a rear supporting frame 3 (A3) and is contained in a front cabinet 4 (D1) in rectangular frame form. The front cabinet 4 is located in the periphery of the front supporting frame 2 and the rear supporting frame 3. The front cabinet 4 has a rectangular opening, and the size of the opening corresponds to the size of the display panel 1. The rear side of the display panel 1 is provided with a number of optical sheets 5 (C) for condensing light from the below-described light-emitting diodes 9 (light-emitting elements) towards the display panel 1.

The rear side of the optical sheets 5 is provided with a diffusing plate 6 for uniformly diffusing light from the light-emitting diodes 9 (B1). The diffusing plate 6 is supported by the edge portion of a support plate 7 (B6) in dish form. A number of substrates 8 (B3) are provided side-by-side on the front surface of the support plate 7, and a film made of a heat conductive substance, for example, a metal, having a heat releasing pattern (not shown) is formed on the rear surface of the substrates 8.

A number of light-emitting diodes 9, 9 . . . 9 are mounted on the front surface of the substrates 8. The light-emitting diodes 9 have a plate portion 9*a* secured to the front surface of a substrate 8 and a spindle portion 9*b* protruding to the front from the plate portion. Lenses 10, 10 . . . 10 (A2) for diffusing light are respectively placed in front of the light-emitting diodes 9, 9 . . . 9. The lenses 10 have a thick portion bulging towards the front, and a recess 10*a* is created so as to match the shape of the spindle portion 9*b* at the center of the rear surface of the lenses 10. The spindle portion 9*b* is contained inside the recess 10*a*. Three protrusions 10*b*, 10*b* and 10*b* (B22) sticking out towards the substrate 8 side are provided in the periphery of the lenses 10, and the top of the protrusions 10*b* is attached to the front surface of the substrates 8 by means of an adhesive.

Individual supports (not shown) for supporting a reflection sheet 11 (B5) in dish form are provided on the left and right of the above-described support plate 7. A number of sheet holes 11*a* (B53) through which the above-described lenses 10 are inserted are provided at the bottom of the reflection sheet 11. The respective lenses 10 protrude to the front side through the above-described sheet holes 11*a*.

The rear side of the support plate 7 is provided with a rear cabinet 12 (D2) in dish form. The length and the width of the rear cabinet 12 are approximately the same as the length and width of the front cabinet 4 (1), and the edge portion of the rear cabinet 12 and the edge portion of the front cabinet 4 face each other. Engaging protrusions and engaging recesses, not shown, are respectively provided on the edge portions of the front cabinet 4 and the rear cabinet 12 so that the engaging protrusions and the engaging recesses are engaged and the front cabinet 4 is secured to the rear cabinet 12. Here, a number of circuit boards, including a power supplying circuit board, connected to electrodes of the substrates 8 through connectors, a control circuit board for driving and controlling the display panel 1, and a signal processing circuit board for processing an image signal to be displayed on the display surface of the display panel 1, are provided between the support plate 7 and the rear cabinet 12.

Figure 81:
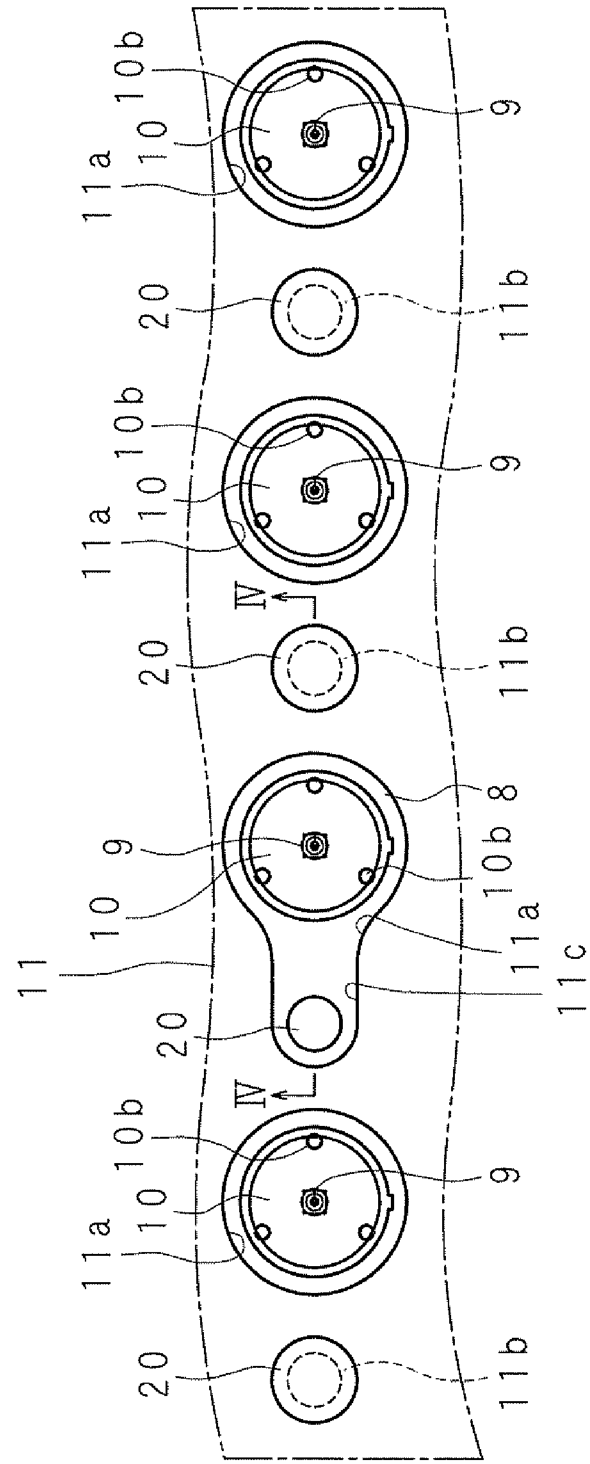
FIG. 81 is a schematic front diagram showing light-emitting diodes and substrates that are provided with a reflection sheet of the embodiment 5.
Figure 82:
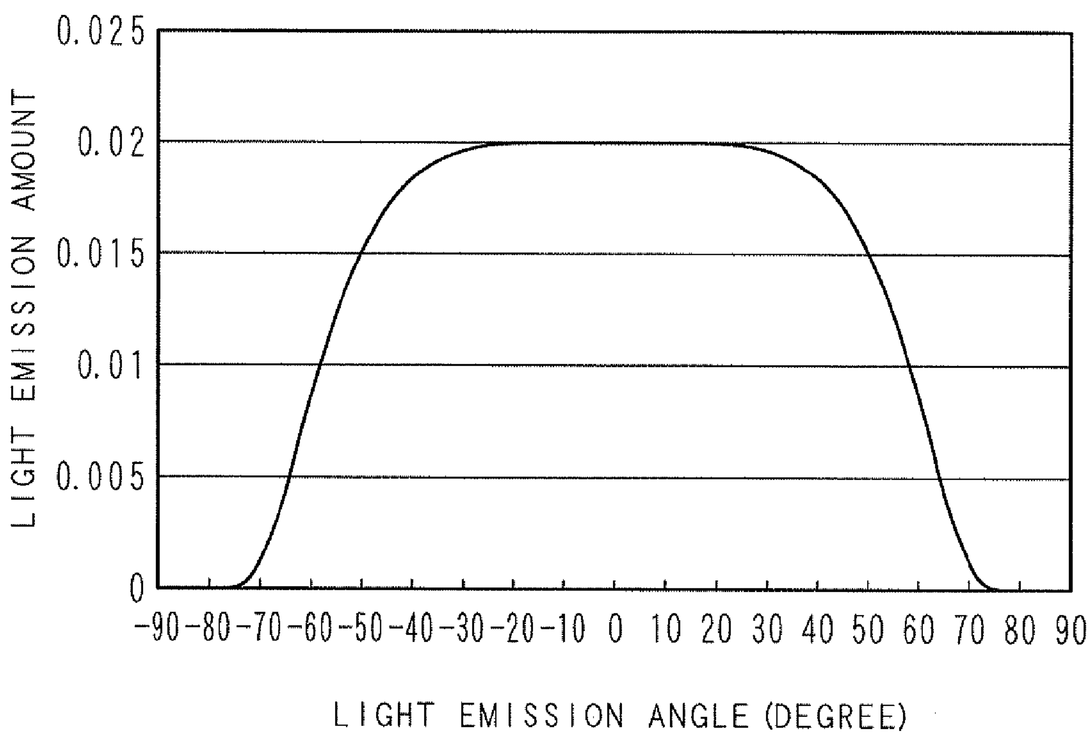
FIG. 82 is a graph showing the amount of emitted light in relation to the angle of the light emitted from a light-emitting diode of the embodiment 5.
Figure 83:
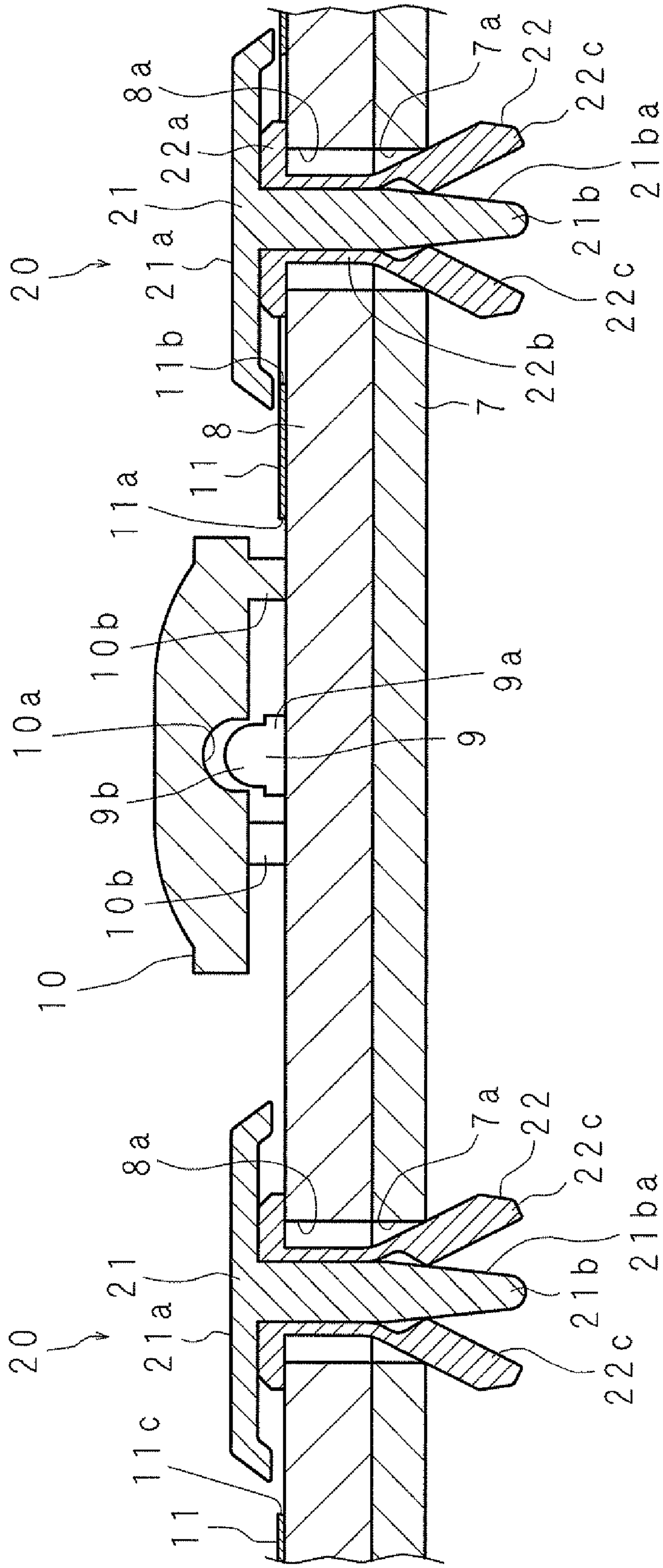
FIG. 83 is a cross-sectional diagram along line IV-IV in FIG. 81 where rivets of the embodiment 5 are schematically shown.

FIG. 81 is a schematic front diagram showing light-emitting diodes 9 and substrates 8 that are provided with a reflection sheet 11, FIG. 82 is a graph showing the amount of emitted light in relation to the angle of the light emitted from a light-emitting diode 9, and FIG. 83 is a cross-sectional diagram along line IV-IV in FIG. 81 where rivets are schematically shown.

The substrates 8 are provided with a number of first through holes 8*a*, 8*a* . . . 8*a* (B33, B34) in the longitudinal direction of the substrates 8. The above-described support plate 7 is provided with a number of second through holes 7*a*, 7*a* . . . 7*a* (B64) in the locations corresponding to the first through holes 8*a*, 8*a* . . . 8*a*. The diameter of the second through holes 7*a* is approximately the same as the diameter of the first through holes 8*a*. The reflection sheet 11 is provided with holes 11*b* (B54) in the locations corresponding to the first through holes 8*a*, and the holes 11*b* have a diameter greater than that of the first through holes 8*a*. As shown in FIG. 81, certain parts of the reflection sheet 11 are provided with through holes 11*c* in elliptical form that are connected to the above-described sheet holes 11*a* and extend in the longitudinal direction of the substrates 8. The shorter diameter and the longer diameter of the through holes 11*c* are greater than the diameter of the head portion of the below-described rivet 20.

As shown in FIG. 81, rivets 20 are provided in the holes 11*b* between the lenses 10. The rivets 20 (B7) made of a metal or a carbon material, for example, are inserted through the first through holes 8*a* and the second through holes 7*a* that correspond to the holes 11*b*, and the substrates 8 are secured to the support plate 7 by means of these rivets 20. The rivets 20 have a reception rivet 22 (B71) and an insertion rivet 21 (B72).

The reception rivet 22 has a stopper portion 22*a* (B71*a*) in annular form having a diameter greater than the diameter of the above-described first through holes 8*a*, and the outer periphery of the stopper portion 22*a* is stopped at the edge portion of a first through hole 8*a* outside the first through hole 8*a* and inside the hole 11*b*. A number of elastic portions 22*b* are provided side-by-side in the inner peripheral portion of the stopper portion 22*a*. The elastic portions 22*b* protrude along the axis of the stopper portion 22*a* and are inserted through a first through hole 8*a* and a second through hole 7*a*. The length of the elastic portions 22*b* along the axis is greater than the length of the first through holes 8*a* and the second through holes 7*a* along the axis, and thus the ends of the elastic portions 22*b* stick out from the second through hole 7*a* along the axis.

Contact portions 22*c* are provided and integrated with the ends of the elastic portions 22*b* so as to protrude towards the inside along the diameter of the stopper portions 22*a*, and there is a gap between the contact portions 22*c* and 22*c*.

The below-described leg portion 21*b* makes contact with the inside of the contact portions 22*c* so that the elastic portions 22*b* are bent outwards, and the elastic portions 22*b* make contact with the edge portion of the second through hole 7*a*. As a result, the substrates 8 and the support plate 7 are sandwiched together between the stopper portion 22*a* and the elastic portions 22*b*.

The above-described insertion rivets 21 have a head portion 21*a* (B72*a*) with a diameter greater than the above-described holes 11*b*, and a cylindrical leg portion 21*b* is provided at the center of the head portion 21*a* so as to be perpendicular to the head portion 21*a*. A tapered portion 21*ba* of the leg portion 21*b* is formed in such a manner that the diameter of the leg portion 21*b* becomes smaller as the location is closer to the end. The diameter of the leg portion 21*b* at the portion closer to the head portion 21*a* is approximately the same as the inner diameter of the above-described stopper portion 22*a* and is greater than the distance between the above-described contact portions 22*c* when the leg portion 21*b* is not inserted. Here, the end portion of the head portion 21*a* sticks out towards the leg portion 21*b* side, and the distance by which the end portion of the head portion 21*a* sticks out is smaller than the dimension in the axis direction of the above-described stopper portion 22*a*, or the thickness of the above-described stopper portion 22*a*.

The leg portion 21*b* of the insertion rivet 21 is inserted into the engaging portion 22*a* so that the end of the leg portion 21*b* is inserted into the gap between the contact portions 22*c*. The tapered portion 21*ba* of the leg portion 21*b* is formed so that the above-described gap is spread when the leg portion 21*b* is inserted. The elastic portions 22*b* are bent to the outside so as to make contact with the edge portion of the second through hole 7*a*.

The head portion 21*a* makes contact with the stopper portion 22*a*, and the head portion 21*a* does not make contact with the reflection sheet 11. There is a slight gap between the edge portion of the head portion 21*a* that sticks out towards the leg portion 21*b* side and the reflection sheet 11. When the reflection sheet 11 is thermally expanded due to the light emitted from the light-emitting diodes 9, the expansion and contraction of the thermally expanded reflection sheet 11 is allowed so that the reflection sheet 11 is not wrinkled. The reflection sheet 11 is supported by the end portions of the head portions 21*a*. The support plate 7 and the substrates 8 are sandwiched between the elastic portions 22*b* and the stopper portions 22*a* with an appropriate pressure so that the substrates 8 and the support plate 7 are made to make close contact.

The thickness of the head portions 21*a* and the stopper portions 22*a* is smaller than the height of the above-described light-emitting diodes 9, and the top of the head portions 21*a* is located lower than the top of the spindle portions 9*b* of the light-emitting diodes 9.

As shown in FIG. 81, rivets 20 are provided in the through holes 11*c* between the lenses 10. The shorter diameter and the longer diameter of the through holes 11*c* in elliptical form are greater than the diameter of the head portions (head portions 21*a*) of the rivets 20, and therefore the head portions 21*a* are located inside the through holes 11*c*. As shown in FIG. 83, the support plate 7 and the substrates 8 are sandwiched between the elastic portions 22*b* and the stopper portions 22*a* under an appropriate pressure so that the substrates 8 and the support plate 7 are made to make close contact in the same manner as the rivets 20 provided in the holes 11*b*. In addition, the thickness of the head portions 21*a* and the stopper portions 22*a* is smaller than the height of the above-described light-emitting diodes 9, and the top of the head portions 21*a* is located beneath the top of the spindle portions 9*b* of the light-emitting diodes 9.

In the display device according to the embodiment 5-1, the distance between the substrate 8 and the top of the head portions 21*a* is smaller than the distance between the substrate 8 and the top of the lenses 10 in accordance with the range in which light is diffused by the lenses 10, and thus the diffused light can be prevented from being blocked by the head portions 21*a*. FIG. 82 shows the amount of light emitted from the light-emitting diodes 9 relative to the angle of the light emission. The amount of light was measured at a point 20 mm away from the light-emitting diodes 9. It can be seen from FIG. 82 that the amount of emitted light was zero when the angle of light emission was 70 degrees or more relative to the angle of light emission at zero degrees (top of the light-emitting diodes 9). Therefore, the light diffused by the lenses 10 can be prevented from being blocked by the head portions 21*a* when the distance between the substrate 8 and the top of the head portions 21*a* of the insertion rivets 21, which are provided at a distance from the lenses 10 attached to the front surface of the substrate 8 along the front surface of the substrate 8, is smaller than the distance between the substrate 8 and the top of the lenses 10, and thus the brightness on the display panel 1 can be prevented from becoming uneven and the display quality can be prevented from lowering.

In addition, a case where light emitted from the light-emitting diodes 9 is dispersed at a large angle when passing through the lenses 10 is taken into consideration, and thus the distance between the substrate 8 and the top of the head portions 21*a* is smaller than the distance between the substrate 8 and the top of the light-emitting diodes 9 so that the light emitted from the light-emitting diodes 9 can be prevented without fail from being blocked by the head portions 21*a*, and the brightness on the display panel 1 can be prevented without fail from becoming uneven.

In addition, the substrate 8 can be secured to the support plate 7 by means of rivets 20 and the head portions 21*a* support the reflection sheet 11, and thus the reflection sheet 11 can be prevented from peeling off the support plate 7, and at the same time, the number of parts used for the display device can be reduced and the manufacturing time of the display device can be shortened. In addition, the manufacturing cost for the display device can be reduced. Furthermore, the reflection sheet 11 is not wrinkled even when the reflection sheet 11 expands and contracts due to a sudden change in temperature because of a gap between the head portions 21*a* and the reflection sheet 11.

When the rivets 20 are used to secure the substrate 8 to the support plate 7, the substrate 8 can be secured quickly to the support plate 7 without fail, and therefore the manufacturing time of the display device can be shortened and the manufacturing cost for the display device can be reduced.

In addition, light-emitting diodes 9 are used as the light-emitting elements so that the heat emission can be reduced and the turning on and off of light can be easily controlled.

Here, the rivets are not limited to those made of an insertion rivet 21 and a reception rivet 22 and may have such a structure without a reception rivet 22 that a number of leg portions 21*b* are provided in a head portion 21*a*, and each of the number of leg portions 21*b* is provided with an engaging portion that protrudes towards the outside from the end of the leg portion 21*b* so that the support plate 7 and the substrate 8 are sandwiched between the engaging portions and the head portion 21*a*. In the display device according to the embodiment, the head portions 21*a* are located behind the spindle portions 9*b*, but the top of the head portions 21*a* may be located between the top of the lenses 10 and the top of the spindle portions 9*b*. In addition, though light-emitting diodes 9 are used as the light-emitting elements in the display device according to the embodiment, LDs (laser diodes) and the like may be used.

Modification

Figure 84:
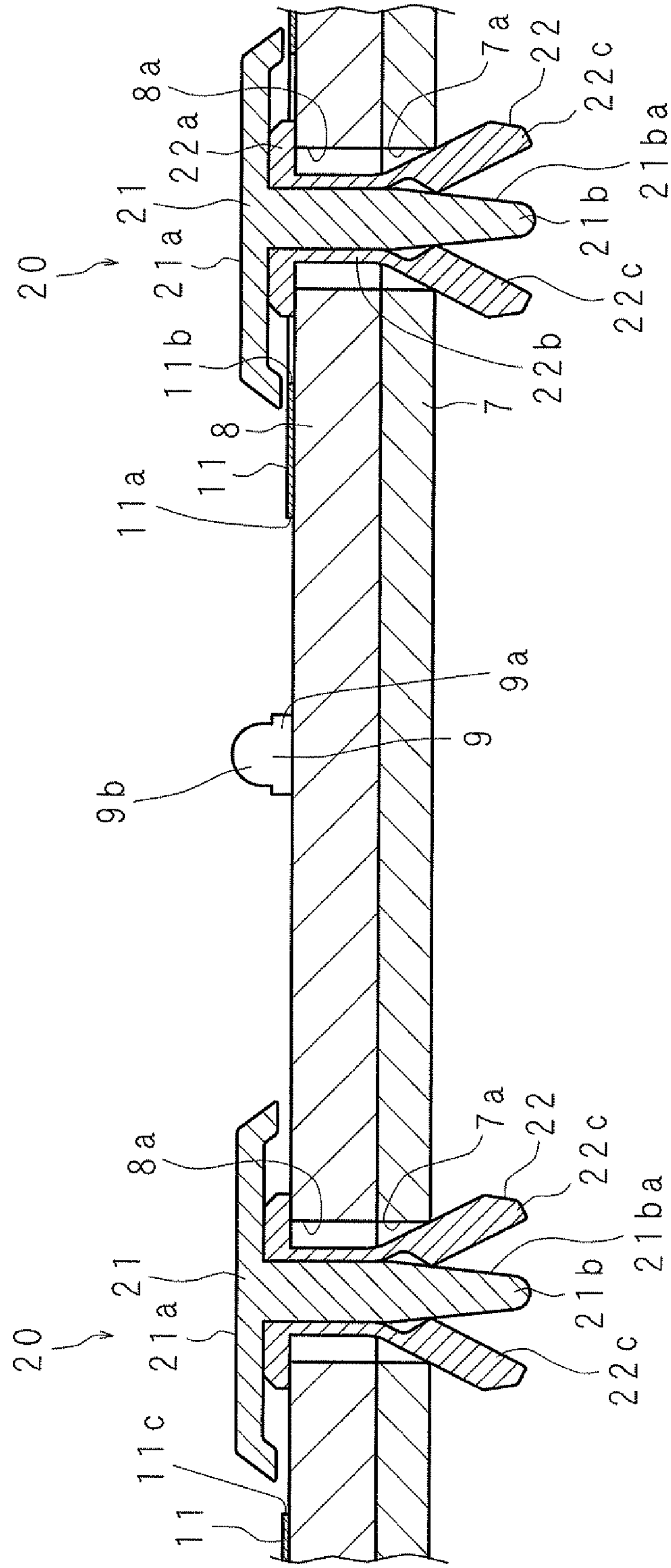
FIG. 84 is a schematic cross-sectional diagram showing rivets in the modification of the embodiment 5.

A modification of the display device according to the embodiment 5-1 is described below in detail in reference to the drawings. FIG. 84 is a schematic cross-sectional diagram showing rivets 20 in the modification.

As shown in FIG. 84, no lenses 10 are provided in front of the light-emitting diodes 9 (B1) in the modification, and the light-emitting diodes 9 directly illuminate diffusing plate 6. The light-emitting diodes 9 illuminate a range at a wide angle, and the light emitted from the light-emitting diodes 9 is sufficiently diffused by the diffusing plate 6 so as to illuminate the display panel 1. In the modification as well, the head portions 21*a* and the engaging portions 22*a* have a thickness smaller than the length of the above-described light-emitting diodes 9, and thus the top of the head portions 21*a* is located beneath the top of the spindle portions 9*b* of the light-emitting diodes 9.

As a result, the distance between the substrate 8 and the top of the head portions 21*a* can be made smaller than the distance between the substrate 8 and the top of the light-emitting diodes 9 in accordance with the range illuminated by light emitted from the light-emitting diodes 9 so that the light emitted from the light-emitting diodes 9 can be prevented without fail from being blocked by the head portions 21a, and the brightness on the display panel 1 can be prevented without fail from becoming uneven.

Embodiment 5-2

Figure 85:
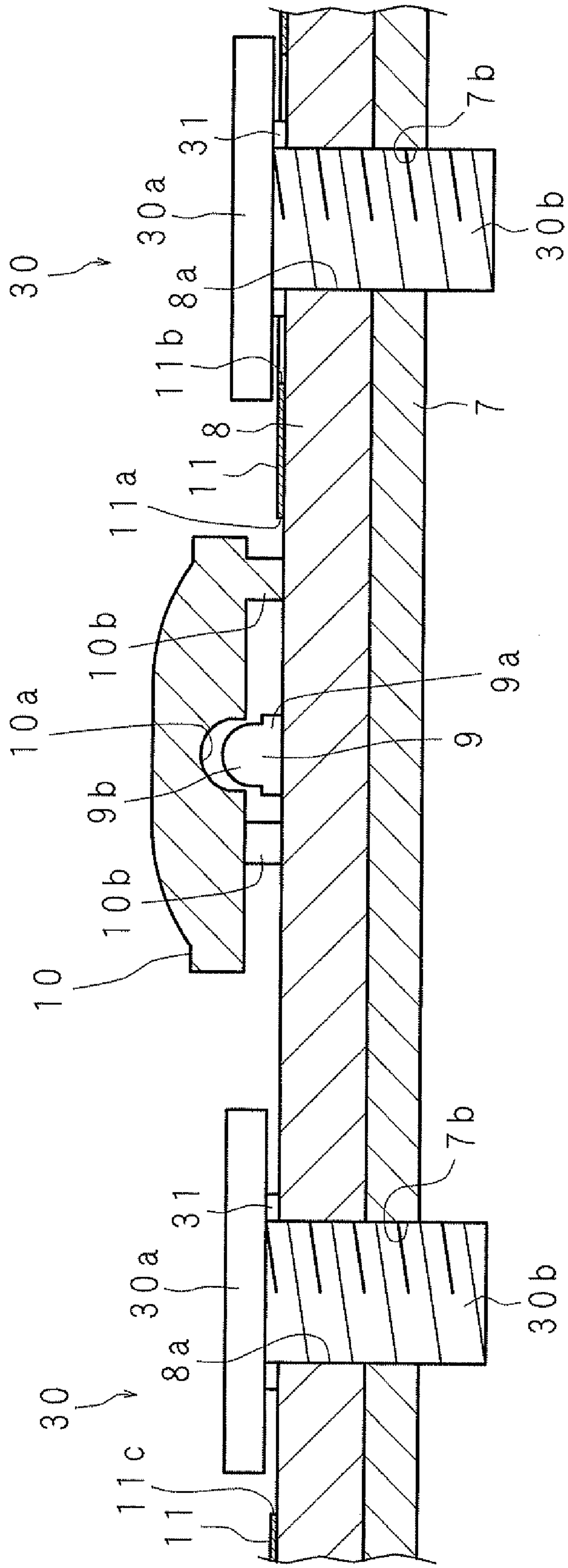
FIG. 85 is a schematic cross-sectional diagram showing screws in a display device of the embodiment 5.

FIG. 85 is a schematic cross-sectional diagram showing screws in a display device.

In this display device, the substrate 8 is secured to the support plate 7 by means of screws 30 instead of rivets 20 (B7). The above-described support plate 7 is provided with a number of second through holes 7b, 7b . . . 7b in the locations corresponding to the first through holes 8a, 8a . . . 8a (B64). Female screws are threaded inside the second through holes 7b, and the diameter of the second through holes 7b is almost equal to the diameter of the first through holes 8a. The screws 30 are inserted into the first through holes 8a so as to be engaged with the second through holes 7b.

The screws 30 have a head portion 30a in disc form with a large diameter and a shaft portion (leg portion) 30b in cylindrical form that protrudes from the center of the head portion 30a. The diameter of the head portion 30a is slightly greater than the diameter of the above-described holes 11b. The shaft portion 30b is a male screw and is inserted through a washer 31. The inner diameter of the washer 31 is slightly greater than that of the shaft portion 30b and is approximately the same as that of the first through holes 8a. The shaft portion 30b is inserted into a first through hole 8a from the substrate 8 side so as to be engaged with a second through hole 7b in such a state as being inserted through the washer 31. Therefore, the washer 31 is located between the periphery of the head portion 30a and the edge of the first through hole 8a.

The washer 31 is slightly thicker than the reflection sheet 11, and as shown in FIG. 85, there is a slight gap between the head portion 30a and the reflection sheet 11. In addition, the washers 31 and the head portions 30a are thinner than the above-described light-emitting diodes 9 so that the top of the head portions 30a is located beneath the top of the spindle portions 9b of the light-emitting diodes 9.

Here, the diameter of the head portions 30a is slightly greater than the diameter of the above-described holes 11b, and therefore the peripheral portion of the head portions 30a and the edge of the holes 11b face each other with a slight gap in between, and the peripheral portions of the head portions 30a support the reflection sheet 11. The substrate 8 is held between the washers 31 and the support plate 7, and thus is secured tightly to the support plate 7 when the screws 30 are tightened.

In the display device according to the embodiment 5-2, the distance between the substrate 8 and the top of the head portions 30a is smaller than the distance between the substrate 8 and the top of the lenses 10 in accordance with the range in which light is diffused by the lenses 10, and thus the diffused light can be prevented from being blocked by the head portions 30a. Therefore, the brightness on the display panel 1 can be prevented from being uneven and the display quality can be prevented from lowering.

In addition, the distance between the substrate 8 and the top of the head portions 30a is smaller than the distance between the substrate 8 and the top of the light-emitting diodes 9 in accordance with the range that is illuminated by light emitted from the light-emitting diodes 9 so that the light emitted from the light-emitting diodes 9 can be prevented without fail from being blocked by the head portions 30a, and the brightness on the display panel 1 can be prevented without fail from becoming uneven.

In addition, the substrate 8 is firmly secured to the support plate 7 using screws 30, and therefore the substrate 8 can be prevented without fail from disengaging from the support plate 7.

Here, the light emitted from the light-emitting diodes 9 may illuminate a range at a wide angle, and thus the lenses 10 may be removed. In this case, the distance between the substrate 8 and the top of the head portions 30a is smaller than the distance between the substrate 8 and the top of the light-emitting diodes 9 in accordance with the range illuminated by the light emitted from the light-emitting diodes 9 so that the light emitted from the light-emitting diodes 9 can be prevented without fail from being blocked by the head portions 30a, and the brightness on the display panel 1 can be prevented without fail from becoming uneven.

The same symbols as for the components in the display device according to the embodiment 5-1 are attached to the components in the display device according to the embodiment 5-2, and the detailed descriptions of these are not repeated.

Embodiment 6-1

Figure 86:
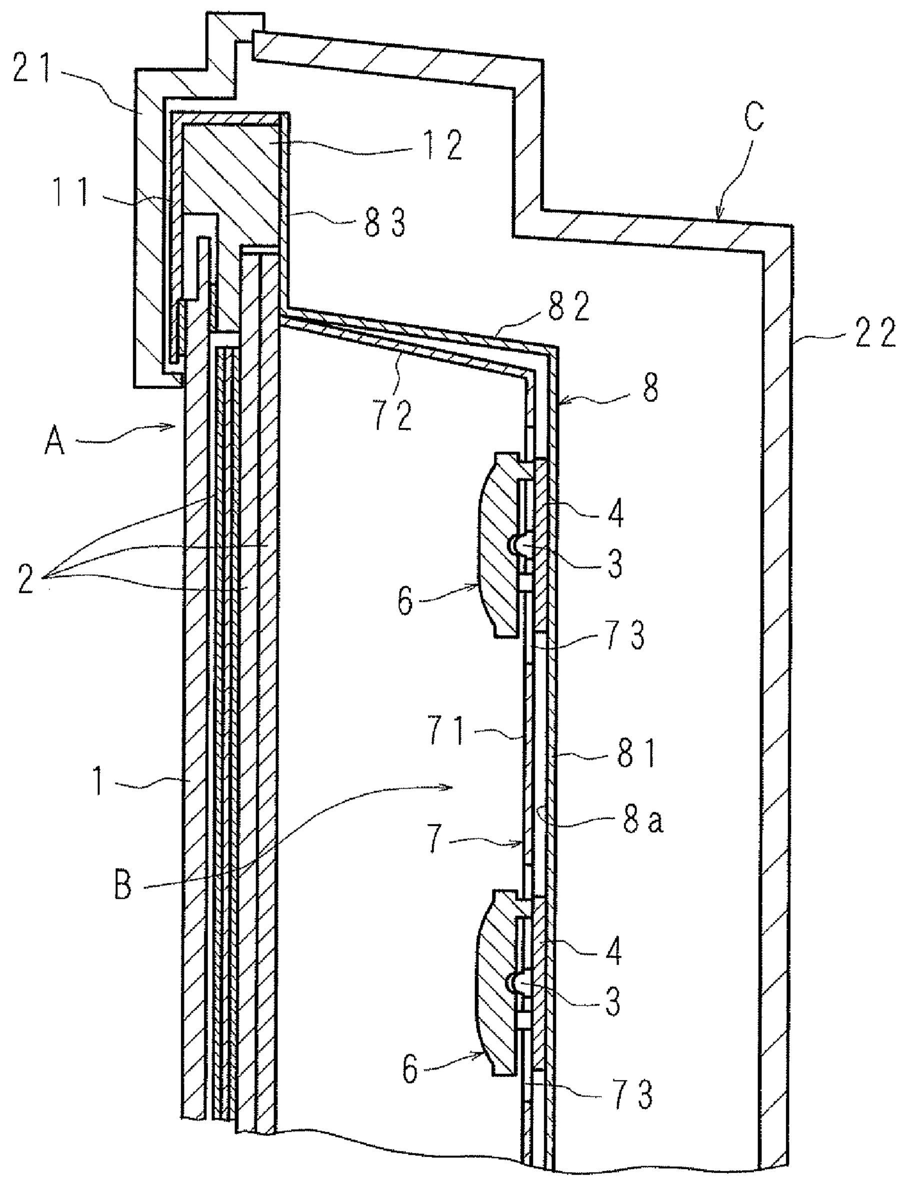
FIG. 86 is a cross-sectional diagram showing an enlargement of a portion of the structure in the display device of an embodiment 6.
Figure 87:
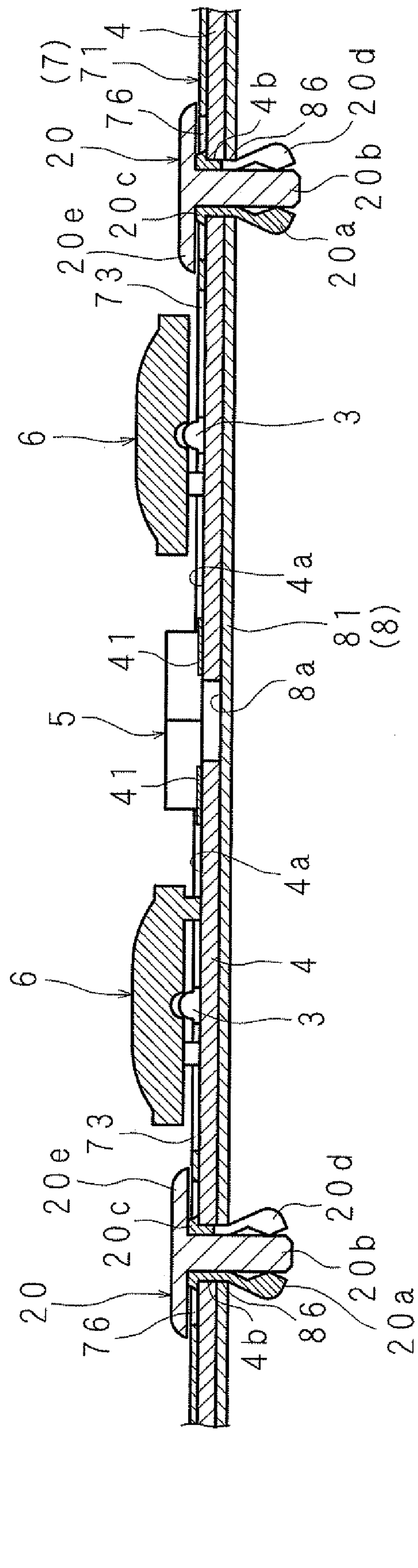
FIG. 87 is a cross-sectional diagram showing an enlargement of a portion of the structure of the light source of the embodiment 6.
Figure 88:
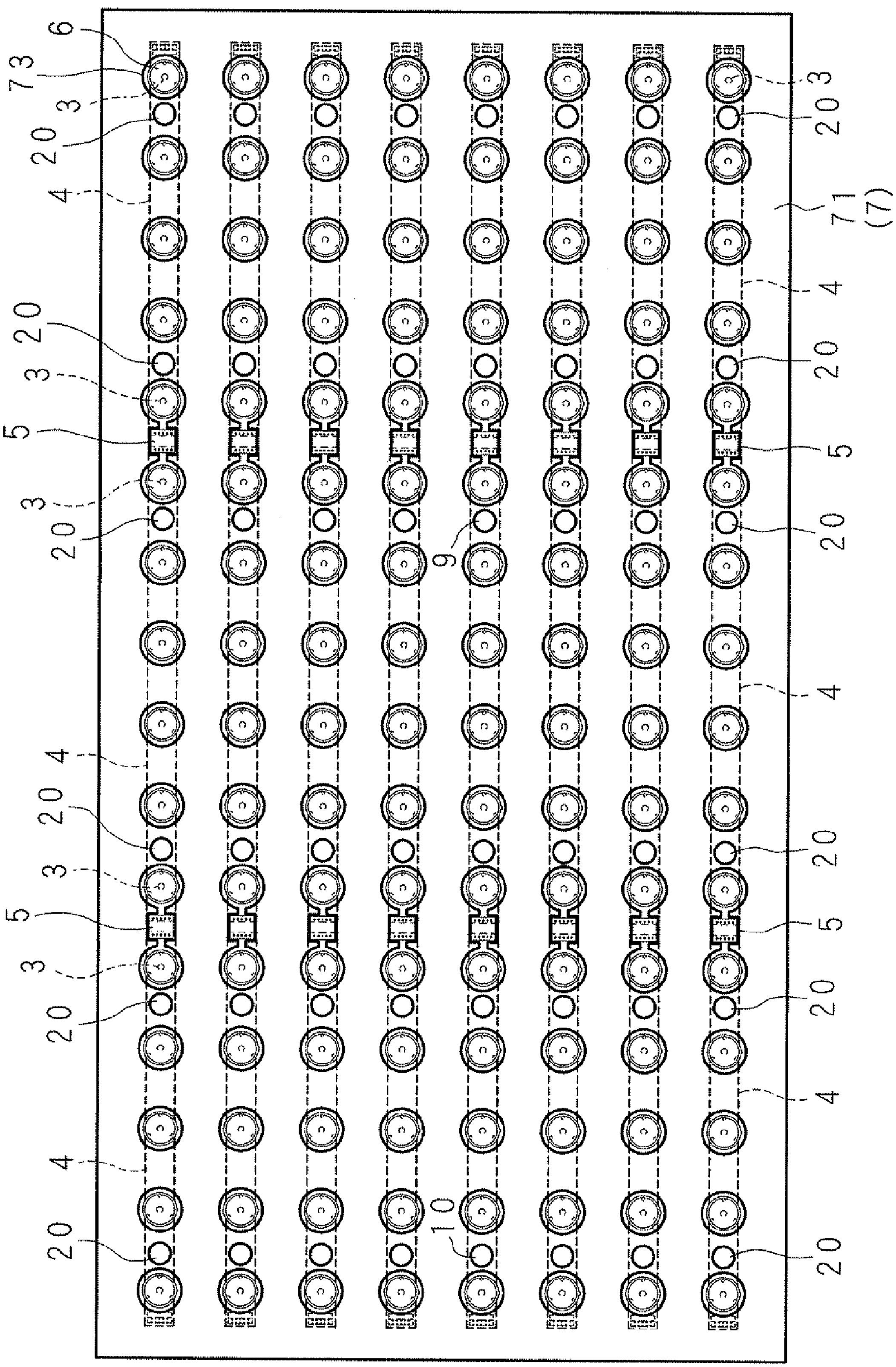
FIG. 88 is a front diagram showing the structure of the light source of the embodiment 6 where the peripheral portion is omitted.
Figure 89:
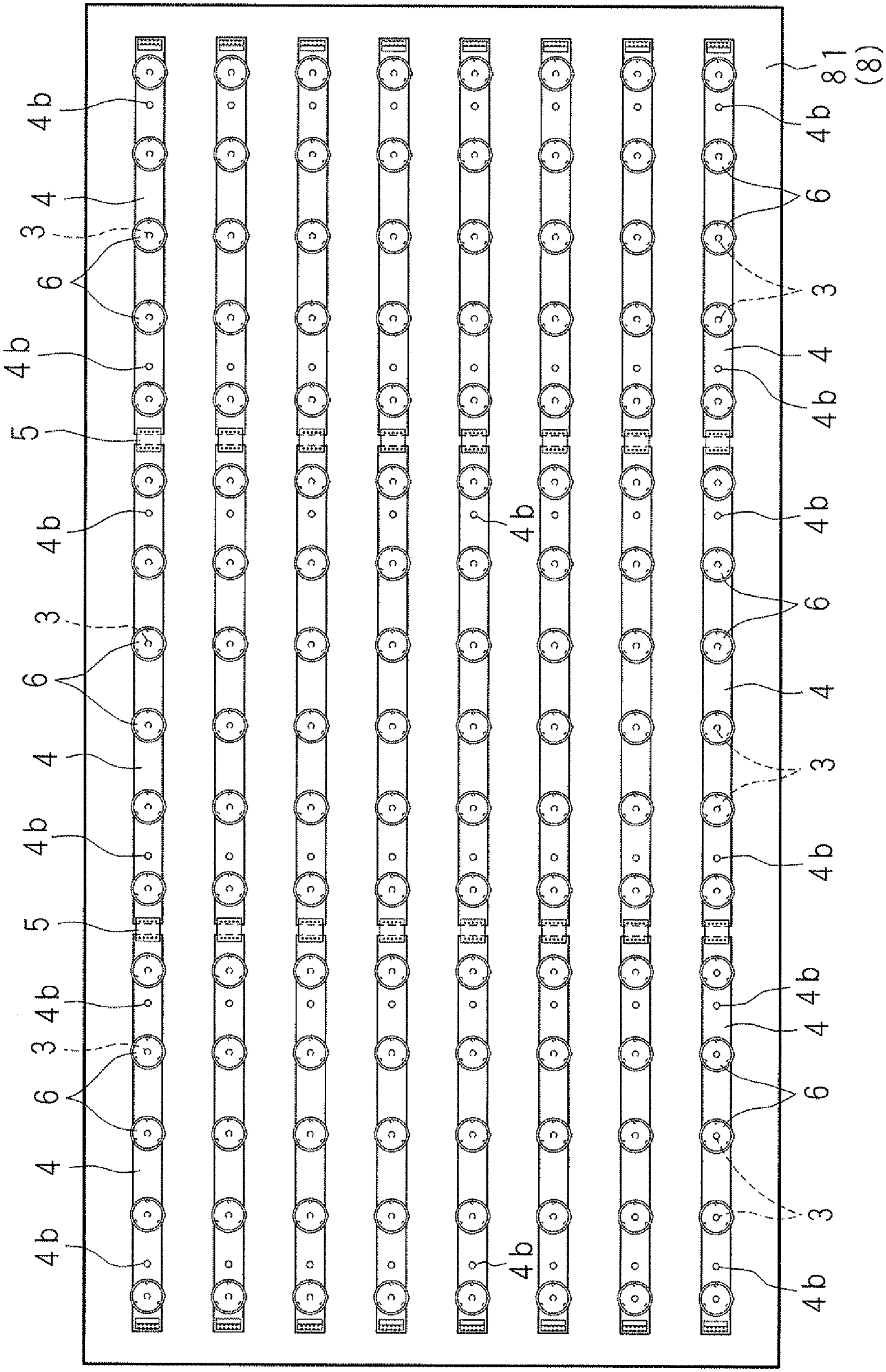
FIG. 89 is a front diagram showing the structure of the light source of the embodiment 6 where the peripheral portion and the light reflection sheet are omitted.
Figure 90:
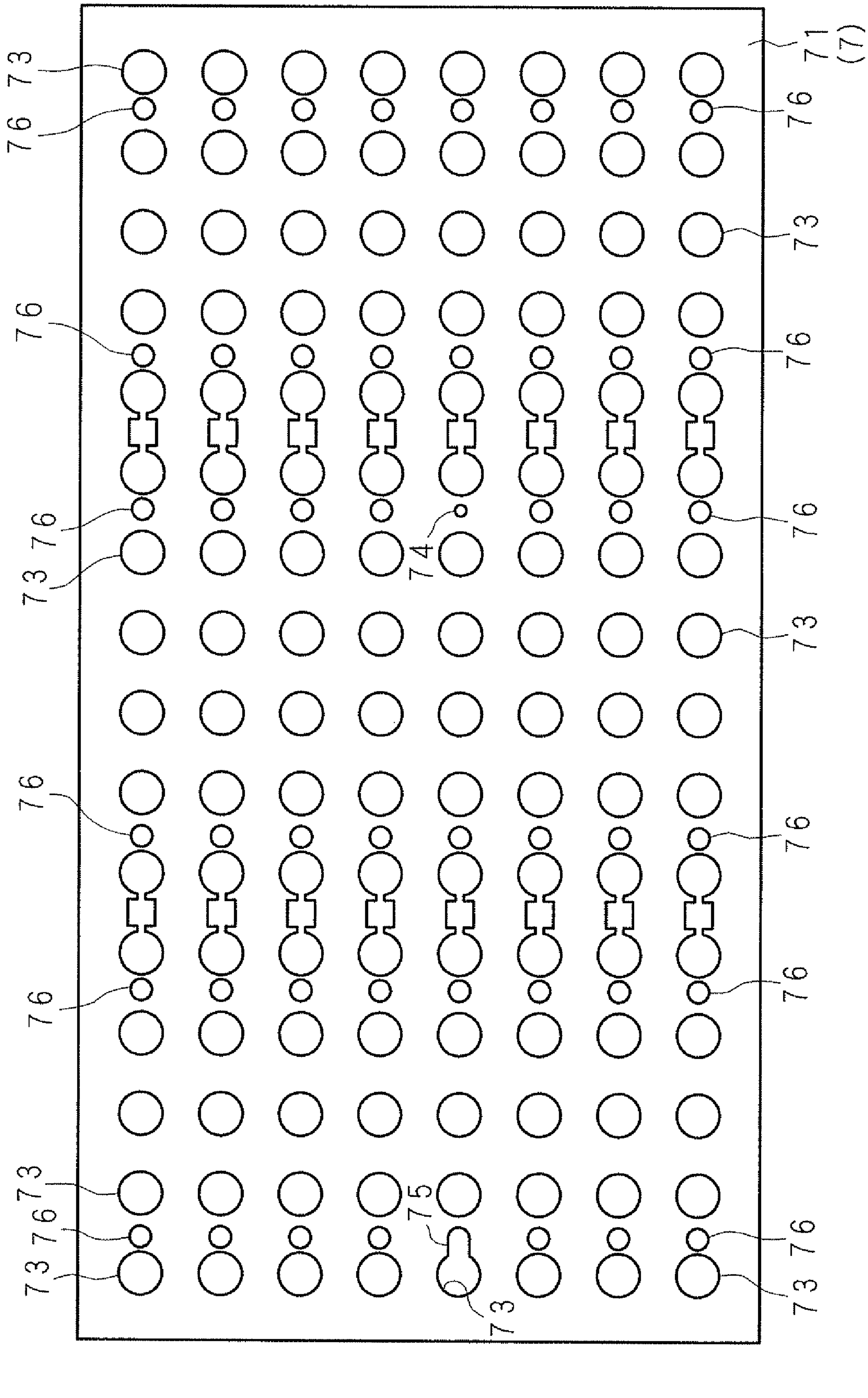
FIG. 90 is a front diagram showing the structure of the light reflection sheet of the embodiment 6 where the peripheral portion is omitted.
Figure 91A:
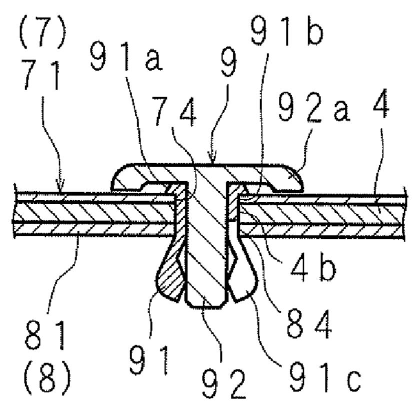
FIG. 91A is a cross-sectional diagram showing the structure of a first shaft portion of the embodiment 6 as viewed from the side.
Figure 91B:
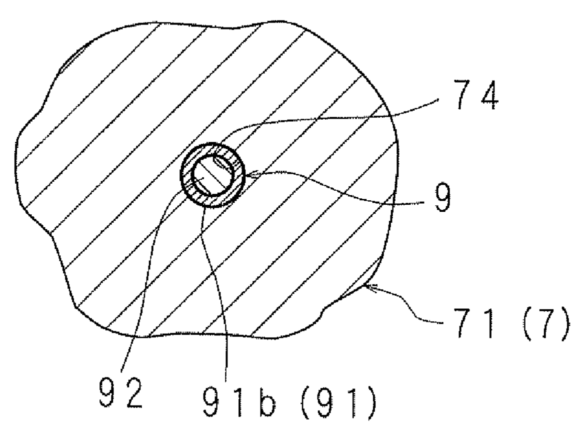
FIG. 91B is a cross-sectional diagram showing the structure of the first shaft portion of the embodiment 6 as viewed from the top.

FIG. 86 is a cross-sectional diagram showing an enlargement of a portion of the structure in the display device according to the present invention, FIG. 87 is a cross-sectional diagram showing an enlargement of a portion of the structure of the light source, FIG. 88 is a front diagram showing the structure of the light source where the peripheral portion is omitted, FIG. 89 is a front diagram showing the structure of the light source where the peripheral portion and the light reflection sheet are omitted, FIG. 90 is a front diagram showing the structure of the light reflection sheet where the peripheral portion is omitted, FIG. 91A is a cross-sectional diagram showing the structure of a first shaft portion as viewed from the side, FIG. 91B is a cross-sectional diagram showing the structure of the first shaft portion as viewed from the top, FIG. 92A is a cross-sectional diagram showing the structure of a second shaft portion as viewed from the side, FIG. 92B is a cross-sectional diagram showing the structure of the second shaft portion as viewed from the top, and FIG. 93 is a cross-sectional diagram showing the structure of a third shaft portion as viewed from the top.

The display device shown in the figures is a liquid crystal television, in other words, a liquid crystal display device, having a display unit A in approximately rectangular parallelepiped form having a display screen for displaying TV images on the front side (one side), a light source portion (light source unit) B in approximately rectangular parallelepiped form, which is provided on the rear side (the other side) of the display unit A, and a cabinet C (D) that covers the periphery of the display unit A and the rear side of the light source portion B.

The display unit A has a display panel 1 (A1) having a display screen and an optical sheet 2 (C) provided on the rear side of the display panel 1. The peripheral portion of the display panel 1 is sandwiched between and supported by a front support frame 11 (A2) and a rear support frame 12 (A3) so as to form a panel module.

The optical sheet 2 is a multilayer body where a relatively thick diffusing plate for diffusing light emitted from the light-emitting diodes 3 (B1), which are the light source, and relatively thin synthetic resin sheets, such as a reflective polarizing plate, a prism sheet and a diffusing sheet, are layered on top of each other.

The light source portion B is provided with a number of light-emitting diodes 3 laid out on a grid, which are the light source; a number of light-emitting diode substrates 4 (B3), on which light-emitting diodes 3 are mounted on one side 4*a* and which are aligned in a number of rows; a number of connectors 5 (B4) for connecting the adjacent light-emitting diode substrates 4, 4; a number of lenses 6 (B2) for diffusing light emitted from the light-emitting diodes 3, which are attached to one side 4*a* of the light-emitting diode substrates 4 so as to face the top of the light-emitting diodes 3; a light reflection sheet 7 (B5) for reflecting light diffused by the lenses 6, which has holes 73 (B53) inside of which the lenses 6 are contained and faces the above-described side 4*a* and one side of the connectors 5; a support body 8 (B6) for supporting the light-emitting diode substrates 4 aligned in a number of lines; first shafts 9 and second shafts 10 for positioning the light reflection sheet 7 relative to the support body 8; and third shafts 20 for attaching the two ends of the light-emitting diode substrates 4 to the support body 8 so as to prevent the light reflection sheet 7 from sliding in the direction of the thickness. The second shafts 10 and the third shafts 20 are the same parts.

The light-emitting diode substrates 4 are in long, rectangular form having a circuit portion on one side 4*a* and through holes 4*b*, 4*b* (B33, B34) at the two ends, and are aligned in a number of lines so as to be at a distance away from each other both in the longitudinal direction and the lateral direction on one side 8*a* of the support body 8 in rectangular form. The two ends of each light-emitting diode substrate 4 are secured to the support body 8 by means of the third shafts 20 (B7) that are inserted into the through holes 4*b*, 4*b* in such a manner that the two can slide relative to each other. A number of light-emitting diodes 3 are mounted at a distance from each other in the longitudinal direction, as shown in FIG. 89, on one side 4*a* of each of the light-emitting diode substrates 4, and connecting portions 41, 41 are provided at either end of one side 4*a* in the longitudinal direction.

Light-emitting diode substrates 4 are aligned in a number of lines, and the light-emitting diode substrates 4 in each row are connected to each other through connectors 5 for connecting two adjacent connecting portions 41, 41 in such a manner that the connecting portion of one light-emitting diode substrate 4 in a certain row is connected to the below-described power source circuit board by means of a second connector (B41) and the connecting portion of the other light-emitting diode substrate 4 in the same line is connected to a short connector.

The support body 8 is made of a metal plate formed into a case shape having a rectangular plate 81 (B61), a frame 82 (B62) connected to the periphery of the plate 81, and four rims 83 (B63) connected to the outer periphery of the frame 82. A first position setting hole 84 is provided at the center of the plate 81, a second position setting hole 85 is provided in the periphery that is away from the first position setting hole 84 in the direction towards the sheet surface, a number of engaging holes 86 are provided in the portions corresponding to the through holes 4*b* in the plate 81 so as to be away from each other around the periphery, and light-emitting diode substrates 4 are laid out on a grid and supported on one side 8*a* of the plate 81. In addition, a number of holes for attachment are provided in the rims 83 at a distance away from each other around the periphery so that the peripheral portion of the display unit A can be attached.

A power source circuit board to be connected to one end in longitudinal direction of a light-emitting diode substrate 4 by means of second connectors (B41) is attached on the other side of the plate 81, and a control circuit board for driving and controlling the display unit A to be connected to the other end in longitudinal direction of the light-emitting diode substrate 4 is attached on the other side of the plate 81. In addition, a signal processing circuit board for processing an image signal for displaying an image on the display unit A is attached to the center in longitudinal direction of the light-emitting diode substrate 4 on the other side of the plate 81.

The light reflection sheet 7 is made of one synthetic resin sheet having high reflecting properties and being rectangular so as to correspond to the display panel 1 and the support body 8, and has a flat portion 71 (B51) that is slightly smaller than the plate 81 and frame portions 72 (B52) connected to the four sides of the flat portion 71 through folding lines, which lies diagonally outwards relative to the flat portion 71, and thus forms a case.

A through hole 74 for preventing the light reflection sheet 7 from shifting its position relative to the plate 81 along the sheet surface is provided at the center of the flat portion 71, and a long hole 75 (B57) (slot) for preventing the light reflection sheet 7 from shifting its position relative to the plate 81 towards the periphery is provided in a location that is away from the through hole 74 towards the periphery. The through hole 74 is circular and is provided in a location corresponding to the first position setting hole 84. The long hole 75 is long in the direction in which the long hole 75 is away from the through hole 74, the width in the direction perpendicular to the direction in which the long hole 75 is away from the through hole 74 is narrow and is provided in a location corresponding to the second position setting hole 85. The width of the long hole 75 is almost the same as the diameter of the through hole 74. In addition, a number of second holes 76 (slots) are provided in the flat portion 71 in locations that correspond to the engaging holes 86, and the long hole 75 is one of the second holes 76 in such a manner that the long hole 75 is connected to a hole 73.

Holes 73 (B53) of which the diameter is slightly greater than that of the lenses 6 are provided in the flat portion 71 in the locations that correspond to the lenses 6, and moving portions that move in the direction of the thickness when making contact with a connector 5 are provided together with slits (B56, B59) in the flat portion 71 in the locations that correspond to the connectors 5.

First shafts 9 (B7) have a flexible cylinder 91 (B71) and a pin 92 (B72) that is fitted into the flexible cylinder 91. The flexible cylinder 91 has a collar portion 91*a* (B71*a*) at one end and a set shaft portion 91*b* connected to the collar portion 91*a*, a number of slits 91*c* (B71*b*) in the direction of the shaft and portions bulging inwards at the other end. The pieces between the slits 91*c* are flexible in the direction of the diameter, and the flexible cylinder 91 is fitted into a through hole 74 and a first position setting hole 84. The set shaft portion 91*b* has a diameter slightly smaller than that of through holes 74, and when the set shaft portion 91*b* is fitted into a through hole 74, the light reflection sheet 7 can be prevented from shifting its position along the sheet surface in the configuration.

The pin 92 has a collar portion 92*a* (B72*a*) at one end where the collar portion 92*a* has a diameter greater than that of the collar portion 91*a* of the flexible cylinder 91. When the pin 92 is fitted into the flexible cylinder 91, the pin 92 makes contact with the bulging portions inside the flexible cylinder 91 so as to bend the pieces between the slits 91*c* to the outside in the direction of the diameter from the first position setting hole 84 and prevents the pieces between the slits 91*c* from recovering their shapes due to elasticity, and thus the structure is not allowed to be removed from the plate 81 and the set shaft portion 91*b* can hold the light reflection sheet 7 in its set position.

Second shafts 10 have a flexible cylinder 10*a* and a pin 10*b* that is fitted into the flexible cylinder 10*a*. The flexible cylinder 10*a* has a collar portion 10*c* at one end and a number of slits 10*d* in the direction of the shaft and portions bulging inwards at the other end. The pieces between the slits 10*d* are flexible in the direction of the diameter, and the flexible cylinder 10*a* is fitted into the long hole 75 and a second position setting hole 85. The collar portion 10*c*, which is a position setting portion, has a diameter slightly smaller than the width of the long hole 75, and when the collar portion 10*c* is fitted into the long hole 75, the light reflection sheet 7 can be prevented from shifting its position towards the periphery with the first shaft 9 at the center in the configuration.

The pin 10*b* has a flange 10*e* at one end where the flange 10*e* has a diameter greater than that of the collar portion 10*c* of the flexible cylinder 10*a*. When the pin 10*b* is fitted into the flexible cylinder 10*a*, the pin 10*b* makes contact with the bulging portions inside the flexible cylinder 10*a* so as to bend the pieces between the slits 10*d* to the outside in the direction of the diameter from the second position setting hole 85 and prevents the pieces between the slits 10*d* from recovering their shapes due to elasticity, and thus the structure is not allowed to be removed from the plate 81.

Third shafts 20 have a flexible cylinder 20*a* and a pin 20*b* that is fitted into the flexible cylinder 20*a*. The flexible cylinder 20*a* has a flange 20*c* at one end and a number of slits 20*d* in the direction of the shaft and portions bulging inwards at the other end. The pieces between the slits 20*d* are flexible in the direction of the diameter, and the flexible cylinder 20*a* can be fitted into an engaging hole 86. The pin 20*b* has a flange 20*e* at one end where the flange 20*e* has a diameter greater than that of the flange 20*c* and the second holes 76. When the pin 20*b* is fitted into the flexible cylinder 20*a*, the pin 20*b* makes contact with the bulging portions inside the flexible cylinder 20*a* so that the pieces between the slits 20*d* are bent to the outside in the direction of the diameter from the engaging hole 86 and the pieces between the slits 20*d* are prevented from recovering their shapes due to elasticity, and thus the structure is not allowed to be removed from the plate 81. In addition, there is a slight gap between the inner surface of the flange 20*e* and the sheet surface of the light reflection sheet 7 so that the thermal expansion and contraction of the light reflection sheet 7 in the direction towards the sheet surface can be allowed, and the flange 20*e* prevents the light reflection sheet 7 from moving in the direction of the thickness relative to the light-emitting diode substrate 4 in the configuration.

The cabinet C has a cabinet front divided unit 21 (D1) for covering the periphery portion of the display unit A on the front side and a cabinet rear divided unit 22 (D2) in dish form for covering the peripheral portion and the rear side of the light source portion B, and is attached to the frame 82 of the support body 8 by means of male screws.

In the thus-formed display device, the support body 8 is placed on a working table in such a manner that the opening faces upwards, a number of rows of two adjacent light-emitting diode substrates 4, 4 are aligned on one side 8*a* of the plate 81 in the support body 8, a connector 5 makes connection between adjacent ends of the light-emitting diode substrates 4, 4 in each line, and flexible cylinders 20*a* of third shafts 20 are fitted into engaging holes 86 through the through holes 4*b*, 4*b* provided at the two ends of the light-emitting diode substrates 4 in each row.

After the light-emitting diode substrates 4 in lines are attached, the light reflection sheet 7 is provided so as to face the entire surface of the light-emitting diode substrates 4 in lines in such a manner that the lenses 6 are contained in the holes 73 in the light reflection sheet 7 and the moving portions cover the connectors 5.

Flexible cylinders 91 of first shafts 9 are fitted into the first position setting holes 84 in the plate 81 through the through holes 74 in the light reflection sheet 7, and pins 92 are fitted into the flexible cylinders 91 so that the circumferential position of the light reflection sheet 7 can be set relative to the plate 81 along the sheet surface. In addition, flexible cylinders 10*a* of second shafts 10 are fitted into the second position setting holes 85 in the plate 81 through the long holes 75 of the light reflection sheet 7, and pins 10*b* are fitted into the flexible cylinders 10*a* so that the position of the light reflection sheet 7 can be set relative to the plate 81, and at the same time, the long holes 75 can move relative to the light reflection sheet 7. Furthermore, when pins 20*b* are fitted into the flexible cylinders 20*a* of the third shafts 20 through the second holes 76 in the light reflection sheet 7, the light reflection sheet 7 can be attached to the plate 81 in such a manner that the light reflection sheet 7 can move relative to the plate 81 while the flanges 20*e* prevent the reflection sheet 7 from moving in the direction of the thickness relative to the light-emitting diode substrates 4.

After the light reflection sheet 7 is attached, an optical sheet 2 is placed on top of the light reflection sheet 7, a display unit A is placed on top of the optical sheet 2, the peripheral portion of the display unit A is attached to the peripheral portion of the support body 8 by means of a number of male screws, and the cabinet C is attached.

As described above, the position of the light reflection sheet 7 is set along the sheet surface by means of the through holes 74, the first shafts 9 and the first position setting holes 84, and at the same time, the position of the light reflection sheet 7 is set in the direction towards the periphery by means of the long holes 75, the second shafts 10 and the second position setting holes 85. The long holes 75 and the portion for attaching the light reflection sheet 7 to the support body 8 allows the light reflection sheet 7 and the support body 8 to move relative to each other, and therefore when the light reflection sheet 7 thermally expands along the sheet surface, this expansion and contraction can be allowed through the long holes 75 and the second holes 76. In addition, the long holes 75 and the second shafts 10 can prevent the light reflection sheet 7 from shifting towards the periphery with the first shafts 9 at the center, and thus the appropriate position of the light reflection sheet 7 relative to the support body 8 can be maintained. Therefore, an appropriate positional relationship between the lenses 6 mounted on the light-emitting diode substrates 4 and the holes 73 provided in the light reflection sheet 7 can be maintained, the space between the lenses 6 and the holes 73 can be kept uniform, and the edge portions of the holes 73 can be prevented from making a shadow, and thus appropriate brightness can be maintained.

Figure 94:
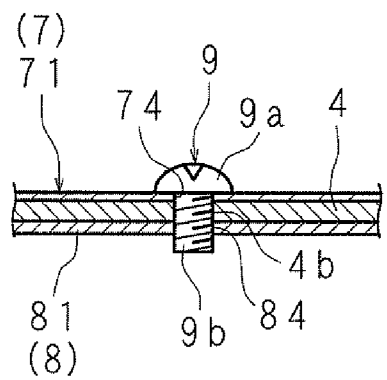
FIG. 94 is a cross-sectional diagram showing another structure of a first shaft portion of the embodiment 6 as viewed from the side.
Figure 95:
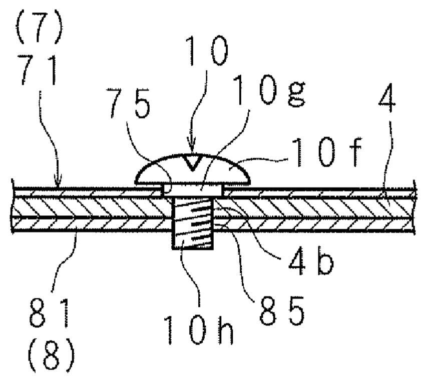
FIG. 95 is a cross-sectional diagram showing another structure of the second shaft portion of the embodiment 6 as viewed from the side.

FIG. 94 is a cross-sectional diagram showing another structure of a first shaft portion as viewed from the side, and FIG. 95 is a cross-sectional diagram showing another structure of a second shaft portion as viewed from the side. Though in the above-described embodiments the first shaft portions 9, the second shaft portions 10 and the third shaft portions 20 form rivets, the first shaft portions 9, the second shaft portions 10 and the third shaft portions 20 may form male screws.

In the case where the first shaft portions 9 are male screws, as shown in FIG. 94, a first shaft portion 9 has a head portion 9*a* having a diameter greater than that of the through holes 74 and a screw portion 9*b* that continues to the head portion 9*a* and has a diameter slightly smaller than the through holes 74. The screw portion 9*b* forms a set shaft portion. In this embodiment, the screw portion 9*b* is inserted into a through hole 74 and is screwed into a first position setting hole 84, and thus the position of the light reflection sheet 7 can be prevented from shifting along the sheet surface.

In the case where the second shaft portions 10 are male screws, as shown in FIG. 95, a second shaft 10 has a head portion 10*f* having a diameter greater than the width of the long hole 75, a mid-diameter shaft portion 10*g* that continues to the head portion 10*f* and has a diameter slightly smaller than the width of the long hole 75, and a screw portion 10*h* that continues to the mid-diameter shaft portion 10*g* and has a diameter smaller than that of the mid-diameter shaft portion 10*g*. The mid-diameter shaft portion 10*g* forms a position setting portion. In this embodiment, the screw portions 10*h* are inserted into the long holes 75 and screwed into the second position setting holes 85 so that the mid-diameter shaft portions 10*g* are fitted into the long holes 75, and thus the position of the light reflection sheet 7 can be prevented from shifting towards the periphery with the first shafts 9 at the center.

In the case where the third shafts 20 are male screws, in the same manner as the second shafts 10 shown in FIG. 95, a third shaft 20 has a structure with a head portion, a mid-diameter shaft portion and a screw portion, and the detailed description thereof and the drawings are omitted.

Embodiment 6-2

FIG. 96 is a plan diagram showing another structure of a hole for preventing the position from shifting as viewed from the top. In this display device, a long hole 75 is provided in a location away from the hole 73 instead of the structure where one of the second holes 76 provided in locations away from the through holes 74 towards the periphery is a long hole 75, and the long hole 75 is connected to the hole 73.

In this structure, the rigidity of the flat portion 71 around the long hole 75 can be increased, and therefore even when a load is applied to the edge of the long hole 75, the flatness of the flat portion 71 can be easily maintained. In the embodiment 6-2, one of the second holes 76 may be a long hole 75 or a long hole 75 may be provided in a location away from a second hole 76 towards the through hole 74.

Embodiment 6-3

FIG. 97 is a cross-sectional diagram showing another structure of the first shaft portion and the second shaft portion as viewed from the side. In this display device, a long hole 75 is provided so as to be connected to an end of a through hole 74 instead of the structure where a long hole 75 is provided in a location away from a through hole 74 towards the periphery.

One second position setting hole 85 is provided next to a first position setting hole 84 in the plate 81. A second through hole 4*c* is provided next to one through hole 4*b* in a light-emitting diode substrate 4 so as to correspond to a second position setting hole 85.

The collar portion 92*a* of a first shaft 9 is elliptical, and a second shaft 10 is provided at an end of the collar portion 92*a* in the longitudinal direction and is integrated with the collar portion 92*a*. The second shaft 10 is a pin having a diameter smaller than the width of the long hole 75 and is provided so as to be parallel with the first shaft 9.

The long hole 75 is long in the direction in which the long hole 75 is away from the center of the through hole 74, and the width in the direction perpendicular to the direction in which the long hole 75 is away from the center of the through hole 74 is narrow. The width of the long hole 75 is almost the same as the diameter of the second shaft 10.

In this embodiment, when the first shaft 9 is inserted into the first position setting hole 84, the second shaft 10 can be inserted into the second position setting hole 85, and therefore the second shaft 10 can be prevented from not being attached. In addition, the number of steps of attaching the second shafts 10 can be reduced, and thus the efficiency in assembly can be increased.

Embodiment 6-4

Figure 98:
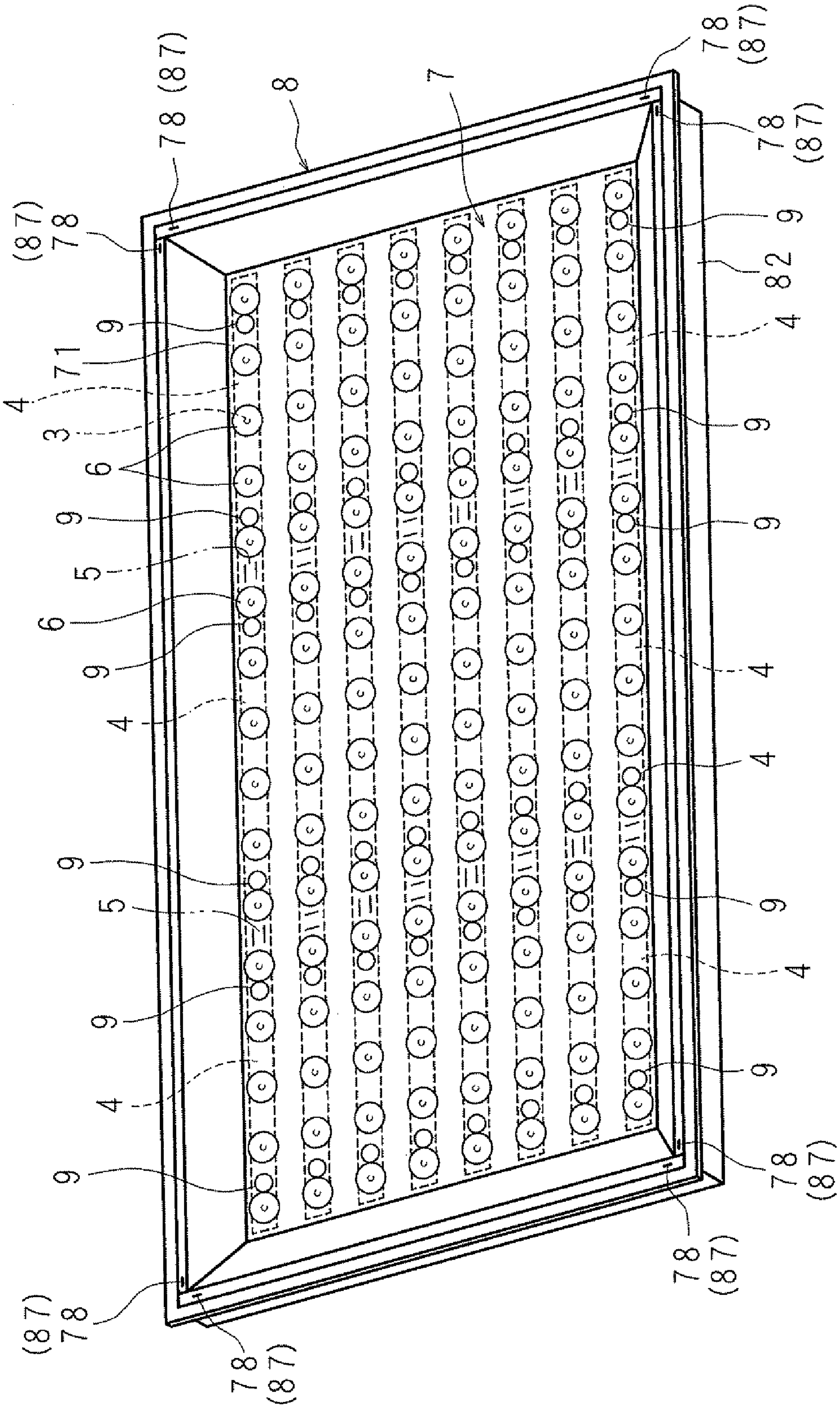
FIG. 98 is a schematic perspective diagram showing another structure of the light source unit.
Figure 99:
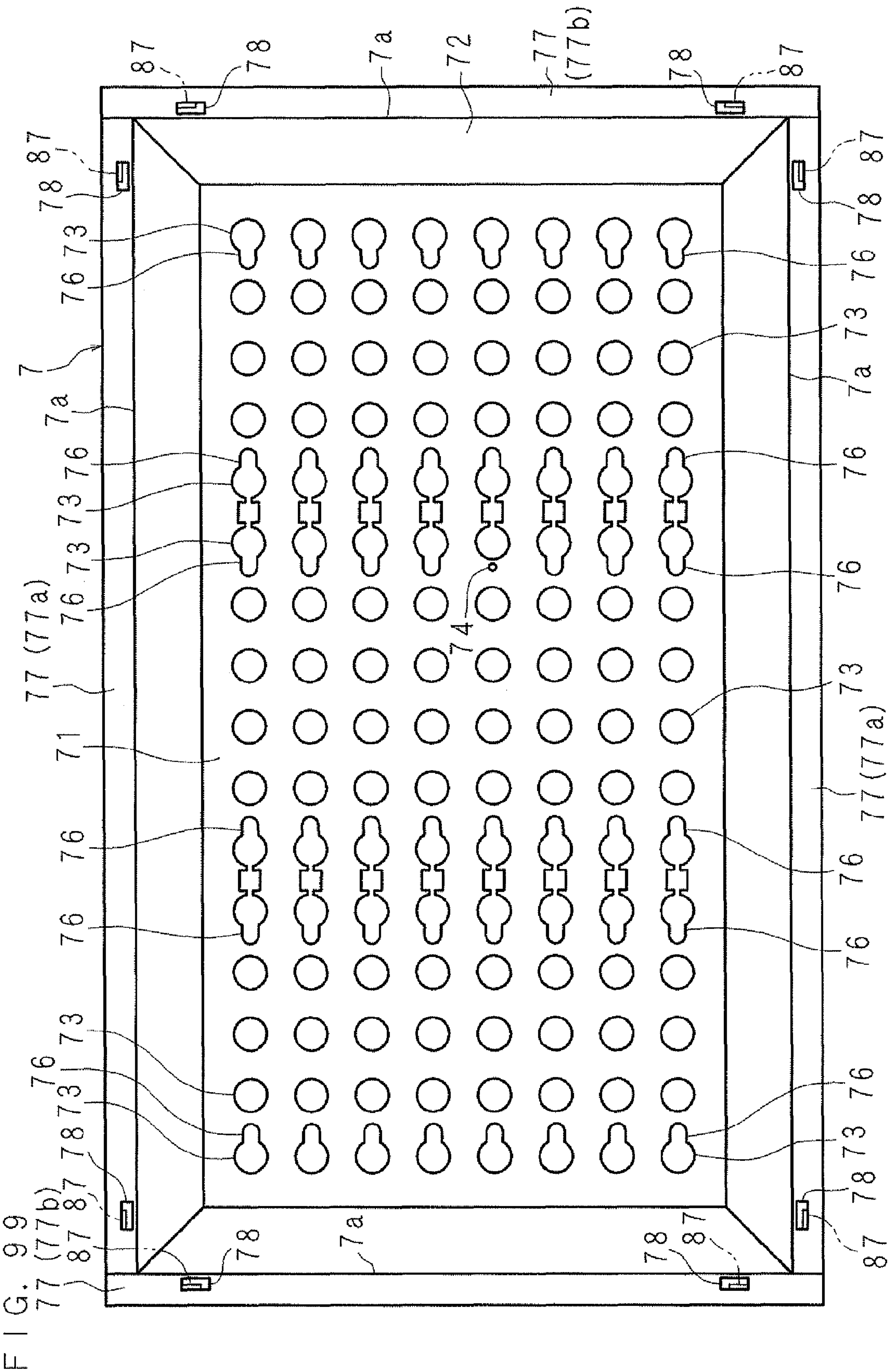
FIG. 99 is a front diagram showing another structure of the portion for preventing the position from shifting of the light reflection sheet.

FIG. 98 is a schematic perspective diagram showing another structure of the light source unit, and FIG. 99 is a front diagram showing another structure of the portion for preventing the position from shifting of the light reflection sheet. In this light source unit, a through hole 74 is provided at the center of the flat portion 71, four narrow collar pieces 77 are provided so as to continue to the outer edge of the square frame 72 (B52) through folding lines 7*a*, long holes 78 (slots) are provided at the two ends of each collar piece 77, and position setting protrusions 87 to be inserted into the long holes 78 are provided in the collar pieces 83 in the corners of the support 8.

The collar pieces 77 include long collar pieces 77*a* that continue to the rectangular flat portion 71 through a long side and short collar pieces 77*b* that continue to the rectangular flat portion 71 through a short side. The two ends of the long collar pieces 77*a* are provided with long holes 78 that are long in the longitudinal direction of the long collar pieces 77*a*, and the two ends of the short collar pieces 77*b* are provided with long holes 78 that are long in the longitudinal direction of the short collar pieces 77*b*.

The position setting protrusions 87 are smaller than the long holes 78 and are formed by cutting and folding part of the flange portion 83. Part of the periphery of the position setting protrusions 87 makes contact with the edge of the long holes 78 so that the position of the light reflection sheet 7 can be prevented from shifting towards the periphery, and the gap between the position setting protrusions 87 and the long holes 78 can allow the light reflection sheet 7 to thermally expand and contract in the configuration.

According to the present invention, long holes 78 are provided in the collar pieces 77 that are provided in the peripheral portion of the display unit A and in the peripheral portion of the support 8 so as not to affect the light reflection, and therefore the light reflectance is not lowered by the long holes 78, which solely work as holes for preventing the position from shifting, and thus the light reflection sheet can have a higher reflectance of light.

Though in the above-described embodiments the through hole 74 is provided at the center of the flat portion 71, this through hole 74 may be provided in the flat portion 71 in such a location as to be away from the center towards the periphery, and there are no particular limitations in the positional relationship between the through hole 74 and the long holes 75, 78.

Though in the above-described embodiments the holes for preventing the position from shifting are long holes, the holes for preventing the shifting may be in any form and not limited to long holes as long as they can allow the light reflection sheet to thermally expand and contract, and at the same time, engage with the second position setting portions so as to prevent the position of the light reflection sheet 7 from shifting towards the periphery.

Though in the above-described embodiments the third shafts 20 for securing the light-emitting diode substrates 4 also work as the second shafts 10 in the configuration, the first shafts 9, the second shafts 10 and the third shafts 20 may be different shaft members.

Though in the above-described embodiments the first shafts 9 are first position setting portions and the second shafts 10 are second position setting portions, the first position setting portions and the second position setting portions may be shaft members mounted on the plate 81 or shaft members mounted on the light-emitting diode substrates that are secured to the plate 81.

Embodiment 7

Figure 101:
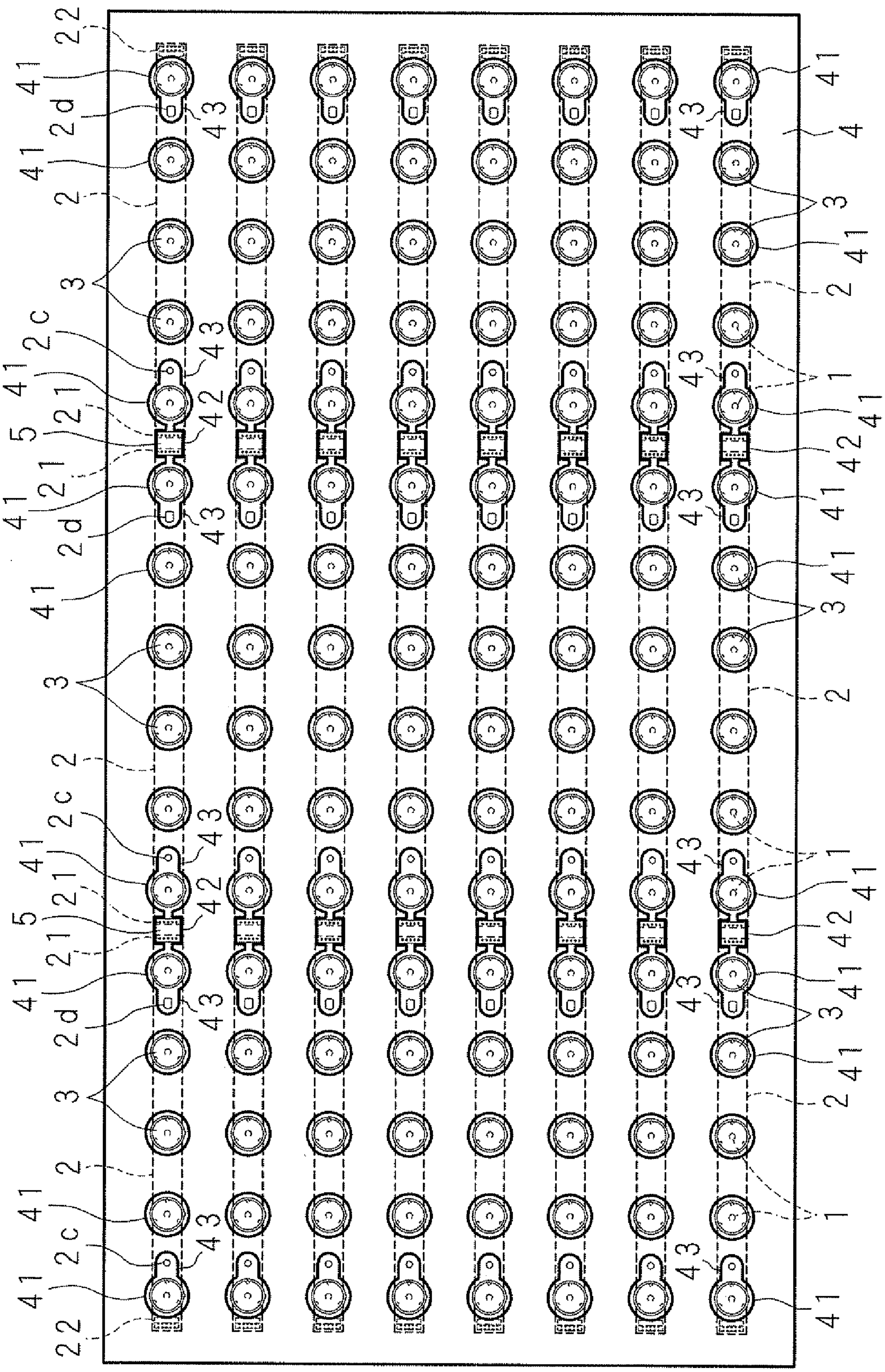
FIG. 101 is a plan view of a part of the light source device of the embodiment 7.
Figure 102:
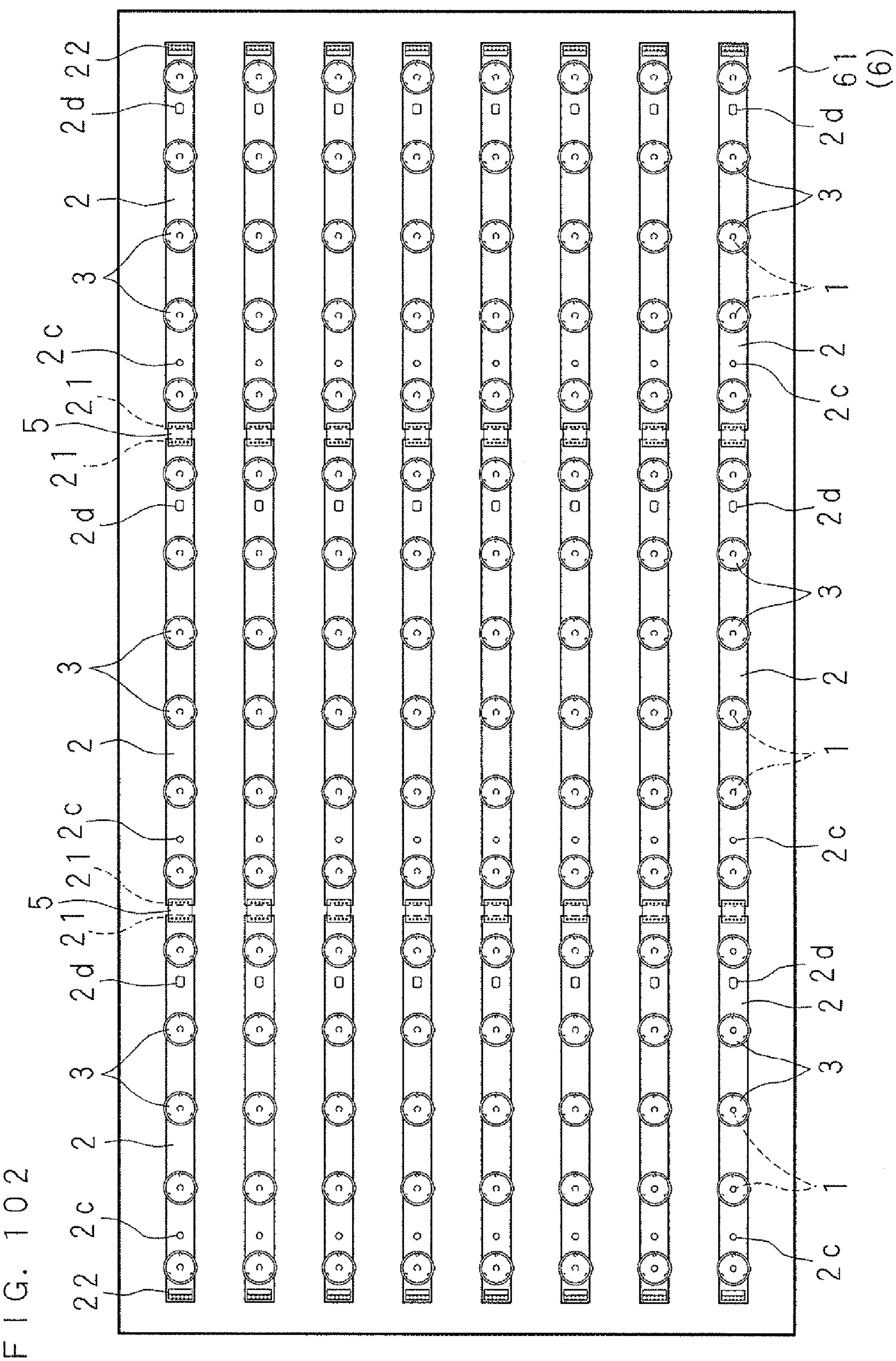
FIG. 102 is a plan view of the light source device of the embodiment 7 with its part disassembled.
Figure 103:
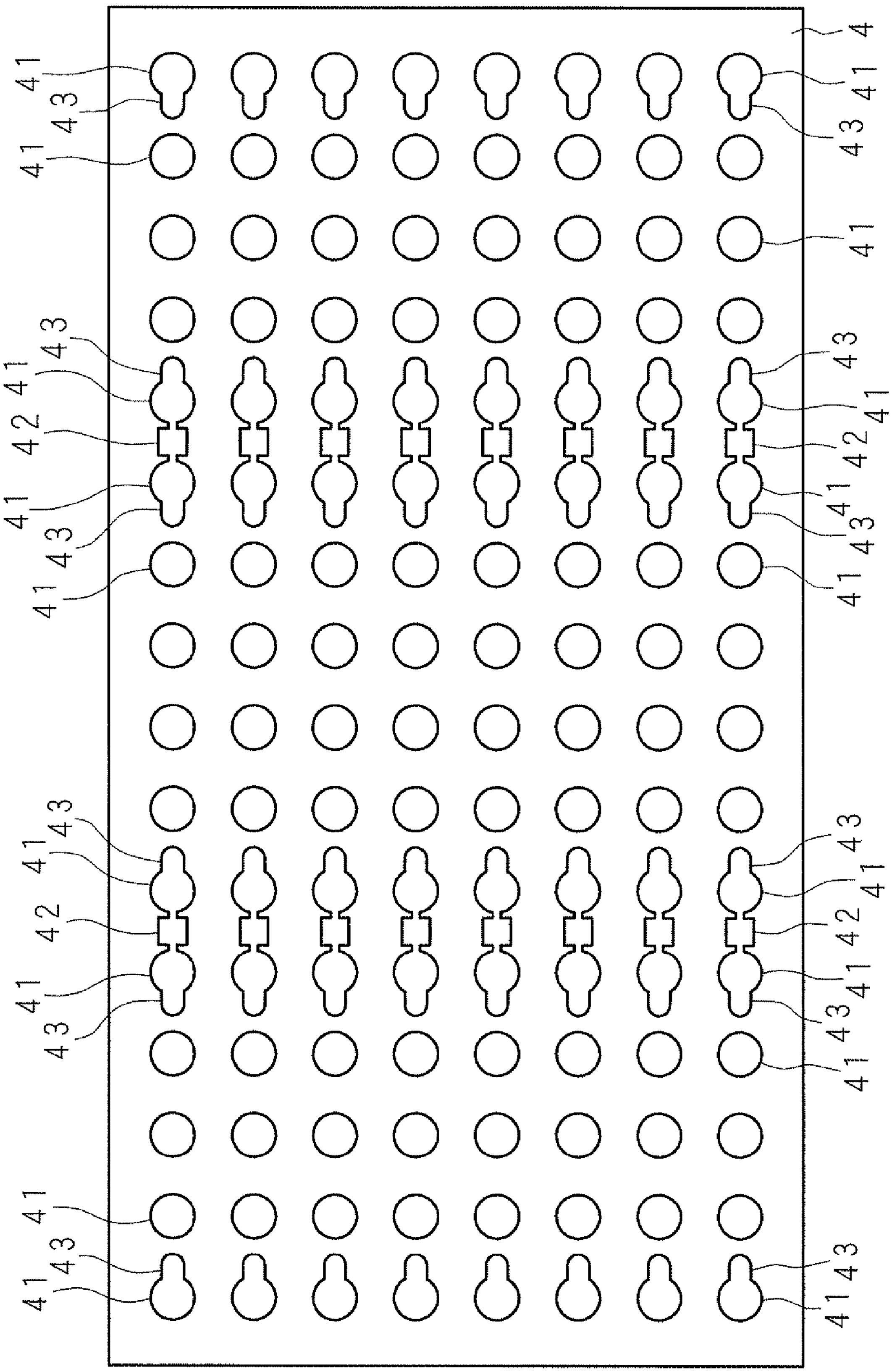
FIG. 103 is a plan view of a part of the light source device of the embodiment 7.
Figure 107:
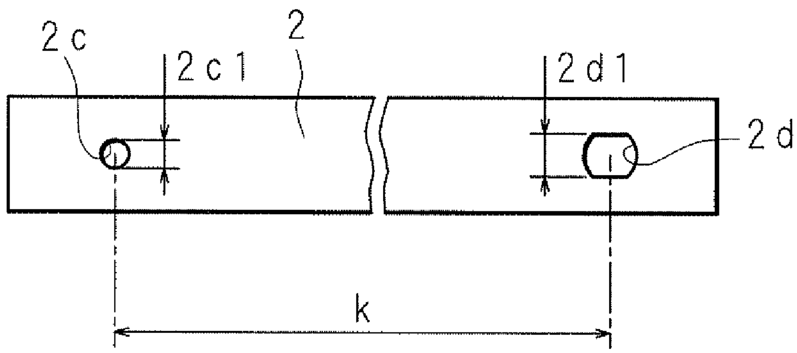
FIG. 107 is a plan view showing dimensional relationship of insertion holes of the embodiment 7.

FIG. 100 is a cross sectional view showing main parts of a structure of a light source device of an embodiment 7. FIG. 101 is a plan view of a part of the light source device, FIG. 102 is a plan view of the light source device with its part disassembled, FIG. 103 is a plan view of a part of the light source device, FIG. 104 is a partially enlarged plan view of the light source device, FIG. 105 is an enlarged perspective view of a connector, FIG. 106 is a plan view schematically showing a structure of the connector, FIG. 107 is a plan view showing dimensional relationship of insertion holes, FIG. 108 is a perspective view showing a configuration of light-emitting diode substrates, onto which lenses are attached, and FIG. 109 is a cross sectional view showing an example of a fixture.

The light source device has a plurality of light-emitting diodes 1 (B1) mounted on one surface 2*a*, and includes a plurality of light-emitting diode substrates 2 (B3) that are juxtaposed apart from one another; a plurality of lenses 3 (B2) that are provided on the one surface 2*a* of the light-emitting diode substrate 2, oppose to top portions of respective light-emitting diodes 1, and diffuse light which the light-emitting diodes 1 emitted; a reflection sheet 4 (B5), mounted on the one surface 2*a* of the light-emitting diode substrates 2 to reflect the light that the light-emitting diodes 1 emitted, including through holes 41 (B53), inside of which the lenses 3 are arranged; a plurality of connectors 5 (B4) connecting together adjacent light-emitting diode substrates 2, 2; and a support body 6 (B6) that is positioned on the other surface 2*b* side of the light-emitting diode substrates 2 and supports the plurality of light-emitting diode substrates 2.

Each light-emitting diode substrate 2 (B3) has a circuit unit on the one surface 2*a*, and configures a rectangular shape (oblong shape) having larger ratio of length over width. On the one surface 2*a* of each light-emitting diode board 2, the plurality of light-emitting diodes 1 is arranged apart at a substantially constant interval in a long direction. The light-emitting diode substrate 2 is a single-sided board having a conductive unit only on the one surface 2*a* side. The plurality of rectangular-shaped light-emitting diode substrates 2 aligns their long direction in the same direction, being spaced apart in the long direction and the width direction, and is arranged parallel on one surface 6*a* of the support body 6 having a rectangular shape. In FIG. 102, an example is shown in which a light-emitting diode substrate 2 onto which 6 pieces of the light-emitting diodes 1 are arranged is provided at the center, and on both sides thereof, light-emitting diode substrates 2 onto which 5 pieces of the light-emitting diodes 1 are arranged are provided, where 8 lines of this three pieces of the light-emitting diode substrates 2 connected in a line are juxtaposed with substantially the same interval as the mounting intervals of the light-emitting diodes 1 on the light-emitting diode substrates 2. Further, the light-emitting diodes 1 on all of the light-emitting diode substrates 2 are two-dimensionally arranged at substantially the same interval.

On both end portions of the light-emitting diode substrate 2 in the long direction of the one surface 2*a*, connecting portions 21, 22 (B31, B32) are provided. The three pieces of the light-emitting diode substrates 2 juxtaposed in a line have the connecting portions 21, 21 of the adjacent light-emitting diode substrates 2 connected via connectors 5. Further, as will be described later, the connecting portion 22 of the light-emitting diode substrate 2 positioned on one end of the line is connected to a power circuit board via a connector, and the connecting portion 22 of the light-emitting diode substrate 2 positioned on the other end of the line is connected to a short connector.

Each connector 5 (B4) includes a plug 51 connected to one of the connecting portions 21 and a receptacle 52 connected to the other of the connecting portions 21, and is formed in a substantially rectangular shape. A plurality of pin electrodes 52*a* facing toward the long direction of the light-emitting diode substrates 2 are formed in the receptacle 52, and a plurality of metal fixtures 51*a* into which the respective pin electrodes 52*a* of the receptacle 52 are to be inserted are formed in the plug 51. The metal fixtures 51*a* of the plug 51 are connected to the one of the connecting portions 21 by a solder reflow processing, and the pin electrodes 52*a* of the receptacle 52 are connected to the other of the connecting portions 21 by the solder reflow processing. By attaching the plug 51 to the receptacle 52 and inserting each of the pin electrodes 52*a* of the receptacle 52 into the respective metal fixtures 51*a* of the plug 51, the adjacent two pieces of light-emitting diode substrate 2 are electrically connected.

The lenses 3 (B2) oppose to the top portions of the light-emitting diodes 1 apart therefrom, and each includes a translucent portion 31 (B21) having a hemispheric recess for diffusing the light that the light-emitting diodes 1 emitted to every direction; and three positioning projections 32 (B22) protruding toward the light-emitting diode substrate 2 from the surface of the translucent portion 31 opposing the one surface 2*a*, which position the lens 3 relative to the light-emitting diode substrate 2; and tips of the positioning projections 32 are attached to the one surface 2*a* by adhesives. The translucent portion 31 is formed somewhat smaller than the through hole 41 of the reflection sheet 4.

The reflection sheet 4 (B5) has high reflectivity, is formed of a sheet of composite resin sheet having a substantially a rectangular shape corresponding to the support body 6, has circular shapes with a somewhat larger diameter than the translucent portions 31 at positions corresponding to each lens 3, has through holes 41 arranged in a matrix formation opened, and has second through holes 42 having a substantially rectangular shape and into which the connectors 5 can penetrate opened at portions corresponding to the connectors 5.

The support body 6 (B6) is formed of a metal plate, includes a plate portion 61 (B61) having a substantially rectangular flat plate shape and a frame portion 62 (B62) along a periphery edge of the plate portion 61, and supportingly houses the light-emitting diode substrates 2 arranged in the long direction and the width direction on the one surface 6*a* of the plate portion 61.

At the one end and the other end in the long direction of each rectangular-shaped light-emitting diode substrate 2, insertion holes 2*c*, 2*d* (B33, B34) for inserting the rivets 8 (B7) for causing the support body 6 to support the light-emitting diode substrate 2 are opened. The dimension of the insertion hole 2*c* (B33), one of the insertion holes 2*c*, 2*d*, is smaller than the dimension of the insertion hole 2*d* (B34), the other of the insertion holes 2*c*, 2*d*. Specifically, the one insertion hole 2*c* is a round hole with a diameter of 2*c*1, and the other insertion hole 2*d* has its dimension 2*d*1 in the substrate width direction to be larger than the diameter 2*c*1 of the insertion hole 2*c* by a predetermined dimensional amount (e.g. about 0.2 mm to 0.3 mm) and has an elongated round shape that is elongated in the substrate long direction. Each light-emitting diode substrate 2 is arranged such that the insertion hole 2*c* with small diameter and the insertion hole 2*d* with large diameter are next to each other at the ends where the light-emitting diode substrates 2 are connected.

Through holes 61*a* (B64) corresponding to the positions of the insertion holes 2*c*, 2*d* are formed on the plate portion 61 of the support body 6, and the distance k between the centers of the two insertion holes 2*c*, 2*d* equals the interval between two through holes 61*a* corresponding to the respective insertion holes 2*c*, 2*d*. That is, the positional relationship of the insertion holes 2*c*, 2*d* of each light-emitting diode substrate 2 and the through hole 61*a* is set so that when the light-emitting diode substrate 2 is aligned onto the support body 6 by coinciding the hole positions of the insertion hole 2*c* and the corresponding through hole 61*a*, the other corresponding through hole 61*a* is positioned at the center of the larger insertion hole 2*d*.

As shown in FIG. 109, each rivet 8 (B7) includes a cylindrical part 81 (B71) having an outer diameter g1 that can be inserted into the insertion holes 2*c*, 2*d* and the through holes 61*a*, a flange portion 81*a* (B71*a*) that cannot be inserted into the insertion holes 2*c*, 2*d* and the through holes 61*a* at its one end, and an inner diameter g3 of the other end being smaller than an inner diameter g2 of the one end; and a shaft part 82 (B72) that can be inserted into the one end of the cylindrical part 81 and has a shaft portion 82*a* having larger diameter than the inner diameter g3 on the other end, and a head portion 82*b* (B82*a*) that cannot be inserted into the insertion holes 2*c*, 2*d* and the through holes 61*a*. The cylindrical part 81 and the shaft part 82 are formed of composite resin material.

The reflection sheet 4 (B5) has third through holes 43 (B54) having elongated hole shape and, a diameter larger than the diameter of the head portion 82*b* of the shaft part 82, aligned along with the through holes 41 opened at positions corresponding to the rivets 8.

Next, a sequence for causing the support body 6 to support the 3 pieces of light-emitting diode substrates 2 connected in a line using the rivets 8 will be explained. Firstly, after having positioned the insertion holes 2*c*, 2*d* of each light-emitting diode substrate 2 and the respective through hole 61*a* of the support body 6, the cylindrical part 81 is inserted through the small diameter insertion hole 2*c* and the through hole 61*a* from the one surface 2*a* side of each light-emitting diode substrate 2, and the flange portion 81*a* is caused to make contact with the one surface 2*a* of the light-emitting diode substrate 2. Next, when the shaft portion 82*a* of the shaft part 82 is inserted until when the head portion 82*b* makes contact with the flange portion 81*a* of the cylindrical part 81, a distal end portion of the cylindrical part 81 is expanded outward by the shaft portion 82*a* of the shaft part 82. The distal end portion of the cylindrical part 81 expanded outward retains the shaft portion 82*a* of the shaft part 82 by pressing inwardly, and cannot be inserted through the through holes 61*a* of the support body 6; thereby each light-emitting diode substrate 2 is fixed to the support body 6 by the rivet 8.

After having attached the rivets 8 for the small diameter insertion holes 2*c* as above, the rivets 8 are similarly attached for the large diameter insertion holes 2*d*, thereby each light-emitting diode substrate 2 is fixed to the support body 6 by the rivets 8. At this occasion, if the positions of both substrates are displaced from their appropriate positions during the connection of the adjacent light-emitting diode substrates 2 by the connector 5, the through holes 61*a* of the support body 6 do not come to the centers of the insertion holes 2*d*; however, since the dimension of the insertion holes 2*d* in the width direction of the substrate is made large, the through holes 61*a* do not fall out of the range of the insertion holes 2*d*; and the rivets 8 can be attached by inserting through the insertion holes 2*d* and the through holes 61*a*.

After having attached the rivets 8 for all of the insertion holes 2*c*, 2*d* of the light-emitting diode substrates 2, the reflection sheet 4 is mounted by being opposed to the light-emitting diode substrates 2 in a state where the lenses 3 are inserted through the through holes 41, the connectors 5 are inserted through the second through holes 42, and the respective rivets 8 are inserted through the third through holes 43.

Figure 110:
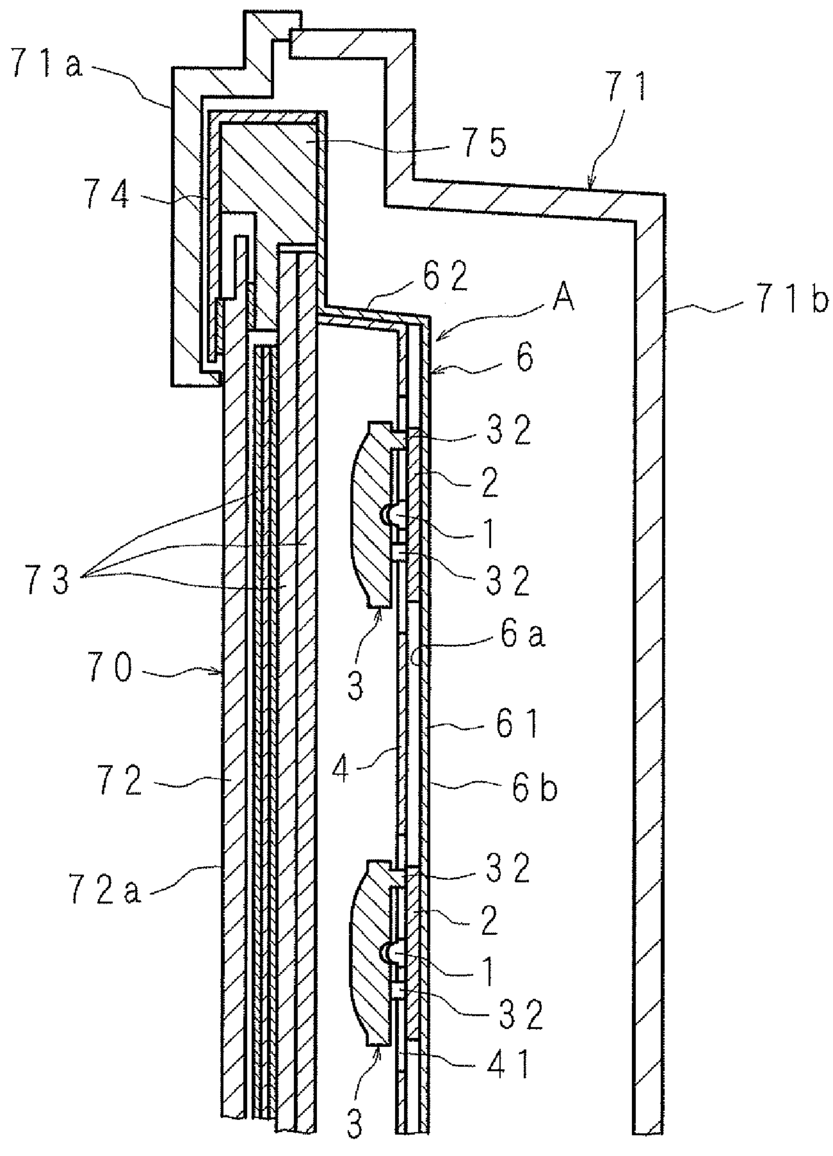
FIG. 110 is a cross sectional view showing a configuration of a display device including the light source device of the embodiment 7.

FIG. 110 is a cross sectional view showing a configuration of a display device including the light source device of the present invention. The display device includes a display screen face 72*a* on the front side; a display unit 70 (A) having a substantially rectangular parallelepiped shape; a light source device A (B) arranged behind the display unit 70; and a cabinet 71 (D) hiding a periphery edge portion of the display unit 70 and the rear side of the light source device A.

The display unit 70 includes a display panel 72 (A1) having the display surface 72*a*, and an optical sheet 73 (C) arranged behind the display panel 72. The periphery edge portion of the display panel 72 is fixedly retained at its front and rear between a front retaining frame 74 (A2) and a rear retaining frame 75 (A3), configuring a panel module, and the rear retaining frame 75 is attached to the periphery edge portion of the support body 6.

The optical sheet 73 is a laminate body in which a relatively thick diffusion plate that diffuses the light emitted by the light-emitting diodes 1 as the light source, and a relatively thin composite resin sheet such as a reflective polarizing plate, a prism sheet, a diffusion sheet, etc. are laminated. The periphery edge portion of the optical sheet 73 is fixedly retained between the frame portion 62 of the support body 6 and the rear retaining frame 75.

The cabinet 71 (D) includes a cabinet front divided unit 71*a* (D1) that hides the front side of the periphery edge portion of the display unit 70, and a cabinet rear divided unit 71*b* (D2) having a basin shape that hides the periphery edge portion and the rear side of the light source device A, and is attached to the frame portion 62 of the support body 6 by a male screw.

Notably, although a depiction thereof is omitted, the power circuit board that is to be connected to a connector electrode 22 of the light-emitting diode board 2 by the second connector (B41) is attached at one side portion in the long direction of the other surface 6*b* of the plate portion 61. On the other side portion in the long direction, a control circuit board that performs driving and control of the display unit is attached. Further, at the center portion in the long direction of the other surface of the plate portion 61, a signal process circuit board that processes image signals to be displayed on the display screen face of the display unit is attached.

In the embodiment 7 above, the fixture is configured of the rivet 8 formed of two components: the cylindrical part 81 and the shaft part 82, however, the fixture may be a rivet formed of a single component; further, aside from the rivet, it may be configured of a screw, a bolt and a nut, etc.

Further, in the embodiment 7 above, it is configured such that, with the third through hole 43 having larger diameter than the diameter of the head portion 82*b* of the rivet 8 being provided and the head portion 82*b* being arranged inside the third through hole 43, the expansion and contraction of the reflection sheet 4 caused by thermal expansion is allowed, however, as an alternative of this, the diameter of the head portion 82*b* may be larger than the third through hole 43, the outer periphery portion of the head portion 82*b* may oppose to the circumference of the third through hole 43 in the thickness direction while being apart therefrom, and the head portion

82$b$ may prevent the reflection sheet 4 from being lateralized toward the direction of recessing from the light-emitting diode substrates 2.

Figure 111A:
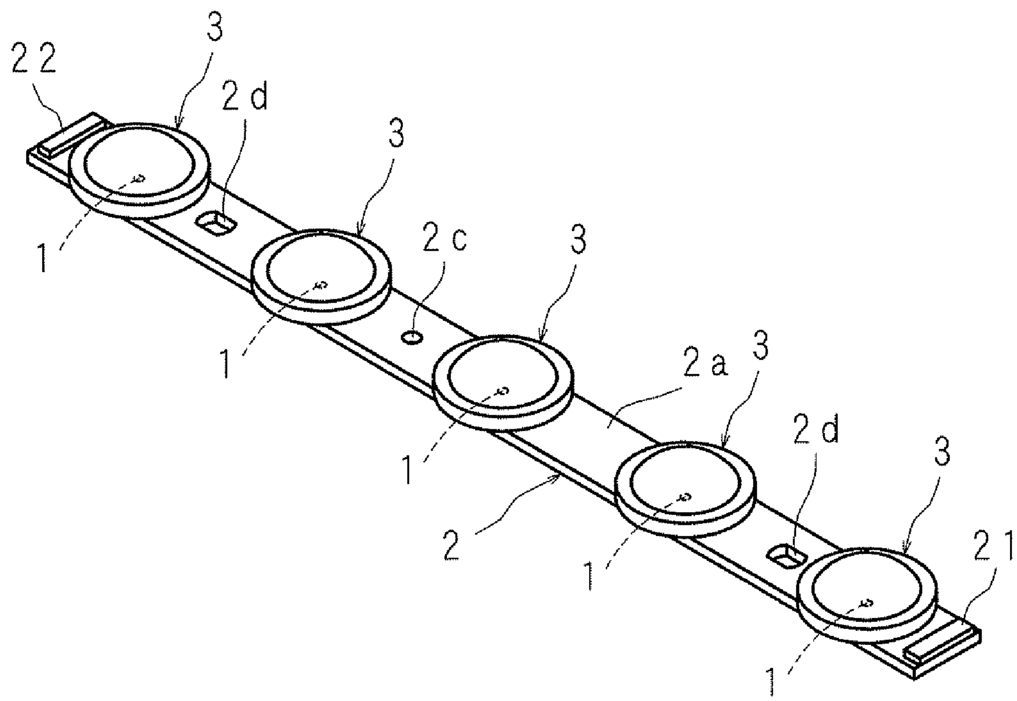
FIG. 111A is a perspective view showing a configuration of a light-emitting diode substrate in another embodiment of the embodiment 7.
Figure 111B:
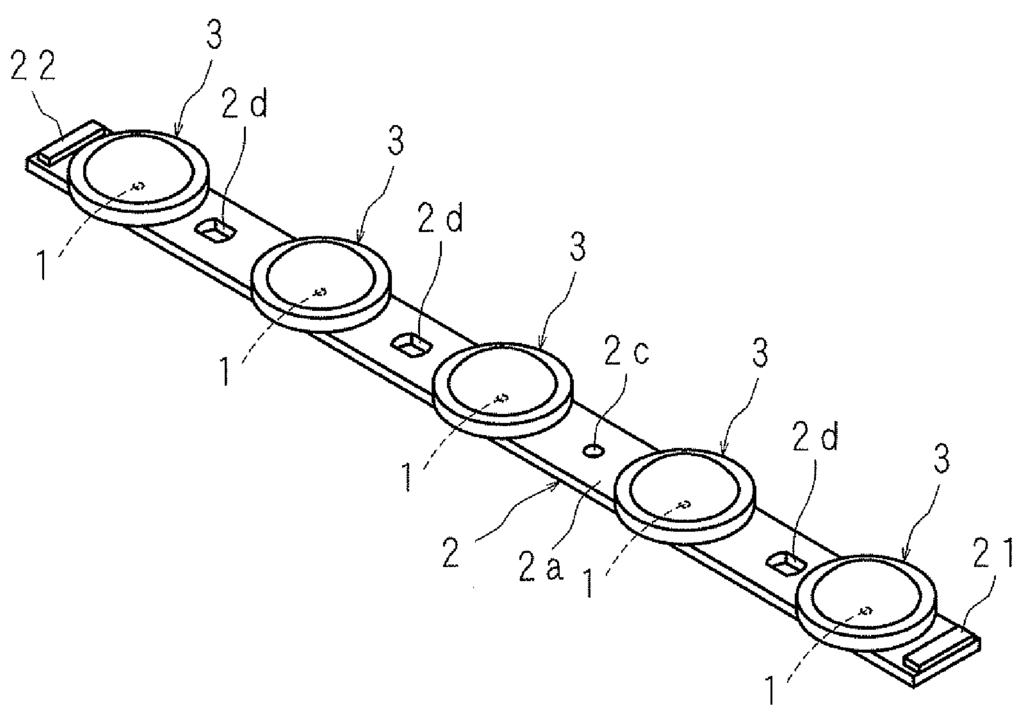
FIG. 111B is a perspective view showing a configuration of a light-emitting diode substrate in yet another embodiment of the embodiment 7.

In the embodiment 7 above, the two insertion holes 2$c$, 2$d$ are formed at the respective ends in the long direction of the rectangular-shaped light-emitting diode substrate 2, however, as are exemplified in FIG. 111A, FIG. 111B, three or more insertion holes 2$c$, 2$d$ may be formed at a plurality of positions on the light-emitting diode substrate 2 in the long direction. FIG. 111A shows an example in which the insertion hole 2$c$ with small dimension is formed not at the ends in the long direction but at an inner position of the light-emitting diode substrate 2, and the insertion holes 2$d$ with large dimension being formed at the respective ends in the long direction; FIG. 111B shows an example in which the insertion hole 2$c$ with small dimension is formed not at the ends in the long direction but at an inner position of the light-emitting diode substrate 2, and the insertion holes 2$d$ with large dimension being formed at three positions including the respective ends in the long direction. Notably, although a depiction thereof is omitted, through holes with larger diameter than the diameter of the head portion 82$b$ of the shaft part 82 of the rivet 8 are opened on the reflection sheet 4 corresponding to the positions of the respective insertion holes 2$c$, 2$d$. In the present embodiment, in connecting a plurality of rectangular light-emitting diode substrates 2 in a line, the end portions of the light-emitting diode substrates 2 having the insertion holes 2$d$ with larger dimension are arranged to be adjacent to one another; thereby the positional displacement of the light-emitting diode substrates 2 caused by connections using the connector can more surely be absorbed.

In the embodiment 7 above, the light source device of the present invention is adapted for illumination in the display panel in a liquid crystal display device, however, it may be adapted for illumination in a display panel in a display device with other light-emission schemes other than the liquid crystal display device.

Embodiment 8

Figure 112:
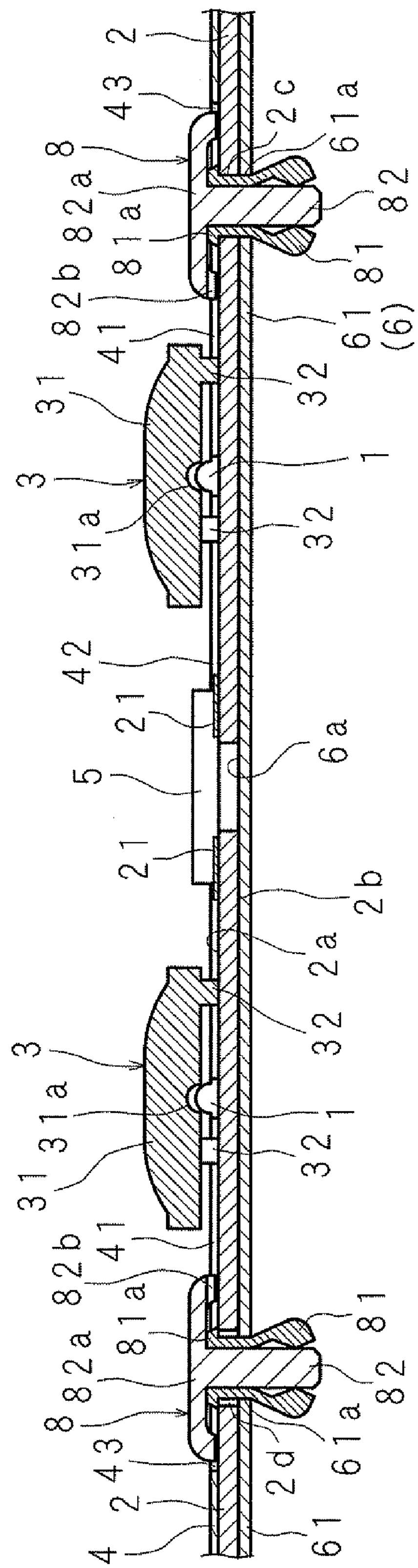
FIG. 112 is a cross sectional view showing main parts of a structure of a light source device of an embodiment 8.
Figure 113:
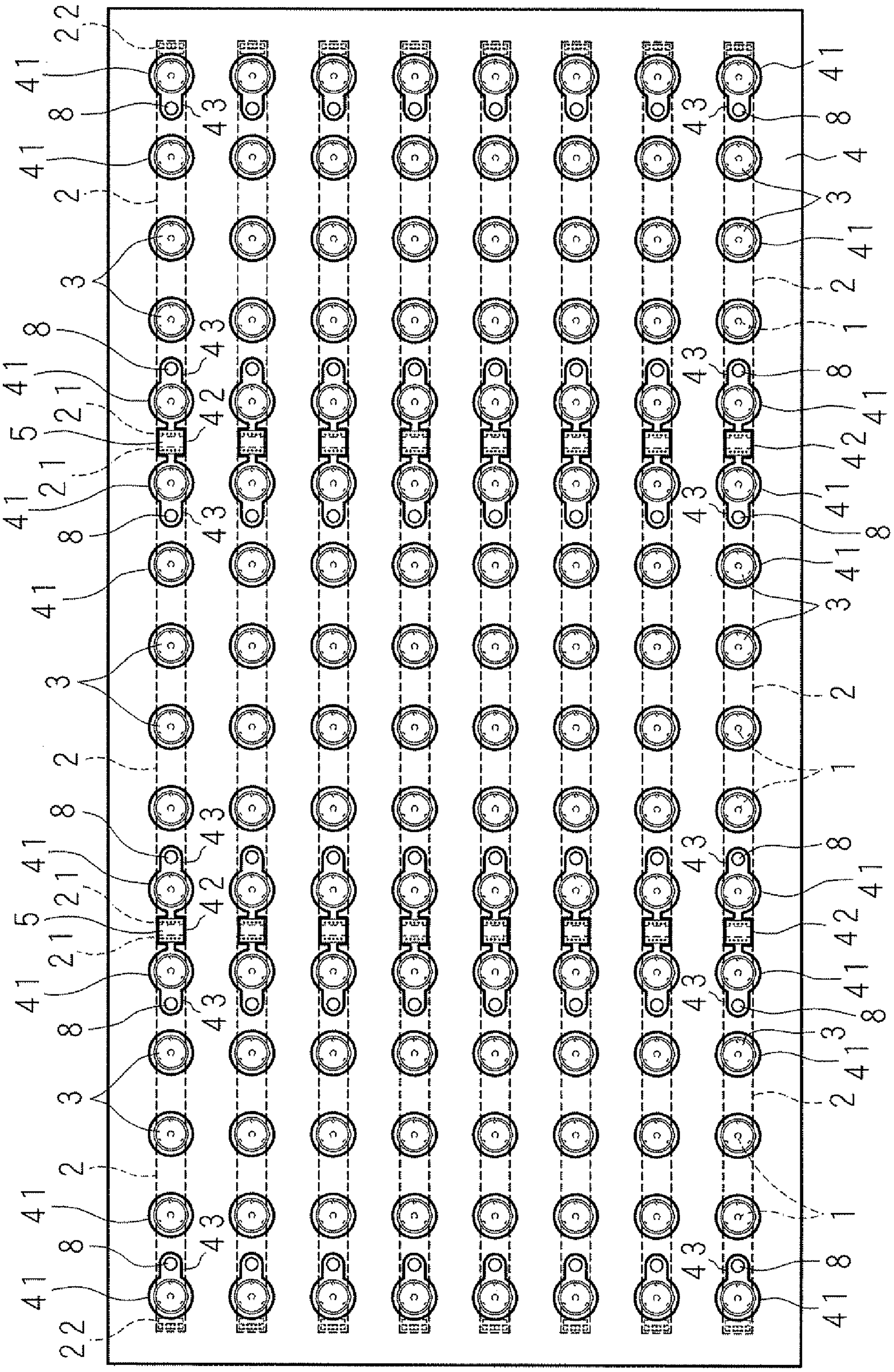
FIG. 113 is a plan view of a part of the light source device of the embodiment 8.
Figure 114:
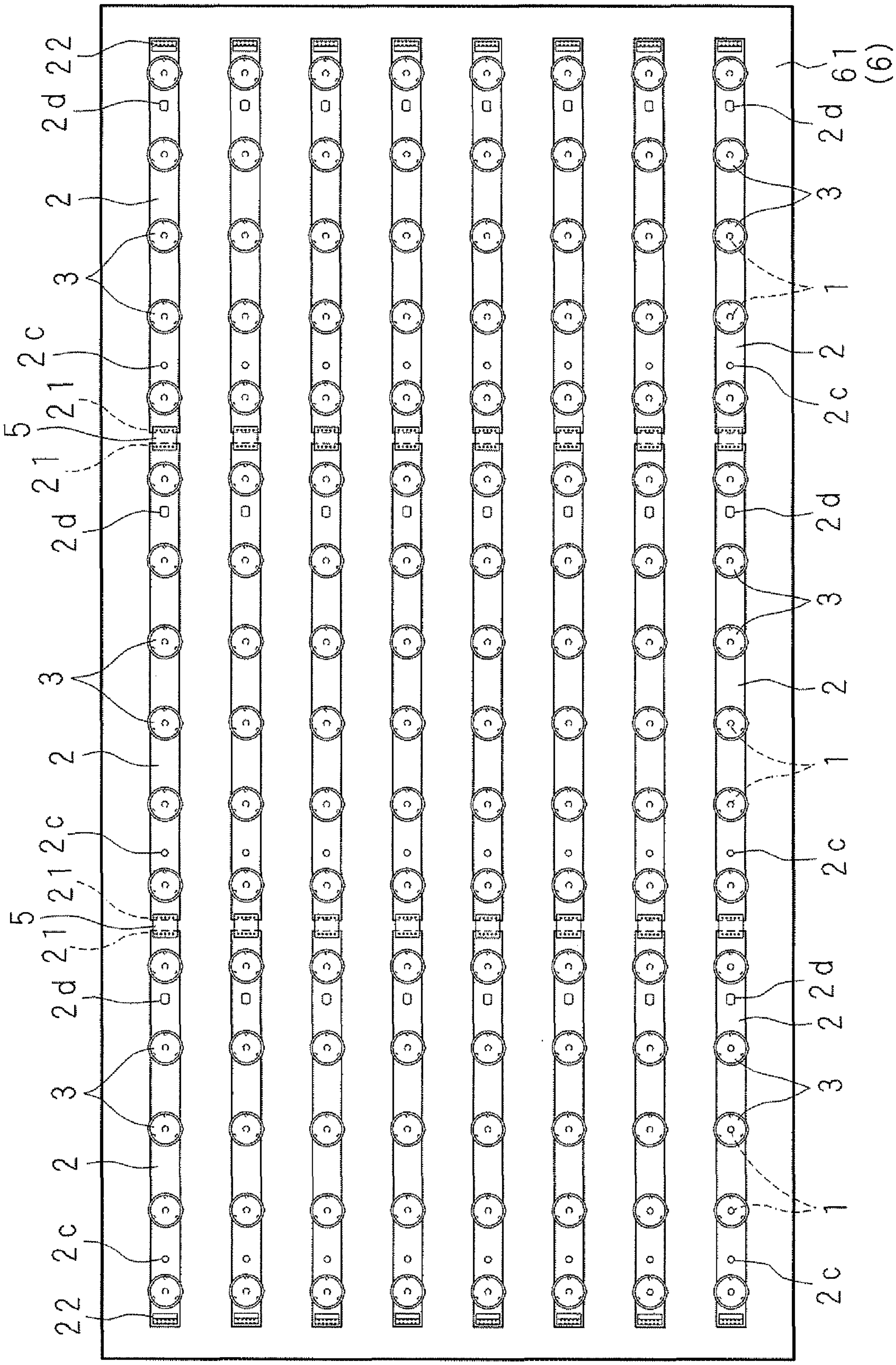
Figure 115:
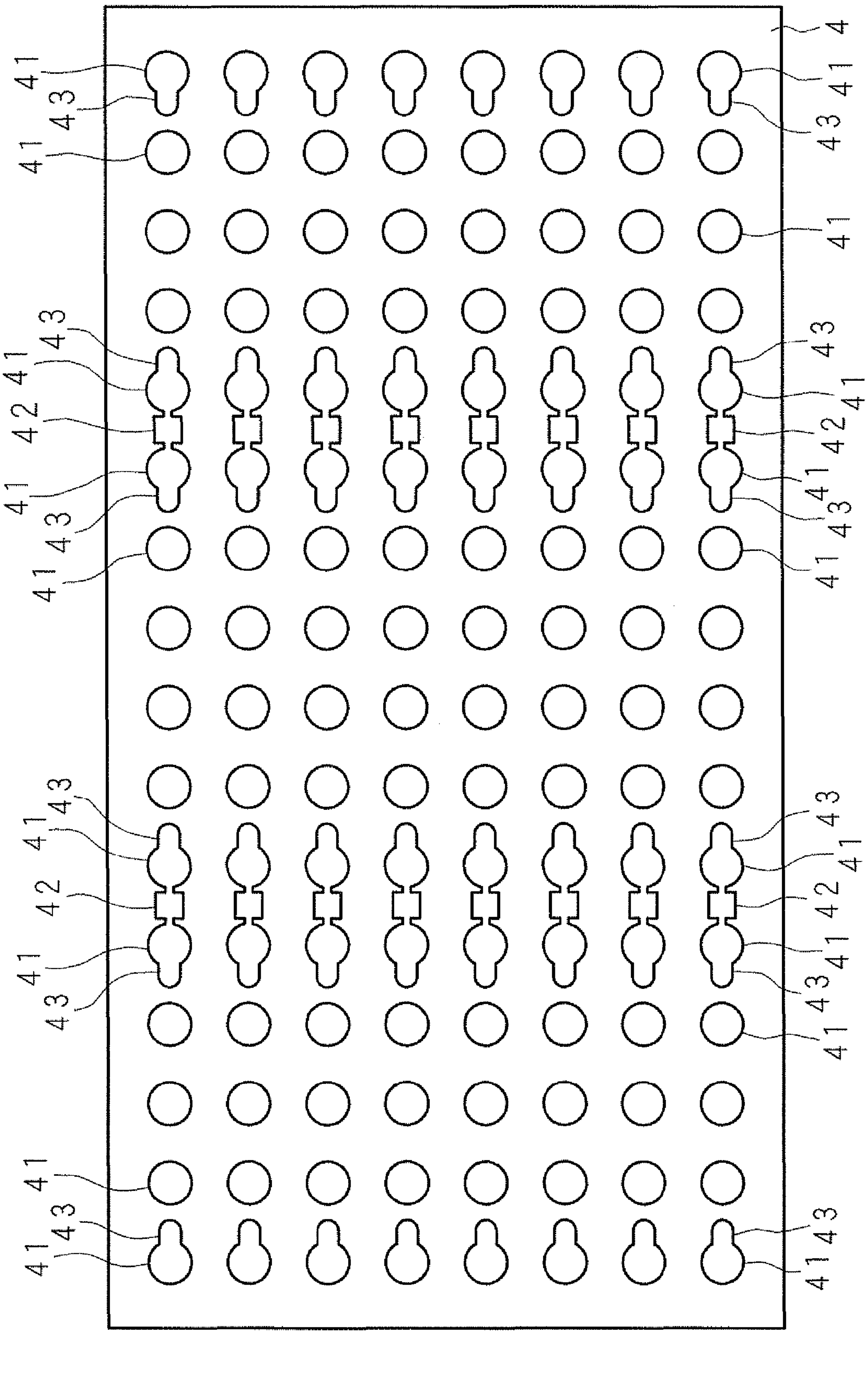
Figure 116:
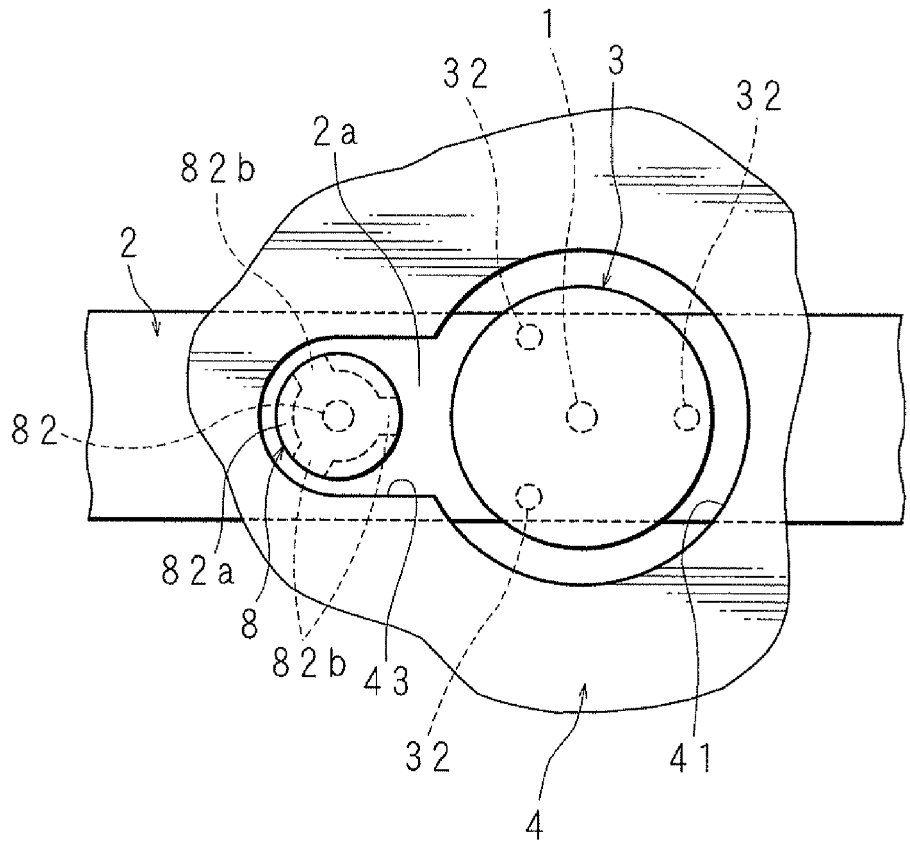
Figure 117:
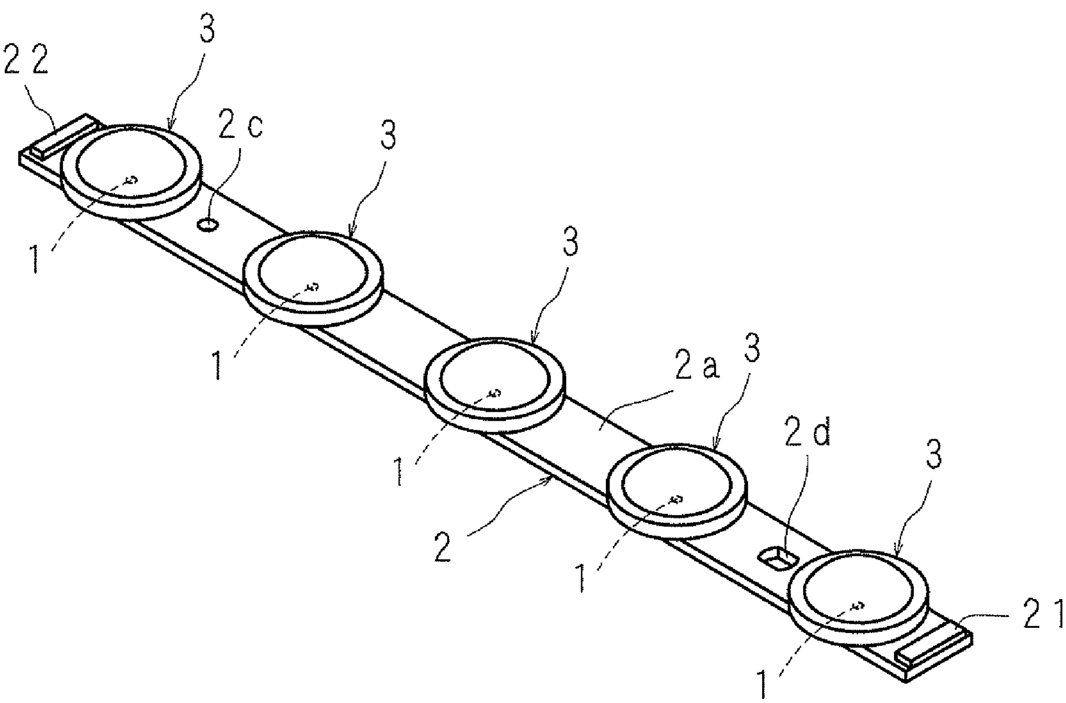
Figure 119:
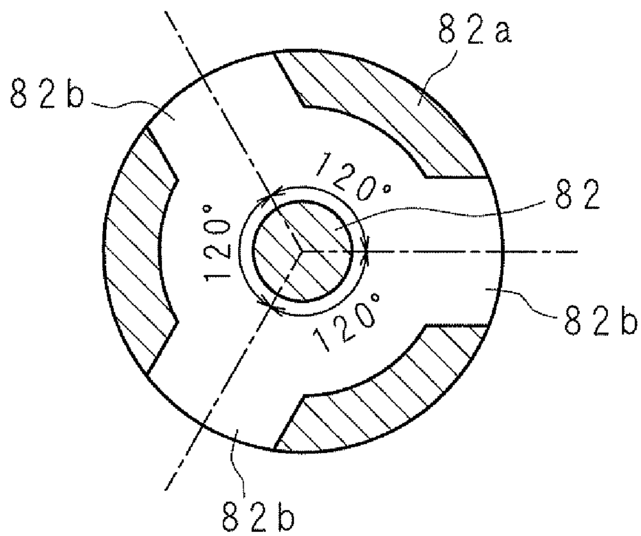

FIG. 112 is a cross sectional view showing main parts of a structure of a light source device of the embodiment 8, FIG. 113 is a plan view of a part of the light source device, FIG. 114 is a plan view of the light source device with its part disassembled, FIG. 115 is a plan view of a part of the light source device, FIG. 116 is a partially enlarged plan view of the light source device, FIG. 117 is a perspective view showing a configuration of light-emitting diode substrates, onto which lenses are attached, FIG. 118 is a cross sectional view showing a structure of rivets, FIG. 119 is a plan view along a line V-V in FIG. 118, and FIG. 120 is a cross sectional view of a positional relationship of the rivets and the lenses.

The light source device has a plurality of light-emitting diodes 1 (B1) mounted on one surface 2$a$, and includes a plurality of light-emitting diode substrates 2 (B3) that are juxtaposed apart from one another; a plurality of lenses 3 (B2) that are provided on the one surface 2$a$ of the light-emitting diode board 2, opposes to top portions of respective light-emitting diodes 1, and diffuses light which the light-emitting diodes 1 emit; a reflection sheet 4 (B5), mounted on the one surface 2$a$ of the light-emitting diode substrates 2 to reflect the light that the light-emitting diodes 1 emit, including through holes 41 (B53), inside of which the lenses 3 are arranged; and a support body 6 (B6) that is positioned on the other surface 2$b$ side of the light-emitting diode substrates 2 and supports the plurality of light-emitting diode substrates 2.

Each light-emitting diode substrate 2 (B3) has a circuit unit on the one surface 2$a$, and configures a rectangular shape (oblong shape) having larger ratio of length over width. On the one surface 2$a$ of each light-emitting diode substrate 2, the plurality of light-emitting diodes 1 are arranged apart at a substantially constant interval in a long direction. The light-emitting diode substrate 2 is a single-sided board having a conductive unit only on the one surface 2$a$ side. The plurality of rectangular-shaped light-emitting diode substrates 2 align their long direction in the same direction, being spaced apart in the long direction and the width direction, and are arranged parallel on a one surface 6$a$ of the support body 6 having a rectangular shape. In FIG. 114, an example is shown in which a light-emitting diode substrate 2 onto which 6 pieces of the light-emitting diodes 1 are arranged is provided at the center, and on both sides thereof, light-emitting diode substrates 2 onto which 5 pieces of the light-emitting diodes 1 are arranged are provided, where 8 lines of this three pieces of the light-emitting diode substrates 2 connected in a line are juxtaposed with substantially the same interval as the mounting intervals of the light-emitting diodes 1 on the light-emitting diode substrates 2. Further, the light-emitting diodes 1 on all of the light-emitting diode substrates 2 are two-dimensionally arranged at substantially the same interval.

On both end portions of the light-emitting diode substrate 2 in the long direction of the one surface 2$a$, connecting portions 21,22 (B31, B32) are provided. The three pieces of the light-emitting diode substrates 2 juxtaposed in a line have the connecting portions 21, 21 of the adjacent light-emitting diode substrates 2 connected via connectors 5 (B4). Further, as will be described later, the connecting portion 22 of the light-emitting diode substrate 2 positioned on one end of the line is connected to a power circuit board via a connector, and the connecting portion 22 of the light-emitting diode substrate 2 positioned on the other end of the row is connected to a short connector.

The lenses 3 (B2) are arranged apart from the one surface 2$a$ of the light-emitting diode substrates 2 and oppose to the top portions of the light-emitting diodes 1 apart therefrom, and each includes a translucent portion 31 (B21) having a hemispheric recess 31$a$ for diffusing the light that the light-emitting diodes 1 emit to every direction; and three positioning projections 32 protruding toward the light-emitting diode substrate 2 from a surface 31$b$ of the translucent portion 31 opposing the one surface 2$a$ of the light-emitting diode substrates 2, which position the lens 3 relative to the light-emitting diode substrate 2; and tips of the positioning projections 32 are attached to the one surface 2$a$ of the light-emitting diode substrates 2 by adhesives.

The reflection sheet 4 (B5) has high reflectivity, is formed of a sheet of composite resin sheet having a substantially a rectangular shape corresponding to the support body 6, has a circular shape with a somewhat larger diameter than the translucent portion 31 at position corresponding to each lens 3, has through holes 41 arranged in a matrix formation opened, and has second through holes 42 having a substantially rectangular shape and into which the connectors 5 can penetrate opened at portions corresponding to the connectors 5. The through holes 41 are formed somewhat larger than the translucent portions 31 of the lenses 3.

The support body 6 (B6) is formed of a metal plate, includes a plate portion 61 (B61) having a substantially rectangular flat plate shape and a frame portion 62 (B62) along a periphery edge of the frame portion 61, and supportingly houses the light-emitting diode substrates 2 arranged in the long direction and the width direction on the one surface 6$a$ of the plate portion 61.

At the one end and the other end in the long direction of each rectangular-shaped light-emitting diode substrate 2, insertion holes 2*c*, 2*d* (B33, B34) for inserting the rivets 8 (B7) for causing the support body 6 to support the light-emitting diode substrate 2 are opened. The insertion hole 2*c* (B33), one of the two insertion holes 2*c*, 2*d*, is a round hole, whereas the insertion hole 2*d* (B34), the other of the insertion holes 2*c*, 2*d*, has an elongated round shape that is elongated in the substrate long direction. Through holes 61*a* (B64) corresponding to the positions of the respective insertion holes 2*c*, 2*d* are formed on the plate portion 61 of the support body 6.

Each rivet 8 (B7) includes a cylindrical part 81 (B71) having an outer diameter g1 that can be inserted into the insertion holes 2*c*, 2*d* of the light-emitting diode substrate 2 and the through holes 61*a* of the support body 6, a flange portion 81*a* (B71*a*) that cannot be inserted into the insertion holes 2*c*, 2*d* and the through holes 61*a* at its one end, and an inner diameter g3 of the other end being smaller than an inner diameter g2 of the one end; and a shaft part 82 (B72) that can be inserted into the one end of the cylindrical part 81 and has larger diameter than the inner diameter g3 on the other end, and at one end of the shaft part 82, a head portion 82*a* (B72*a*) that cannot penetrate through the through holes 2*c*, 2*d* and the through holes 61*a* is formed. The head portion 82*a* has a round plate shape having an annular convex portion that convexes on its outer periphery side on the shaft part 82 side. The cylindrical part 81 and the shaft part 82 are formed of composite resin material.

The head portion 82*a* of the rivet 8 has a plurality of grooves 82*b* (B74) opened to the outer periphery portion formed on a side opposing the one surface 2*a* of the light-emitting diode substrate 2. Specifically, the annular convex portion is configured such that three radial grooves 82*b* having their center at a center side position 82 of the head portion 82*a* where the shaft part 82 is connected are formed at substantially 120 degrees to one another. Each groove 82*b* has a predetermined width.

A bottom portion of each groove 82*b* is positioned on the one surface 2*a* side of the light-emitting diode substrate 2 than a position of an outer periphery side end portion of an opposing surface 31*b* of the translucent portion 31 of the lens 3 opposed to the one surface 2*a* of the light-emitting diode board 2. FIG. 120 shows an example in which the bottom portion of the groove 82*b* is offset from the position of the outer periphery side end portion of the opposing surface 31*b* of the translucent portion 31 toward the one surface 2*a* side by a distance k. Due to this, the light emitted from the outer periphery of the translucent portion 31 is not incident to the inside of the groove 82*b*, but is reflected on an outer surface of the head portion 82*a* of the rivet 8, or is penetrated without being reflected, in either case becomes an illumination.

The reflection sheet 4 has third through holes 43 (B54) having elongated hole shape and, a diameter larger than the diameter of the head portion 82*b*, aligned along with the second through holes 42 opened at positions corresponding to the rivets 8.

Next, a sequence for causing the support body 6 to support the 3 pieces of light-emitting diode substrates 2 connected in a line using the rivets 8 will be explained. Firstly, after having positioned the insertion holes 2*c*, 2*d* of each light-emitting diode substrate 2 and the respective through hole 61*a* of the support body 6, the cylindrical part 81 is inserted through the insertion hole 2*c* and the through hole 61*a* from the one surface 2*a* side of each light-emitting diode substrate 2, and the flange portion 81*a* is caused to make contact with the one surface 2*a* of the light-emitting diode substrate 2. Next, when the shaft part 82 is inserted until when the head portion 82*a* makes contact with the flange portion 81*a* of the cylindrical part 81, a distal end portion of the cylindrical part 81 is expanded outward by the distal end portion of the shaft part 82. The distal end portion of the cylindrical part 81 expanded outward retains the distal end portion of the shaft part 82 by pressing inwardly, and the head portion 82*a* cannot be inserted through the through holes 61*a* of the support body 6; thereby each light-emitting diode substrate 2 is fixed to the support body 6 by the rivet 8. After having attached the rivets 8 for the round insertion holes 2*c* as above, the rivets 8 are similarly attached for the elongated insertion holes 2*d*, thereby each light-emitting diode substrate 2 is fixed to the support body 6 by the rivets 8.

After having attached the rivets 8 for all of the insertion holes 2*c*, 2*d*, the reflection sheet 4 is mounted by being opposed to the light-emitting diode substrates 2 in a state where the lenses 3 are inserted through the through holes 41, the connectors 5 are inserted through the second through holes 42, and the respective rivets 8 are inserted through the third through holes 43, thereby completing the light source device.

Next, a sequence for releasing the state in which the respective light-emitting diode substrates 2 are fixed to the support body 6 by the rivets 8 will be explained. For example, as shown in FIG. 116, of the three grooves 82*b* formed on the head portion 82*a*, since one groove 82*b* is positioned on a side adjacent to the lens 3, a screwdriver cannot be inserted into the groove 82*b* for the lens 3 which becomes an obstacle. However, as to the two grooves 82*b* maintaining 120 degrees relative to the groove 82*b*, the lens 3 will not be an obstacle, so the screwdriver can be inserted into one of the grooves 82*b*, and when the head portion 82*a* is compulsorily moved to the side recessing from the light-emitting diode substrate 2, the distal end portion of the cylindrical part 81 that had been expanded outward returns to its original diameter, penetrating the through holes 61*a* of the support body 6 and the through holes 2*c*, 2*d* of the light-emitting diode substrate 2, thereby the fixed state of the light-emitting diode substrate 2 and the support body 6 is released.

Figure 121:
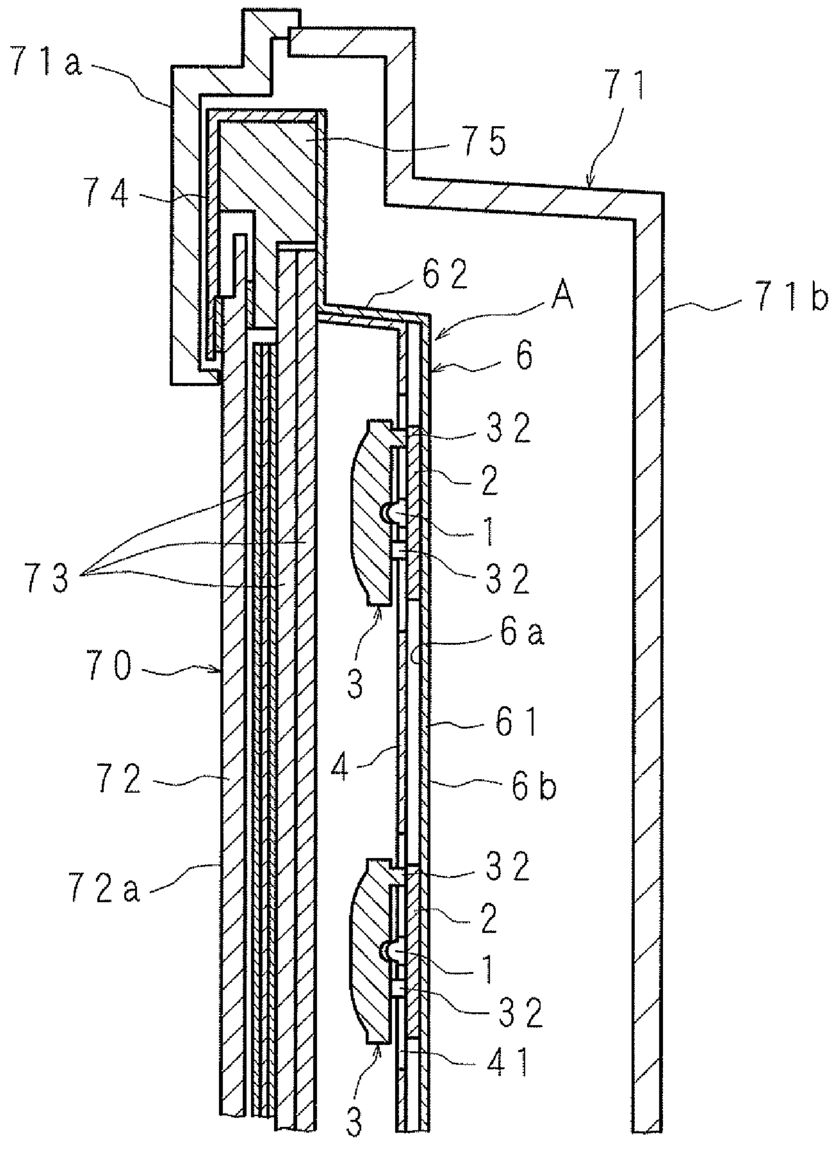

FIG. 121 is a cross sectional view showing a configuration of a display device including the light source device of the embodiment 8. The display device includes a display screen face 72*a* on the front side; a display unit 70 (A) having a substantially rectangular parallelepiped shape; a light source device A (B) arranged behind the display unit 70; and a cabinet 71 (D) hiding a periphery edge portion of the display unit 70 and the rear side of the light source device A.

The display unit 70 includes a display panel 72 (A1) having the display surface 72*a*, and an optical sheet 73 (C) arranged behind the display panel 72. The periphery edge portion of the display panel 72 is fixedly retained at its front and rear between a front retaining frame 74 (A2) and a rear retaining frame 75 (A3), configuring a panel module, and the rear retaining frame 75 is attached to the periphery edge portion of the support body 6.

The optical sheet 73 is a laminate body in which a relatively thick diffusion plate that diffuses the light emitted by the light-emitting diodes 1 as the light source, and a relatively thin composite resin sheet such as a reflective polarizing plate, a prism sheet, a diffusion sheet, etc. are laminated. The periphery edge portion of the optical sheet 73 is fixedly retained between the frame portion 62 of the support body 6 and the rear retaining frame 75.

The cabinet 71 (D) includes a cabinet front divided unit 71*a* (D1) that hides the front side of the periphery edge portion of the display unit 70, and a cabinet rear divided unit 71*b* (D2) having a basin shape that hides the periphery edge portion and the rear side of the light source device A, and is attached to the frame portion 62 of the support body 6 by a male screw.

Notably, although a depiction thereof is omitted, the power circuit board that is to be connected to a connector electrode 22 of the light-emitting diode substrate 2 by the second connector (B41) is attached at one side portion in the long direction of the other surface 6*b* of the plate portion 61. On the other side portion in the long direction, a control circuit board that performs driving and control of the display unit is attached. Further, at the center portion in the long direction of the other surface 6*b* of the plate portion 61, a signal process circuit board that processes image signals to be displayed on the display screen face of the display unit is attached.

Figure 122:
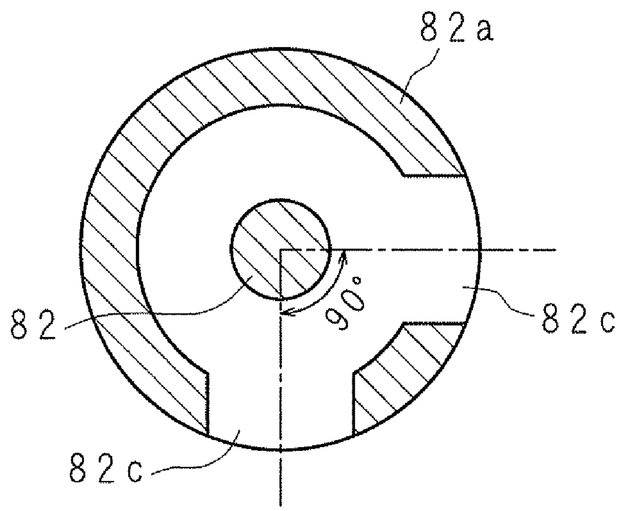
Figure 123:
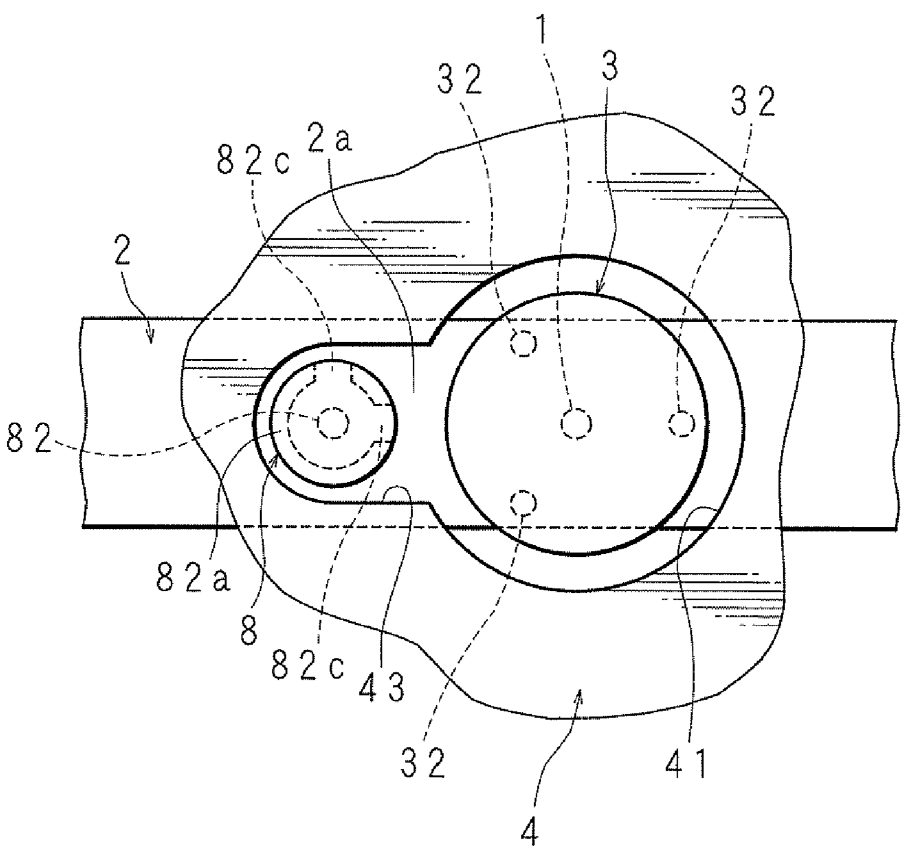

Next, another embodiment of the rivets 8 will be explained. FIG. 122 is a plan view showing a rear face side of a head portion of a rivet in a variant light source device of the embodiment 8, FIG. 123 is a partially enlarged plan view of the another light source device. In this another embodiment, the annular convex portion of the head portion 82*a* of the rivet 8 (B7) includes two radial grooves 82*c* having their center at a center side position 82 of the head portion 82*a* where the shaft part 82 is connected are formed at substantially 90 degrees to one another. As shown in FIG. 123, one of the two grooves 82*c* (B74) is positioned on a side adjacent to the lens 3, so even in the case where a screwdriver cannot be inserted into the lens 3 (B2) being an obstacle, the lens 3 will not be an obstacle for the other of the grooves 82*c*, and the screwdriver can be inserted thereinto.

Next, another, second embodiment of the rivets 8 will be explained. FIG. 124 is a plan view showing a rear face side of a head portion of a rivet in a second another light source device of the embodiment 8. In this another, second embodiment, the annular convex portion of the head portion 82*a* of the rivet 8 (B7) includes two radial grooves 82*d* having their center at a center side position 82 of the head portion 82*a* where the shaft part 82 is connected are formed at substantially 60 degrees to one another. Similar to the above another embodiment, one of the two grooves 82*d* is positioned on a side adjacent to the lens 3, so even in the case where a screwdriver cannot be inserted, the screwdriver can be inserted into the other groove 82*d*. Note that, as for the angle between the plurality of grooves, any given angle other than 120 degrees, 90 degrees, and 60 degrees may be employed. In such cases, in order to avoid a state in which the screwdriver cannot be inserted into the plurality of grooves at an instant, of the plurality of grooves, at least one needs to be positioned off of a straight line that connects the center side position of the head portion 82*a* where the shaft portion 82 is connected and the other groove.

In the embodiment 8 above, it is configured such that, with the third through hole 43 having larger diameter than the diameter of the head portion 82*a* of the rivet 8 being provided and the head portion 82*a* being arranged inside the third through hole 43, the expansion and contraction of the reflection sheet 4 caused by thermal expansion is allowed, however, as an alternative of this, the diameter of the head portion 82*a* may be larger than the third through hole 43, the outer periphery portion of the head portion 82*a* may oppose to the circumference of the third through hole 43 in the thickness direction while being apart therefrom, and the head portion 82*b* may prevent the reflection sheet 4 from being lateralized toward the direction of recessing from the light-emitting diode substrates 2.

Further, in the embodiment 8 above, the light source device of the present invention is adapted for illumination in the display panel in a liquid crystal display device, however, it may be adapted for illumination in a display panel in a display device with other light-emission schemes other than the liquid crystal display device.

Embodiment 9

Figure 125:
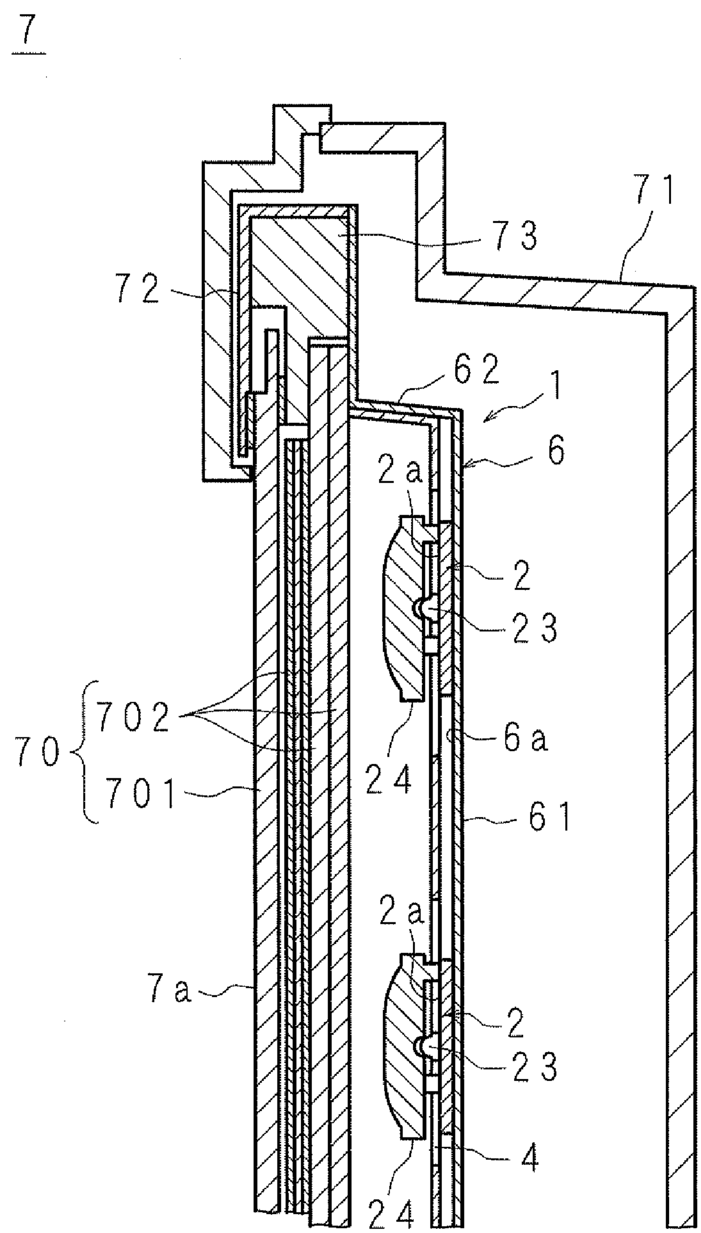

FIG. 125 is a vertical cross sectional view showing a partial configuration of a display device 7 including a light source device 1 of an embodiment of the present invention. The left and right direction in FIG. 125 is equivalent to the front and rear direction of the display device 7, more specifically the light source device 1.

FIG. 126 and FIG. 127A are horizontal cross sectional view showing a configuration of a connecting portion of circuit boards 2, 2 that the light source device 1 includes and a front view thereof, and FIG. 127B is a front view showing a relationship of the circuit boards 2, 2 and attachment members 6 that the light source device 1 includes. The up and down direction in FIG. 126 is equivalent to the front and rear direction of the display device 7, more specifically the light source device 1 (B). Further, FIG. 126 corresponds to a cross sectional view along a line VI-VI in FIG. 127A.

FIG. 128 is a plan view schematically showing a state in which the circuit boards 2, 2, . . . are arranged in parallel, and showing a state before a reflection sheet 4 is attached to the attachment member 6.

As shown in FIG. 125, the display device 7 includes a display unit 70 (A); a cabinet 71 (D); a front side frame 72 (A2) and a rear side frame 73 (A3); and a light source device 1 (B).

Hereinafter, firstly, the configuration of the light source device 1 will be explained.

As shown in FIG. 125 to FIG. 128, the light source device 1 (B) includes a plurality pieces of circuit boards 2, 2, . . . (B3); a reflection sheet 4 (B5); and an attachment member 6 (B6).

Each circuit board 2 (B3) is formed in a rectangular plate shape that extends in the left and right direction, has a first connecting portion (e.g. a male connecting portion) 21 mounted on a right end portion of a front face 2*a*, and a second connecting portion (e.g. a female connecting portion) 22 mounted on a left end portion of the front face 2*a*. That is, a off direction of the first and second connecting portions 21, 22 is the left and right direction.

Further, on an upper face 2*a* between the first and second connecting portions 21, 22 (B31, B32) of the circuit board 2, a plurality (5 pieces in FIG. 128) of light-emitting units 23, 23, . . . (B1) is mounted thereon by being appropriately apart in the long direction.

Further, a driver (not shown) for driving the light-emitting units 23, 23, . . . is mounted on the circuit board 2.

Here, each light-emitting unit 23 (B1) includes a light-emitting diode.

Moreover, on the front face 2*a* of each circuit board 2, a plurality of lenses 24, 24, . . . (B2) each corresponding to the respective light-emitting units 23, 23, . . . is provided. Each lens 24 is formed in a circular shape, and is arranged to oppose to a top portion of the light-emitting unit 23. The lens 24 diffuses the light emitted by the light-emitting unit 23.

The attachment member 6 (B6) is rectangular plate shaped, formed of a metal plate, and includes a flat plate portion 61 (B61) having a rectangular flat plate shape; and a frame portion 62 (B62) connecting to a peripheral edge of the flat plate portion 61. The long direction (or the short direction) is equivalent to the left and right direction (or the up and down direction).

On a front face 6*a* of the flat plate portion 61, the circuit boards 2, 2, . . . are mounted in a state of being juxtaposed in a matrix formation. As a result, the light-emitting units 23, 23, . . . (B1) are arranged in the matrix formation. FIG. 128 shows an example of a state in which the circuit boards 2, 2, . . . are arranged by 2 in the left and right direction and 5 in the up and down direction.

Further, at a back face left end portion of the attachment member 6, a power circuit board (B10*a*) (not shown) for supplying power to drivers of the respective circuit boards 2, 2, . . . is attached. Further, at a back face right end portion of the attachment member 6, a control circuit board for executing drive and control of the display unit 70 is attached.

In the circuit boards 2, 2, . . . that are adjacent in the left and right direction, the first connecting portion 21 of the circuit board 2 arranged on the left side and the second connecting portion 22 of the circuit board 2 arranged on the right side are electrically connected via a first connector 25 (B4) for bridging the first and second connecting portions 21, 22.

Further, each of the second connecting portions 22, 22, . . . of the circuit boards 2, 2, . . . arranged on the leftmost side in the flat plate portion 61 is electrically connected to the power circuit board via a second connector (B41) (not shown).

Moreover, each of the second connecting portions 22, 22, . . . of the circuit boards 2, 2, . . . arranged on the rightmost side in the flat plate portion 61 is electrically connected to a short connector.

The reflection sheet 4 (B5) is formed of a composite resin sheet, and at least a front face of the reflection sheet 4 has high reflectivity in order to reflect the light emitted by the light-emitting units 23, 23, . . . . Further, the reflection sheet 4 is formed of a rectangular shape corresponding to the shape of the attachment member 6, and is attached on the front face side of the attachment member 6.

On the reflection sheet 4, at positions corresponding to the arranged positions of the lenses 24, 24, . . . , circular-shaped through holes 41, 41, . . . (B53) are formed. Further, on the reflection sheet 4, at positions corresponding to the arranged positions of first connectors 25, 25, . . . , rectangular-shaped through holes 42, 42, . . . are formed.

The reflection sheet 4 is laminated on the respective front faces 2*a*, 2*a*, . . . of the circuit boards 2, 2, . . . in a state in which the lenses 24, 24, . . . are arranged inside the through holes 41, 41, . . . and the first connectors 25, 25, . . . are arranged inside the through holes 42, 42, . . . .

Next, the configuration of the display device 7 shown in FIG. 125 will be explained. The light source device 1 (B) is arranged on a back face side of the display unit 70 so as to illuminate the display unit 70 (A).

The display unit 70 has a rectangular shape, and includes a display panel 701 (A1) and an optical sheet 702 (C).

The display panel 701 is e.g. a liquid crystal display panel, and a front surface of the display panel 701 configures a display surface 7*a* for displaying images.

The optical sheet 702 is arranged opposing to the back face of the display panel 701 and in between the display panel 701 and the lenses 24, 24, . . . , and diffuses the light emitted by the light-emitting units 23, 23, . . . . The optical sheet 702 is a laminated body in which a relatively thick diffusion plate, and a relatively thin composite resin sheet configured with a reflective polarizing plate, a prism sheet, or a diffusion sheet, etc. are laminated.

The display panel 701 configures a panel module by the peripheral edge portion of the display panel 701 being fixedly retained at its front and rear by the front side frame 72 and the rear side frame 73.

The rear side frame 73 is attached to the frame portion 62 of the attachment member 6, and the optical sheet 702 is fixedly retained by the rear side frame 73 and the frame portion 62 at the front and rear.

The cabinet 71 (D) houses the panel module, the optical sheet 702, and the light-emitting element 1 in a state where the display surface 7*a* is exposed from a front face opening and remainders other than the display surface 7*a* are hidden.

At the center portion in the left and right direction at the back face of the flat plate portion 61 of the attachment member 6 (B6), the signal process circuit board for processing image signals to be displayed on the display surface of the display panel 701 is attached.

In manufacturing the light source device 1 of the display device 7 as aforementioned, the manufacturer attaches the circuit boards 2, 2, . . . (B3) to the flat plate portion 61 (B61) of the attachment member 6 (B6). In attaching each circuit board 2, marks 31, 32, 33 (B38, B35) as shown in FIG. 126 to FIG. 128 are formed on each circuit board 2 so that the manufacturer can easily and accurately recognize the orientation in the left and right (hereafter referred to simply as orientation of the circuit boards 2).

The marks 31, 32, 33 are each recess shaped and show the orientation of the circuit board 2.

The marks 31, 32 (B38) are arranged in the vicinity of the first connecting portion 21. The mark 31 is a rectangular-shaped notched portion that penetrates from the front face 2*a* of the circuit board 2 to its back face at the upper end portion of the circuit board 2. Similarly, the mark 32 is a rectangular-shaped notched portion at the lower end portion of the circuit board 2.

The mark 33 (B35) is arranged in the vicinity of the second connecting portion 22. The mark 33 is a round-shaped hole that penetrates from the front face 2*a* of the circuit board 2 to its back face at the center portion in the up and down direction.

The inner diameter of the mark 33 is larger than the inner size of the marks 31, 32.

The marks 31, 32 and mark 33 as aforementioned are formed respectively at the right end portion and the left end portion (in other words, one end and the other end in the left and right direction in the circuit board 2) with different number of pieces, dimension, and shape.

Due to this, the operator can easily and accurately recognize that the side where the marks 31, 32 are formed in the circuit board 2 is the right side, and the side where the mark 33 is formed in the circuit board 2 is the left side Notably, the marks 31, 32 and mark 33 may have the same dimension and/or shape. Further, in the case where the dimension and/or shape are different, the number of pieces of the marks formed on the right side and the number of pieces of the marks formed on the left side of the circuit board 2 may be the same.

On the other hand, at respective attaching positions on the attachment member 6 (B6) for the circuit board 2, indexes 51, 52, 53 (B69*b*, B68) are formed thereon.

The indexes 51, 52, 53 are each convex shaped and show the attaching positions of the circuit board 2, each of which are protrudingly formed on the front face 6*a* of the flat plate portion 61. The indexes 51, 52, 53 may be integrally formed with the flat plate portion 61, and may alternatively be configured by a member that is separate from the attachment member 6 being fixed to the front face 6*a*.

The indexes 51, 52 (B69*b*) are arranged in the vicinity of the arranged position of the first connecting portion 21. The index 53 is arranged in the vicinity of the arranged position of the second connecting portion 22. The distances between the indexes 51, 52, 53 correspond to the distances between the marks 31, 32, 33.

The index 51 (or the index 52) is formed in a square columnar shape, and engages with the mark 31 (or the mark 32) by being fitted therein. The index 53 is formed in a round columnar shape, and engages with the mark 33 by being fitted therein. That is, the indexes 51, 52, 53 have the number of pieces, dimension and shape corresponding to the marks 31, 32, 33 to which they are to be engaged.

By seeing the marks 31, 32, 33 and contacting fingers to the marks 31, 32, 33, the operator can be prevented from an erroneous judgment in the orientation of the circuit board 2. Further, by seeing the indexes 51, 52, 53 directly or through the marks 31, 32, 33 and by contacting fingers or the circuit board 2 to the marks 31, 32, 33, the attaching position of the circuit board 2 can easily and accurately recognized.

Further, the operator can position the circuit board 2 easily and accurately, yet further uniquely by contacting the circuit board 2 to the attachment member 6 such that the indexes 51, 52, 53 are fitted into the marks 31, 32, 33.

Accordingly, the operator can attach the circuit board 2 having been arranged in the correct orientation at the correct position onto the attachment member 6. In this case, the operator fixes the circuit board 2 onto the flat plate portion 61 e.g. by using a plurality of rivets (B7) (not shown).

At this occasion, the circuit board 2 is prevented from erroneously being attached with its left and right wrong. This is because the number of pieces, dimension and shape of the marks 31, 32, 33 and the indexes 51, 52, 53 differ in the left side and the right side of the circuit board 2.

In a case where the mark 33 and the index 53 are not formed, the marks 31, 32 may be regarded as showing the orientation of the circuit board 2 by making the outer periphery shape of the circuit board 2 differ in the right end portion and the left end portion. In this case, the operator can judge easily and accurately that the side of the circuit board 2 onto which the marks 31, 32 are formed is the right side, and the side of the circuit board 2 onto which the marks 31, 32 are not formed is the left side.

Further, the operator can position the circuit board 2 easily and accurately, yet further uniquely by contacting the circuit board 2 to the flat plate portion 61 such that the indexes 51, 52 are fitted into the marks 31, 32.

The present embodiment 9 exemplifies a configuration in which a plurality of marks and an equaling number of indexes are formed in the circuit board 2 and the attachment member 6, however, it is not limited to this. For example, the configuration may be that in which one of the marks 31, 32, 33 and one of the corresponding indexes 51, 52, 53 are formed. In this case also, the orientation of the circuit board 2 can be judged easily and accurately, and the circuit board 2 can be positioned.

The marks formed on the circuit board 2 may be configured to be used only for the confirmation of the orientation of the circuit board 2 and not to be used for the positioning. In this case, the indexes corresponding to the marks do not have to be formed on the attachment member 6. Further, the marks may have a convex shape. Alternatively, the marks may be configured such that a corner portion of the right end portion of the circuit board 2 is formed in a right-angled shape whereas a corner portion of the left end portion of the circuit board 2 is formed in an arc shape; or, the marks may be configured such that concavo-convex pattern is formed on the right end face of the circuit board 2 whereas the left end face is formed smoothly, etc.

The manufacturing operation of the light source device 1 as aforementioned, further regarding the manufacturing operation of the display device 7 has an improved efficiency in the attaching operation of the circuit boards 2, 2, . . . .

Incidentally, the positioning of the circuit board 2 is also possible by printing a mark for positioning on each of the circuit board 2 and the attachment member 6. However, in this case, when the mark printed on the attachment member 6 is hidden by the circuit board 2 that is to be attached, it is required to confirm the presence or absence of the mark printed on the attachment member 6 and/or the printed position, etc. by retreating the circuit board 2 from the attaching position all of the time.

That is, it is advantageous for improving the operation efficiency to form the convex-shaped indexes 51, 52, 53 on the attachment member 6 by which the presence or absence and/or the formed position is easier to be recognized by the sense of touch.

Generally, the colors of the circuit board 2, the attachment member 6 and the first connector 25, etc. are respectively a color that reflects the light emitted by the light-emitting units 23, 23, . . . (e.g. white), or that is difficult to absorb the same (e.g. cream).

The peripheral portions of the marks 31, 32, 33 and the indexes 51, 52, 53 in the present embodiment are the same color as the circuit boards 2 and the attachment member 6, however, for the purpose of improving the visibility thereof, the colors of the peripheral portions of the marks 31, 32, 33 and/or the tip ends of the indexes 51, 52, 53 may be a different color from the color of the circuit boards 2 and the attachment member 6. It should be noted that this color is limited to colors that reflect the light emitted by the light-emitting units 23, 23, . . . , or that is difficult to absorb the same. Notably, in the case where the marks 31, 32, 33 and the indexes 51, 52, 53 are arranged at positions that will be hidden by the reflection sheet 4, a limitation to the colors will not be needed.

Further, in the embodiment 9, the circuit boards 2, 2, . . . are juxtaposed at an equaling interval in a plurality of rows, however, aside from this, the circuit boards 2, 2, . . . may be arranged such that a offset dimension on the center side of a juxtaposing direction is short, and the offset dimension on the both sides of the juxtaposing direction is long.

The embodiment 9 disclosed herein is an example in its all aspects, and should not be regarded as being restrictive. The scope of the present invention does not mean as above, and is intended to include meanings equivalent to the scope of the claims, and all of the modifications made within the scope of the claims. For example, the orientation of the circuit board 2 is not limited to the orientation in the left and right direction, and may be an orientation in the up and down direction. That is, the first and second connecting portions 21, 22 may be configured to be arranged apart in the up and down direction.

Further, in so far as to the effect of the present invention, the light source device 1 or the display device 7 may include configuration elements that are not disclosed in the embodiment 9.

Embodiment 10

FIG. 129 is a plan view of an illumination device in accordance with the present invention. The illustrated illumination device is constructed as a backlight device which is arranged in the rear of a liquid crystal display panel, and is used so as to apply light uniformly to a whole surface of the liquid crystal display panel, has a rectangular planar shape which corresponds to the liquid crystal display panel serving as an irradiated body, is provided with a backlight chassis 1 (B6)

which is formed as a shallow bottomed box shape, and is configured by arranging a lot of light-emitting diodes (LED) 2, 2, . . . (B1) as a light source vertically and horizontally in a whole surface of a bottom plate 10 (B61) in an inner portion of the backlight chassis 1.

As shown in FIG. 129, the LED 2, 2, . . . (B1) are mounted in increments of plural numbers (five or eight in the figure) on the LED substrates 20, 20, . . . (B3). The LED substrate 20 (B3) has a strip shape of a narrow width and a large length, and a plurality of LED 2, 2, . . . are mounted in a center portion in a width direction of one surface of the LED substrate 20 so as to be spaced at uniform distances from each other in a longitudinal direction.

An arrangement of the LED 2, 2, . . . on the bottom plate 10 of the backlight chassis 1 is achieved, for example, by arranging the LED substrate 20 on which five LED 2, 2, . . . are mounted, and the LED substrate 20 on which eight LED 2, 2, . . . are amounted, in a longitudinal direction, and arranging them in a plurality of rows (nine rows in the figure) so as to be spaced at uniform distances, as shown in FIG. 129. In this case, the number of the LED substrates 20, 20, . . . and the arrangement of these on the bottom plate 10 are not limited to the illustrated aspect, but can be appropriately set in correspondence to a magnitude and a shape of the backlight chassis 1. Further, the number or the LED 2, 2, . . . which are mounted on each of the LED substrates 20 is not limited to the illustrated five or eight, but can be set to an appropriate number.

FIG. 130 is a plan view of the backlight chassis 1, and shows a state before the LED substrates 20, 20, . . . are attached. As shown in the figure, a plurality of fixing holes 11, 11, . . . (B64), a plurality of positioning holes 12, 12, . . . (B67) and a plurality of parts attaching holes 13, 13, . . . (B66) are formed in the bottom plate 10 of the backlight chassis 1 in such a manner as to pass through back and front.

The fixing holes 11, 11, . . . (B64) are holes for fixing the LED substrates 20, 20, . . . , and are provided by making four which line up in the longitudinal direction of the bottom plate 10 a set and arranging this in nine rows at uniform distances in a width direction of the bottom plate 10, in such a manner as to correspond to the arrangement of the LED substrates 20, 20, . . . shown in FIG. 129. In FIG. 130, the positions of the LED substrates 20, 20, . . . are shown by a two-dot chain line. Four fixing holes 11, 11, . . . in each of the rows are positioned in the vicinity of both end portions of the LED substrates 20, 20, . . . in the center portion in the width direction of two LED substrates 20 and 20 on the same row.

The positioning holes 12, 12, . . . (B67) are provided for positioning an element member plate with respect to a metal mold for forming by engaging with a projection which is provided in the metal mold, at a time of manufacturing the backlight chassis 1 in accordance with a press molding. In the figure, the positioning holes 12, 12, . . . are formed at three positions within the surface of the bottom plate 10. It is desirable that the positioning holes 12, 12, . . . are formed at three positions or more for making the positioning within the surface of the metal mold possible, and the forming positions are set uniformly within the surface of the bottom plate 10, as illustrated.

The parts attaching holes 13, 13, . . . (B66) are provided for attaching the constructing parts of the backlight device and the liquid crystal display device using it, such as a cooling fan, a power supply circuit, various connecting cables and the like, and these parts attaching holes 13, 13, . . . are formed respectively in bottom portions of recesses 14, 14, . . . formed by depressing the corresponding portions of the bottom plate 10 to the back face side so as to pass through. The number and the arrangement of the parts attaching holes 13, 13, . . . can be appropriately set in correspondence to the number and the position of the constructing parts to be attached. In the figure, four parts attaching holes 13, 13, . . . are arranged in a random order within the surface of the bottom plate 10.

In the illumination device in accordance with the present invention, the positioning holes 12, 12, . . . and the parts attaching holes 13, 13, . . . mentioned above are provided in such a manner as to be positioned between the fixing holes 11 and 11, on a line connecting two fixing holes 11 and 11 which are set with respect to each of the LED substrates 20.

FIG. 131 is a perspective view showing an outer appearance of the LED substrate 20. FIG. 132 is a cross sectional view by a line XII-XII in FIG. 129 showing an attached portion of the LED substrate 20, and FIG. 133 is a cross sectional view by a line XIII-XIII in FIG. 129 in the same manner.

As shown in these figures, upper portions of the LED 2, 2, . . . which are mounted on the LED substrate 20 are covered individually by the light diffusing lens 3, 3, . . . (B2) attached to the LED substrate 20. The lens 3 has a circular planar shape as shown in FIG. 131, and is a convex lens having a cross sectional shape in which one surface is flat and another surface is curved convexly, as shown in FIG. 132 and FIG. 133. A recess 30 (B21) is provided in the center of the flat one surface of the lens 3, and a plurality of support leg portions 31, 31, . . . (B22) are integrally provided in a protruding manner in the periphery of the recess 30. The lens 3 constructed as mentioned above is positioned in such a manner that the LED 2 is received within the recess 30 in the center while setting the flat surface below, as shown in FIG. 132 and FIG. 133, and is fixed and supported to a position which is away from the surface of the LED substrate 20 at an appropriate length, by bonding each of three support leg portions 31, 31, . . . to the LED substrate 20.

As shown in FIG. 131, terminal portions 22 and 23 (B31 and B32) for connecting to an external portion are provided in both end portions of the LED substrate 20. Further, through holes 21 and 21 (B33 and B34) passing through a center position in the width direction rear and front are provided in the vicinity of both end portions of the LED substrate 20, particularly, between the LED 2 and 2 in both ends and the LED 2 and 2 which are adjacent to each other. These through holes 21 and 21 correspond to the positions of the fixing holes 11 and 11 which are formed as mentioned above in the bottom plate 10 of the backlight chassis 1. The LED substrate 20, 20, . . . are fixed to the backlight chassis 1 by arranging the respective through holes 21 and 21 on the bottom plate 10 in correspondence to the positions of the individual fixing holes 11 and 11, and inserting a substrate retaining device 6 (B7) to an alignment portion of the through hole 21 and the fixing hole 11, as shown in FIG. 129.

The substrate retaining device 6 (B7) is provided with a fixing claw 61 which protrudes from one surface of a pressing plate 60 formed as a disc shape, as show in FIG. 132, and pinches and fixes the LED substrate 20 between the pressing plate 60 and the support plate 1, by putting the fixing claw 61 through the through hole 21 of the LED substrate 20 and the fixing hole 11 of the bottom plate 10, and engaging with a peripheral edge in a back surface side of the fixing hole 11. In this case, this pinching is carried out via a reflection sheet 5 which is provided in such a manner as to cover a whole surface of the bottom plate 10. The reflection sheet 5 (B5) is a sheet which has an excellent light reflectance and is made of a resin, such as a polycarbonate or the like. The reflection sheet 5 also covers the upper surface of the LED substrate 20, and the lens 3 (B2) covering the mounting position of the LED 2 is exposed to the surface of the reflection sheet 5 via an individual through hole 51 (B53) formed at the corresponding position of the reflection sheet 5. In this case, an illustration of the reflection sheet 5 is omitted in FIG. 129.

Further, the substrate retaining device 6 is provided with a support projection 62 (B83) which is provided in a rising manner in another surface of the pressing plate 60. The support projection 62 is provided in such a manner as to support a diffusion plate which is faced to the bottom plate 10 of the backlight chassis 1 from a back face. The support projection 62 may be configured such that a part of the substrate retaining device 6 has, in addition that all the substrate retaining device 6 has.

Two LED substrates 20 and 20 which are lined up in such a manner as to be continuous in a length direction on the bottom plate 10 of the backlight chassis 1 are connected to each other, by connecting respective terminal portions 22 and 22 which are at mutually opposed positions by a connector 4 (B4), as shown in FIG. 129. Terminal portions 23 and 23 in another end are used for connecting to an external power supply, and the LED 2, 2, . . . mounted on the LED substrates 20, 20, . . . emit light on the basis of a power feed from the external power supply. The light emission of each of the LED 2, 2, . . . disperses uniformly within the surface of the bottom plate 10 of the backlight chassis 1, on the basis of a synergetic effect of the diffusion by the individual lenses 3, 3, . . . and the reflection by the reflection sheet 5, and is applied onto the irradiated body which is arranged so as to be opposed to the bottom plate 10.

In the illumination device in accordance with the present invention, the bottom plate 10 of the backlight chassis 1 is provided with the positioning holes 12, 12, . . . (B67) and the parts attaching holes 13, 13, . . . (B66) which pass through the bottom plate 10 back and forth. These positioning holes 12, 12, . . . and the parts attaching holes 13, 13, . . . have the positional relationship mentioned above with respect to the fixing holes 11, 11, . . . which are used for fixing the LED substrate 20, and come to a state of being occluded by the LED substrates 20, 20, . . . which are attached to the fixing holes 11, 11, . . . as mentioned above. In this case, the parts attaching holes 13, 13, . . . are provided in the inner portion of the recesses 14, 14, . . . which are provided by depressing the bottom plate 10, however, the LED substrates 20, 20, . . . occlude a whole of these recesses 14, 14, . . . .

Accordingly, there is no risk that the dusts enter into the inner portion of the backlight chassis 1 through the positioning holes 12, 12, . . . and the parts attaching holes 13, 13, . . . under the used state, and it is possible to prevent the dusts from being attached and piled up on the surfaces of the LED 2, 2, . . . and the lens 3, 3, . . . and the surface of the reflection sheet 5, and prevent an optical problem such as a non-uniformity of the applying light, an illumination intensity defect or the like from being generated. Further, it is possible to prevent the dusts having a conductivity from being attached to the surfaces of the LED substrates 20, 20, . . . and prevent an electric problem from being generated in a driving circuit of the LED 2, 2, . . . formed in the LED substrates 20, 20, . . . .

Further, the light emission mentioned above by the LED 2, 2, . . . does not leak out to the external portion via the positioning holes 12, 12, . . . and the parts attaching holes 13, 13, . . . which are occluded by the LED substrates 20, 20, . . . , and it is possible to dissolve such a risk of making a user viewing the leaking light nourish a fear of insecurity.

The occlusion of the positioning holes 12, 12, . . . and the parts attaching holes 13, 13, . . . by the LED substrates 20, 20, . . . can be achieved by appropriately defining the positions of the positioning holes 12, 12, . . . and the parts attaching holes 13, 13, . . . with respect to the fixing holes 11, 11, . . . of the LED substrates 20, 20, . . . at a time of designing the backlight chassis 1.

As shown in the embodiment 10, in the case of using the strip shaped LED substrate 20 (B3), and fixing the LED substrate 20 to the bottom plate 10 by the fixing holes 11 and 11 in the vicinity of both end portions, the positioning hole 12 and the parts attaching hole 13 can be securely occluded by being formed between both the fixing holes 11 and 11 on the line connecting these fixing holes 11 and 11. The LED substrate 20 has an appropriate elasticity, and is well attached close to the bottom plate 10 only by fixing the vicinity of both the end portions by the substrate retaining device 6, whereby the positioning holes 12, 12, . . . and the parts attaching holes 13, 13, . . . can be securely occluded. However, in order to secure the occlusion, the other fixing means such as an adhesive bonding or the like may be used at the same time. The positioning holes 12, 12, . . . and the parts attaching holes 13, 13, . . . may be arranged at a position which is deviated in a width direction of the LED substrate 20 from the line connecting two fixing holes 11 and 11, in addition to being arranged in such a manner as to be positioned between these fixing holes 11 and 11 on the line connecting two fixing holes 11 and 11, and may be positioned at any position which is occluded by the LED substrate 20.

The recess 14 around the parts attaching hole 13 is provided in such a manner as to secure a space in the back face side of the LED substrate 20 occluding said recess 14, and make the attachment of the parts to the parts attaching hole 13 by a retainer, a clipping or the like possible. The through hole occluded by the LED substrate 20, 20, . . . is not limited to the positioning holes 12, 12, . . . and the parts attaching holes 13, 13, . . . mentioned above, but may be configured by a hole which is used for the other purposes.

In this case, the shape of the LED substrates 20, 20, . . . is not limited to the strip shape, but may be formed as an appropriate shape such as a rectangular shape, a square shape, a circular shape or the like. Even in this case, it is possible to achieve a secure occlusion by appropriately setting the positions of the positioning holes 12, 12, . . . and the parts attaching holes 13, 13, . . . with respect to the fixing positions of the LED substrates 20, 20, . . . in a design stage of the backlight chassis 1. However, since it is possible to arrange a plurality of LED substrates 20, 20, . . . having a comparatively narrow width in a plurality of rows so as to be spaced, by forming the LED substrates 20, 20, . . . as the strip shape, it is possible to reduce a total area of the LED substrates 20, 20, . . . , it is possible to reduce a cost of the LED substrates 20, 20, . . . , and further a cost of the illumination device, and it is possible to occlude the positioning holes 12, 12, . . . and the parts attaching holes 13, 13, . . . by the LED substrates 20, 20, . . . regardless of the spaced or parallel arrangement.

FIG. 134 is a cross sectional view of a liquid crystal display device in accordance with the present invention which is provided with the illumination device structured as mentioned above as the backlight device. The liquid crystal display device is provided with a liquid crystal display panel 8 (A1) serving as an image display unit. The liquid crystal display panel 8 and a plurality of optical sheets 81, 81, . . . (diffusion plates, reflection polarizing plates, prism sheets, diffusion sheets and the like) (C) are stacked each other, and peripheral edge portions are integrally pinched by a front retention frame body 82 (A2) and a rear retention frame body 83 (A3) so as to configure a liquid crystal module.

The backlight device (B) is configured by arranging the LED substrates 20, 20, . . . (B3) in the inner portion of the backlight chassis 1 (B6) formed by uprising a frame portion

15 (B62) in a peripheral edge of a bottom plate 10 (B61) as mentioned above, and covering upper portions thereof by the reflection sheet 5, and the LED 2, 2, . . . lined up on the bottom plate 10 is attached in such a manner as to be opposed to the back face of the liquid crystal display panel 8 serving as the irradiated body via the optical sheets 81, 81, . . . , by fixing the peripheral edge of the frame portion 15 to the back face of the rear retention frame body 83.

The substrate retaining device 6 pinching and fixing the LED substrates 20, 20, . . . and the reflection sheet 5 with respect to the bottom plate 10 is provided with a support projection 62. The support projection 62 brings its leading end into contact with the optical sheet 81, as illustrated, limits the deflection of the optical sheet 81, and carries out an action of keeping the distance with respect to the LED 2, 2, . . . on the bottom plate 10 appropriately.

The liquid crystal display device is configured by fixing the liquid crystal module and the backlight device to a front face cabinet 80*a* via the front retention frame body 82 and the rear retention frame body 83 which pinch the peripheral edge thereof, and covering a back face of the front face cabinet 80*a* by a back face cabinet 80*b*. In the liquid crystal display device configured as mentioned above, the light emission of the LED 2, 2, . . . lined up on the bottom plate 10 of the backlight chassis 1 is uniformly applied on a whole surface of the liquid crystal module which is arranged so as to be opposed to the bottom plate 10, and transmits the optical sheets 81, 81, . . . and the liquid crystal display panel 8, and a desired image is displayed on the display surface of the liquid crystal display panel 8 which is exposed to a front face opening of the front face cabinet 80*a*.

In this case, the liquid crystal display device mentioned above is one of application examples of the illumination device in accordance with the present invention, and it goes without saying that the illumination device in accordance with the present invention can be applied to various intended uses in which a uniform light application onto a whole surface of a sheet irradiated body is requested.

In the embodiment mentioned above, the box-shaped chassis 1 in which the bottom plate 10 and the frame portion 15 are integrated is used, however, the chassis 1 may be formed as a tabular shape. FIG. 135 is a cross sectional view showing another embodiment of the liquid crystal display device in accordance with the present invention. The illustrated liquid crystal display device is provided with the tabular chassis 1.

A frame body 16 is fixed to a peripheral edge portion of the chassis 1 in such a manner as to rise on one surface (a surface in which the LED substrates 20, 20, . . . are provided in parallel). The illustrated frame body 16 is fixed by a rivet 17, however, this fixing can be achieved by an appropriate means such as a bolt fixing, an adhesive bonding or the like. The chassis 1 configured as mentioned above is attached in such a manner that the LED 2, 2, . . . lined up in the one surface are opposed to the back face of the liquid crystal display panel 8 as an irradiated body via the optical sheets 81 and 81, by fixing the peripheral edge of the frame body 16 to the back face of the rear retention frame body 83.

The other configurations and motions of the liquid crystal display device shown in FIG. 135 are the same as the liquid crystal display device shown in FIG. 134, and a description of the configuration and the motion is omitted by attaching reference numerals which are in common with FIG. 134 to the corresponding constructing members.

Embodiment 11

A description will be in detail given below of the present invention on the basis of the accompanying drawings which show a display device in accordance with an embodiment. FIG. 136 is a cross sectional view showing a partial structure of the display device provided with the backlight device in accordance with the present invention, FIG. 137 is a partially enlarged cross sectional view showing a structure of the backlight device in accordance with the present invention, FIG. 138 is a cross sectional view showing a structure of a rivet of the backlight device in accordance with the present invention, FIG. 139 is a partly omitted plan view of the backlight device in accordance with the present invention, FIG. 140 is a partly exploded schematic perspective view of the backlight device in accordance with the present invention, and FIG. 141A and FIG. 141B are partly enlarged plan views showing a structure of a reflection sheet of the backlight device in accordance with the present invention.

As shown in FIG. 136, the display device is provided with an approximately rectangular parallelepiped display unit 10 (A) which has a display surface displaying an image in a front side, a backlight device A (B) which is arranged in a rear side of the display unit 10, and a cabinet 11 (D) which covers a peripheral edge portion of the display unit 10 and a rear side of the backlight device A. In this case, the cabinet 11 houses a power supply circuit board which feeds an electric power to the display unit 10, a terminal circuit board which processes an image displayed on the display unit 10, and a plurality of circuit boards (not shown) (B10) such as a control circuit board or the like which controls the display unit 10, and the LED 1 (B1) and the display panel 12 (A1) are driven on the basis of an output from the circuit boards.

The display unit 10 (A) has a display panel 12 (A1) which has a display surface, and an optical sheet 13 (C) which is arranged in a rear side of the display panel 12. A peripheral edge portion of the display panel 12 is retained so as to be pinched back and front by a front retention frame body 14 (A2) and a rear retention frame body 15 (A3), and configures a panel module, and the rear retention frame body 15 is attached to a peripheral edge portion of the support member 7 (B6).

The optical sheet 13 (C) is a laminated body obtained by laminating a comparatively thick diffusion plate which diffuses uniformly the light emitted by the LED 1, that is, the light-emitting element serving as the light source, and a comparatively thin resin sheet such as a reflection polarizing plate, a prism sheet, a diffusion sheet or the like.

The support member 7 (B6) has a plate portion 71 (B61) and a frame portion 72 (B62) which is connected to a peripheral edge of the plate portion 71, and supports the peripheral edge portion of the diffusion plate to the frame portion 72.

The backlight device A (B) in accordance with the present invention is provided with a plurality of LEDs 1 (B1) which are arranged in a matrix manner and serve as a light source, a plurality of LED substrates 2 (B3) which mount the LED 1 in one surface 2*a*, and are arranged in parallel in vertical and horizontal two directions, a plurality of connectors 3 (B4) which connect the adjacent LED substrates 2 and 2 to each other, a support pin 4 (B8) which supports the optical sheet 13, a plurality of lenses 5 (B2) which are attached to the one surface 2*a* of the LED substrate 2 so as to be opposed to a top portion of the LED 1, and diverge the light emitted by the LED 1, a reflection sheet 6 (B5) which is opposed to the one surface 2*a* of the LED substrate 2 and reflects the light diverged by the lens 5, a support member 7 (B6) which supports the LED substrate 2, and a plurality of rivets 8 (B7) which fix the reflection sheet 6 to the support member 7 for preventing the reflection sheet 6 from lifting.

The LED substrate 2 (B3) is formed as a strip shape which has a circuit portion in the one surface 2*a*, and is arranged in a plurality of rows in vertical and horizontal directions on one surface of the support member 7 which is formed as an approximately rectangular shape. A plurality of LEDs 1 are mounted on the one surface 2*a* of each of the LED substrates 2 so as to be close in a longitudinal direction, as shown in the figure, and connecting portions 21 and 22 (B31 and B32) having terminals are provided in both end portions in the longitudinal direction of the one surface 2*a*.

The LED 1 (B1) is configured, as shown in FIG. 139, such that five or six are mounted, for example, so as to be spaced in the longitudinal direction of the LED substrate 2, and five or six lenses 5 are attached to the one surface 2*a* by an adhesive agent in correspondence to each of the LED 1.

For the parallel arranged LED substrate 2 (B3), in the LED substrates 2 of one row in the longitudinal direction, two adjacent connecting portions 21 and 21 (B31 and B32) are connected to each other by the connector 3 (B4), the connecting portion 22 of one LED substrate 2 is connected to the power supply circuit board by the second connector (B41), and a short connector is connected to the connecting portion 22 of another LED substrate 2. The LED substrate 2 is provided in an opening manner with a support pin insertion hole 23 (B36) at a position corresponding to the support pin 4, and a rivet insertion hole 24 (B36) at a position corresponding to the rivet 8.

The connector 3 (B4) is formed as an approximately parallelepiped shape, is provided with terminals corresponding to the connecting portions 21 and 21 in both end portions in a longitudinal direction of one surface, and laps over the one surface 2*a* of the LED substrate 2 at a time of being connected to the connecting portions 21 and 21.

The lens 5 (B2) has a translucent portion 51 (B21) which is opposed to be spaced from the top portion of the LED 1, and has a hemispheric recess for diverging the light emitted by the LED 1 to all directions, and three positioning projections 52 (B22) which protrude toward the LED substrate 2 from a surface opposed to the one surface 2*a* of the translucent portion 51, and fix the position with respect to the LED substrate 2 of the translucent portion 51, and a leading end of the positioning projection 52 is attached to the one surface 2*a* by an adhesive agent.

The positioning projection 52 is set such as to be slightly longer than a thickness of the reflection sheet 6 in a distance between the translucent portion 51 and the LED substrate 2, and is configured such that it can absorb a thermal expansion of the reflection sheet 6.

The reflection sheet 6 (B5) includes one synthetic resin sheet which has a high reflectance and is formed as an approximately rectangular shape in correspondence to the support member 7, is provided in an opening manner with a through hole 61 (B53) at a position corresponding to each of the lenses 5, is provided in an opening manner with a through hole 62 at a position corresponding to the connector 3, is provided with a support pin hole 63 (B55), that is, a first through hole at a position corresponding to the support pin 4, and is provided with a rivet hole 64 (B55), that is, a second through hole at a position corresponding to the rivet 8. In this case, the support pin hole 63 has a diameter which is larger than the support pin insertion hole 23, and the rivet hole 64 has a diameter which is larger than the rivet insertion hole 24. As shown in FIG. 141, a small hole 65 (B55*a*) is provided as an identifying mark in a peripheral edge portion of the support pin hole 63.

The through hole 61 is formed as a round shape which has a slightly larger diameter than the translucent portion 51 (B21) of the lens 5, and is arranged in a matrix manner. The translucent portion 51 of the lens 5 is arranged in the through hole 61. The through hole 62 is formed as an approximately rectangular shape, and the connector 3 is fitted thereto. Further, the support pin hole 63 is formed as a round shape which is larger than an attaching portion 43 of the support pin 4 and smaller than a collar portion 42, and the attaching portion 43 is inserted thereto, and the rivet hole 64 is formed as a round shape which is larger than an elastic portion 82*b* of the rivet 8 and smaller than a head portion 81*a*, and the elastic portion 82*b* is inserted thereto.

The support member 7 (B6) is formed as a metal plate, has a tabular plate portion 71 (B61) which is formed as an approximately rectangular shape and a frame portion 72 (B62) which is connected to a peripheral edge of the plate portion 71, and houses and supports the LED substrate 2 in one surface of the plate portion 71 so as to be lined up in a longitudinal direction and a width direction.

The support member 7 is provided with a plurality of through holes 73 (B65) in an opening manner at positions corresponding to the support pin insertion holes 23. A diameter of the through hole 74 is approximately the same as the diameter of the rivet insertion hole 24.

The support pin 4 (B8) is provided with a columnar portion 41 (B83) which extends out of the LED substrate 2 in the direction of the one surface 2*a*, and comes into contact by its leading end with the optical sheet 13 so as to restrict a deflection of the optical sheet 13, a collar portion 42 which extends out of a peripheral edge side of a base end of the columnar portion 41 toward an outer side in a horizontal direction, and an attaching portion (a foot portion) 43 which protrudes out of the collar portion 42 along a direction opposed to the columnar portion 41, and is inserted to the support pin insertion hole 23 and the through hole 73.

The columnar portion 41 is formed as an approximately conical shape, and is formed integrally with the collar portion 42. The attaching portion 43 has a columnar connecting portion 43*a* which is directed to an opposed direction to the columnar portion 41 from the collar portion 42, and two claw portions 43*b* which are connected to a leading end of the connecting portion 43*a* and are engaged to a hole edge portion of the through hole 74. The support pin 4 is attached to the LED substrate 2 and the support member 7 by inserting the attaching portion 43 to the insertion hole 23. The support pin 4 is opposed at such a slight distance that a leading end of the columnar portion 41 comes into contact with one surface of the optical sheet 13, at a position which is opposed to the optical sheet 13, restricts the deflection of the optical sheet 13, and keeps a distance between the optical sheet 13 and the LED substrate 2 uniform.

In the case that the support pin 4 is attached to the LED substrate 2 and the support member 7, the collar portion 42 extends to a small hole 65 in an outer side of a support pin hole 63 which is provided in an opening manner in the reflection sheet 6, in its outer peripheral portion. The collar portion 42 and the reflection sheet 6 do not come into contact and a slight gap is provided. In accordance with this, in the case that the support pin 4 is attached, the small hole 65 provided in an opening manner in an outer side of the support pin hole 63 is invisible.

Further, the support member 7 is provided with a plurality of through holes 74 (B65) at positions corresponding to the rivet insertion holes 24, as shown in FIG. 138. A diameter of the through hole 74 is approximately equal to a diameter of the rivet insertion hole 24.

The rivet 8 (B7) is made of, for example, a metal or a carbon material, and is inserted to the rivet insertion hole 24 and the through hole 74. The LED substrate 2 is fixed to the support member 7 by the rivet 8. The rivet 8 is provided with a reception rivet 82 (B71) and an insertion rivet 81 (B72).

The reception rivet 82 (B71) is provided with a retainer portion 82*a* (B71*a*) which is formed as an annular shape having a diameter which is a little larger than a diameter of the rivet insertion hole 24, and an outer peripheral portion of the retainer portion 82*a* is retained to an edge portion of the rivet insertion hole 24 in an inner side of the rivet hole 64 which is provided in an opening manner in the reflection sheet 6 and yet in an outer side of the rivet insertion hole 24. A plurality of elastic portions 82*b* are provided in parallel in a peripheral direction at an inner peripheral portion of the retainer portion 82*a*. The elastic portion 82*b* protrudes along an axial direction of the retainer portion 82*a*, and is inserted to the rivet insertion hole 24 and the through hole 74. A dimension in an axial direction of the elastic portion 82*b* is larger than the dimension in the axial direction of the rivet insertion hole 84 and the through hole 74, and a protruding end portion of the elastic portion 82*b* extends out of the through hole 74 in an axial direction. A contact portion 82*c* extending to an inner side in a diametrical direction of the retainer portion 82*a* is provided in the protruding end portion of the elastic portion 82*b* so as to be integral with the elastic portion 82*b*, and a gap is provided between the contact portions 82*c* and 82*c*.

A leg portion 81*b* mentioned below comes into contact with an inner side of the contact portion 82*c*, the elastic portion 82*b* curves to an outer side due to the contact of the leg portion 81*b*, and the elastic portion 82*b* comes into contact with an edge portion of the through hole 74. Accordingly, the LED substrate 2 and the support member 7 are pinched back and front between the retainer portion 82*a* and the elastic portion 82*b*.

The insertion rivet 81 (B72) is provided with a head portion 81*a* (B72*a*) which has a larger diameter than the insertion hole 11*b*, and a columnar leg portion 81*b* which is vertical to the head portion 81*a* is provided in the center portion of the head portion 81*a*. A taper 81*ba* is formed in a leading end portion of the leg portion 81*b* in such a manner that a diameter of the leg portion 81*b* becomes smaller toward a leading end. The diameter of the leg portion 81*b* in the vicinity of the head portion 81*a* is approximately the same as an inner diameter of the retainer portion 82*a*, and becomes larger than a dimension between the contact portions 82*c* in the case that the leg portion 81*b* is not inserted. In this case, the edge portion of the head portion 81*a* extends to the leg portion 81*b* side, and an extending width of the edge portion of the head portion 81*a* is smaller than a dimension in the axial direction of the retainer portion 82*a*. Further, the diameter of the head portion 81*a* is smaller than the diameter of the collar portion 42 of the support pin 4.

The leg portion 81*b* of the insertion rivet 81 is inserted to the retainer portion 82*a*, and the leading end portion of the leg portion 81*b* is inserted to the gap between the contact portions 82*c*. The taper 81*ba* is formed in the leading end portion of the leg portion 81*b*, and the gap is expanded by the insertion of the leg portion 81*b*. The elastic portion 82*b* is curved to the outer side, and comes into contact with the edge portion of the through hole 74. The support member 7 and the LED substrate 2 are pinched by an appropriate pressure by the elastic portion 82*b* and the retainer portion 82*a*, and the LED substrate 2 and the support member 7 are attached closely.

The head portion 81*a* comes into contact with the retainer portion 82*a*, and does not come into contact with the reflection sheet 6. A slight gap is provided between an edge portion of the head portion 81*a* extending to the leg portion 81*b* side and the reflection sheet 6. The reflection sheet 6 is retained by an edge portion of the head portion 81*a*. In accordance with this, it is possible to prevent the reflection sheet 6 from lifting with respect to the LED substrate 2.

In the backlight device configured as mentioned above, in a state in which the support member 7 is mounted on a working table in such a manner that the opening side is directed upward, a plurality of LED 1 are mounted on the one surface 2*a*, the LED substrate 2 to which the lens 5 opposed to the top portion of each of the LED 1 is attached is arranged in the one surface of the plate portion 72 in the support member 7 so as to come close in the horizontal direction and be spaced in the vertical direction, and the LED substrates 2 which are adjacent to each other in the horizontal direction are connected by the connector 3. Further, the reflection sheet 6 is mounted on the one surface 2*a* of each of the LED substrates 2 so as to be opposed.

At this time, the translucent portion 51 in the lens 5 passes through each of the through holes 61 of the reflection sheet 6, and the connector 3 passes through each of the through holes 62. Further, each of the support pin holes 63 of the reflection sheet 6, each of the support pin insertion holes 23 of the LED substrate 2, and each of the through holes 73 of the support member 7 are aligned in their positions, and each of the rivet holes 64 of the reflection sheet 6, each of the rivet insertion holes 24 of the LED substrate 2, and each of the through holes 74 of the support member 7 are aligned in their positions.

After the reflection sheet 6 is assembled, the support pin 4 and the rivet 8 are attached. Particularly, the attaching portion 43 of the support pin 4 is fitted and locked to the support pin insertion hole 23 of the LED substrate 2 and the through hole 73 of the support member 7 by the support pin hole 63 of the reflection sheet 6, and the support pin 4 is fixed to the support member 7. The rivet 8 is fixed to the support member 7 by inserting the reception rivet 82 of the rivet 8 to the rivet insertion hole 24 of the LED substrate 2 and the through hole 74 of the support member 7 by the rivet hole 64 of the reflection sheet 6, thereafter inserting the leg portion 81*b* of the insertion rivet 81 to the retaining portion 82*a* of the reception rivet 82, and inserting the leading end portion of the leg portion 81*b* to the gap between the contact portions 82*c*.

As shown in FIG. 140, the support pin hole 63 and the rivet hole 64 have a small difference in an outer shape dimension and are hard to be distinguished in their outer appearance, and it is hard to discriminate. However, it is possible to recognize on the basis of a visual observation by forming an identification mark of the small hole 65 in the peripheral edge of the support pin hole 63, and an erroneous attachment of the support pin 4 and the rivet 8 does not occur.

Further, as shown in FIG. 141A, in the backlight device in accordance with the present invention, a diameter of the head portion 81*a* of the rivet 8 is smaller than a diameter of the collar portion 42 of the support pin 4. Further, the small hole 65 for identification provided in an opening manner in the peripheral edge of the support pin hole 63 is provided at the position which is not covered by the rivet 8 but is covered by the support pin 4. It is provided in such a manner as to be covered by the collar portion 42 of the support pin 4 in the case that the support pin 4 is inserted to the support pin hole 63, and in such a manner that at least a part thereof is visible in the case that the rivet 8 is inserted to the support pin hole 63. In accordance with this, since the small hole 65 is visible in the case that the rivet 8 is erroneously attached to the support pin hole 63, it is possible to immediately know an error, and it is possible to securely attach the support pin 4. In this case, if the support pin 4 is erroneously attached to the rivet hole 64 inversely, the number of the support pins 4 is increased, and the optical sheet 13 can be securely supported. Further, since the reflection sheet is retained, any problem does not particularly occur.

Further, in the backlight device in accordance with the present embodiment 11, the small hole 65 (B55*a*) is utilized as the identification mark. The small hole 65 can be formed in the reflection sheet 6 at the same time of forming the support pin hole 63. Accordingly, it is possible to securely attach without any special steps and man power for the identifying mark. In this case, the identification mark is not limited to the small hole 65 which is provided in an opening manner in the reflection sheet 6, but may be configured such that the support pin hole 63 and the rivet hole 64 can be discriminated in accordance with a visual observation at a time of attaching the support pin 4 and the rivet 8.

Further, in the backlight device in accordance with the present embodiment 11, the description is given of the matter that the support pin 4 is inserted to the support pin hole 63 so as to be fixed to the LED substrate 2 and the support member 7, and the rivet 8 is inserted to the rivet hole 64 so as to be fixed to the LED substrate 2 and the support member 7, however, is not limited to this. For example, the support pin 4 and the rivet 8 may be fixed only to the LED substrate 2. Alternatively, in the reflection sheet 6, the support pin hole 63 and the rivet hole 64 may be provided in an opening manner at a position at which the LED substrate 2 is not formed, and the support pin 4 and the rivet 8 may be respectively inserted in the support pin hole 63 and the rivet hole 64 so as to be fixed to the support member 7.

Further, in the backlight device in accordance with the present embodiment 11, the description is given of the matter that the small hole 65 for identification is provided in the reflection sheet 6 so as to prevent the erroneous attachment of the rivet 8, however, the configuration may be made additionally such that the substrate basis material is exposed by removing a resist around the rivet hole 64 to which the rivet 8 is inserted, in the resist covering the one surface 2*a* of the LED substrate 2. In this configuration, since the substrate basis material around the hole is covered at a time when the rivet 8 is inserted to the rivet hole 64, and the substrate basis material around the hole is visible at a time when the rivet 8 is not inserted to the rivet hole 64, it is possible to easily find neglecting of the attachment of the rivet 8.

The description is in detail given above of the embodiments in accordance with the present invention on the basis of the accompanying drawings, however, the present invention is not limited to the embodiment mentioned above, but can be variously modified and executed within the range of the scope of the present invention.

Embodiment 12-1

A description will be in detail given below on the basis of the accompanying drawings which show a display device in accordance with an embodiment 12-1. FIG. 142 is a vertical cross sectional view schematically showing the display device.

In the figure, reference numeral 1 denotes a rectangular display panel provided with a liquid crystal, and the display panel 1 (A1) is configured such as to regulate a coefficient of transmission of the light by controlling an applied voltage to the liquid crystal, and display the image. The display panel 1 is pinched its peripheral edge portion by a front retention frame body 2 (A2) and a rear retention frame body 3 (A3), and is housed in a rectangular frame shaped front cabinet 4 (D1). The front cabinet 4 is arranged in the periphery of the front retention frame body 2 and the rear retention frame body 3. The front cabinet 4 is provided with a rectangular opening, and a dimension of the opening comes to a dimension which corresponds to the display panel 1. A rear side of the display panel 1 is provided with a plurality of optical sheets 5 (C) which collects the light of the light-emitting diode (LED) 9 serving as the light source mentioned below toward the display panel 1.

A diffusion plate 6 which diffuses the light of the LED 9 uniformly is provided in a rear side of the optical sheet 5. The diffusion plate 6 is supported by an edge portion of a deep-dish shaped support plate 7 made of a metal. A plurality of LED substrates 8 (B3) are provided in parallel in a front face of the support plate 7 (B6), and a membrane shaped heat radiating pattern 8*a* made of a heat conducting material, for example, a metal is formed in a rear face of the LED substrate 8.

A plurality of LED 9, 9, . . . , 9 (B1) are mounted onto a front face of the LED substrate 8 (B3), and lenses 10, 10, . . . , 10 (B2) diffusing the light are respectively arranged in front sides of the LED 9, 9, . . . , 9. Three projections 10*a*, 10*a* and 10*a* (B22) which protrude to the LED substrate 8 side are provided in parallel in a peripheral direction at a peripheral edge portion of the lens 10, and a leading end of the projection 10*a* is firmly attached to the front face of the LED substrate 8 by an adhesive agent.

Support tables (not shown) which support the deep-dish shaped reflection sheet 11 (B5) are provided individually in right and left sides of the support plate 7. A plurality of holes 11*a* (B53) to which the lens 10 is inserted is provided in an opening manner in a bottom surface of the reflection sheet 11. Each of the lenses 10 protrudes to a front side through the hole 11*a*.

A deep-dish shaped rear cabinet 12 (D2) is provided in a rear side of the support plate 7. Vertical and horizontal dimensions of the cabinet 12 are approximately the same as vertical and horizontal dimensions of the front cabinet 4, and an edge portion of the rear cabinet 12 and an edge portion of the front cabinet 4 are opposed to each other. An engagement convex portion and an engagement recess which are not illustrated are provided respectively in the edge portions of the front cabinet 4 and the rear cabinet 12, and the front cabinet 4 is fixed to the rear cabinet 12 by engaging of the engagement convex portion and the engagement recess.

FIG. 143 is a schematic back elevational view in which the support plate 7 is seen from a rear side, and FIG. 144 is a perspective view which schematically shows a through hole provided in an opening manner in the vicinity of an edge of the support plate.

The support plate 7 (B6) is provided near its edge with a truncated pyramid portion 7*a* (a protruding portion) in which a part of the support plate 7 is protruded to a rear side, by a drawing process. A rectangular through hole 7*c* (B61*a*) passing through back and front is provided in an opening manner in a top surface portion 7*b* of the truncated pyramid portion 7*a*, and two notches (engagement recesses) 7*d* and 7*d* (B61*b*) are formed in respective edge portions along a longitudinal direction of the through hole 7*c* so as to be spaced at an appropriate length. A dimension between the notches 7*d* and 7*d* which are formed in one edge portion is different from a dimension between the notches 7*d* and 7*d* which are formed in another edge portion. A locking hole 7*e* (B61*c*) is provided in an opening manner in the top surface portion 7*b*, in an outer side than the one end edge of the through hole 7*c* in the longitudinal direction. A locking projection 41 (B91*d*) mentioned below is locked to the locking hole 7*e*.

As shown in FIG. 143, a rear surface of the support plate 7 is provided with a power supply circuit board 20 (B10*a*)

which feeds an electric power to the display panel 1, the LED substrate 8 and the like, a control circuit board 21 (B10*b*) which carries out a driving and a control of the display panel 1, and a signal processing circuit board 22 (B10*c*) which processes an image signal displayed on the display surface of the display panel 1. A plurality of linear electric conductors 25 (B40) are connected to the power supply circuit board 20, and the electric conductors 25 are connected to the LED substrate 8 while passing through the through hole 7*c*. A plurality of electric conductors 25 are banded together by a band 26 between the power supply circuit board 20 and the through hole 7*c*. In this case, the electric conductor 25 is coated by an insulating material.

A protection trunk 30 (B91) protecting the electric conductor 25 from the edge portion of the through hole 7*c* is fitted to the through hole 7*c*. The protection trunk 30 is short in an axial direction, and a cross section of the protection trunk 30 which is orthogonal to the axial direction is formed as a rectangular shape which corresponds to the through hole 7*c*. A lid 50 (B92) is attached to the protection trunk 30. A recess 30*b* (B910 mentioned below is formed in the protection trunk 30, and the electric conductor 25 passes through between the recess 30*b* and a lid 50, in the case that the lid 50 is attached to the protection trunk 30.

FIG. 145 is a plan view which schematically shows the protection trunk 30 fitted to the through hole 7*c*, FIG. 146 is a schematic cross sectional view in a line VII-VII described in FIG. 145, FIG. 147 is a schematic cross sectional view in a line VIII-VIII described in FIG. 145, and FIG. 148 is a schematic cross sectional view in a line IX-IX described in FIG. 145.

As shown in FIG. 146 and FIG. 147, both side surfaces of the protection trunk 30 along the longitudinal direction is narrowed in an axial direction of the protection trunk 30 formed as a rectangular tubular shape in one end portion side in a longitudinal direction, the width of an intermediate portion is expanded little by little toward one side (a lower side in FIG. 146 and FIG. 147) in the axial direction, and the width in another end portion side becomes wider.

As shown in FIG. 145, one end portion in the longitudinal direction of the protection trunk 30 is opened, and the one end portion is provided with a connecting plate 30*a* which connects to both side surfaces of the protection trunk 30 along the longitudinal direction. The connecting plate 30*a* is flat, and a recess 30*b* (B91*a*) is formed by the connecting plate 30*a* and both the side surfaces, as shown in FIG. 145 and FIG. 148. An inclined plate 30*c* is provided in an edge portion of the recess 30*b* in an opposite side to the one end portion, and the inclined plate 30*c* is connected to the intermediate portion in which the width in the axial direction of the protection trunk 30 mentioned above is expanded little by little. Between the inclined plate 30*c* and another end portion in the longitudinal direction of the protection trunk 30, a narrow reinforcing plate 30*d* which is vertical to the axial direction of the protection trunk 30 extends out of an inner peripheral surface of the protection trunk 30 at an appropriate length. A slit 30*e* along the protection trunk 30 is provided in an opening manner in the reinforcing plate 30*d* which is connected to another end portion in the longitudinal direction of the protection trunk 30.

The protection trunk 30 (B91) is configured such that dimensions in the longitudinal direction and the width direction are slightly shorter than the rectangular through hole 7*c*, and is fitted to the through hole 7*c*. As shown in FIG. 146 and FIG. 147, in the protection trunk 30 fitted to the through hole 7*c*, a portion in which the width in the axial direction is expanded little by little, and a portion in which the width is expanded are positioned between one surface (a lower surface in FIG. 146 and FIG. 147) of the top surface portion 7*b* of the truncated pyramid portion 7*a* and a front face of the support plate 7.

As shown in FIG. 146, the one side surface of the protection trunk 30 along the longitudinal direction is provided with two positioning plates 31 and 31 (positioning portions) which protrude out of the one side surface and are in parallel to a diametrical direction of the through hole 7*c* so as to be in parallel to the longitudinal direction. The positioning plates 31 and 31 are positioned in another surface side (an upper side in FIG. 146) of the top surface portion 7*b*. Further, one side surface of the protection trunk 30 along the longitudinal direction is provided with two tabular engagement pieces (engagement protruding portions) 32 and 32 (B91*b*) which are in parallel to the diametrical direction of the through hole 7*c* so as to be in parallel to the longitudinal direction. The engagement pieces 32 and 32 are arranged alternately with the positioning plates 31 and 31 in the longitudinal direction, and are positioned in one surface side (a lower side in FIG. 146) of the top surface portion 7*b* of the truncated pyramid portion 7*a*. A dimension between the positioning plates 31 and 31 and the engagement pieces 32 and 32 is slightly longer than a thickness dimension of the top surface portion 7*b* of the truncated pyramid portion 7*a*.

Further, a claw portion 33 which protrudes outward is provided in the one side surface of the protection trunk 30, and the claw portion 33 is spaced at an appropriate length in the longitudinal direction from the positioning plates 31 and 31, and is positioned in another surface side of the top surface portion 7*b*. A contact portion 34 (B91*c*) which protrudes outward along a corner portion and is formed as an L-shaped form in a side view is provided in the corner portion which is positioned in another surface side of the top surface portion 7*b* in the one end portion side in the longitudinal direction, in the one side surface of the protection trunk 30. A bent portion 55 (B92*a*) mentioned below comes into contact with the contact portion 34.

On the other hand, another side surface along the longitudinal direction of the protection trunk 30 is provided in parallel to the longitudinal direction with two positioning plates 35 and 35 which are in parallel to the diametrical direction of the through hole 7*c*, as shown in FIG. 147. The positioning plates 35 and 35 are positioned in another surface side (an upper side in FIG. 147) of the top surface portion 7*b*. Further, another side surface of the protection trunk 30 along the longitudinal direction is provided in parallel to the longitudinal direction with two tabular engagement pieces 36 and 36 (B91*b*) which are in parallel to the diametrical direction of the through hole 7*c*. The engagement pieces 36 and 36 are arranged alternately with the positioning plates 35 and 35 in the longitudinal direction, and are positioned in one surface side (the lower side in FIG. 147) of the top surface portion 7*b* of the truncated pyramid portion 7*a*. The engagement pieces 36 and 36 are arranged at positions which are asymmetric in the width direction of the protection trunk 30 with the engagement pieces 32 and 32 which are provided in one side surface along the longitudinal direction of the protection trunk 30. A dimension between the engagement pieces 36 and 36 becomes longer than a dimension between the engagement pieces 32 and 32. In this case, the engagement pieces 32 and 32 and the engagement pieces 36 and 36 correspond to the positions of four notches 7*d*, in the case that the lid 50 is attached to the protection trunk 30.

Further, an outward protruding claw portion 37 is provided in the another side surface of the protection trunk 30, and the claw portion 37 is spaced at an appropriate length in the longitudinal direction from the positioning plates 35 and 35, and is positioned in another surface side (an upper side in FIG. 147) of the top surface portion 7*b*. The claw portion 37 is arranged at a position which is symmetrical in the width direction of the protection trunk 30 with the claw portion 33 which is provided in the one side surface along the longitudinal direction of the protection trunk 30. A dimension between the positioning plates 35 and 35 and the engagement pieces 36 and 36 is slightly longer than a thickness dimension of the top surface portion 7*b* of the truncated pyramid portion 7*a*. Further, a contact portion 38 (B91*c*) which protrudes outward along a corner portion and is formed as an L-shaped form in a side view is provided in the corner portion which is positioned in another surface side of the top surface portion 7*b* in the one end portion side in the longitudinal direction, in the another side surface of the protection trunk 30. A bent portion 55 (B92*a*) mentioned below comes into contact with the contact portion 38.

As shown in FIG. 146 and FIG. 147, the connecting plate 30*a* is provided with a locking portion 39 which extends out of the connecting plate 30*a* to one side of the axial direction. The locking portion 39 locks to an edge portion of the through hole 7*c* along the width direction. A tongue shaped extension portion 40 which extends in the longitudinal direction is provided on an outer side surface in another end portion in the longitudinal direction of the protection trunk 30. The extension portion 40 is positioned in one surface side of the top surface portion 7*b*, and an extending end portion of the extension portion 40 is provided with a locking projection 41 (B91*d*) which protrudes to another surface side in correspondence to the locking hole 7*e* (B61*c*). The locking projection 41 locks to a locking hole 7*e* which is provided in an opening manner in the top surface portion 7*b*, and carries out a positioning of the protection trunk 30 in the diametrical direction of the through hole 7*c*.

Both corner portions of the another end portion in the longitudinal direction of the protection trunk 30 is provided with positioning plates (positioning portions) 42 and 42 which extend out of a side surface along the longitudinal direction and a side surface along the width direction. The positioning plates 42 and 42 are orthogonal to a penetrating direction of the through hole 7*c* and are positioned in one surface side of the top surface portion 7*b*. The positioning plates 42 and 42 exist at positions which are approximately the same as the positioning plates 31 and 35 mentioned above in the penetrating direction. Accordingly, the positioning plates 31, 35 and 42 and the engagement pieces 32 and 36 are arranged in both sides of the top surface of the truncated pyramid portion 7*a*, and the positioning of the protection trunk 30 in the penetrating direction of the through hole 7*c* is carried out.

In this case, each of the engagement pieces 32 and 36 is arranged at the position which corresponds to each of the notches 7*d*, and in the case that the protection trunk 30 is fitted to the through hole 7*c*, each of the engagement pieces 32 and 36 is engaged with each of the notches 7*d*, and is positioned in one surface side of the top surface portion 7*b*. Further, the locking projection 41 is locked to the locking hole 7*e* and the positioning plates 31, 35 and 42 and the engagement pieces 32 and 36 are arranged respectively in both surface sides of the top surface portion 7*b*, by sliding the protection trunk 30 to another end portion side in the longitudinal direction in a state in which the positioning plates 31, 35 and 42 are brought into contact with the top surface portion 7*b*. At this time, as shown in FIG. 146 and FIG. 147, the positioning plates 31, 35 and 42 come into contact with the top surface portion 7*b*, and the portion in which the width in the axial direction mentioned above is expanded little by little, and the widened portion in the protection trunk 30 fitted to the through hole 7*c* are positioned in a rear side rather than a front face of the support plate 7.

The lid 50 is arranged in the portion of the protection trunk 30 which protrudes to another surface side of the top surface portion 7*b*. FIG. 149 is a plan view schematically showing the lid 50, FIG. 150 is a schematic side elevational view as seen from a direction of F1 described in FIG. 149, FIG. 151 is a schematic side elevational view as seen from a direction of F2 described in FIG. 149, FIG. 152 is a schematic cross sectional view in a line XI-XI described in FIG. 149, and FIG. 153 is a schematic side elevational view as seen from a direction of F3 described in FIG. 149.

The lid 50 (B92) is provided with a rectangular occlusion plate portion 51 which is mounted to the protection trunk 30, side surface portions 52 and 52 which are connected to an edge portion of the occlusion plate portion 51 running from one end portion to an intermediate portion in the longitudinal direction, and a side surface portion 53 which is connected to the edge portion of the occlusion plate portion 51 along the width direction. As shown in FIG. 149, notches 54 and 54 are formed in both corner portions of one end portion in the longitudinal direction of the occlusion plate portion 51. The notches 54 and 54 are provided with bent portions 55 and 55 (B92*a*) which are connected to the side surface portions 52 and 52 and bent as an L-shaped form in such a manner that the notch 54 side is depressed. The bent portion 55 extends toward one end portion in the longitudinal direction of the occlusion plate portion 51, and a space is formed by the bent portion 55 and the notch 54. As shown in FIG. 153, the occlusion plate portion 51 is provided between the notches 54 and 54 with an elastic member 70 which protrudes to the bent portion 55 side and extends in a width direction.

Another end portion in the longitudinal direction of the occlusion plate portion 51 is slightly narrower than the intermediate portion. An edge portion along the longitudinal direction in the another end portion in the longitudinal direction of the occlusion plate portion 51 is provided with hook shaped retention portions 56 and 56 (B91*e*) which protrude in the same direction as the elastic member 70 (refer to FIG. 151). As shown in FIG. 150 and FIG. 152, retention holes 56*a* and 56*a* are provided in an opening manner in a portion in a side of the occlusion plate portion 51 of the retention portions 56 and 56.

Next, a description will be given of an attachment of the lid 50 to the protection trunk 30. FIG. 154 and FIG. 155 are explanatory views explaining the attachment of the lid 50 to the protection trunk 30. In this case, the description of the electric conductor 25 is omitted in FIG. 154.

As shown in FIG. 154, in the case that the lid 50 is attached to the protection trunk 30, first of all, a plurality of electric conductors 25 are inserted to the protection trunk 30 so as to be arranged within the recess 30*b*. Next, as shown in FIG. 154, the lid 50 is set to an attitude which is inclined with respect to the top surface portion 7*b*, the contact portions 34 and 38 are inserted to a space which is formed by the bent portion 55 and the notch 54, and the contact portions 34 and 38 are brought into contact with inner corner portions of the bent portions 55 and 55. Further, the lid 50 is approximated to the protection trunk 30 while using the contact portions 34 and 38 as a supporting point, and the retention portions 56 and 56 are brought into contact with the claw portions 33 and 37 so as to be elastically deformed. Further, the lid 50 is approximated to the protection trunk 30 and the claw portions 33 and 37 are retained to the retention holes 56*a* and 56*a*. At this time, as shown in FIG. 155, the electric conductor 25 is pinched between the elastic member 70 and the connecting plate 30*a* within the recess 30*b*. The connecting plate 30*a* is flat, and a plurality of electric conductors 25 are aligned and are in close formation within the recess 30*b*.

In the display device in accordance with the embodiment 12-1, since a plurality of electric conductors 25 passing through the through hole 7*c* are arranged within the recess 30*b*, a plurality of electric conductors 25 are retained within the recess 30*b* in the case that the protection trunk 30 is occluded by the lid 50, it is possible to bring together the electric conductors 25 within the recess 30*b* for a short time, and it is possible to prevent the dusts from making into intrusion from the through hole 7*c*.

Further, since the electric conductor 25 is pinched between the elastic member 70 and the connecting plate 30*a*, and the gap within the recess 30*b* is filled up as well as the electric conductors 25 are closed up by the elastic force of the elastic member 70, it is possible to bring together the electric conductors 25 within the recess 30*b* for a short time, and it is possible to securely prevent the dust from making an intrusion from the through hole 7*c*.

Further, since the electric conductors 25 are easily aligned within the recess 30*b* by the flat connecting plate 30*a*, and are easily closed up, it is possible to securely bundle the electric conductors 25 within the recess 30*b*.

As mentioned above, the dimension between the notches 7*d* and 7*d* which are formed in one edge portion is different from the dimension between the notches 7*d* and 7*d* which are formed in another edge portion, and the dimension between the engagement pieces 36 and 36 is longer than the dimension between the engagement pieces 32 and 32 in correspondence to the different dimensions. Accordingly, only in the case that the protection trunk 30 is arranged in the through hole 7*c* in a predetermined direction, the engagement pieces 32 and 36 formed in the outer peripheral portion of the protection trunk 30 is engaged with the notch 7*d* formed in the edge portion of the through hole 7*c*. Therefore, it is possible to avoid such a manner that the worker misidentifies the direction of the protection trunk 30 at a time of assembling the display device, and attaches the protection trunk 30 to the through hole 7*c*, and it is possible to rapidly and securely assemble the display device.

Further, since the positioning plates 31, 35 and 42 come into contact with the top surface portion 7*b* by fitting the protection trunk 30 to the through hole 7*c* provided in the truncated pyramid portion 7*a*, and the portion in which the width in the axial direction is expanded little by little mentioned above and the portion in which the width is widened are positioned in the rear side from the front face of the support plate 7, in the protection trunk 30 fitted to the through hole 7*c*, the protection trunk 30 does not come into contact with the parts which are arranged in the front face side of the support plate 7, and the assembly of the display device is not prevented by fitting the protection trunk 30 to the through hole 7*c*.

Further, since the locking hole 7*e* and the locking projection 41 are provided in the support plate 7 and the protection trunk 30, thereby carrying out the positioning of the protection trunk 30 in the diametrical direction of the through hole 7*c*, it is possible to securely attach the protection trunk 30 to the through hole 7*c*.

Further, since the positioning of the protection trunk 30 in the penetrating direction of the through hole 7*c* is carried out by the positioning plates 31, 35 and 42, it is possible to securely fix the protection trunk 30 to the through hole 7*c*.

Further, since the contact portions 34 and 38 are brought into contact with the corner in the inner side of the bent portions 55 and 55 and the lid 50 is rotated toward the protection trunk 30 by using the contact portions 34 and 38 as a supporting point, in the case that the lid 50 is attached to the protection trunk 30, the worker can easily attach the lid 50 to the protection trunk 30, and it is possible to efficiently manufacture the display device for a short time.

Further, since the lid 50 is fixed to the protection trunk 30 by retaining the claw portions 33 and 37 to the retention holes 56*a* and 56*a*, it is possible to prevent the attached lid 50 from being detached from the protection trunk 30.

Further, since any complicated shape for inserting the electric conductor 25 without damaging, for example, a groove formation is not applied to the support plate 7, the support plate 7 can be manufactured for a short time. Further, it is possible to prevent the electric conductor 25 from being scratched by the edge of the through hole 7*c*, because of the protection trunk 30.

In the display device in accordance with the embodiment 12-1, the notch 7*d* is formed in the through hole 7*c*, and the engagement pieces 32 and 36 are provided in the protection trunk 30, however, an engagement piece may be provided in the through hole 7*c* and an engagement recess 30*b* with which the engagement piece engages may be provided in the outer periphery of the protection trunk 30. Further, the retainer projection is provided in the extension portion 40, and the locking hole 7*e* is provided in the top surface portion 7*b*, however, a retainer projection may be provided in the top surface portion 7*b*, and the locking hole 7*e* may be provided in the extension portion 40. Further, the recess 30*b* is formed only in the protection trunk 30, however, may be formed in the lid 50, and the mutually opposed recesses 30*b* may be formed in both the lid 50 and the protection trunk 30.

Further, the display device in accordance with the embodiment 12-1 uses the LED 9 as the light source, however, may use a fluorescent tube as the light source. In this case, the fluorescent tube is attached to the support plate 7 via a lamp holder. In this case, the configuration may be made such as to use a self luminous panel, for example, an organic EL panel as the display panel without using a light source such as an LED or a fluorescent tube, and input a control signal to the display panel from a signal processing circuit 21.

Embodiment 12-2

A description will be in detail given below on the basis of the accompanying drawings showing a display device in accordance with an embodiment 12-2. FIG. 156 and FIG. 157 are explanatory views explaining an attachment of the lid 50 to the protection trunk 30 of the display device, and FIG. 158 is a perspective view schematically showing the vicinity of an engaging shaft in an enlarged manner. In this case, the description of the electric conductor 25 is omitted in FIG. 156.

As shown in FIG. 156, two claw portions 80 and 80 are provided respectively in both side surfaces along the longitudinal direction of the protection trunk 30, and the claw portions 80 and 80 are positioned in another surface side of the top surface portion 7*b*. Side surface portions 58 running from another end portion to an intermediate portion are respectively provided in both edge portions along the longitudinal direction of the occlusion plate portion 51, and the side surface portions 58 are provided with two retention holes 58*a* and 58*a* corresponding to the claw portions 80 and 80 in an opening manner. Another end portion of the occlusion plate portion 51 comes to a thin elastic plate portion 51*a*, and contact shafts (contact portions) 51*b* and 51*b* protruding in a width direction are provided in both corner portions of the elastic plate portion 51*a*. L-shaped bent portions 45 and 45 extending outward from both side surfaces of the protection trunk 30 along the longitudinal direction are provided in one end portion side of the protection trunk e 30.

In the case that the lid 50 is attached to the protection trunk 30, first of all, a plurality of electric conductors 25 are inserted to the protection trunk 30 so as to be arranged within the recess 30*b*. Next, as shown in FIG. 156, the lid 50 is set to an inclined attitude with respect to the top surface portion 7*b*, and as shown in FIG. 158, the contact shaft 51*b* is brought into contact with the inner corner portions of the bent portions 45 and 45. Further, the lid 50 is approximated to the protection trunk 30 by using the contact shaft 51*b* as a supporting point, and the side surface portion 58 is brought into contact with the claw portions 80 and 80 so as to be elastically deformed. Further, the lid 50 is approximated to the protection trunk 30, and the claw portions 80 and 80 are retained to the retention holes 58*a* and 58*a*. At this time, as shown in FIG. 157, the electric conductor 25 is pinched between the elastic plate portion 51*a* and the connecting plate 30*a* within the recess 30*b*. The connecting plate 30*a* is flat, and a plurality of electric conductors 25 are aligned and closed up within the recess 30*b*. In this case, an elastic member 70 may be provided in the elastic plate portion 51*a*, and the electric conductor 25 may be pinched between the elastic member 70 and the connecting plate 30*a*.

In the structure of the display device in accordance with the embodiment 12-2, the same reference numerals are attached to the same structures as the embodiment 12-1, and a detailed description thereof will be omitted.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A light reflection sheet, comprising:
a through hole;
a long slot extending in a separating direction from the through hole;
a flat portion taking an almost square shape and provided with the through hole; and
a frame portion connected to enable bending at a folded part formed on a peripheral edge of the flat portion and a flange piece connected to a peripheral edge of the frame portion;
wherein the slot is provided on the flange piece.

2. A light source device, comprising:
a light source;
a support body for supporting the light source;
the light reflection sheet according to claim 1 which reflects light emitted from the light source;
a first position setting portion fitted in the through hole for setting a position of the light reflection sheet with respect to the support body; and
a second position setting portion fitted in the slot to enable a relative movement in a longitudinal direction of the slot for setting a position of the light reflection sheet with respect to the support body.

3. The light source device according to claim 2, wherein the first position setting portion is a first shaft member having a setting shaft portion smaller than the through hole, the second position setting portion is a second shaft member having a setting shaft portion smaller than a width of the slot, and two position setting holes in which the first shaft member and the second shaft member are to be fitted are provided on the support body.

4. The light source device according to claim 2, wherein the light source is a light-emitting diode;
further comprising a plurality of circuit boards each of which has the light-emitting diodes mounted and juxtaposed thereon.

5. The light source device according to claim 2, wherein the support body has a plate portion taking an almost square shape and supporting the light source, and a frame portion connected to a peripheral edge of the plate portion and a flange portion connected to a peripheral edge of the frame portion, and the flange portion is provided with the second position setting portion.

6. A display device, comprising
a display portion having a display surface on one of sides; and
the light source device according to claim 2 which is provided on the other side of the display portion.

7. A light source device, comprising:
a light source;
a support body for supporting the light source; and
a light reflection sheet which reflects light emitted from the light source, the light reflection sheet comprising
a through hole; and
a long slot extending in a separating direction from the through hole,
wherein a plurality of second through holes are provided in a peripheral edge portion, the through hole is smaller than the second through hole, and a width of the slot is smaller than that of the second through hole;
the light source device further comprising:
a first position setting portion fitted in the through hole for setting a position of the light reflection sheet with respect to the support body; and
a second position setting portion fitted in the slot to enable a relative movement in a longitudinal direction of the slot for setting a position of the light reflection sheet with respect to the support body.

8. The light source device according to claim 7, wherein the first position setting portion is a first shaft member having a setting shaft portion smaller than the through hole, the second position setting portion is a second shaft member having a setting shaft portion smaller than a width of the slot, and two position setting holes in which the first shaft member and the second shaft member are to be fitted are provided on the support body.

9. The light source device according to claim 7, wherein the light source is a light-emitting diode;
further comprising a plurality of circuit boards each of which has the light-emitting diodes mounted and juxtaposed thereon.

10. The light source device according to claim 7, wherein the support body has a plate portion taking an almost square shape and supporting the light source, and a frame portion connected to a peripheral edge of the plate portion and a flange portion connected to a peripheral edge of the frame portion, and the flange portion is provided with the second position setting portion.

11. A display device, comprising
a display portion having a display surface on one of sides; and
the light source device according to claim 7 which is provided on the other side of the display portion.

12. A light reflection sheet, comprising:

a through hole; and a slot connected to an edge of the through hole, wherein a plurality of second through holes are provided in a peripheral edge portion, the through hole is smaller than the second through hole, and a width of the slot is smaller than that of the second through hole.

13. A light source device, comprising:

a light source;

the support body for supporting the light source;

the light reflection sheet according to claim 12 which reflects light emitted from the light source;

a first position setting portion fitted in the through hole for setting a position of the light reflection sheet with respect to the support body; and a second position setting portion fitted in the slot to enable a relative movement in a longitudinal direction of the slot for setting a position of the light reflection sheet with respect to the support body.

14. The light source device according to claim 13, wherein the first position setting portion is a first shaft member having a setting shaft portion smaller than the through hole, the second position setting portion is a second shaft member having a setting shaft portion smaller than a width of the slot, and two position setting holes in which the first shaft member and the second shaft member are to be fitted are provided on the support body.

15. The light source device according to claim 13, wherein the light source is a light-emitting diode;

further comprising a plurality of circuit boards each of which has the light-emitting diodes mounted and juxtaposed thereon.

16. The light source device according to claim 13, wherein the support body has a plate portion taking an almost square shape and supporting the light source, and a frame portion connected to a peripheral edge of the plate portion and a flange portion connected to a peripheral edge of the frame portion, and the flange portion is provided with the second position setting portion.

17. A display device, comprising a display portion having a display surface on one of sides; and the light source device according to claim 13 which is provided on the other side of the display portion.

18. A light reflection sheet, comprising:

a through hole;

a slot connected to an edge of the through hole;

a flat portion taking an almost square shape and provided with the through hole; and a frame portion connected to enable bending at a folded part formed on a peripheral edge of the flat portion and a flange piece connected to a peripheral edge of the frame portion;

wherein the slot is provided on the flange piece.

19. A light source device, comprising:

a light source;

the support body for supporting the light source;

the light reflection sheet according to claim 18 which reflects light emitted from the light source;

a first position setting portion fitted in the through hole for setting a position of the light reflection sheet with respect to the support body; and a second position setting portion fitted in the slot to enable a relative movement in a longitudinal direction of the slot for setting a position of the light reflection sheet with respect to the support body.

20. The light source device according to claim 19, wherein the first position setting portion is a first shaft member having a setting shaft portion smaller than the through hole, the second position setting portion is a second shaft member having a setting shaft portion smaller than a width of the slot, and two position setting holes in which the first shaft member and the second shaft member are to be fitted are provided on the support body.

21. The light source device according to claim 19, wherein the light source is a light-emitting diode;

further comprising a plurality of circuit boards each of which has the light-emitting diodes mounted and juxtaposed thereon.

22. The light source device according to claim 19, wherein the support body has a plate portion taking an almost square shape and supporting the light source, and a frame portion connected to a peripheral edge of the plate portion and a flange portion connected to a peripheral edge of the frame portion, and the flange portion is provided with the second position setting portion.

23. A display device, comprising a display portion having a display surface on one of sides; and the light source device according to claim 19 which is provided on the other side of the display portion.

* * * * *